US011917901B2

(12) United States Patent
Stoessel et al.

(10) Patent No.: US 11,917,901 B2
(45) **Date of Patent: *Feb. 27, 2024**

(54) METAL COMPLEXES

(71) Applicant: UDC IRELAND LIMITED, Dublin (IE)

(72) Inventors: Philipp Stoessel, Frankfurt am Main (DE); Dominik Joosten, Frankfurt am Main (DE); Esther Breuning, Ober-Ramstadt (DE); Joachim Kaiser, Darmstadt (DE)

(73) Assignee: UDC Ireland Limited, Dublin (IE)

( * ) Notice: Subject to any disclaimer, the term of this patent is extended or adjusted under 35 U.S.C. 154(b) by 854 days.

This patent is subject to a terminal disclaimer.

(21) Appl. No.: 14/419,981

(22) PCT Filed: Jul. 2, 2013

(86) PCT No.: PCT/EP2013/001926

§ 371 (c)(1),
(2) Date: Feb. 6, 2015

(87) PCT Pub. No.: WO2014/023377

PCT Pub. Date: Feb. 13, 2014

(65) Prior Publication Data

US 2015/0171348 A1 Jun. 18, 2015

(30) Foreign Application Priority Data

Aug. 7, 2012 (EP) .................................... 12005715

(51) Int. Cl.

| | |
|---|---|
| *H10K 85/30* | (2023.01) |
| *C07F 15/00* | (2006.01) |
| *C09K 11/06* | (2006.01) |
| *H10K 50/11* | (2023.01) |
| *H05B 33/10* | (2006.01) |
| *H05B 33/20* | (2006.01) |
| *H10K 71/12* | (2023.01) |
| *H10K 71/16* | (2023.01) |
| *H10K 101/10* | (2023.01) |

(52) U.S. Cl.

CPC ....... *H10K 85/342* (2023.02); *C07F 15/0033* (2013.01); *C09K 11/06* (2013.01); *H05B 33/10* (2013.01); *H05B 33/20* (2013.01); *H10K 85/346* (2023.02); *C09K 2211/1007* (2013.01); *C09K 2211/1011* (2013.01); *C09K 2211/1029* (2013.01); *C09K 2211/1044* (2013.01); *C09K 2211/1088* (2013.01); *C09K 2211/185* (2013.01); *H10K 50/11* (2023.02); *H10K 71/12* (2023.02); *H10K 71/164* (2023.02); *H10K 2101/10* (2023.02); *Y02E 10/549* (2013.01)

(58) Field of Classification Search

CPC ............. C07F 15/0033; C07F 15/0086; H01L 51/0085; H01L 51/0087; H01L 51/003–0095; H01L 51/50–5296; H01L 2251/50–558; C07C 13/08; C07C 2602/08; C09K 11/06; C09K 2211/1011; C09K 2211/1029; C09K 2211/185; C09K 2211/00–188

USPC ...................... 428/90, 691, 917; 427/58, 66; 313/498–512; 257/40, 88–103, 257/E51.001–E51.052; 252/301.16–301.35

See application file for complete search history.

(56) References Cited

U.S. PATENT DOCUMENTS

2002/0064681 A1* 5/2002 Takiguchi ........... C07F 15/0033 428/690
2007/0009760 A1* 1/2007 Inoue ..................... C09K 11/06 428/690
2007/0190359 A1 8/2007 Knowles et al.
2007/0196690 A1 8/2007 Ikemizu et al.
2007/0196691 A1 8/2007 Ikemizu et al.
2007/0249834 A1 10/2007 Stossel et al.
2007/0281182 A1* 12/2007 Schulte ................. C08G 61/02 428/690
2008/0131730 A1* 6/2008 Takiguchi ........... C07F 15/0033 428/690
2011/0050092 A1 3/2011 Takada (Continued)

FOREIGN PATENT DOCUMENTS

EP 1659129 A1 5/2006
JP 2003146996 A 5/2003

(Continued)

OTHER PUBLICATIONS

Kui et al., Chem. Commun., 2013, 49, 1497-1499 (Year: 2013).*

(Continued)

*Primary Examiner* — Dylan C Kershner
*Assistant Examiner* — Elizabeth M. Dahlburg
(74) *Attorney, Agent, or Firm* — Riverside Law LLP

(57) ABSTRACT

The present invention relates to metal complexes of formula (1):

$$M(L)_n(L')_m \quad (1)$$

which comprises a moiety $M(L)_n$ of formula (2):

(2)

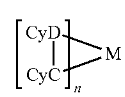

and to electronic devices, in particular organic electroluminescent devices, comprising these metal complexes.

23 Claims, 1 Drawing Sheet

(56) References Cited

U.S. PATENT DOCUMENTS

| | | | | |
|---|---|---|---|---|
| 2011/0284799 | A1 | 11/2011 | Stoessel et al. | |
| 2013/0032766 | A1 | 2/2013 | Molt et al. | |
| 2013/0328037 | A1 * | 12/2013 | Oshiyama | C07F 9/5022<br>257/40 |
| 2013/0342102 | A1 * | 12/2013 | Hakoi | H05B 33/14<br>313/504 |

FOREIGN PATENT DOCUMENTS

| | | | | |
|---|---|---|---|---|
| JP | 2006505956 | A | 2/2006 | |
| JP | 2008500377 | A | 1/2008 | |
| JP | 2008075043 | A | 4/2008 | |
| JP | 2009526071 | A | 7/2009 | |
| JP | 2011068848 | A | 4/2011 | |
| JP | 2012516831 | A | 7/2012 | |
| KR | 20100098294 | A | 9/2010 | |
| TW | 200418865 | A | 10/2004 | |
| WO | 2004045002 | A1 | 5/2004 | |
| WO | WO-2004/043974 | A1 | 5/2004 | |
| WO | WO-2005/113563 | A1 | 12/2005 | |
| WO | 2007097153 | A1 | 8/2007 | |
| WO | 2008094187 | A2 | 8/2008 | |
| WO | WO-2010086089 | A1 * | 8/2010 | C07F 1/00 |
| WO | 2011073149 | A1 | 6/2011 | |
| WO | 2012064499 | A1 | 5/2012 | |
| WO | 2012111548 | A1 | 8/2012 | |
| WO | WO-2012111548 | A1 * | 8/2012 | C07F 15/0086 |

OTHER PUBLICATIONS

Hanson, K., et al., "Efficient dipyrrin-centered phosphorescence at room temperature from bis-cyclometalated iridium (III) dipyrrinato complexes," 2010, pp. 6077-6084, vol. 49(13), Inorganic Chemistry.

Watson, A.A., et al., "Chiral heterocyclic ligands III. A structural study of the cyclopalladation of (4S, 7R)-7,8,8-Trimethyl-1-Phenyl-4,5,6,7-Tetrahydro-4,7-Methano-1H-Indazole," 1986, pp. 387-397, vol. 311, Journal of Organometallic Chemistry.

Zhang, G., et al., "Highly efficient organic light-emitting diodes (OLEDs) based on an iridium complex with rigid cyclometalated ligand," 2010, pp. 632-640, vol. 11, Organic Electronics.

Zhang, G., et al., "Highly efficient white organic light-emitting diodes based on broad excimer emission of iridium complex," 2010, pp. 1165-1171, vol. 11, Organic Electronics.

Shiyanshi, F., Chinese Journal of Analysis Laboratory, 2011, pp. 6-9, vol. 30(4).

Blanck, et al. "Bioactive Cyclometalated Phthalimides: Design, Synthesis and Kinase Inhibition", Dalton Trans., 2012, vol. 41, pp. 9337-9348.

International Search Report for International Application No. PCT/EP2013/001926; Search Reported dated Aug. 7, 2014.

Japanese Office Action dated Oct. 10, 2017 in Japanese Patent Application Serial No. 2015-525756.

* cited by examiner

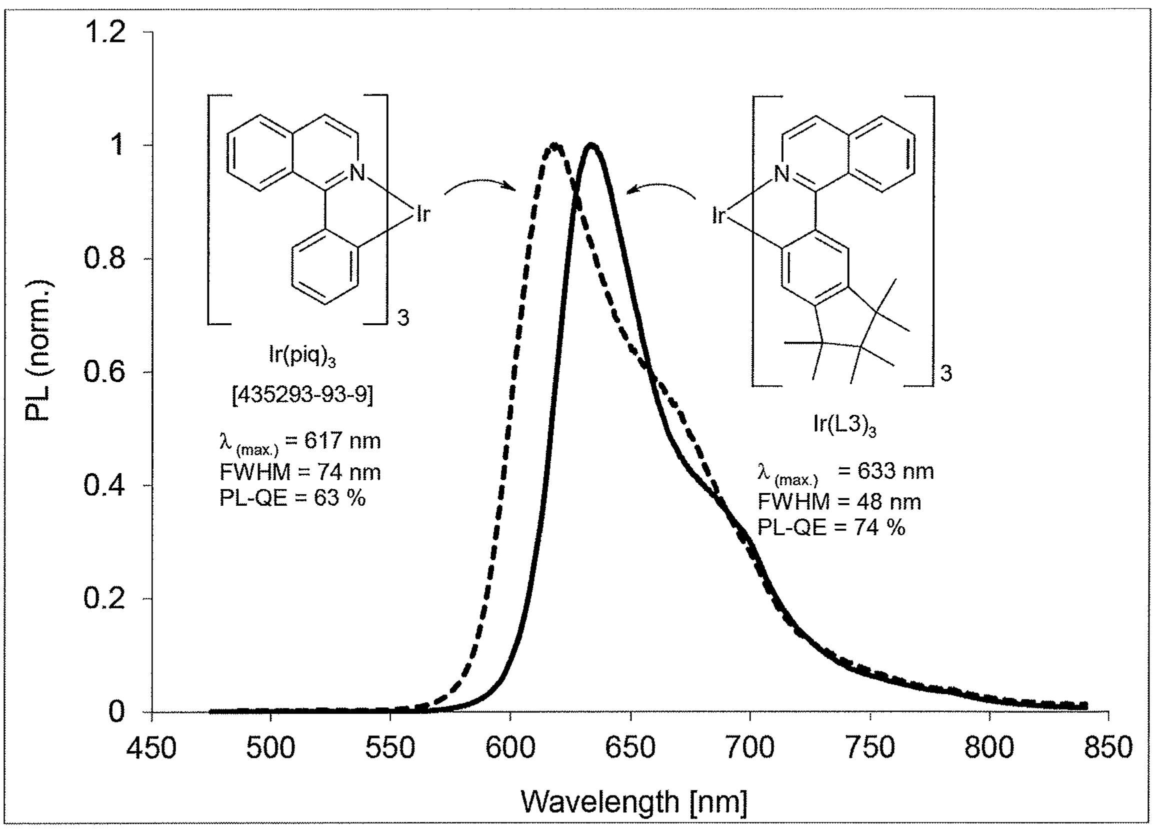
1.2
1
0.8
0.6
0.4
0.2
0
PL (norm.)
450
500
550
600
650
700
750
800
850
Wavelength [nm]
N
Ir
3
Ir(piq)3
[435293-93-9]
λ (max.) = 617 nm
FWHM = 74 nm
PL-QE = 63 %
Ir
N
3
Ir(L3)3
λ (max.) = 633 nm
FWHM = 48 nm
PL-QE = 74 %

METAL COMPLEXES

RELATED APPLICATIONS

This application is a national stage application, filed pursuant to 35 U.S.C. § 371, of PCT/EP2013/001926, filed Jul. 2, 2013, which claims the benefit of European Patent Application No. 12005715.3, filed Aug. 7, 2012, which is incorporated herein by reference in its entirety.

The present invention relates to metal complexes which are suitable for use as emitters in organic electroluminescent devices.

The structure of organic electroluminescent devices (OLEDs) in which organic semiconductors are employed as functional materials is described, for example, in U.S. Pat. Nos. 4,539,507, 5,151,629, EP 0676461 and WO 98/27136. The emitting materials employed here are increasingly organometallic complexes which exhibit phosphorescence instead of fluorescence (M. A. Baldo et al., *Appl. Phys. Lett.* 1999, 75, 4-6). For quantum-mechanical reasons, an up to four-fold increase in energy and power efficiency is possible using organometallic compounds as phosphorescent emitters. In general, there is still a need for improvement in OLEDs which exhibit triplet emission, in particular with respect to efficiency, operating voltage and lifetime. This applies, in particular, to OLEDs which emit in the relatively shortwave region, i.e. green and in particular blue.

In accordance with the prior art, iridium and platinum complexes, in particular, are employed as triplet emitters in phosphorescent OLEDs. It has been possible to achieve an improvement in these OLEDs by employing metal complexes with polypodal ligands or cryptates, causing the complexes to have higher thermal stability, which results in a longer lifetime of the OLEDs (WO 2004/081017, WO 2005/113563, WO 2006/008069). However, further improvements, in particular with respect to the efficiency and the lifetime of the complexes, are desirable.

The iridium complexes employed are, in particular, bis- and tris-ortho-metallated complexes with aromatic ligands, where the ligands are bonded to the metal via a negatively charged carbon atom and a neutral nitrogen atom or via a negatively charged carbon atom and a neutral carbene carbon atom. Examples of such complexes are tris(phenylpyridyl)iridium(III) and derivatives thereof (for example in accordance with US 200210034656 or WO 2010/027583). The literature discloses a multiplicity of related ligands and iridium or platinum complexes, such as, for example, complexes with 1- or 3-phenylisoquinoline ligands (for example in accordance with EP 1348711 or WO 2011/028473), with 2-phenylquinolines (for example in accordance with WO 2002/064700 or WO 2006/095943), with phenylquinoxalines (for example in accordance with US 2005/0191527), with phenylimidazoles (for example in accordance with JP 20031109758), with phenylbenzimidazoles (for example in accordance with US 2005/0008895) or with phenylcarbenes (for example in accordance with WO 2005/019373). Platinum complexes are known, for example, from WO 2003/040257. Although good results are already achieved with metal complexes of this type, further improvements are still desirable here.

The object of the present invention is therefore the provision of novel metal complexes which are suitable as emitters for use in OLEDs. In particular, the object is to provide emitters which exhibit improved properties with respect to efficiency, operating voltage, lifetime, colour coordinates and/or colour purity, i.e. width of the emission band.

Surprisingly, it has been found that certain metal chelate complexes described in greater detail below achieve this object and are very highly suitable for use in an organic electroluminescent device. The present invention therefore relates to these metal complexes and to organic electroluminescent devices which comprise these complexes.

The invention thus relates to a compound of the formula (1), $$M(L)_n(L')_m \qquad \text{formula (1)}$$

which contains a moiety $M(L)_n$ of the formula (2):

formula (2)

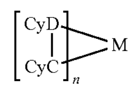

where the following applies to the symbols and indices used:

M is iridium or platinum;

CyC is an aryl or heteroaryl group having 5 to 18 aromatic ring atoms or a fluorene group, each of which is coordinated to M via a carbon atom and each of which may be substituted by one or more radicals R and each of which is bonded to CyD via a covalent bond;

CyD is a heteroaryl group having 5 to 18 aromatic ring atoms which is coordinated to M via a neutral nitrogen atom or via a carbene carbon atom and which may be substituted by one or more radicals R and which is bonded to CyC via a covalent bond;

R is on each occurrence, identically or differently, H, D, F, Cl, Br, I, $N(R^1)_2$, CN, $NO_2$, OH, COOH, $C(=O)N(R^1)_2$, $Si(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl, alkoxy or thioalkoxy group having 1 to 20 C atoms or an alkenyl or alkynyl group having 2 to 20 C atoms or a branched or cyclic alkyl, alkoxy or thioalkoxy group having 3 to 20 C atoms, each of which may be substituted by one or more radicals $R^1$, where one or more non-adjacent $CH_2$ groups may be replaced by $R^1C{=}CR^1$, C≡C, $Si(R^1)_2$, C=O, $NR^1$, O, S or $CONR^1$ and where one or more H atoms may be replaced by D, F, Cl, Br, I or CN, or an aromatic or heteroaromatic ring system having 5 to 60 aromatic ring atoms, which may in each case be substituted by one or more radicals $R^1$, or an aryloxy or heteroaryloxy group having 5 to 40 aromatic ring atoms, which may be substituted by one or more radicals $R^1$, or an aralkyl or heteroaralkyl group having 5 to 40 aromatic ring atoms, which may be substituted by one or more radicals $R^1$, or a diarylamino group, diheteroarylamino group or arylheteroarylamino group having 10 to 40 aromatic ring atoms, which may be substituted by one or more radicals $R^1$; two adjacent radicals R here may also form a mono- or polycyclic, aliphatic, aromatic or heteroaromatic ring system with one another;

$R^1$ is on each occurrence, identically or differently, H, D, F, Cl, Br, I, $N(R^2)_2$, CN, $NO_2$, $Si(R^2)_3$, $B(OR^2)_2$, $C(=O)R^2$, $P(=O)(R^2)_2$, $S(=O)R^2$, $S(=O)_2R^2$, $OSO_2R^2$, a straight-chain alkyl, alkoxy or thioalkoxy group having 1 to 20 C atoms or an alkenyl or alkynyl group having 2 to 20 C atoms or a branched or cyclic alkyl, alkoxy or thioalkoxy group having 3 to 20 C atoms, each of which may be substituted by one or more radicals $R^2$, where one or more non-adjacent $CH_2$ groups may be replaced by $R^2C{=}CR^2$, C≡C, $Si(R^2)_2$, C=O, $NR^2$, O, S or $CONR^2$ and where one or more H atoms may be replaced by D, F, Cl, Br, I, CN or $NO_2$, or an aromatic or heteroaromatic ring system having 5 to 60 aromatic ring atoms, which may in each case be substituted by one or more radicals $R^2$, or an aryloxy or heteroaryloxy group having 5 to 40 aromatic ring atoms, which may be substituted by one or more radicals $R^2$, or an aralkyl or heteroaralkyl group having 5 to 40 aromatic ring atoms, which may be substituted by one or more radicals $R^2$, or a diarylamino group, diheteroarylamino group or arylheteroarylamino group having 10 to 40 aromatic ring atoms, which may be substituted by one or more radicals $R^2$; two or more adjacent radicals $R^1$ with one another or $R^1$ with R here may form a mono- or polycyclic, aliphatic, aromatic or heteroaromatic ring system;

$R^2$ is on each occurrence, identically or differently, H, D, F or an aliphatic, aromatic and/or heteroaromatic hydrocarbon radical having 1 to 20 C atoms, in which, in addition, one or more H atoms may be replaced by F; two or more substituents $R^2$ here may also form a mono- or polycyclic, aliphatic ring system with one another;

L' is, identically or differently on each occurrence, any desired co-ligand;

n is 1, 2 or 3;

m is 0, 1, 2, 3 or 4;

CyC and CyD here may also be linked to one another via a group selected from $C(R^1)_2$, $C(R^1)_2—C(R^1)_2—$, $NR^1$, O or S;

a plurality of ligands L may also be linked to one another or L may be linked to L' via a single bond or a divalent or trivalent bridge and thus form a tridentate, tetradentate, pentadentate or hexadentate ligand system;

a substituent R may also additionally coordinate to the metal;

characterised in that CyD and/or CyC contain(s) two adjacent carbon atoms which are each substituted by radicals R, where the respective radicals R, together with the C atoms, form a ring of the following formula (3) or (4), formula (3)

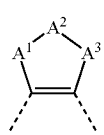

formula (4)

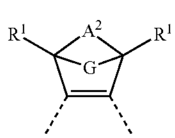

where $R^1$ and $R^2$ have the above-mentioned meanings, the dashed bonds indicate the linking of the two carbon atoms in the ligand, and furthermore:

$A^1$, $A^3$ are, identically or differently on each occurrence, $C(R^3)_2$, O, S, $NR^3$ or C(═O);

$A^2$ is $C(R^1)_2$, O, S, $NR^3$ or C(═O);

G is an alkylene group having 1, 2 or 3 C atoms, which may be substituted by one or more radicals $R^2$, or is $—CR^2═CR^2—$ or an ortho-linked arylene or heteroarylene group having 5 to 14 aromatic ring atoms, which may be substituted by one or more radicals $R^2$;

$R^3$ is, identically or differently on each occurrence, F, a straight-chain alkyl or alkoxy group having 1 to 20 C atoms, a branched or cyclic alkyl or alkoxy group having 3 to 20 C atoms, each of which may be substituted by one or more radicals $R^2$, where one or more non-adjacent $CH_2$ groups may be replaced by $R^2C═CR^2$, C≡C, $Si(R^2)_2$, C═O, $NR^2$, O, S or $CONR^2$ and where one or more H atoms may be replaced by D or F, or an aromatic or heteroaromatic ring system having 5 to 24 aromatic ring atoms, which may in each case be substituted by one or more radicals $R^2$, or an aryloxy or heteroaryloxy group having 5 to 24 aromatic ring atoms, which may be substituted by one or more radicals $R^2$, or an aralkyl or heteroaralkyl group having 5 to 24 aromatic ring atoms, which may be substituted by one or more radicals $R^2$; two radicals $R^3$ here which are bonded to the same carbon atom may form an aliphatic or aromatic ring system with one another and thus form a spiro system; furthermore, $R^3$ may form an aliphatic ring system with an adjacent radical R or $R^1$;

with the proviso that two heteroatoms are not bonded directly to one another in $A^1$-$A^2$-$A^3$.

The presence of a moiety of the formula (3) or formula (4), i.e. a condensed-on aliphatic five-membered ring, is essential to the invention. As is evident from the above-mentioned formula (3), the 5-membered ring formed by the two C atoms, $A^1$, $A^2$ and $A^3$ contains no benzylic protons, since $R^3$, if $A^1$ or $A^3$ stands for $C(R^3)_2$, is not equal to hydrogen. In the structures of the formulae (3) and (4) depicted above and the further embodiments of these structures indicated as preferred, a double bond is formally depicted between the two carbon atoms. This represents a simplification of the chemical structure, since these two carbon atoms are bonded into an aromatic or heteroaromatic system and the bond between these two carbon atoms is thus formally between the degree of bonding of a single bond and that of a double bond. The drawing-in of the formal double bond should thus not be regarded as limiting for the structure, but instead it is apparent to the person skilled in the art that this is taken to mean an aromatic bond.

"Adjacent carbon atoms" here means that the carbon atoms are bonded directly to one another. Furthermore, "adjacent radicals" in the definition of the radicals means that these radicals are bonded to the same carbon atom or to adjacent carbon atoms.

An aryl group in the sense of this invention contains 6 to 40 C atoms; a heteroaryl group in the sense of this invention contains 2 to 40 C atoms and at least one heteroatom, with the proviso that the sum of C atoms and heteroatoms is at least 5. The heteroatoms are preferably selected from N, O and/or S. An aryl group or heteroaryl group here is taken to mean either a simple aromatic ring, i.e. benzene, or a simple heteroaromatic ring, for example pyridine, pyrimidine, thiophene, etc., or a condensed aryl or heteroaryl group, for example naphthalene, anthracene, phenanthrene, quinoline, isoquinoline, etc.

An aromatic ring system in the sense of this invention contains 6 to 60 C atoms in the ring system. A heteroaromatic ring system in the sense of this invention contains 1 to 60 C atoms and at least one heteroatom in the ring system, with the proviso that the sum of C atoms and heteroatoms is at least 5. The heteroatoms are preferably selected from N, O and/or S. An aromatic or heteroaromatic ring system in the sense of this invention is intended to be taken to mean a system which does not necessarily contain only aryl or heteroaryl groups, but instead in which, in addition, a plurality of aryl or heteroaryl groups may be interrupted by a non-aromatic unit (preferably less than 10% of the atoms other than H), such as, for example, a C, N or O atom or a carbonyl group. Thus, for example, systems such as 9,9'-spirobifluorene, 9,9-diarylfluorene, triarylamine, diaryl ether, stilbene, etc., are also intended to be taken to be aromatic ring systems in the sense of this invention, as are systems in which two or more aryl groups are interrupted, for example, by a linear or cyclic alkyl group or by a silyl group. Furthermore, systems in which two or more aryl or heteroaryl groups are bonded directly to one another, such as, for example, biphenyl or terphenyl, are likewise intended to be taken to be an aromatic or heteroaromatic ring system.

A cyclic alkyl, alkoxy or thioalkoxy group in the sense of this invention is taken to mean a monocyclic, bicyclic or polycyclic group.

For the purposes of the present invention, a $C_1$- to $C_{40}$-alkyl group, in which, in addition, individual H atoms or $CH_2$ groups may be substituted by the above-mentioned groups, is taken to mean, for example, the radicals methyl, ethyl, n-propyl, i-propyl, cyclopropyl, n-butyl, i-butyl, s-butyl, t-butyl, cyclobutyl, 2-methylbutyl, n-pentyl, s-pentyl, tert-pentyl, 2-pentyl, neopentyl, cyclopentyl, n-hexyl, s-hexyl, tert-hexyl, 2-hexyl, 3-hexyl, neohexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo[2.2.2]octyl, 2-(2,6-dimethyl)octyl, 3-(3,7-dimethyl)octyl, adamantyl, trifluoromethyl, pentafluoroethyl, 2,2,2-trifluoroethyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octadec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyl-n-hexadec-1-yl, 1,1-diethyl-n-octadec-1-yl, 1-(n-propyl)cyclohex-1-yl, 1-(n-butyl)cyclohex-1-yl, 1-(n-hexyl)cyclohex-1-yl, 1-(n-octyl)cyclohex-1-yl and 1-(n-decyl)cyclohex-1-yl. An alkenyl group is taken to mean, for example, ethenyl, propenyl, butenyl, pentenyl, cyclopentenyl, hexenyl, cyclohexenyl, heptenyl, cycloheptenyl, octenyl, cyclooctenyl or cyclooctadienyl. An alkynyl group is taken to mean, for example, ethynyl, propynyl, butynyl, pentynyl, hexynyl, heptynyl or octynyl. A $C_1$- to $C_{40}$-alkoxy group is taken to mean, for example, methoxy, trifluoromethoxy, ethoxy, n-propoxy, i-propoxy, n-butoxy, i-butoxy, s-butoxy, t-butoxy or 2-methylbutoxy.

An aromatic or heteroaromatic ring system having 5-60 aromatic ring atoms, which may also in each case be substituted by the radicals mentioned above and which may be linked to the aromatic or heteroaromatic ring system via any desired positions, is taken to mean, for example, groups derived from benzene, naphthalene, anthracene, benzanthracene, phenanthrene, benzophenanthrene, pyrene, chrysene, perylene, fluoranthene, benzofluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or transindenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

Preference is given to compounds of the formula (1), characterised in that they are uncharged, i.e. are electrically neutral. This is achieved in a simple manner by selecting the charge of the ligands L and L' in such a way that they compensate for the charge of the complexed metal atom M.

In the complexes of the formula (1), the indices n and m are selected so that the coordination number at the metal M corresponds in total, depending on the metal, to the usual coordination number for this metal. For iridium(III) this is the coordination number 6 and for platinum(II) this is the coordination number 4.

In a preferred embodiment of the invention, M is iridium (III), and the index n stands for 1, 2 or 3, preferably for 2 or 3. If the index n=1, four monodentate or two bidentate or one bidentate and two monodentate or one tridentate and one monodentate or one tetradentate ligand L', preferably two bidentate ligands L', are also coordinated to the metal. If the index n=2, one bidentate or two monodentate ligands preferably one bidentate ligand L', are also coordinated to the metal. If the index n=3, the index m=0.

In a further preferred embodiment of the invention, M is platinum(II), and the index n stands for 1 or 2. If the index n=1, one bidentate or two monodentate ligands L', preferably one bidentate ligand L', are also coordinated to the metal M. If the index n=2, the index m=0.

In a preferred embodiment of the present invention, CyC is an aryl or heteroaryl group having 6 to 14 aromatic ring atoms, particularly preferably having 6 to 10 aromatic ring atoms, very particularly preferably having 6 aromatic ring atoms, which is coordinated to M via a carbon atom and which may be substituted by one or more radicals R and which is bonded to CyD via a covalent bond.

Preferred embodiments of the group CyC are the structures of the following formulae (CyC-1) to (CyC-19), where the group CyC is in each case bonded to CyD at the position denoted by # and is coordinated to the metal at the position denoted by *, (CyC-1)

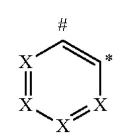

(CyC-2)

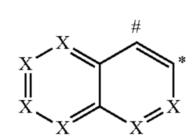

-continued
(CyC-3)
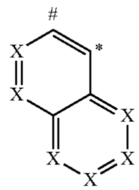
(CyC-4)
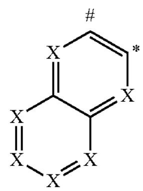
(CyC-5)
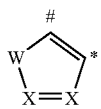
(CyC-6)
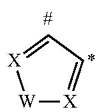
(CyC-7)
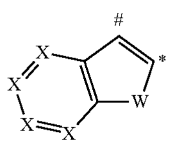
(CyC-8)
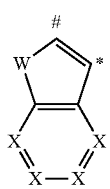
(CyC-9)
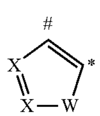
(CyC-10)
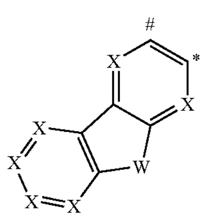
(CyC-11)
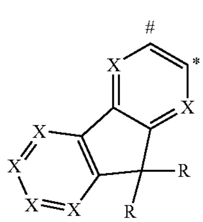
-continued
(CyC-12)
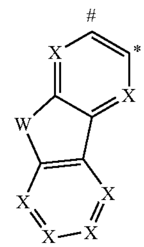
(CyC-13)
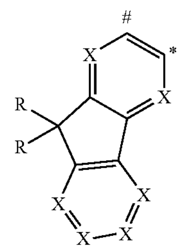
(CyC-14)
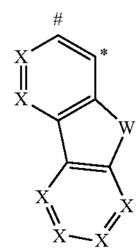
(CyC-15)
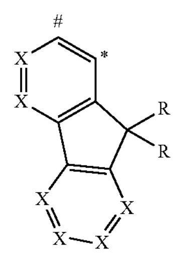
(CyC-16)
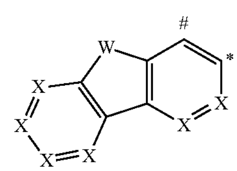
(CyC-17)
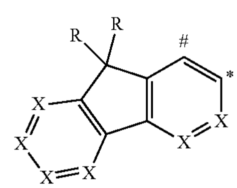
(CyC-18)
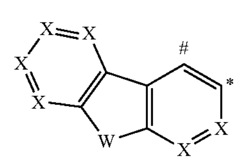

-continued (CyC-19)

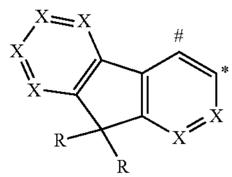

where R has the meanings given above and the following applies to the other symbols used:

X is on each occurrence, identically or differently, CR or N;

W is on each occurrence, identically or differently, NR, O, S or $CR_2$.

If the group of the formula (3) or (4) is bonded to CyC, two adjacent groups X in CyC stand for CR and, together with the radicals R which are bonded to these carbon atoms, form a group of the formula (3) or (4) mentioned above or described in greater detail below.

Preferably a maximum of three symbols X in CyC stand for N, particularly preferably a maximum of two symbols X in CyC stand for N, very particularly preferably a maximum of one symbol X in CyC stands for N. Especially preferably all symbols X stand for CR.

Particularly preferred groups CyC are the groups of the following formulae (CyC-1a) to (CyC-19a), (CyC-1a)

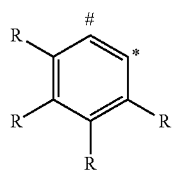

(CyC-1b)

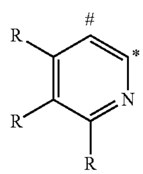

(CyC-1c)

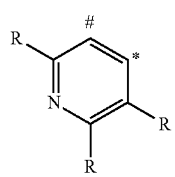

(CyC-1d)

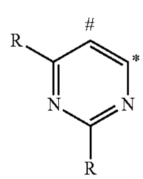

(CyC-2a)

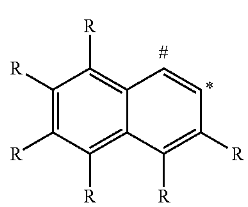

-continued (CyC-2b)

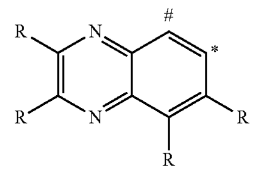

(CyC-3a)

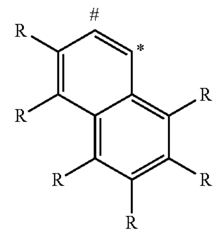

(CyC-3b)

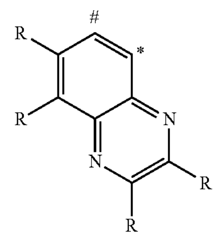

(CyC-4a)

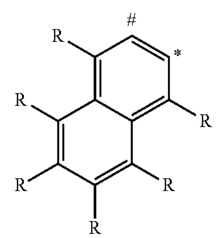

(CyC-4b)

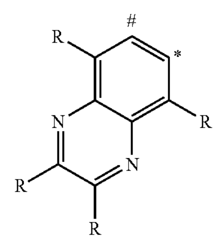

(CyC-5a)

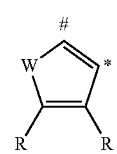

(CyC-6a)

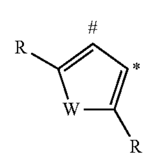

-continued
(CyC-7a)
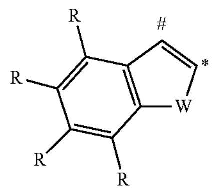
(CyC-8a)
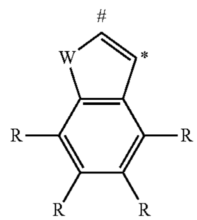
(CyC-9a)
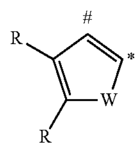
(CyC-10a)
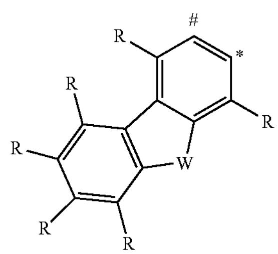
(CyC-11a)
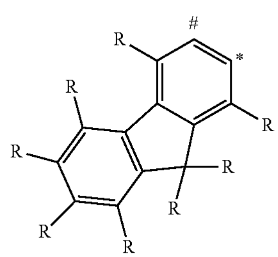
(CyC-12a)
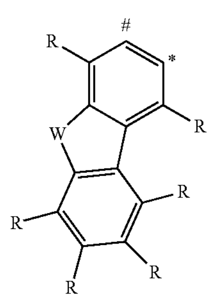
-continued
(CyC-13a)
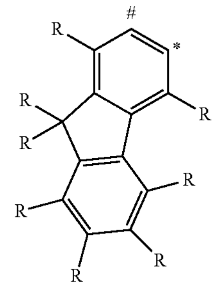
(CyC-14a)
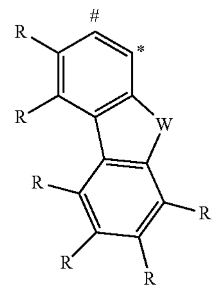
(CyC-15a)
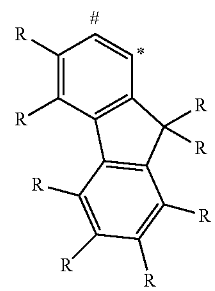
(CyC-16a)
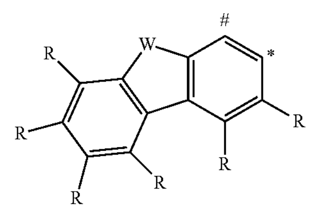
(CyC-17a)
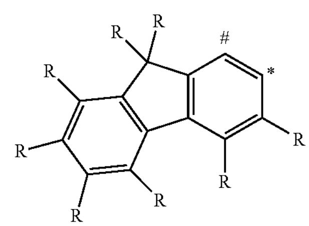
(CyC-18a)
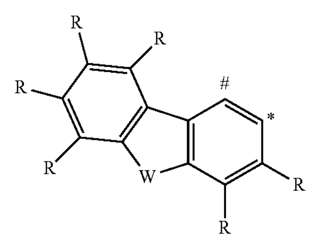

-continued (CyC-19a)

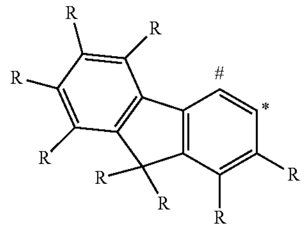

where the symbols used have the meanings given above.

Preferred groups amongst the groups (CyC-1) to (CyC-19) are the groups (CyC-1), (CyC-3), (CyC-8), (CyC-10), (CyC-12), (CyC-13) and (CyC-16), and particular preference is given to the groups (CyC-1a), (CyC-3a), (CyC-8a), (CyC-10a), (CyC-12a), (CyC-13a) and (CyC-16a).

In a further preferred embodiment of the invention, CyD is a heteroaryl group having 5 to 13 aromatic ring atoms, particularly preferably having 5 to 10 aromatic ring atoms, which is coordinated to M via a neutral nitrogen atom or via a carbene carbon atom and which may be substituted by one or more radicals R and which is bonded to CyC via a covalent bond.

Preferred embodiments of the group CyD are the structures of the following formulae (CyD-1) to (CyD-10), where the group CyD is in each case bonded to CyC at the position denoted by # and is coordinated to the metal at the position denoted by *, (CyD-1)

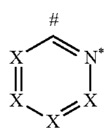

(CyD-2)

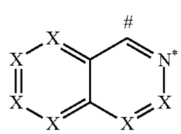

(CyD-3)

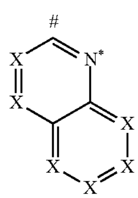

(CyD-4)

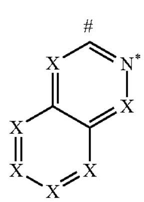

(CyD-5)

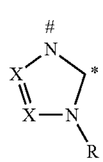

-continued (CyD-6)

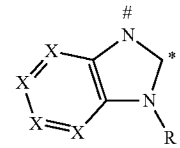

(CyD-7)

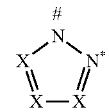

(CyD-8)

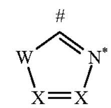

(CyD-9)

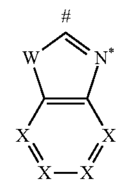

(CyD-10)

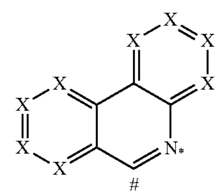

where X, W and R have the meanings given above.

If the group of the formula (3) or (4) is bonded to CyD, two adjacent groups X in CyD stand for CR and, together with the radicals R which are bonded to these carbon atoms, form a group of the formula (3) or (4) mentioned above or described in greater detail below.

Preferably a maximum of three symbols X in CyD stand for N, particularly preferably a maximum of two symbols X in CyD stand for N, very particularly preferably a maximum of one symbol X in CyD stands for N. Especially preferably all symbols X stand for CR.

Particularly preferred groups CyD are the groups of the following formulae (CyD-1a) to (CyD-10a), (CyD-1a)

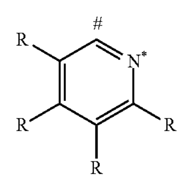

(CyD-2a)

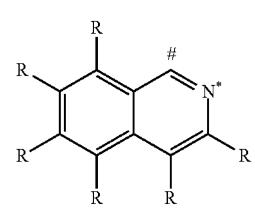

-continued (CyD-3a)

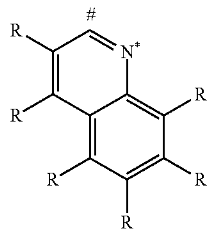

(CyD-3b)

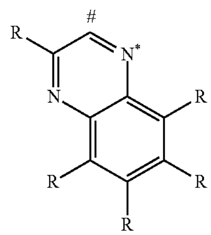

(CyD-4a)

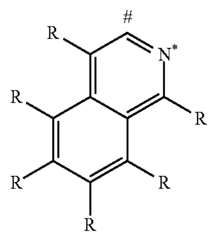

(CyD-5a)

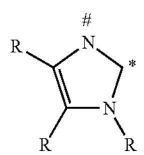

(CyD-6a)

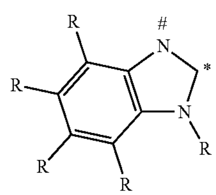

(CyD-7a)

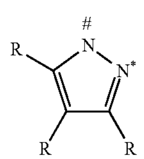

(CyD-8a)

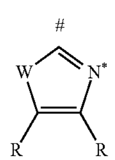

(CyD-9a)

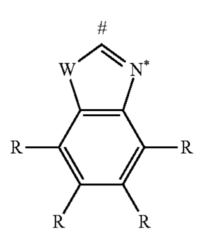

-continued (CyD-10a)

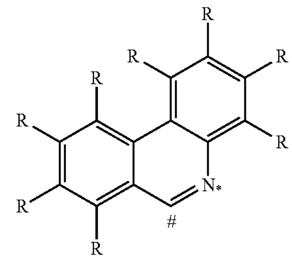

where the symbols used have the meanings given above.

Preferred groups amongst the groups (CyD-1) to (CyD-10) are the groups (CyD-1), (CyD-3), (CyD-4), (CyD-5) and (CyD-6), and particular preference is given to the groups (CyD-1a), (CyD-3a), (CyD-4a), (CyD-5a) and (CyD-6a).

The above-mentioned preferred groups CyC and CyD can be combined with one another as desired. The following combinations of CyC and CyD are thus suitable in the ligand L:

| No. | CyC | CyD |
|---|---|---|
| 1 | CyC-1 | CyD-1 |
| 2 | CyC-1 | CyD-2 |
| 3 | CyC-1 | CyD-3 |
| 4 | CyC-1 | CyD-4 |
| 5 | CyC-1 | CyD-5 |
| 6 | CyC-1 | CyD-6 |
| 7 | CyC-1 | CyD-7 |
| 8 | CyC-1 | CyD-8 |
| 9 | CyC-1 | CyD-9 |
| 10 | CyC-1 | CyD-10 |
| 11 | CyC-2 | CyD-1 |
| 12 | CyC-2 | CyD-2 |
| 13 | CyC-2 | CyD-3 |
| 14 | CyC-2 | CyD-4 |
| 15 | CyC-2 | CyD-5 |
| 16 | CyC-2 | CyD-6 |
| 17 | CyC-2 | CyD-7 |
| 18 | CyC-2 | CyD-8 |
| 19 | CyC-2 | CyD-9 |
| 20 | CyC-2 | CyD-10 |
| 21 | CyC-3 | CyD-1 |
| 22 | CyC-3 | CyD-2 |
| 23 | CyC-3 | CyD-3 |
| 24 | CyC-3 | CyD-4 |
| 25 | CyC-3 | CyD-5 |
| 26 | CyC-3 | CyD-6 |
| 27 | CyC-3 | CyD-7 |
| 28 | CyC-3 | CyD-8 |
| 29 | CyC-3 | CyD-9 |
| 30 | CyC-3 | CyD-10 |
| 31 | CyC-4 | CyD-1 |
| 32 | CyC-4 | CyD-2 |
| 33 | CyC-4 | CyD-3 |
| 34 | CyC-4 | CyD-4 |
| 35 | CyC-4 | CyD-5 |
| 36 | CyC-4 | CyD-6 |
| 37 | CyC-4 | CyD-7 |
| 38 | CyC-4 | CyD-8 |
| 39 | CyC-4 | CyD-9 |
| 40 | CyC-4 | CyD-10 |
| 41 | CyC-5 | CyD-1 |
| 42 | CyC-5 | CyD-2 |
| 43 | CyC-5 | CyD-3 |
| 44 | CyC-5 | CyD-4 |
| 45 | CyC-5 | CyD-5 |
| 46 | CyC-5 | CyD-6 |
| 47 | CyC-5 | CyD-7 |
| 48 | CyC-5 | CyD-8 |
| 49 | CyC-5 | CyD-9 |
| 50 | CyC-5 | CyD-10 |
| 51 | CyC-6 | CyD-1 |

-continued

| No. | CyC | CyD |
|---|---|---|
| 52 | CyC-6 | CyD-2 |
| 53 | CyC-6 | CyD-3 |
| 54 | CyC-6 | CyD-4 |
| 55 | CyC-6 | CyD-5 |
| 56 | CyC-6 | CyD-6 |
| 57 | CyC-6 | CyD-7 |
| 58 | CyC-6 | CyD-8 |
| 59 | CyC-6 | CyD-9 |
| 60 | CyC-6 | CyD-10 |
| 61 | CyC-7 | CyD-1 |
| 62 | CyC-7 | CyD-2 |
| 63 | CyC-7 | CyD-3 |
| 64 | CyC-7 | CyD-4 |
| 65 | CyC-7 | CyD-5 |
| 66 | CyC-7 | CyD-6 |
| 67 | CyC-7 | CyD-7 |
| 68 | CyC-7 | CyD-8 |
| 69 | CyC-7 | CyD-9 |
| 70 | CyC-7 | CyD-10 |
| 71 | CyC-8 | CyD-1 |
| 72 | CyC-8 | CyD-2 |
| 73 | CyC-8 | CyD-3 |
| 74 | CyC-8 | CyD-4 |
| 75 | CyC-8 | CyD-5 |
| 76 | CyC-8 | CyD-6 |
| 77 | CyC-8 | CyD-7 |
| 78 | CyC-8 | CyD-8 |
| 79 | CyC-8 | CyD-9 |
| 80 | CyC-8 | CyD-10 |
| 81 | CyC-9 | CyD-1 |
| 82 | CyC-9 | CyD-2 |
| 83 | CyC-9 | CyD-3 |
| 84 | CyC-9 | CyD-4 |
| 85 | CyC-9 | CyD-5 |
| 86 | CyC-9 | CyD-6 |
| 87 | CyC-9 | CyD-7 |
| 88 | CyC-9 | CyD-8 |
| 89 | CyC-9 | CyD-9 |
| 90 | CyC-9 | CyD-10 |
| 91 | CyC-10 | CyD-1 |
| 92 | CyC-10 | CyD-2 |
| 93 | CyC-10 | CyD-3 |
| 94 | CyC-10 | CyD-4 |
| 95 | CyC-10 | CyD-5 |
| 96 | CyC-10 | CyD-6 |
| 97 | CyC-10 | CyD-7 |
| 98 | CyC-10 | CyD-8 |
| 99 | CyC-10 | CyD-9 |
| 100 | CyC-10 | CyD-10 |
| 101 | CyC-11 | CyD-1 |
| 102 | CyC-11 | CyD-2 |
| 103 | CyC-11 | CyD-3 |
| 104 | CyC-11 | CyD-4 |
| 105 | CyC-11 | CyD-5 |
| 106 | CyC-11 | CyD-6 |
| 107 | CyC-11 | CyD-7 |
| 108 | CyC-11 | CyD-8 |
| 109 | CyC-11 | CyD-9 |
| 110 | CyC-11 | CyD-10 |
| 111 | CyC-12 | CyD-1 |
| 112 | CyC-12 | CyD-2 |
| 113 | CyC-12 | CyD-3 |
| 114 | CyC-12 | CyD-4 |
| 115 | CyC-12 | CyD-5 |
| 116 | CyC-12 | CyD-6 |
| 117 | CyC-12 | CyD-7 |
| 118 | CyC-12 | CyD-8 |
| 119 | CyC-12 | CyD-9 |
| 120 | CyC-12 | CyD-10 |
| 121 | CyC-13 | CyD-1 |
| 122 | CyC-13 | CyD-2 |
| 123 | CyC-13 | CyD-3 |
| 124 | CyC-13 | CyD-4 |
| 125 | CyC-13 | CyD-5 |
| 126 | CyC-13 | CyD-6 |
| 127 | CyC-13 | CyD-7 |
| 128 | CyC-13 | CyD-8 |

-continued

| No. | CyC | CyD |
|---|---|---|
| 129 | CyC-13 | CyD-9 |
| 130 | CyC-13 | CyD-10 |
| 131 | CyC-14 | CyD-1 |
| 132 | CyC-14 | CyD-2 |
| 133 | CyC-14 | CyD-3 |
| 134 | CyC-14 | CyD-4 |
| 135 | CyC-14 | CyD-5 |
| 136 | CyC-14 | CyD-6 |
| 137 | CyC-14 | CyD-7 |
| 138 | CyC-14 | CyD-8 |
| 139 | CyC-14 | CyD-9 |
| 140 | CyC-14 | CyD-10 |
| 141 | CyC-15 | CyD-1 |
| 142 | CyC-15 | CyD-2 |
| 143 | CyC-15 | CyD-3 |
| 144 | CyC-15 | CyD-4 |
| 145 | CyC-15 | CyD-5 |
| 146 | CyC-15 | CyD-6 |
| 147 | CyC-15 | CyD-7 |
| 148 | CyC-15 | CyD-8 |
| 149 | CyC-15 | CyD-9 |
| 150 | CyC-15 | CyD-10 |
| 151 | CyC-16 | CyD-1 |
| 152 | CyC-16 | CyD-2 |
| 153 | CyC-16 | CyD-3 |
| 154 | CyC-16 | CyD-4 |
| 155 | CyC-16 | CyD-5 |
| 156 | CyC-16 | CyD-6 |
| 157 | CyC-16 | CyD-7 |
| 158 | CyC-16 | CyD-8 |
| 159 | CyC-16 | CyD-9 |
| 160 | CyC-16 | CyD-10 |
| 161 | CyC-17 | CyD-1 |
| 162 | CyC-17 | CyD-2 |
| 163 | CyC-17 | CyD-3 |
| 164 | CyC-17 | CyD-4 |
| 165 | CyC-17 | CyD-5 |
| 166 | CyC-17 | CyD-6 |
| 167 | CyC-17 | CyD-7 |
| 168 | CyC-17 | CyD-8 |
| 169 | CyC-17 | CyD-9 |
| 170 | CyC-17 | CyD-10 |
| 171 | CyC-18 | CyD-1 |
| 172 | CyC-18 | CyD-2 |
| 173 | CyC-18 | CyD-3 |
| 174 | CyC-18 | CyD-4 |
| 175 | CyC-18 | CyD-5 |
| 176 | CyC-18 | CyD-6 |
| 177 | CyC-18 | CyD-7 |
| 178 | CyC-18 | CyD-8 |
| 179 | CyC-18 | CyD-9 |
| 180 | CyC-18 | CyD-10 |
| 181 | CyC-19 | CyD-1 |
| 182 | CyC-19 | CyD-2 |
| 183 | CyC-19 | CyD-3 |
| 184 | CyC-19 | CyD-4 |
| 185 | CyC-19 | CyD-5 |
| 186 | CyC-19 | CyD-6 |
| 187 | CyC-19 | CyD-7 |
| 188 | CyC-19 | CyD-8 |
| 189 | CyC-19 | CyD-9 |
| 190 | CyC-19 | CyD-10 |

It is particularly preferred for the groups CyC and CyD mentioned above as particularly preferred to be combined with one another. The following combinations of CyC and CyD are thus preferred in the ligand L:

| No. | C | N |
|---|---|---|
| 1 | CyC-1a | CyD-1a |
| 2 | CyC-1a | CyD-2a |
| 3 | CyC-1a | CyD-3a |
| 4 | CyC-1a | CyD-4a |

-continued

| No. | C | N |
|---|---|---|
| 5 | CyC-1a | CyD-5a |
| 6 | CyC-1a | CyD-6a |
| 7 | CyC-1a | CyD-7a |
| 8 | CyC-1a | CyD-8a |
| 9 | CyC-1a | CyD-9a |
| 10 | CyC-1a | CyD-10a |
| 11 | CyC-2a | CyD-1a |
| 12 | CyC-2a | CyD-2a |
| 13 | CyC-2a | CyD-3a |
| 14 | CyC-2a | CyD-4a |
| 15 | CyC-2a | CyD-5a |
| 16 | CyC-2a | CyD-6a |
| 17 | CyC-2a | CyD-7a |
| 18 | CyC-2a | CyD-8a |
| 19 | CyC-2a | CyD-9a |
| 20 | CyC-2a | CyD-10a |
| 21 | CyC-3a | CyD-1a |
| 22 | CyC-3a | CyD-2a |
| 23 | CyC-3a | CyD-3a |
| 24 | CyC-3a | CyD-4a |
| 25 | CyC-3a | CyD-5a |
| 26 | CyC-3a | CyD-6a |
| 27 | CyC-3a | CyD-7a |
| 28 | CyC-3a | CyD-8a |
| 29 | CyC-3a | CyD-9a |
| 30 | CyC-3a | CyD-10a |
| 31 | CyC-4a | CyD-1a |
| 32 | CyC-4a | CyD-2a |
| 33 | CyC-4a | CyD-3a |
| 34 | CyC-4a | CyD-4a |
| 35 | CyC-4a | CyD-5a |
| 36 | CyC-4a | CyD-6a |
| 37 | CyC-4a | CyD-7a |
| 38 | CyC-4a | CyD-8a |
| 39 | CyC-4a | CyD-9a |
| 40 | CyC-4a | CyD-10a |
| 41 | CyC-5a | CyD-1a |
| 42 | CyC-5a | CyD-2a |
| 43 | CyC-5a | CyD-3a |
| 44 | CyC-5a | CyD-4a |
| 45 | CyC-5a | CyD-5a |
| 46 | CyC-5a | CyD-6a |
| 47 | CyC-5a | CyD-7a |
| 48 | CyC-5a | CyD-8a |
| 49 | CyC-5a | CyD-9a |
| 50 | CyC-5a | CyD-10a |
| 51 | CyC-6a | CyD-1a |
| 52 | CyC-6a | CyD-2a |
| 53 | CyC-6a | CyD-3a |
| 54 | CyC-6a | CyD-4a |
| 55 | CyC-6a | CyD-5a |
| 56 | CyC-6a | CyD-6a |
| 57 | CyC-6a | CyD-7a |
| 58 | CyC-6a | CyD-8a |
| 59 | CyC-6a | CyD-9a |
| 60 | CyC-6a | CyD-10a |
| 61 | CyC-7a | CyD-1a |
| 62 | CyC-7a | CyD-2a |
| 63 | CyC-7a | CyD-3a |
| 64 | CyC-7a | CyD-4a |
| 65 | CyC-7a | CyD-5a |
| 66 | CyC-7a | CyD-6a |
| 67 | CyC-7a | CyD-7a |
| 68 | CyC-7a | CyD-8a |
| 69 | CyC-7a | CyD-9a |
| 70 | CyC-7a | CyD-10a |
| 71 | CyC-8a | CyD-1a |
| 72 | CyC-8a | CyD-2a |
| 73 | CyC-8a | CyD-3a |
| 74 | CyC-8a | CyD-4a |
| 75 | CyC-8a | CyD-5a |
| 76 | CyC-8a | CyD-6a |
| 77 | CyC-8a | CyD-7a |
| 78 | CyC-8a | CyD-8a |
| 79 | CyC-8a | CyD-9a |
| 80 | CyC-8a | CyD-10a |
| 81 | CyC-9a | CyD-1a |

-continued

| No. | C | N |
|---|---|---|
| 82 | CyC-9a | CyD-2a |
| 83 | CyC-9a | CyD-3a |
| 84 | CyC-9a | CyD-4a |
| 85 | CyC-9a | CyD-5a |
| 86 | CyC-9a | CyD-6a |
| 87 | CyC-9a | CyD-7a |
| 88 | CyC-9a | CyD-8a |
| 89 | CyC-9a | CyD-9a |
| 90 | CyC-9a | CyD-10a |
| 91 | CyC-10a | CyD-1a |
| 92 | CyC-10a | CyD-2a |
| 93 | CyC-10a | CyD-3a |
| 94 | CyC-10a | CyD-4a |
| 95 | CyC-10a | CyD-5a |
| 96 | CyC-10a | CyD-6a |
| 97 | CyC-10a | CyD-7a |
| 98 | CyC-10a | CyD-8a |
| 99 | CyC-10a | CyD-9a |
| 100 | CyC-10a | CyD-10a |
| 101 | CyC-11a | CyD-1a |
| 102 | CyC-11a | CyD-2a |
| 103 | CyC-11a | CyD-3a |
| 104 | CyC-11a | CyD-4a |
| 105 | CyC-11a | CyD-5a |
| 106 | CyC-11a | CyD-6a |
| 107 | CyC-11a | CyD-7a |
| 108 | CyC-11a | CyD-8a |
| 109 | CyC-11a | CyD-9a |
| 110 | CyC-11a | CyD-10a |
| 111 | CyC-12a | CyD-1a |
| 112 | CyC-12a | CyD-2a |
| 113 | CyC-12a | CyD-3a |
| 114 | CyC-12a | CyD-4a |
| 115 | CyC-12a | CyD-5a |
| 116 | CyC-12a | CyD-6a |
| 117 | CyC-12a | CyD-7a |
| 118 | CyC-12a | CyD-8a |
| 119 | CyC-12a | CyD-9a |
| 120 | CyC-12a | CyD-10a |
| 121 | CyC-13a | CyD-1a |
| 122 | CyC-13a | CyD-2a |
| 123 | CyC-13a | CyD-3a |
| 124 | CyC-13a | CyD-4a |
| 125 | CyC-13a | CyD-5a |
| 126 | CyC-13a | CyD-6a |
| 127 | CyC-13a | CyD-7a |
| 128 | CyC-13a | CyD-8a |
| 129 | CyC-13a | CyD-9a |
| 130 | CyC-13a | CyD-10a |
| 131 | CyC-14a | CyD-1a |
| 132 | CyC-14a | CyD-2a |
| 133 | CyC-14a | CyD-3a |
| 134 | CyC-14a | CyD-4a |
| 135 | CyC-14a | CyD-5a |
| 136 | CyC-14a | CyD-6a |
| 137 | CyC-14a | CyD-7a |
| 138 | CyC-14a | CyD-8a |
| 139 | CyC-14a | CyD-9a |
| 140 | CyC-14a | CyD-10a |
| 141 | CyC-15a | CyD-1a |
| 142 | CyC-15a | CyD-2a |
| 143 | CyC-15a | CyD-3a |
| 144 | CyC-15a | CyD-4a |
| 145 | CyC-15a | CyD-5a |
| 146 | CyC-15a | CyD-6a |
| 147 | CyC-15a | CyD-7a |
| 148 | CyC-15a | CyD-8a |
| 149 | CyC-15a | CyD-9a |
| 150 | CyC-15a | CyD-10a |
| 151 | CyC-16a | CyD-1a |
| 152 | CyC-16a | CyD-2a |
| 153 | CyC-16a | CyD-3a |
| 154 | CyC-16a | CyD-4a |
| 155 | CyC-16a | CyD-5a |
| 156 | CyC-16a | CyD-6a |
| 157 | CyC-16a | CyD-7a |
| 158 | CyC-16a | CyD-8a |

-continued

| No. | C | N |
|---|---|---|
| 159 | CyC-16a | CyD-9a |
| 160 | CyC-16a | CyD-10a |
| 161 | CyC-17a | CyD-1a |
| 162 | CyC-17a | CyD-2a |
| 163 | CyC-17a | CyD-3a |
| 164 | CyC-17a | CyD-4a |
| 165 | CyC-17a | CyD-5a |
| 166 | CyC-17a | CyD-6a |
| 167 | CyC-17a | CyD-7a |
| 168 | CyC-17a | CyD-8a |
| 169 | CyC-17a | CyD-9a |
| 170 | CyC-17a | CyD-10a |
| 171 | CyC-18a | CyD-1a |
| 172 | CyC-18a | CyD-2a |
| 173 | CyC-18a | CyD-3a |
| 174 | CyC-18a | CyD-4a |
| 175 | CyC-18a | CyD-5a |
| 176 | CyC-18a | CyD-6a |
| 177 | CyC-18a | CyD-7a |
| 178 | CyC-18a | CyD-8a |
| 179 | CyC-18a | CyD-9a |
| 180 | CyC-18a | CyD-10a |
| 181 | CyC-19a | CyD-1a |
| 182 | CyC-19a | CyD-2a |
| 183 | CyC-19a | CyD-3a |
| 184 | CyC-19a | CyD-4a |
| 185 | CyC-19a | CyD-5a |
| 186 | CyC-19a | CyD-6a |
| 187 | CyC-19a | CyD-7a |
| 188 | CyC-19a | CyD-8a |
| 189 | CyC-19a | CyD-9a |
| 190 | CyC-19a | CyD-10a |

As described above, it is essential to the invention that CyD and/or CyC or the preferred embodiments described above have two adjacent carbon atoms, each of which are substituted by radicals R, where the respective radicals R, together with the C atoms, form a ring of the above-mentioned formula (3) or (4).

In a preferred embodiment of the invention, the ligand L contains precisely one group of the formula (3) or (4). CyD particularly preferably has two adjacent carbon atoms, each of which are substituted by radicals R, where the respective radicals R, together with the C atoms, form a ring of the above-mentioned formula (3) or (4). In general, the group of the formula (3) or (4) can be bonded to CyC or CyD in any possible position.

The preferred positions for adjacent groups X which stand for CR, where the respective radicals R, together with the C atoms to which they are bonded, form a ring of the above-mentioned formula (3) or (4), are in each case depicted in the following groups (CyC-1-1) to (CyC-19-1) and (CyD-1-1) to (CyD-10-1), (CyC-1-1)

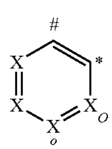

(CyC-1-2)

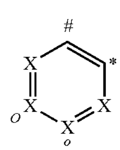

-continued (CyC-2-1)

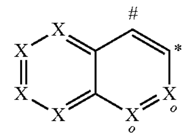

(CyC-2-2)

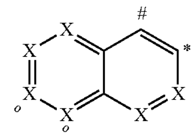

(CyC-2-3)

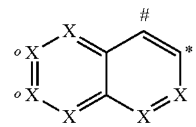

(CyC-3-1)

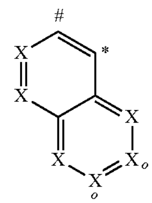

(CyC-3-2)

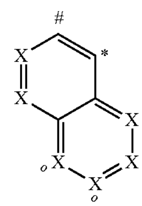

(CyC-4-1)

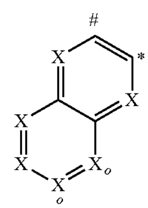

{CyC-4-2)

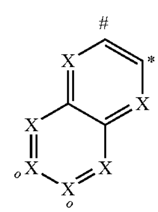

(CyC-4-3)

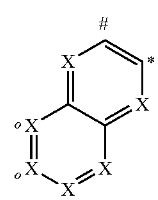

(CyC-5-1)

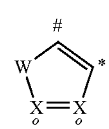

-continued
(CyC-7-1)
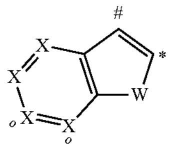
(CyC-7-2)
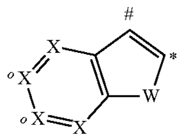
(CyC-7-3)
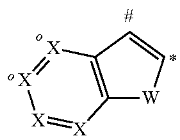
(CyC-8-1)
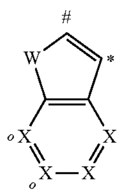
(CyC-8-2)
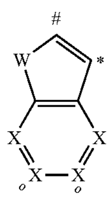
(CyC-8-3)
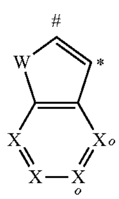
(CyC-9-1)
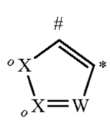
(CyC-14-1)
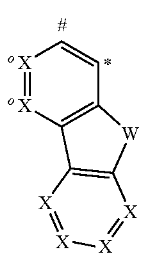
-continued
(CyC-15-1)
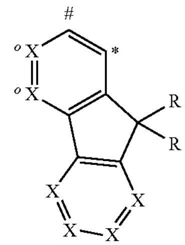
(CyC-16-1)
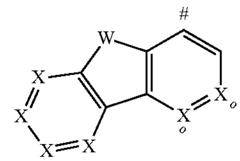
(CyC-17-1)
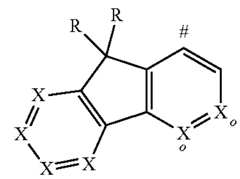
(CyC-18-1)
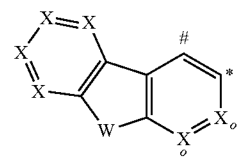
(CyC-19-1)
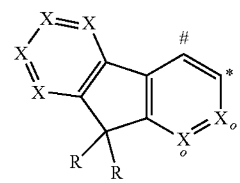
(CyD-1-1)
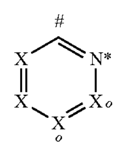
(CyD-1-2)
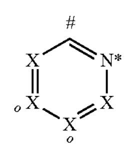
(CyD-2-1)
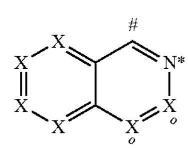
(CyD-2-2)
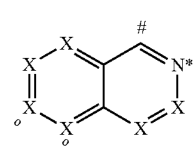

-continued
(CyD-2-3)
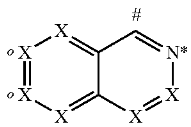
(CyD-3-1)
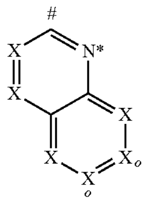
(CyD-3-2)
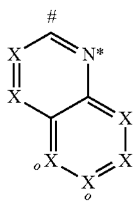
(CyD-4-1)
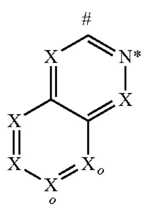
(CyD-4-2)
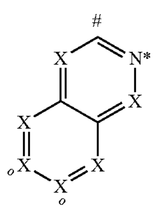
(CyD-4-3)
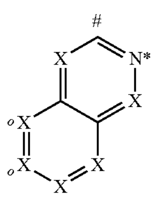
(CyD-5-1)
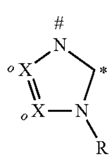
(CyD-6-1)
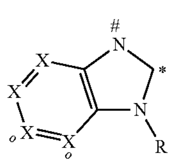
-continued
(CyD-6-2)
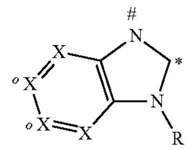
(CyD-6-3)
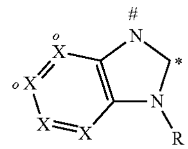
(CyD-7-1)
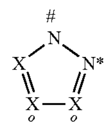
(CyC-7-2)
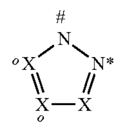
(CyD-8-1)
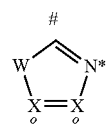
(CyD-9-1)
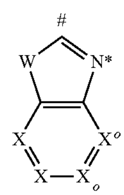
(CyD-9-2)
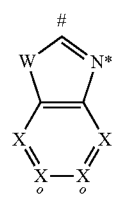
(CyD-9-3)
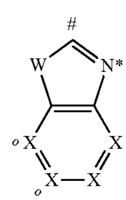
(CyD-10-1)
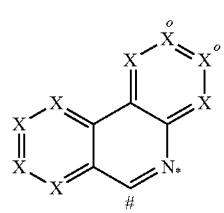

-continued (CyD-10-2)

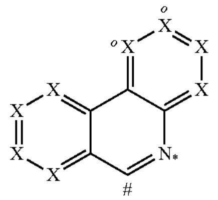

(CyD-10-3)

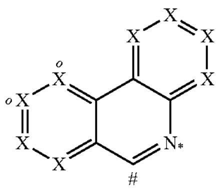

(CyD-10-4)

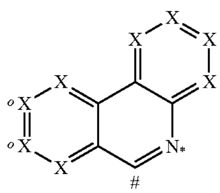

where the symbols and indices used have the meanings given above and ° in each case denotes the positions which stand for CR, where the respective radicals R, together with the C atoms to which they are bonded, form a ring of the above-mentioned formula (3) or (4).

In the two tables shown above, the groups (CyC-1-1) to (CyC-19-1) or (CyD-1-1) to (CyD-10-4) are likewise preferred instead of the groups (CyC-1) to (CyC-19) or (CyD-1) to (CyD-19) shown in the tables.

Preferred embodiments of the groups of the formulae (3) and (4) are described below.

It is essential in the case of the groups of the formulae (3) and (4) that they contain no acidic benzylic protons. Benzylic protons are taken to mean protons which are bonded to a carbon atom which is bonded directly to the heteroaromatic ligand. The absence of acidic benzylic protons is achieved in formula (3) through $A^1$ and $A^3$, if they stand for $C(R^3)_2$, being defined in such a way that $R^3$ is not equal to hydrogen. The absence of acidic benzylic protons is automatically achieved in formula (4) in that it is a bicyclic structure. Owing to the rigid spatial arrangement, R', if it stands for H, is significantly less acidic than benzylic protons, since the corresponding anion of the bicyclic structure is not mesomerism-stabilised. Even if $R^1$ in formula (4) stands for H, this is a non-acidic proton in the sense of the present application.

In a preferred embodiment of the structure of the formula (3), a maximum of one of the groups $A^1$, $A^2$ and $A^3$ stands for a heteroatom, in particular for O or $NR^3$, and the other two groups stand for $C(R^3)_2$ or $C(R^1)_2$ or $A^1$ and $A^3$ stand, identically or differently on each occurrence, for O or $NR^3$ and $A^2$ stands for $C(R^1)_2$. In a particularly preferred embodiment of the invention, $A^1$ and $A^3$ stand, identically or differently on each occurrence, for $C(R^3)_2$ and $A^2$ stands for $C(R^1)_2$ and particularly preferably for $C(R^3)_2$. Preferred embodiments of the formula (3) are thus the structures of the formulae (3-A), (3-B), (3-C) and (3-D), and a particularly preferred embodiment of the formula (3-A) is the structure of the formula (3-E), formula (3-A)

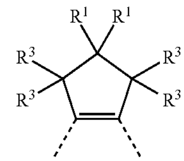

formula (3-B)

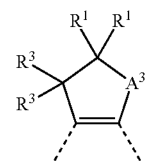

formula (3-C)

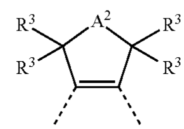

formula (3-D)

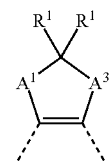

formula (3-E)

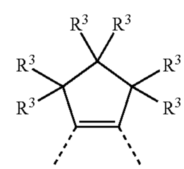

where $R^1$ and $R^3$ have the above-mentioned meanings and $A^1$, $A^2$ and $A^3$ stand, identically or differently on each occurrence, for O or $NR^3$.

In a preferred embodiment of the structure of the formula (4), the radicals $R^1$ which are bonded to the bridgehead stand for H, D, F or $CH_3$. Furthermore, $A^2$ preferably stands for $C(R^1)_2$ or O, and particularly preferably for $C(R^3)_2$. Preferred embodiments of the formula (4) are thus structures of the formulae (4-A) and (4-B), and a particularly preferred embodiment of the formula (4-A) is a structure of the formula (4-C), formula (4-A)

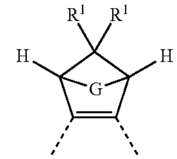

formula (4-B)

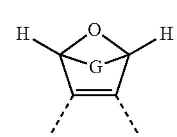

-continued formula (4-C)

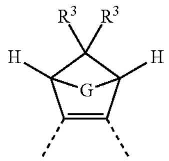

where the symbols used have the above-mentioned meanings.

Furthermore preferably, the group G in the formulae (4), (4-A), (4-B) and (4-C) stands for an ethylene group, which may be substituted by one or more radicals $R^2$, where $R^2$ preferably stands, identically or differently on each occurrence, for H or an alkyl group having 1 to 4 C atoms, i.e. a —$C(R^2)_2$—$C(R^2)_2$— group, or an ortho-arylene group having 6 to 10 C atoms, which may be substituted by one or more radicals $R^2$, but is preferably unsubstituted, in particular an ortho-phenylene group, which may be substituted by one or more radicals $R^2$, but is preferably unsubstituted.

In a further preferred embodiment of the invention, $R^3$ in the groups of the formulae (3) and (4) and in the preferred embodiments stands, identically or differently on each occurrence, for F, a straight-chain alkyl group having 1 to 10 C atoms or a branched or cyclic alkyl group having 3 to 20 C atoms, where in each case one or more non-adjacent $CH_2$ groups may be replaced by $R^2C{=}CR^2$ and one or more H atoms may be replaced by D or F, or an aromatic or heteroaromatic ring system having 5 to 14 aromatic ring atoms, which may in each case be substituted by one or more radicals $R^2$; two radicals $R^3$ here which are bonded to the same carbon atom may form an aliphatic or aromatic ring system with one another and thus form a spiro system; furthermore, $R^3$ may form an aliphatic ring system with an adjacent radical R or $R^1$.

In a particularly preferred embodiment of the invention, $R^3$ in the groups of the formulae (3) and (4) and in the preferred embodiments stands, identically or differently on each occurrence, for F, a straight-chain alkyl group having 1 to 3 C atoms, in particular methyl, or an aromatic or heteroaromatic ring system having 5 to 12 aromatic ring atoms, which may in each case be substituted by one or more radicals $R^2$, but is preferably unsubstituted; two radicals $R^3$ here which are bonded to the same carbon atom may form an aliphatic or aromatic ring system with one another and thus form a Spiro system; furthermore, $R^3$ may form an aliphatic ring system with an adjacent radical R or $R^1$.

Examples of particularly suitable groups of the formula (3) are the groups (3-1) to (3-69) shown below:

(3-1)

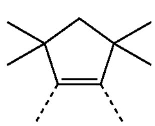

(3-2)

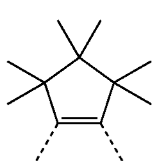

-continued (3-3)

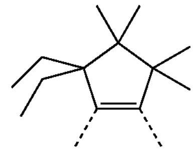

(3-4)

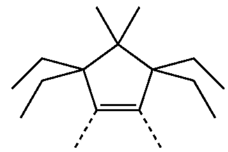

(3-5)

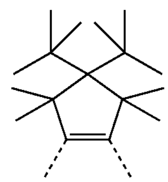

(3-6)

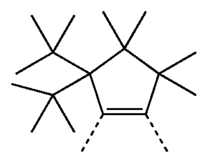

(3-7)

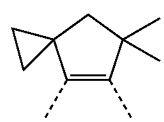

(3-8)

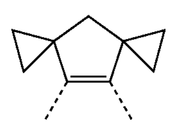

(3-9)

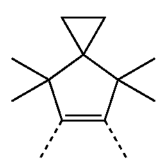

(3-10)

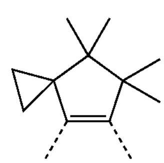

(3-11)

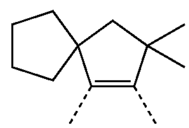

(3-12)

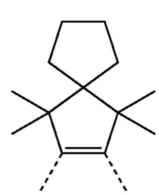

-continued
(3-13)
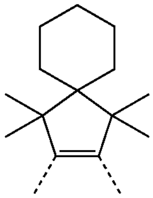
(3-14)
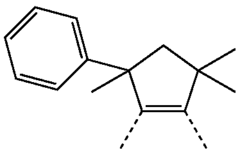
(3-15)
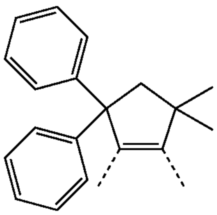
(3-16)
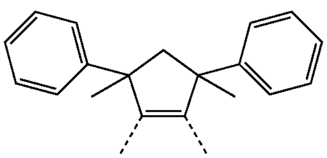
(3-17)
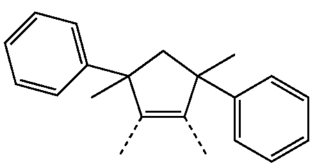
(3-18)
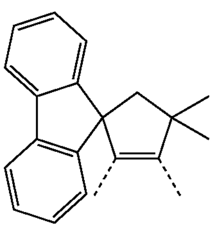
(3-19)
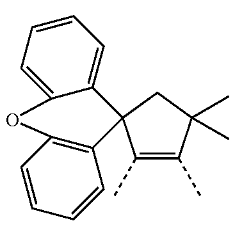
(3-20)
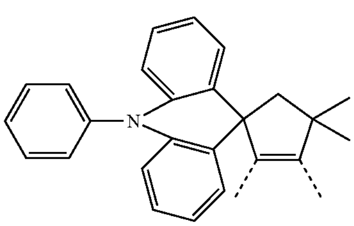
-continued
(3-21)
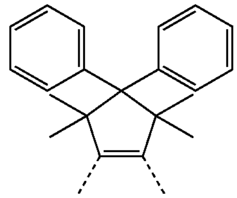
(3-22)
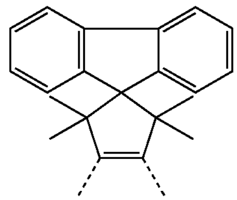
(3-23)
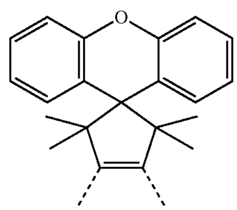
(3-24)
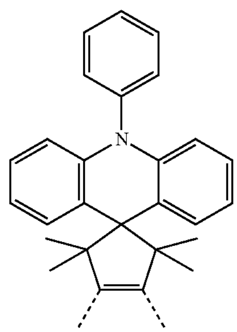
(3-25)
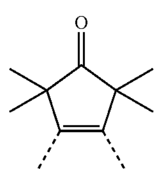
(3-26)
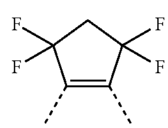
(3-27)
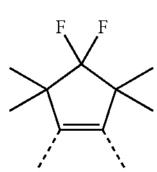
(3-28)
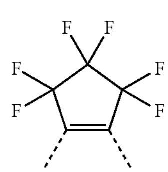

-continued
(3-29)
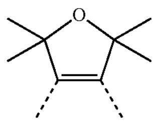
(3-30)
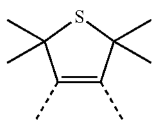
(3-31)
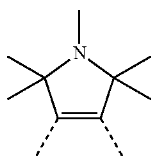
(3-32)
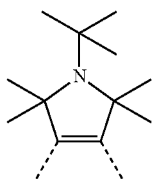
(3-33)
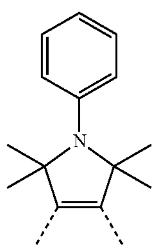
(3-34)
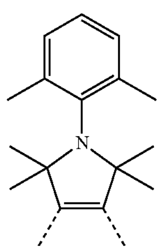
(3-35)
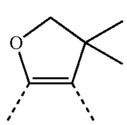
(3-36)
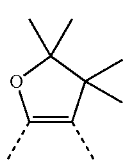
(3-37)
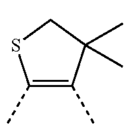
-continued
(3-38)
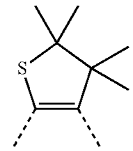
(3-39)
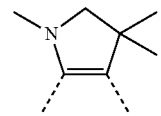
(3-40)
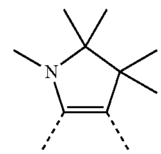
(3-41)
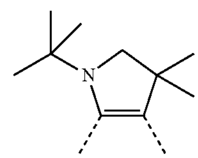
(3-42)
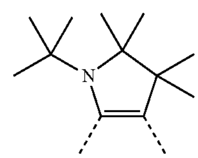
(3-43)
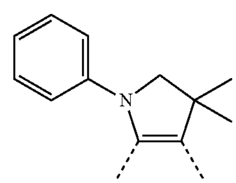
(3-44)
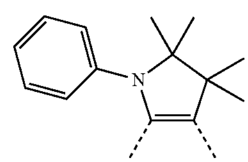
(3-45)
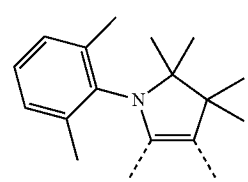
(3-46)
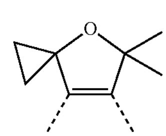
(3-47)
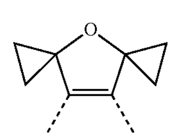

-continued
(3-48)
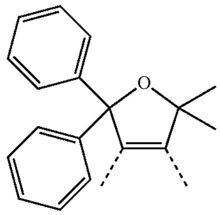
(3-49)
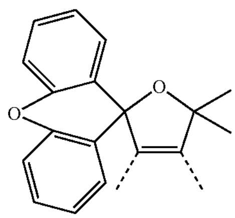
(3-50)
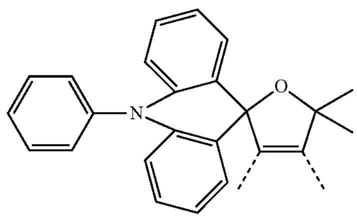
(3-51)
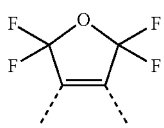
(3-52)
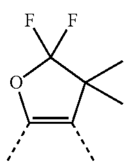
(3-53)
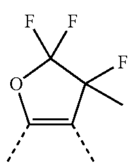
(3-54)
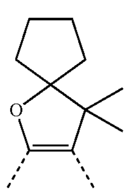
(3-55)
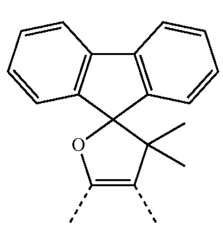
-continued
(3-56)
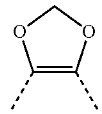
(3-57)
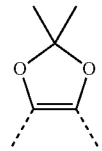
(3-58)
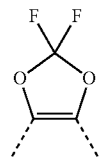
(3-59)
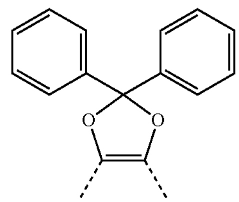
(3-60)
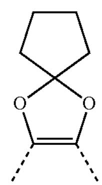
(3-61)
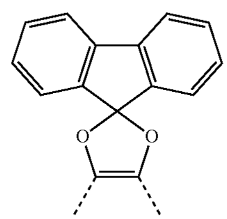
(3-62)
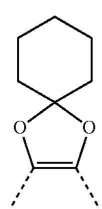
(3-63)
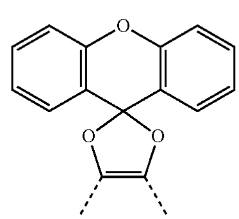
(3-64)
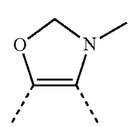

-continued
(3-65)
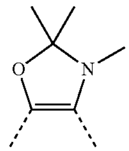
(3-66)
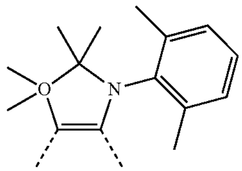
(3-67)
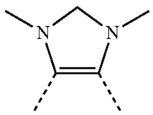
(3-68)
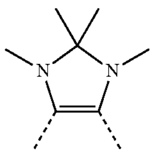
(3-69)
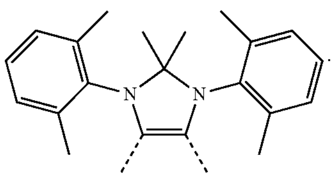
Examples of particularly suitable groups of the formula (4) are groups (4-1) to (4-21) shown below:
(4-1)
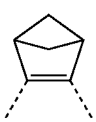
(4-2)
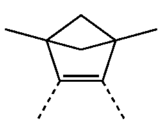
(4-3)
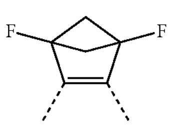
(4-4)
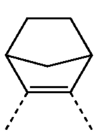
(4-5)
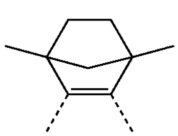
-continued
(4-6)
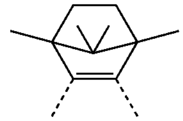
(4-7)
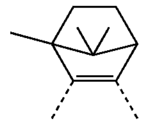
(4-8)
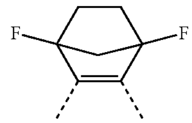
(4-9)
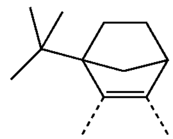
(4-10)
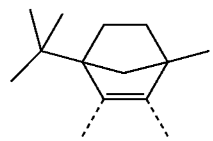
(4-11)
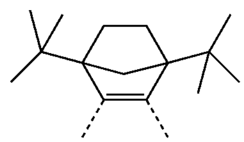
(4-12)
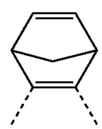
(4-13)
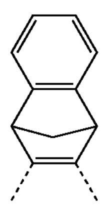
(4-14)
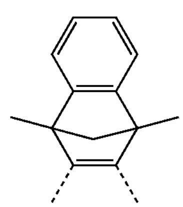
(4-15)
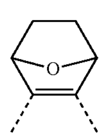

-continued (4-16)
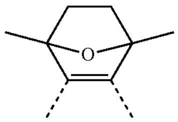

(4-17)
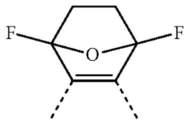

(4-18)
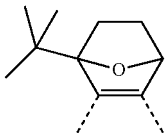

(4-19)
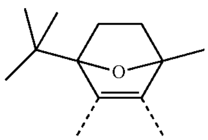

(4-20)
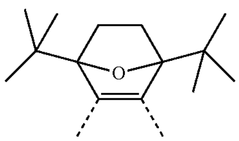

(4-21)
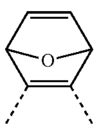

(4-22)
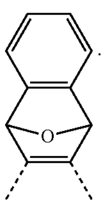

If radicals R are bonded in the moiety of the formula (2), (3) or (4), these radicals R are preferably selected on each occurrence, identically or differently, from the group consisting of H, D, F, Br, I, $N(R^1)_2$, CN, $Si(R^1)_3$, $B(OR^1)_2$, $C(=O)R^1$, a straight-chain alkyl group having 1 to 10 C atoms or an alkenyl group having 2 to 10 C atoms or a branched or cyclic alkyl group having 3 to 10 C atoms, each of which may be substituted by one or more radicals $R^1$, where one or more H atoms may be replaced by D or F, or an aromatic or heteroaromatic ring system having 5 to 30 aromatic ring atoms, which may in each case be substituted by one or more radicals $R^1$; two adjacent radical R or R with $R^1$ here may also form a mono- or polycyclic, aliphatic or aromatic ring system with one another. These radicals R are particularly preferably selected on each occurrence, identically or differently, from the group consisting of H, D, F, $N(R^1)_2$, a straight-chain alkyl group having 1 to 6 C atoms or a branched or cyclic alkyl group having 3 to 10 C atoms, where one or more H atoms may be replaced by D or F, or an aromatic or heteroaromatic ring system having 5 to 24 aromatic ring atoms, which may in each case be substituted by one or more radicals $R^1$; two adjacent radicals R or R with $R^1$ here may also form a mono- or polycyclic, aliphatic or aromatic ring system with one another.

It is furthermore possible for the substituent R which is bonded in the ortho-position to the metal coordination to represent a coordinating group which is likewise coordinated or bonded to the metal M. Preferred coordinating groups R are aryl or heteroaryl groups, for example phenyl or pyridyl, aryl or alkyl cyanides, aryl or alkyl isocyanides, amines or amides, alcohols or alcoholates, thioalcohols or thioalcoholates, phosphines, phosphites, carbonyl functions, carboxylates, carbamides or aryl- or alkylacetylides. Examples of moieties ML of the formula (2) in which CyD stands for pyridine and CyC stands for benzene are the structures of the following formulae (5) to (16):

formula (5)
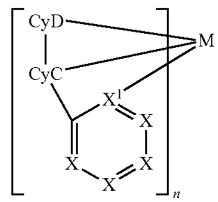

formula (6)
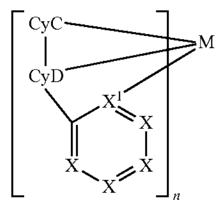

formula (7)
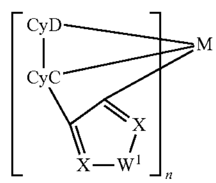

formula (8)
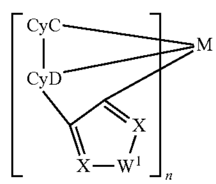

formula (9)
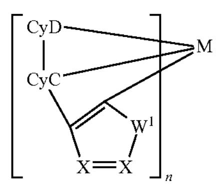

formula (10)
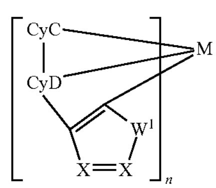

-continued formula (11)

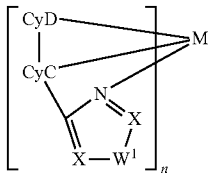

formula (12)

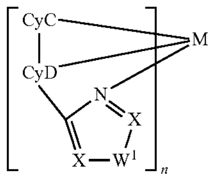

formula (13)

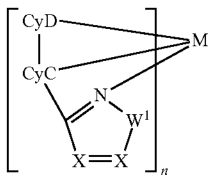

formula (14)

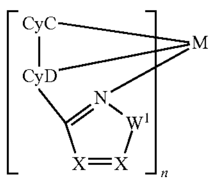

formula (15)

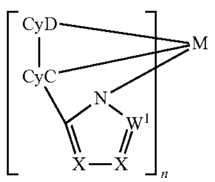

formula (16)

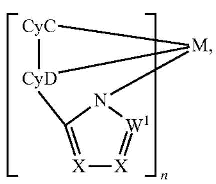

where the symbols and indices have the same meanings as described above, $X^1$ stands, identically or differently on each occurrence, for C or N and $W^1$ stands, identically or differently on each occurrence, for S, O or $NR^1$.

Formulae (5) to (16) show, merely by way of example, how the substituent R can additionally coordinate to the metal. Other groups R which coordinate to the metal, for example also carbenes, are also accessible entirely analogously without further inventive step.

As described above, a bridging unit which links this ligand L to one or more further ligands L or L' may also be present instead of one of the radicals R. In a preferred embodiment of the invention, a bridging unit is present instead of one of the radicals R, in particular instead of the radicals R which are in the ortho- or meta-position to the coordinating atom, so that the ligands have a tridentate or polydentate or polypodal character. It is also possible for two such bridging units to be present. This results in the formation of macrocyclic ligands or in the formation of cryptates.

Preferred structures containing polydentate ligands are the metal complexes of the following formulae (17) to (22), formula (17)

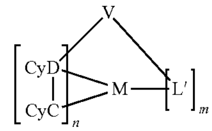

formula (18)

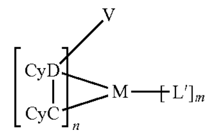

formula (19)

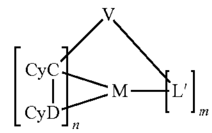

formula (20)

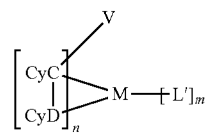

formula (21)

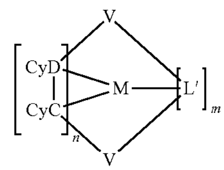

formula (22)

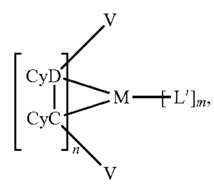

where the symbols and indices used have the above-mentioned meanings.

The ligands can likewise be bridged to one another via the cyclic group of the formula (3) or (4). This is depicted diagrammatically for a ligand of the phenylpyridine type:

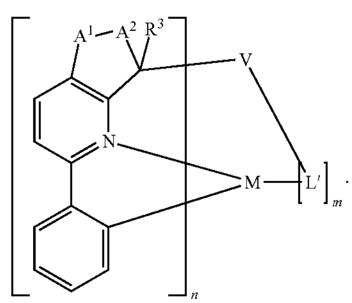

In the structures of the formulae (17) to (22), V preferably represents a single bond or a bridging unit containing 1 to 80 atoms from the third, fourth, fifth and/or sixth main group (IUPAC group 13, 14, 15 or 16) or a 3- to 6-membered homo- or heterocycle which covalently bonds the part-ligands L to one another or covalently bonds L to L'. The bridging unit V here may also have an asymmetrical structure, i.e. the linking of V to L and L' need not be identical.

The bridging unit V can be neutral, singly, doubly or triply negatively charged or singly, doubly or triply positively charged. V is preferably neutral or singly negatively charged or singly positively charged, particularly preferably neutral. The charge of V is preferably selected so that overall a neutral complex forms. The preferences mentioned above for the moiety $ML_n$ apply to the ligands, and n is preferably at least 2.

The precise structure and chemical composition of the group V does not have a significant effect on the electronic properties of the complex since the job of this group is essentially to increase the chemical and thermal stability of the complexes by bridging L to one another or to L'.

If V is a trivalent group, i.e. bridges three ligands L to one another or two ligands L to L' or one ligand L to two ligands L', V is preferably selected, identically or differently on each occurrence, from the group consisting of B, $B(R^1)_-$, $B(C(R^1)_2)_3$, $(R^1)B(C(R^1)_2)_3^-$, $B(O)_3$, $(R^1)B(O)_3^-$, $B(C(R^1)_2C(R^1)_2)_3$, $(R^1)B(C(R^1)_2C(R)_2)_3^-$, $B(C(R^1)_2O)_3$, $(R^1)B(C(R^1)_2)_3^-$, $B(OC(R^1)_2)_3$, $(R^1)B(OC(R^1)_2)_3^-$, $C(R^1)$, $CO^-$, $CN(R^1)_2$, $(R^1)C(C(R^1)_2)_3$, $(R^1)C(O)_3$, $(R^1)C(C(R^1)_2C(R^1)_2)_3$, $(R^1)C(C(R^1)_2O)_3$, $(R^1)C(OC(R^1)_2)_3$, $(R^1)C(Si(R^1)_2)_3$, $(R^1)C(Si(R^1)_2C(R^1)_2)_3$, $(R^1)C(C(R^1)_2Si(R^1)_2)_3$, $(R^1)C(Si(R^1)_2Si(R^1)_2)_3$, $Si(R^1)$, $(R^1)Si(C(R^1)_2)_3$, $(R^1)Si(O)_3$, $(R^1)Si(C(R^1)_2C(R^1)_2)_3$, $(R^1)Si(OC(R^1)_2)_3$, $(R^1)Si(C(R^1)_2O)_3$, $(R^1)Si(Si(R^1)_2)_3$, $(R^1)Si(Si(R^1)_2C(R^1)_2)_3$, $(R^1)Si(C(R^1)_2Si(R^1)_2)_3$, $(R^1)Si(Si(R^1)_2Si(R^1)_2)_3$, N, NO, $N(R^1)_+$, $N(C(R^1)_2)_3$, $(R^1)N(C(R^1)_2)_3^+$, $N(C{=}O)_3$, $N(C(R^1)_2C(R^1)_2)_3$, $(R^1)N(C(R^1)_2C(R^1)_2)_+$, P, $P(R^1)_+$, PO, PS, $P(O)_3$, $PO(O)_3$, $P(OC(R^1)_2)_3$, $PO(OC(R^1)_2)_3$, $P(C(R^1)_2)_3$, $P(R^1)(C(R^1)_2)_3^+$, $PO(C(R^1)_2)_3$, $P(C(R^1)_2C(R^1)_2)_3$, $P(R^1)(C(R^1)_2C(R^1)_2)_3^+$, $PO(C(R^1)_2C(R^1)_2)_3$, $S^+$, $S(C(R^1)_2)_3^+$, $S(C(R^1)_2C(R^1)_2)_3^+$, or a unit of the formulae (23) to (27), formula (23)

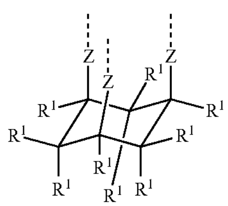

formula (24)

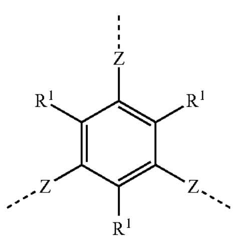

formula (25)

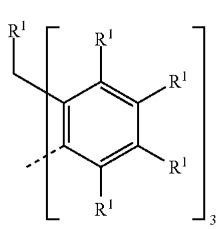

formula (26)

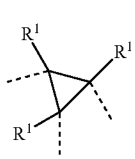

-continued formula (27)

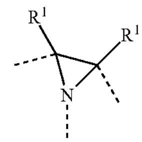

where the dashed bonds in each case indicate the bond to the part-ligands L or L', and Z is selected, identically or differently on each occurrence, from the group consisting of a single bond, O, S, S(=O), $S(=O)_2$, $NR^1$, $PR^1$, $P(=O)R^1$, $C(R^1)_2$, C(=O), $C(=NR^1)$, $C(=C(R^1)_2)$, $Si(R^1)_2$ or $BR^1$. The other symbols used have the meanings given above.

If V stands for a group $CR_2$, the two radicals R may also be linked to one another, and consequently structures such as, for example, 9,9-fluorene, are also suitable groups V.

If V is a divalent group, i.e. bridges two ligands L to one another or one ligand L to L', V is preferably selected, identically or differently on each occurrence, from the group consisting of aus $BR^1$, $B(R^1)_2^-$, $C(R^1)_2$, C(=O), $Si(R^1)_2$, $NR^1$, $PR^1$, $P(R^1)_2^+$, $P(=O)(R^1)$, $P(=S)(R^1)$, O, S, Se, or a unit of the formulae (28) to (37), formula (28)

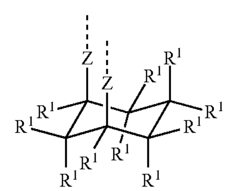

formula (29)

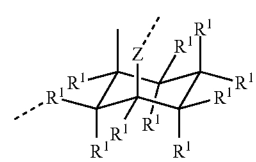

formula (30)

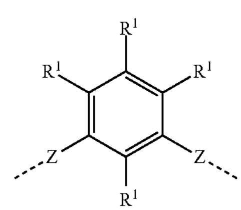

formula (31)

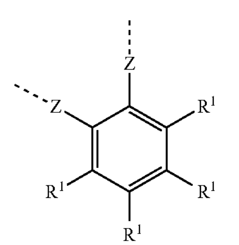

-continued formula (32)

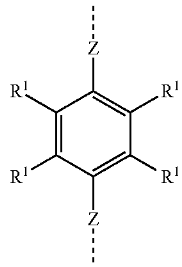

formula (33)

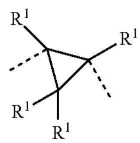

formula (34)

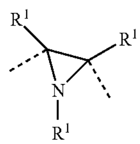

formula (35)

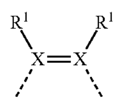

formula (36)

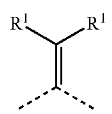

formula (37)

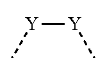

where the dashed bonds in each case indicate the bond to the part-ligands L or L', Y stands on each occurrence, identically or differently, for $C(R^1)_2$, $N(R^1)$, O or S, and the other symbols used each have the meanings indicated above.

Preferred ligands L' as occur in formula (1) are described below. The ligand groups L' can also be selected correspondingly if they are bonded to L via a bridging unit V, as indicated in formulae (17), (19) and (21).

The ligands L' are preferably neutral, monoanionic, dianionic or trianionic ligands, particularly preferably neutral or monoanionic ligands. They can be monodentate, bidentate, tridentate or tetradentate and are preferably bidentate, i.e. preferably have two coordination sites. As described above, the ligands L' can also be bonded to L via a bridging group V.

Preferred neutral, monodentate ligands L' are selected from the group consisting of carbon monoxide, nitrogen monoxide, alkyl cyanides, such as, for example, acetonitrile, aryl cyanides, such as, for example, benzonitrile, alkyl isocyanides, such as, for example, methyl isonitrile, aryl isocyanides, such as, for example, benzoisonitrile, amines, such as, for example, trimethylamine, triethylamine, morpholine, phosphines, in particular halophosphines, trialkylphosphines, triarylphosphines or alkylarylphosphines, such as, for example, trifluorophosphine, trimethylphosphine, tricyclohexylphosphine, tri-certbutylphosphine, triphenylphosphine, tris(pentafluorophenyl)phosphine, dimethyiphenylphosphine, methyldiphenylphosphine, bis(tert-butyl)phenylphosphine, phosphites, such as, for example, trimethyl phosphite, triethyl phosphite, arsines, such as, for example, trifluoroarsine, trimethylarsine, tricyclohexylarsine, tri-tert-butylarsine, triphenylarsine, tris(pentafluorophenyl)arsine, stibines, such as, for example, trifluorostibine, trimethylstibine, tricyclohexyistibine, tri-tert-butylstibine, triphenylstibine, tris(pentafluorophenyl) stibine, nitrogen-containing heterocycles, such as, for example, pyridine, pyridazine, pyrazine, pyrimidine, triazine, and carbenes, in particular Arduengo carbenes.

Preferred monoanionic, monodentate ligands L' are selected from hydride, deuteride, the halides $F^-$, $Cl^-$, $Br^-$ and $I^-$, alkylacetylides, such as, for example, methyl-$C\equiv C^-$, tert-butyl-$C\equiv C^-$, arylacetylides, such as, for example, phenyl-$C\equiv C^-$, cyanide, cyanate, isocyanate, thiocyanate, isothiocyanate, aliphatic or aromatic alcoholates, such as, for example, methanolate, ethanolate, propanolate, isopropanolate, tert-butylate, phenolate, aliphatic or aromatic thioalcoholates, such as, for example, methanethiolate, ethanethiolate, propanethiolate, isopropanethiolate, tert-thiobutylate, thiophenolate, amides, such as, for example, dimethylamide, diethylamide, diisopropylamide, morpholide, carboxylates, such as, for example, acetate, trifluoroacetate, propionate, benzoate, aryl groups, such as, for example, phenyl, naphthyl, and anionic, nitrogen-containing heterocycles, such as pyrrolide, imidazolide, pyrazolide. The alkyl groups in these groups are preferably $C_1$-$C_{20}$-alkyl groups, particularly preferably $C_1$-$C_{10}$-alkyl groups, very particularly preferably $C_1$-$C_4$-alkyl groups. An aryl group is also taken to mean heteroaryl groups. These groups are as defined above.

Preferred di- or trianionic ligands are $O^{2-}$, $S^{2-}$, carbides, which result in coordination in the form R—C≡M, and nitrenes, which result in coordination in the form R—N=M, where R generally stands for a substituent, or N.

Preferred neutral or mono- or dianionic, bidentate or polydentate ligands L' are selected from diamines, such as, for example, ethylenediamine, N,N,N',N'-tetramethylethylenediamine, propylenediamine, N, N,N',N'-tetramethylpropylenediamine, cis- or trans-diaminocyclohexane, cis- or trans-N, N,N',N'-tetramethyldiaminocyclohexane, imines, such as, for example, 2-[1-(phenylimino)ethyl]pyridine, 2-[1-(2-methylphenylimino)ethyl]pyridine, 2-[1-(2,6-diisopropylphenylimino)ethyl]pyridine, 2-[1-(methylimino) ethyl]-pyridine, 2-[1-(ethylimino)ethyl]pyridine, 2-[1-(isopropylimino)ethyl]pyridine, 2-[1-(tert-butylimino)ethyl] pyridine, diimines, such as, for example, 1,2-bis (methylimino)ethane, 1,2-bis(ethylimino)ethane, 1,2-bis (isopropylimino)ethane, 1,2-bis(tert-butylimino)ethane, 2,3-bis(methylimino)butane, 2,3-bis(ethylimino)butane, 2,3-bis (isopropylimino)butane, 2,3-bis(tert-butylimino)butane, 1,2-bis(phenylimino)ethane, 1,2-bis(2-methylphenylimino) ethane, 1,2-bis(2,6-diisopropylphenylimino)ethane, 1,2-bis (2,6-di-tert-butylphenylimino)ethane, 2,3-bis(phenylimino) butane, 2,3-bis(2-methylphenylimino)butane, 2,3-bis(2,6-diisopropylphenylimino)butane, 2,3-bis(2,6-di-tert-butylphenylimino)butane, heterocycles containing two nitrogen atoms, such as, for example, 2,2'-bipyridine, o-phenanthroline, diphosphines, such as, for example, bis (diphenylphosphino)methane, bis(diphenylphosphino)ethane, bis(diphenylphosphino)propane, bis(diphenylphosphino)butane, bis(dimethylphosphino)methane, bis (dimethylphosphino)ethane, bis(dimethylphosphino) propane, bis(diethylphosphino)methane, bis (diethylphosphino)ethane, bis(diethylphosphino)propane, bis(di-tert-butylphosphino)methane, bis(di-tert-butylphosphino)ethane, bis(tert-butylphosphino)propane, 1,3-diketonates derived from 1,3-diketones, such as, for example, acetylacetone, benzoylacetone, 1,5-diphenylacetylacetone, dibenzoylmethane, bis(1,1,1-trifluoroacetyl)methane, 3-ketonates derived from 3-ketoesters, such as, for example, ethyl acetoacetate, carboxylates derived from aminocarboxylic acids, such as, for example, pyridine-2-carboxylic acid, quinoline-2-carboxylic acid, glycine, N,N-dimethylglycine, alanine, N,N-dimethylaminoalanine, salicyliminates derived from salicylimines, such as, for example, methylsalicylimine, ethylsalicylimine, phenylsalicylimine, dialcoholates derived from dialcohols, such as, for example, ethylene glycol, 1,3-propylene glycol, and dithiolates derived from dithiols, such as, for example, 1,2-ethylenedithiol, 1,3-propylenedithiol, bis(pyrazolyl) borates, bis(imidazolyl) borates, 3-(2-pyridyl)diazoles or 3-(2-pyridyl)triazoles.

Preferred tridentate ligands are borates of nitrogen-containing heterocycles, such as, for example, tetrakis(1-imidazolyl) borate and tetrakis(1-pyrazolyl) borate.

Preference is furthermore given to bidentate monoanionic, neutral or dianionic ligands L', in particular monoanionic ligands, which, with the metal, form a cyclometallated five- or six-membered ring with at least one metal-carbon bond, in particular a cyclometallated five-membered ring. These are, in particular, ligands as are generally used in the area of phosphorescent metal complexes for organic electroluminescent devices, i.e. ligands of the type phenylpyridine, naphthylpyridine, phenylquinoline, phenylisoquinoline, etc., each of which may be substituted by one or more radicals R. A multiplicity of ligands of this type is known to the person skilled in the art in the area of phosphorescent electroluminescent devices, and he will be able, without inventive step, to select further ligands of this type as ligand L' for compounds of the formula (1). The combination of two groups as depicted by the following formulae (38) to (62) is generally particularly suitable for this purpose, where one group is preferably bonded via a neutral nitrogen atom or a carbene carbon atom and the other group is preferably bonded via a negatively charged carbon atom or a negatively charged nitrogen atom. The ligand L' can then be formed from the groups of the formulae (38) to (62) through these groups bonding to one another in each case at the position denoted by #. The position at which the groups coordinate to the metal is denoted by *. These groups may also be bonded to the ligand L via one or two bridging units V.

formula (38)

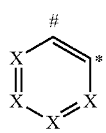

formula (39)

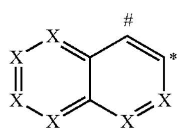

formula (40)

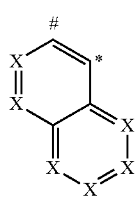

-continued formula (41)

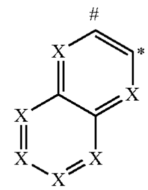

formula (42)

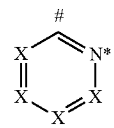

formula (43)

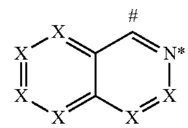

formula (44)

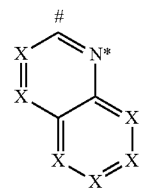

formula (45)

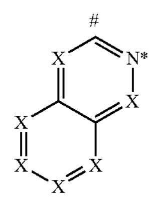

formula (46)

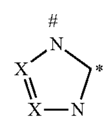

formula (47)

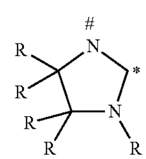

formula (48)

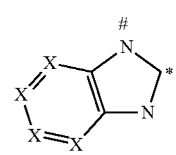

formula (49)

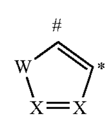

formula (50)

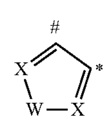

-continued formula (51)

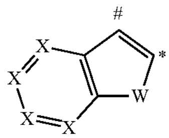

formula (52)

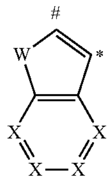

formula (53)

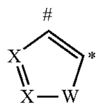

formula (54)

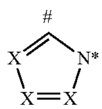

formula (55)

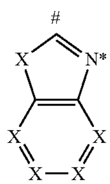

formula (56)

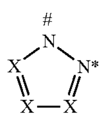

formula (57)

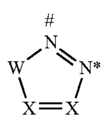

formula (58)

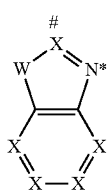

formula (59)

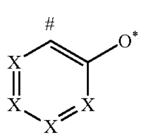

formula (60)

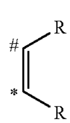

formula (61)

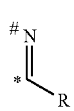

-continued formula (62)

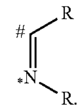

Where has the meaning given above and X stands on each occurrence, identically or differently, for CR or N, where the above-mentioned limitation, that at least two adjacent groups X stand for CR and the radicals R form a ring of the formula (3) or (4), does not apply here; and R has the same meaning as described above. Preferably, a maximum of three symbols X in each group stand for N, particularly preferably a maximum of two symbols X in each group stand for N, very particularly preferably a maximum of one symbol X in each group stands for N. Especially preferably, all symbols X stand for CR.

Likewise preferred ligands L' are $\eta^5$-cyclopentadienyl, $\eta^5$-pentamethyl-cyclopentadienyl, $\eta^6$-benzene or $\eta^7$-cycloheptatrienyl, each of which may be substituted by one or more radicals R.

Likewise preferred ligands L' are 1,3,5-cis,cis-cyclohexane derivatives, in particular of the formula (63), 1,1,1-tri(methylene)methane derivatives, in particular of the formula (64), and 1,1,1-trisubstituted methanes, in particular of the formula (65) and (66), formula (63)

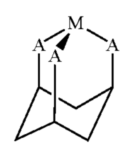

formula (64)

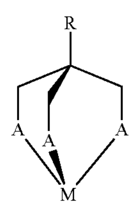

formula (65)

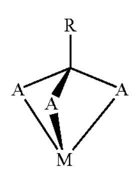

formula (66)

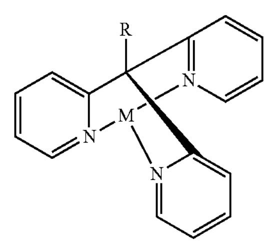

where the coordination to the metal M is shown in each of the formulae, R has the meaning given above, and A stands, identically or differently on each occurrence, for $O^-$, $COO^-$, $PR_2$ or $NR_2$.

Preferred radicals R in the structures shown above are selected on each occurrence, identically or differently, from the group consisting of H, D, F, Br, $N(R^1)_2$, CN, $B(OR^1)_2$, $C(=O)R^1$, $P(=O)(R^1)_2$, a straight-chain alkyl group having 1 to 10 C atoms or a straight-chain alkenyl or alkynyl group having 2 to 10 C atoms or a branched or cyclic alkyl group having 3 to 10 C atoms, each of which may be substituted by one or more radicals $R^1$, where one or more H atoms may be replaced by D or F, or an aromatic or heteroaromatic ring system having 5 to 14 aromatic ring atoms, which may in each case be substituted by one or more radicals $R^1$; two or more adjacent radicals R here may also form a mono- or polycyclic, aliphatic, aromatic and/or benzo-fused ring system with one another. Particularly preferred radicals R are selected on each occurrence, identically or differently, from the group consisting of H, D, F, Br, CN, $B(OR^1)_2$, a straight-chain alkyl group having 1 to 5 C atoms, in particular methyl, or a branched or cyclic alkyl group having 3 to 5 C atoms, in particular isopropyl or tert-butyl, where one or more H atoms may be replaced by D or F, or an aromatic or heteroaromatic ring system having 5 to 12 aromatic ring atoms, which may in each case be substituted by one or more radicals $R^1$; two or more radicals R here may also form a mono- or polycyclic, aliphatic, aromatic and/or benzo-fused ring system with one another.

The complexes according to the invention can be facial or pseudofacial or they can be meridional or pseudomeridional.

The ligands L may also be chiral, depending on the structure. This is the case, in particular, if they contain a bicyclic group of the formula (4) or if they contain substituents, for example alkyl, alkoxy, dialkylamino or aralkyl groups, which have one or more stereocentres. Since the basic structure of the complex may also be a chiral structure, the formation of diastereomers and a number of enantiomer pairs is possible. The complexes according to the invention then encompass both the mixtures of the various diastereomers or the corresponding racemates and also the individual isolated diastereomers or enantiomers.

The preferred embodiments indicated above can be combined with one another as desired. In a particularly preferred embodiment of the invention, the preferred embodiments indicated above apply simultaneously.

The metal complexes according to the invention can in principle be prepared by various processes. However, the processes described below have proven particularly suitable.

The present invention therefore furthermore relates to a process for the preparation of the metal complex compounds of the formula (1) by reaction of the corresponding free ligands L and optionally L' with metal alkoxides of the formula (67), with metal ketoketonates of the formula (68), with metal halides of the formula (69) or with dimeric metal complexes of the formula (70) or with metal complexes of the formula (71), formula (67)

$M(OR)_n$ formula (68)

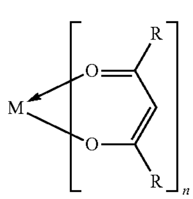

formula (69)

$MHal_n$

-continued formula (70)

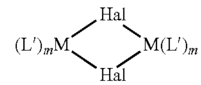

formula (71)

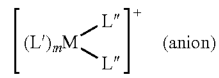

where the symbols M, m, n and R have the meanings indicated above, Hal=F, Cl, Br or 1, L" stands for an alcohol, in particular for an alcohol having 1 to 4 C atoms, or a nitrile, in particular acetonitrile or benzonitrile, and (anion) stands for a non-coordinating anion, such as, for example, triflate It is likewise possible to use metal compounds, in particular iridium compounds, which carry both alkoxide and/or halide and/or hydroxyl radicals as well as ketoketonate radicals. These compounds may also be charged. Corresponding iridium compounds which are particularly suitable as starting materials are disclosed in WO 2004/085449. $[IrCl_2(acac)_2]^-$, for example $Na[IrCl_2(acac)_2]$, are particularly suitable. Metal complexes with acetylacetonate derivatives as ligand, for example $Ir(acac)_3$ or tris(2,2,6,6-tetramethylheptane-3,5-dionato)iridium, and $IrCl_3 \cdot xH_2O$, where x usually stands for a number between 2 and 4.

Suitable platinum starting materials are, for example, $PtCl_2$, $K_2[PtCl_4]$, $PtCl_2(DMSO)_2$, $Pt(Me)_2$ $(DMSO)_2$ or $PtCl_2(benzonitrile)_2$.

The synthesis of the complexes is preferably carried out as described in WO 2002/060910, WO 2004/085449 and WO 2007/065523. Heteroleptic complexes can also be synthesised, for example, in accordance with WO 2005/042548. The synthesis here can also be activated, for example, thermally, photochemically and/or by microwave radiation. In a preferred embodiment of the invention, the reaction is carried out in the melt without the use of an additional solvent. "Melt" here means that the ligand is in molten form and the metal precursor is dissolved or suspended in this melt. In order to activate the reaction, it is furthermore also possible to add a Lewis acid, for example a silver salt or $AlCl_3$.

These processes, optionally followed by purification, such as, for example, recrystallisation or sublimation, enable the compounds of the formula (1) according to the invention to be obtained in high purity, preferably greater than 99% (determined by means of $^1H$-NMR and/or HPLC).

The compounds according to the invention can also be rendered soluble by suitable substitution, for example by relatively long alkyl groups (about 4 to 20 C atoms), in particular branched alkyl groups, or optionally substituted aryl groups, for example, xylyl, mesityl or branched terphenyl or quaterphenyl groups. Compounds of this type are then soluble in common organic solvents, such as, for example, toluene or xylene, at room temperature in sufficient concentration to be able to process the complexes from solution. These soluble compounds are particularly suitable for processing from solution, for example by printing processes.

The compounds according to the invention can also be mixed with a polymer. It is likewise possible to incorporate these compounds covalently into a polymer. This is possible, in particular, with compounds which are substituted by reactive leaving groups, such as bromine, iodine, chlorine, boronic acid or boronic acid ester, or by reactive, polymerisable groups, such as olefins or oxetanes. These can be used as monomers for the production of corresponding oligomers, dendrimers or polymers. The oligomerisation or polymerisation here preferably takes place via the halogen functionality or the boronic acid functionality or via the polymerisable group. It is furthermore possible to crosslink the polymers via groups of this type. The compounds and polymers according to the invention can be employed as crosslinked or uncrosslinked layer.

The invention therefore furthermore relates to oligomers, polymers or dendrimers containing one or more of the above-mentioned compounds according to the invention, where one or more bonds are present from the compound according to the invention to the polymer, oligomer or dendrimer. Depending on the linking of the compound according to the invention, this therefore forms a side chain of the oligomer or polymer or is linked in the main chain. The polymers, oligomers or dendrimers may be conjugated, partially conjugated or non-conjugated. The oligomers or polymers may be linear, branched or dendritic. The same preferences as described above apply to the recurring units of the compounds according to the invention in oligomers, dendrimers and polymers.

For the preparation of the oligomers or polymers, the monomers according to the invention are homopolymerised or copolymerised with further monomers. Preference is given to copolymers, where the units of the formula (1) or the preferred embodiments described above are present in amounts of 0.01 to 99.9 mol %, preferably 5 to 90 mol %, particularly preferably 20 to 80 mol %. Suitable and preferred comonomers which form the polymer backbone are selected from fluorenes (for example in accordance with EP 842208 or WO 2000/022026), spirobifluorenes (for example in accordance with EP 707020, EP 894107 or WO 2006/061181), paraphenylenes (for example in accordance with WO 92/18552), carbazoles (for example in accordance with WO 2004/070772 or WO 20041113468), thiophenes (for example in accordance with EP 1028136), dihydrophenanthrenes (for example in accordance with WO 2005/014689), cis- and trans-indenofluorenes (for example in accordance with WO 2004/041901 or WO 2004/113412), ketones (for example in accordance with WO 2005/040302), phenanthrenes (for example in accordance with WO 2005/104264 or WO 2007/017066) or also a plurality of these units. The polymers, oligomers and dendrimers may also contain further units, for example hole-transport units, in particular those based on triarylamines, and/or electron-transport units.

The present invention again furthermore relates to a formulation comprising a compound according to the invention or an oligomer, polymer or dendrimer according to the invention and at least one further compound. The further compound can be, for example, a solvent. However, the further compound can also be a further organic or inorganic compound which is likewise employed in the electronic device, for example a matrix material. This further compound may also be polymeric.

For processing from solution, solutions or formulations of the compounds of the formula (1) are necessary. It may be preferred here to use mixtures of two or more solvents. Suitable solvents are, for example, toluene, o-, m- or p-xylene, anisoles, methyl benzoate, dimethylanisoles, mesitylenes, tetralin, veratrol, chlorobenzene, phenoxytoluene, in particular 3-phenoxytoluene, dioxane, THF, methyl-THF, THP or mixtures of these solvents. The way in which such solutions can be prepared is known to the person skilled in the art and is described, for example, in WO 20021072714, WO 2003/019694 and the literature cited therein.

The complexes of the formula (1) described above or the preferred embodiments indicated above can be used as active component in the electronic device. An electronic device is taken to mean a device which comprises an anode, a cathode and at least one layer, where this layer comprises at least one organic or organometallic compound. The electronic device according to the invention thus comprises an anode, a cathode and at least one layer which comprises at least one compound of the formula (1) given above. Preferred electronic devices here are selected from the group consisting of organic electroluminescent devices (OLEDs, PLEDs), organic integrated circuits (O-ICs), organic field-effect transistors (O-FETs), organic thin-film transistors (O-TFTs), organic light-emitting transistors (O-LETS), organic solar cells (O-SCs), organic optical detectors, organic photoreceptors, organic field-quench devices (O-FQDs), light-emitting electrochemical cells (LECs) or organic laser diodes (O-lasers), comprising at least one compound of the formula (1) given above in at least one layer. Particular preference is given to organic electroluminescent devices. Active components are generally the organic or inorganic materials which have been introduced between the anode and cathode, for example charge-injection, charge-transport or charge-blocking materials, but in particular emission materials and matrix materials. The compounds according to the invention exhibit particularly good properties as emission material in organic electroluminescent devices. Organic electroluminescent devices are therefore a preferred embodiment of the invention. Furthermore, the compounds according to the invention can be employed for the generation of singlet oxygen or in photocatalysis.

The organic electroluminescent device comprises a cathode, an anode and at least one emitting layer. Apart from these layers, it may also comprise further layers, for example in each case one or more hole-injection layers, hole-transport layers, hole-blocking layers, electron-transport layers, electron-injection layers, exciton-blocking layers, electron-blocking layers, charge-generation layers and/or organic or inorganic p/n junctions. It is possible here for one or more hole-transport layers to be p-doped, for example with metal oxides, such as $MoO_3$ or $WO_3$, or with (per)fluorinated electron-deficient aromatic compounds, and/or for one or more electron-transport layers to be n-doped. Interlayers which have, for example, an exciton-blocking function and/or control the charge balance in the electroluminescent device may likewise be introduced between two emitting layers. However, it should be pointed out that each of these layers does not necessarily have to be present.

The organic electroluminescent device here may comprise one emitting layer or a plurality of emitting layers. If a plurality of emission layers are present, these preferably have in total a plurality of emission maxima between 380 nm and 750 nm, resulting overall in white emission, i.e. various emitting compounds which are able to fluoresce or phosphoresce are used in the emitting layers. Particular preference is given to three-layer systems, where the three layers exhibit blue, green and orange or red emission (for the basic structure see, for example, WO 2005/011013), or systems which have more than three emitting layers. It may also be a hybrid system, where one or more layers fluoresce and one or more other layers phosphoresce.

In a preferred embodiment of the invention, the organic electroluminescent device comprises the compound of the formula (1) or the preferred embodiments indicated above as emitting compound in one or more emitting layers.

If the compound of the formula (1) is employed as emitting compound in an emitting layer, it is preferably employed in combination with one or more matrix materials.

The mixture comprising the compound of the formula (1) and the matrix material comprises between 1 and 99% by vol., preferably between 2 and 90% by vol., particularly preferably between 3 and 40% by vol., especially between 5 and 15% by vol., of the compound of the formula (1), based on the mixture as a whole comprising emitter and matrix material. Correspondingly, the mixture comprises between 99.9 and 1% by vol., preferably between 99 and 10% by vol., particularly preferably between 97 and 60% by vol., in particular between 95 and 85% by vol., of the matrix material, based on the mixture as a whole comprising emitter and matrix material.

The matrix material employed can in general be all materials which are known for this purpose in accordance with the prior art. The triplet level of the matrix material is preferably higher than the triplet level of the emitter.

Suitable matrix materials for the compounds according to the invention are ketones, phosphine oxides, sulfoxides and sulfones, for example in accordance with WO 2004/013080, WO 2004/093207, WO 2006/005627 or WO 2010/006680, triarylamines, carbazole derivatives, for example CBP (N,N-biscarbazolylbiphenyl), m-CBP or the carbazole derivatives disclosed in WO 2005/039246, US 2005/0069729, JP 2004/288381, EP 1205527, WO 2008/086851 or US 2009/0134784, indolocarbazole derivatives, for example in accordance with WO 2007/063754 or WO 2008/056746, indenocarbazole derivatives, for example in accordance with WO 2010/136109 or WO 2011/000455, azacarbazoles, for example in accordance with EP 1617710, EP 1617711, EP 1731584, JP 2005/347160, bipolar matrix materials, for example in accordance with WO 2007/137725, silanes, for example in accordance with WO 2005/111172, azaboroles or boronic esters, for example in accordance with WO 2006/117052, diazasilole derivatives, for example in accordance with WO 2010/054729, diazaphosphole derivatives, for example in accordance with WO 2010/054730, triazine derivatives, for example in accordance with WO 2010/015306, WO 2007/063754 or WO 2008/056746, zinc complexes, for example in accordance with EP 652273 or WO 2009/062578, dibenzofuran derivatives, for example in accordance with WO 2009/148015, or bridged carbazole derivatives, for example in accordance with US 2009/0136779, WO 2010/050778, WO 2011/042107 or WO 2011/088877.

It may also be preferred to employ a plurality of different matrix materials as a mixture, in particular at least one electron-conducting matrix material and at least one hole-conducting matrix material. A preferred combination is, for example, the use of an aromatic ketone, a triazine derivative or a phosphine oxide derivative with a triarylamine derivative or a carbazole derivative as mixed matrix for the metal complex according to the invention. Preference is likewise given to the use of a mixture of a charge-transporting matrix material and an electrically inert matrix material which is not involved or not essentially involved in charge transport, as described, for example, in WO 20101108579.

It is furthermore preferred to employ a mixture of two or more triplet emitters together with a matrix. The triplet emitter having the shorter-wave emission spectrum serves as co-matrix for the triplet-emitter having the longer-wave emission spectrum. Thus, for example, the complexes of the formula (1) according to the invention can be employed as co-matrix for triplet emitters emitting at longer wavelength, for example for green- or red-emitting triplet emitters.

The compounds according to the invention can also be employed in other functions in the electronic device, for example as hole-transport material in a hole-injection or -transport layer, as charge-generation material or as electron-blocking material. The complexes according to the invention can likewise be employed as matrix material for other phosphorescent metal complexes in an emitting layer.

The cathode preferably comprises metals having a low work function, metal alloys or multilayered structures comprising various metals, such as, for example, alkaline-earth metals, alkali metals, main-group metals or lanthanoids (for example Ca, Ba, Mg, Al, In, Mg, Yb, Sm, etc.). Also suitable are alloys comprising an alkali metal or alkaline-earth metal and silver, for example an alloy comprising magnesium and silver. In the case of multilayered structures, further metals which have a relatively high work function, such as, for example, Ag, may also be used in addition to the said metals, in which case combinations of the metals, such as, for example, Mg/Ag, Ca/Ag or Ba/Ag, are generally used. It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides or carbonates (for example LiF, $Li_2O$, $BaF_2$, MgO, NaF, CsF, $Cs_2CO_3$, etc.). Organic alkali-metal complexes, for example Liq (lithium quinolinate), are likewise suitable for this purpose. The layer thickness of this layer is preferably between 0.5 and 5 nm.

The anode preferably comprises materials having a high work function. The anode preferably has a work function of greater than 4.5 eV vs. vacuum. Suitable for this purpose are on the one hand metals having a high redox potential, such as, for example, Ag, Pt or Au. On the other hand, metal/metal oxide electrodes (for example Al/Ni/$NiO_x$, Al/$PtO_x$) may also be preferred. For some applications, at least one of the electrodes must be transparent or partially transparent in order either to facilitate irradiation of the organic material (O-SCs) or the coupling-out of light (OLEDs/PLEDs, O-LASERs). Preferred anode materials here are conductive mixed metal oxides. Particular preference is given to indium tin oxide (ITO) or indium zinc oxide (IZO). Preference is furthermore given to conductive, doped organic materials, in particular conductive doped polymers, for example PEDOT, PANI or derivatives of these polymers. It is furthermore preferred for a p-doped hole-transport material to be applied to the anode as hole-injection layer, where suitable p-dopants are metal oxides, for example $MoO_3$ or $WO_3$, or (per)fluorinated electron-deficient aromatic compounds. Further suitable p-dopants are HAT-CN (hexacyanohexaazatriphenylene) or the compound NPD9 from Novaled. A layer of this type simplifies hole injection in materials having a low HOMO, i.e. a large value of the HOMO.

All materials as are used in accordance with the prior art for the layers can generally be used in the further layers, and the person skilled in the art will be able to combine each of these materials with the materials according to the invention in an electronic device without inventive step.

The device is correspondingly structured (depending on the application), provided with contacts and finally hermetically sealed, since the lifetime of such devices is drastically shortened in the presence of water and/or air.

Preference is furthermore given to an organic electroluminescent device, characterised in that one or more layers are coated by means of a sublimation process, in which the materials are vapour-deposited in vacuum sublimation units at an initial pressure of usually less than $10^{-5}$ mbar, preferably less than $10^{-6}$ mbar. It is also possible for the initial pressure to be even lower or even higher, for example less than $10^{-7}$ mbar.

Preference is likewise given to an organic electroluminescent device, characterised in that one or more layers are coated by means of the OVPD (organic vapour phase deposition) process or with the aid of carrier-gas sublimation, in which the materials are applied at a pressure of between $10^{-5}$ mbar and 1 bar. A special case of this process is the OVJP (organic vapour jet printing) process, in which the materials are applied directly through a nozzle and thus structured (for example M. S. Arnold et al., *Appl. Phys. Left.* 2008, 92, 053301).

Preference is furthermore given to an organic electroluminescent device, characterised in that one or more layers are produced from solution, such as, for example, by spin coating, or by means of any desired printing process, such as, for example, screen printing, flexographic printing, offset printing or nozzle printing, but particularly preferably LITI (light induced thermal imaging, thermal transfer printing) or ink-jet printing. Soluble compounds are necessary for this purpose, which are obtained, for example, through suitable substitution.

The organic electroluminescent device may also be produced as a hybrid system by applying one or more layers from solution and applying one or more other layers by vapour deposition. Thus, for example, it is possible to apply an emitting layer comprising a compound of the formula (1) and a matrix material from solution and to apply a hole-blocking layer and/or an electron-transport layer on top by vacuum vapour deposition.

These processes are generally known to the person skilled in the art and can be applied by him without problems to organic electroluminescent devices comprising compounds of the formula (1) or the preferred embodiments indicated above.

The electronic devices according to the invention, in particular organic electroluminescent devices, are distinguished over the prior art by one or more of the following surprising advantages:

1. Organic electroluminescent devices comprising compounds of the formula (1) as emitting materials have a very long lifetime.
2. Organic electroluminescent devices comprising compounds of the formula (1) as emitting materials have excellent efficiency. In particular, the efficiency is significantly higher compared with analogous compounds which do not contain a structural unit of the formula (3) or formula (4).
3. Some of the metal complexes according to the invention have a very narrow emission spectrum, which results in high colour purity of the emission, as desired, in particular, for display applications.
4. The metal complexes according to the invention have reduced aggregation compared with analogous compounds which do not contain a structural unit of the formula (3) or formula (4). This is evident from a lower sublimation temperature and higher solubility and reduced triplet-triplet quenching in the electroluminescent device.

These advantages mentioned above are not accompanied by an impairment of the other electronic properties.

The invention is explained in greater detail by the following examples, without wishing to restrict it thereby. The person skilled in the art will be able to produce further electronic devices on the basis of the descriptions without inventive step and will thus be able to carry out the invention throughout the range claimed.

DESCRIPTION OF THE FIGURES

The FIGURE shows the photoluminescence spectrum of a tris(phenylisoquinoline)iridium complex which contains a group of the formula (3), compared with the spectrum of the corresponding complex without the group of the formula (3). The spectra were measured in an approx. $10^{-5}$ molar solution in degassed toluene at room temperature. The narrower emission band having a full width at half maximum (FWHM) value of 48 nm compared with 74 nm in the case of the compound without a group of the formula (3) is clearly evident.

EXAMPLES

The following syntheses are carried out, unless indicated otherwise, in dried solvents under a protective-gas atmosphere. The metal complexes are additionally handled with exclusion of light or under yellow light. The solvents and reagents can be purchased, for example, from Sigma-ALDRICH or ABCR. The respective numbers in square brackets or the numbers indicated for individual compounds relate to the CAS numbers of the compounds known from the literature.

A: Synthesis of the Synthones S

Example S1

1,1,2,2,3,3-Hexamethylindane-d18, S1

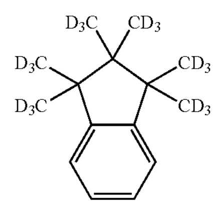 [SMILES: [2H]C([2H])([2H])C1(C([2H])([2H])[2H])c2ccccc2C(C([2H])([2H])[2H])(C([2H])([2H])[2H])C1(C([2H])([2H])[2H])C([2H])([2H])[2H]]

Preparation analogous to J. Baran, et al., J. Org. Chem. 1988, 53, 19, 4626.

18.7 ml (170 mmol) of titanium tetrachloride are added dropwise with vigorous stirring to a mixture, cooled to −78° C., of 160.7 g (1 mol) of 2-chloro-2-phenylpropane-d6 [53102-26-4], 230.8 g (2.4 mol) of 2,3-dimethylbut-2-ene-d12 [69165-86-2] and 2500 ml of anhydrous dichloromethane, and the mixture is stirred for a further 2 h. The cold reaction mixture is poured into 1500 ml of 3 N hydrochloric acid with vigorous stirring, stirred for a further 20 min., the organic phase is separated off, washed twice with 1000 ml of water each time, once with 500 ml of sat. sodium carbonate solution, once with 500 ml of saturated sodium chloride solution, dried over magnesium sulfate, the desiccant is filtered off, the filtrate is freed from dichloromethane in vacuo, and the residue is subjected to fractional distillation (core fraction 60-65° C., about 0.5 mbar). Yield: 163.1 g (740 mmol), 74%; purity: about 95% according to NMR.

The following compounds are prepared analogously:

| Ex. | Starting materials | Product | Yield |
|---|---|---|---|
| S2 | 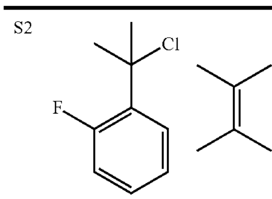  1716-38-7/563-79-1 | 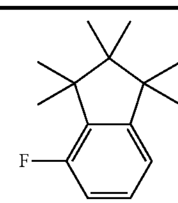  S2 | 68% |

-continued

| Ex. | Starting materials | Product | Yield |
|---|---|---|---|
| S3 | 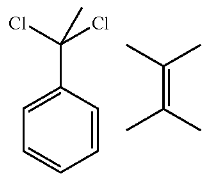 934-53-2/563-79-1 Use von 4.4 mol of 2,3-dimethylbut-2-ene | 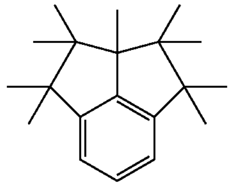 S3 | 49% |

Example S4

Pinacolyl 1,1,3,3-tetramethylindane-5-boronate, S4-B

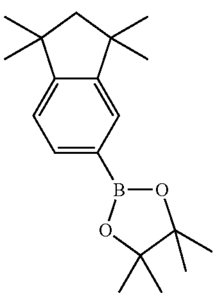

A) 5-Bromo-1,1,3,3-tetramethylindane [169695-24-3], S4-Br

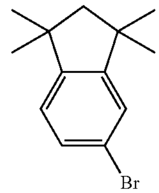

0.6 g of anhydrous iron(III) chloride and then, dropwise with exclusion of light, a mixture of 25.6 ml (500 mol) of bromine and 300 ml of dichloromethane are added to a solution, cooled to 0° C., of 87.2 g (500 mmol) of 1,1,3,3-tetramethylindane [4834-33-7] in 1000 ml of dichloromethane at such a rate that the temperature does not exceed +5° C. The reaction mixture is stirred at room temperature for a further 16 h, 300 ml of saturated sodium sulfite solution are then slowly added, the aqueous phase is separated off, the organic phase is washed three times with 1000 ml of water each time, dried over sodium sulfate, filtered through a short silica-gel column, and the solvent is then stripped off. Finally, the solid is recrystallised once from a little (about 100-150 ml) ethanol. Yield: 121.5 g (480 mmol), 96%; purity: about 95% according to $^{1}$H-NMR.

B) Pinacolyl 1,1,3,3-tetramethylindane-5-boronate, S4-B

A mixture of 25.3 g (100 mmol) of S4-Br, 25.4 g (120 mmol) of bis(pinacolato)diborane [73183-34-3], 29.5 g (300 mmol) of potassium acetate, anhydrous, 561 mg (2 mmol) of tricyclohexylphosphine and 249 mg (1 mmol) of palladium (II) acetate and 400 ml of dioxane is stirred at 80° C. for 16 h. After removal of the solvent in vacuo, the residue is taken up in 500 ml of dichloromethane, filtered through a Celite bed, the filtrate is evaporated in vacuo until crystallisation commences, and finally about 100 ml of methanol are also added dropwise in order to complete the crystallisation. Yield: 27.9 g (93 mmol), 93%; purity: about 95% according to $^{1}$H-NMR. Boronic acid esters formed as oil can also be reacted further without purification.

The following compounds are prepared analogously:

| Ex. | Starting materials | Bromide | Product Boronic acid ester | Yield 2 steps |
|---|---|---|---|---|
| S5 | 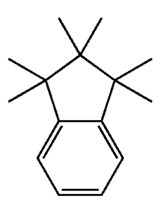 91324-94-6 | 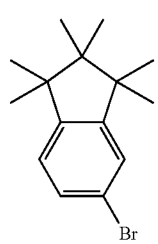 S5-Br | 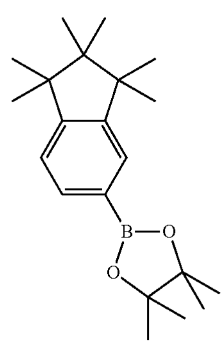 S5-B | 80% |

-continued
| Ex. | Starting materials | Bromide | Product Boronic acid ester | Yield 2 steps |
|---|---|---|---|---|
| S6 | 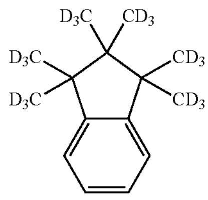 S1 | 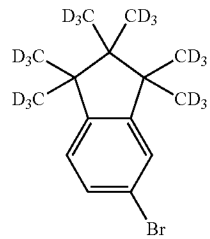 S6-Br | 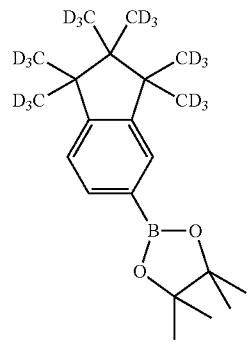 S6-B | 78% |
| S7 | 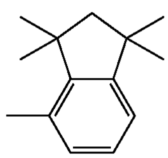 479070-73-0 | 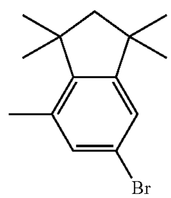 S7-Br Separation of regioisomers by distillation | 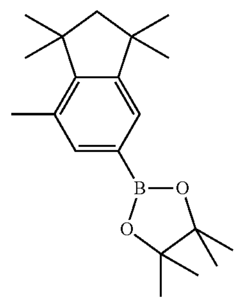 S7-B | 60% |
| S8 | 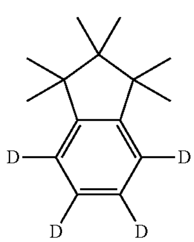 142076-41-3 | 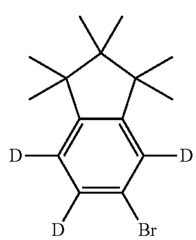 S8-Br | 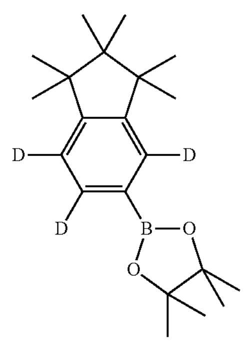 S8-B | 81% |
| S9 | 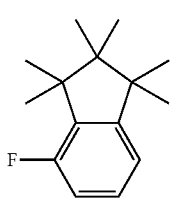 S2 | 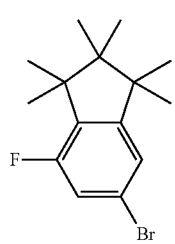 S9-Br Separation of regioisomers by distillation | 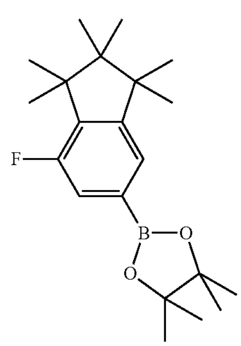 S9-B | 43% |

-continued
| Ex. | Starting materials | Bromide | Product Boronic acid ester | Yield 2 steps |
|---|---|---|---|---|
| S10 | 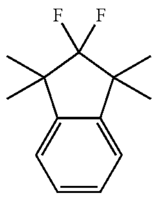 59508-28-0 | 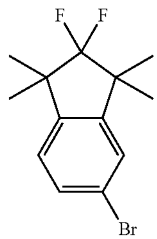 S10-Br | 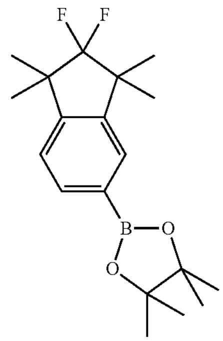 S10-B | 78% |
| S11 | 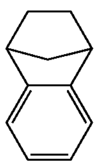 4486-29-7 | 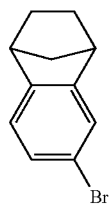 16499-72-2 S11-Br | 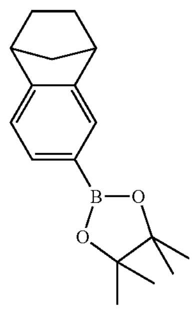 S11-B | 80% |
| S12 | 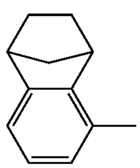 215725-16-9 | 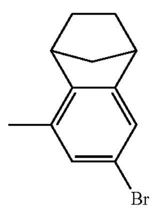 S12-Br Separation of regioisomers by distillation | 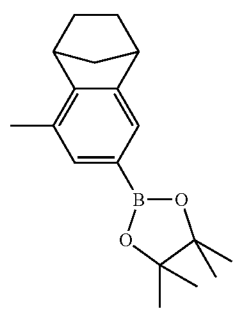 S12-B | 68% |
| S13 | 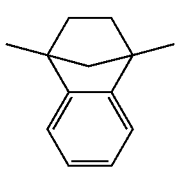 66684-45-5 | 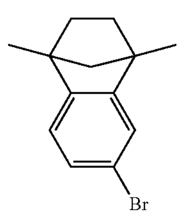 S13-Br | 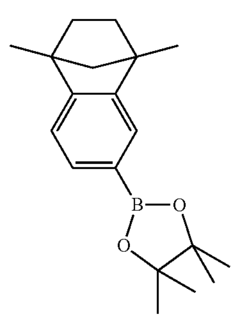 S13-B | 77% |

-continued
| Ex. | Starting materials | Bromide | Product Boronic acid ester | Yield 2 steps |
|---|---|---|---|---|
| S14 | 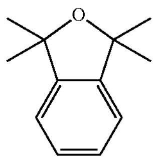 113710-83-1 | 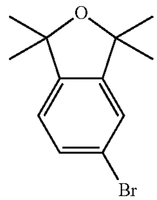 S14-Br | 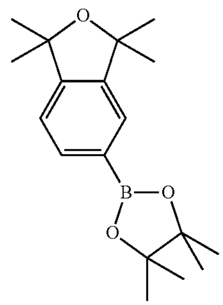 S-14-B | 79% |
| S15 | 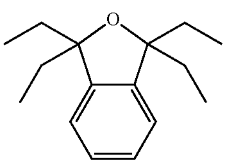 65089-09-0 | 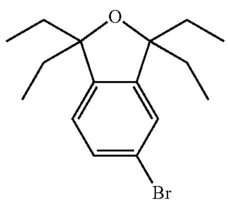 S15-Br | 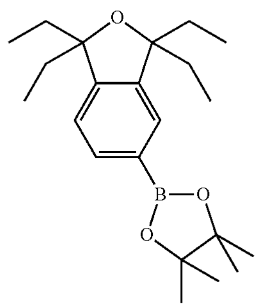 S15-Br | 70% |
| S16 | 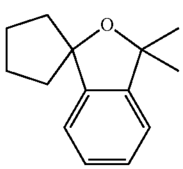 1020726-74-2 | 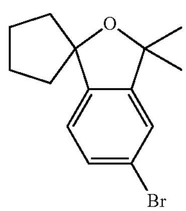 S16-Br Separation of regioisomers by distillation | 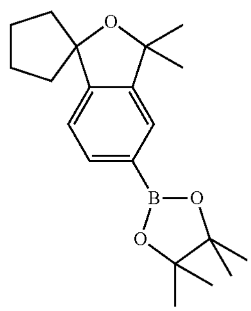 S16-B | 54% |
| S17 | 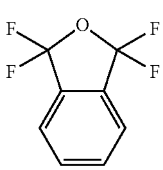 651-39-8 | 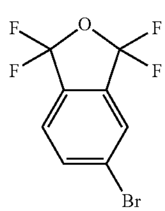 S17-Br | 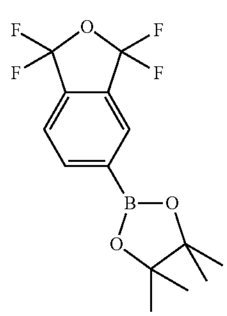 S17-B | 81% |

-continued
| Ex. | Starting materials | Bromide | Product Boronic acid ester | Yield 2 steps |
|---|---|---|---|---|
| S18 | 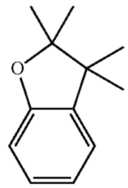 124797-68-8 | 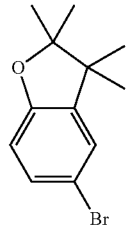 S18-Br Separation of regioisomers by distillation | 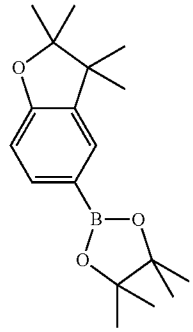 S18-B | 56% |
| S19 | | 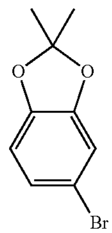 73790-19-9 S19-Br | 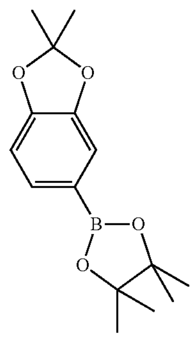 S19-B | 94% 1 step |
| S20 | 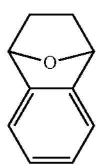 35185-96-7 | 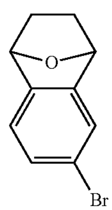 S20-Br | 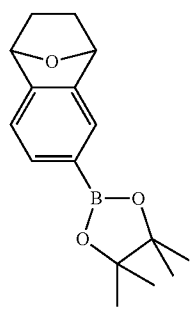 S20-B | 82% |
| S21 | 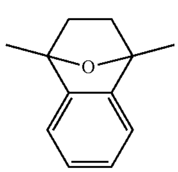 61200-08-6 | 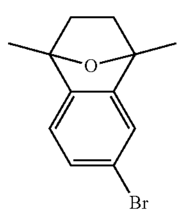 S21-Br | 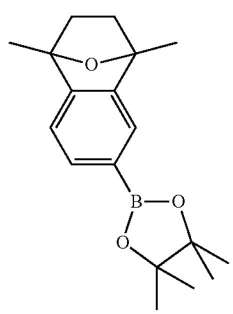 S21-B | 79% |

-continued

| Ex. | Starting materials | Bromide | Product Boronic acid ester | Yield 2 steps |
|---|---|---|---|---|
| S22 | 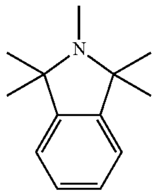 3723-85-1 | 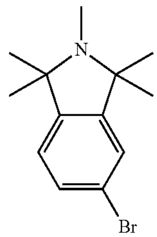 S22-Br | 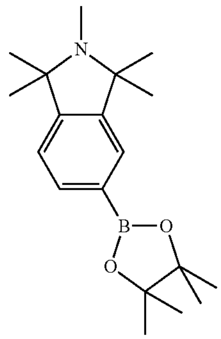 S22-B | 23% |
| S23 | 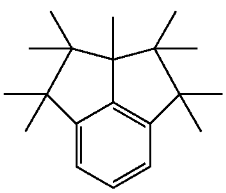 S3 | 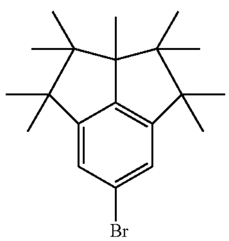 S22-Br | 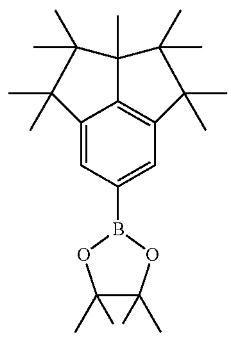 S23-B | 77% |

Example S24

5,5,7,7-Tetramethyl-6,7-dihydro-5H-[2]pyridine, S24

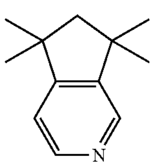

Procedure analogous to D. L. Boger et al., J. Org. Chem., 1981, 46, 10, 2180.

A mixture of 14.0 g (100 mmol) of 2,2,4,4-tetramethyl-cyclopentanone [4694-11-5], 9.0 ml (110 mmol) of pyrrolidine [123-75-1], 951 mg (5 mmol) of p-toluenesulfonic acid monohydrate [6192-52-5] and 500 ml of toluene is heated on a water separator until the separation of water is complete (typically about 16 h). The toluene is then removed in vacuo, and the oily residue is subjected to a bulb-tube distillation. The 17.4 g (90 mmol) of 1-(3,3,5,5-tetramethylcyclopent-1-enyl)pyrrolidine obtained as amber-coloured oil are taken up in 50 ml of chloroform and slowly added dropwise at room temperature to a solution of 10.5 g (130 mmol) of 1,2,4-triazine in 50 ml of chloroform. When the addition is complete, the orange solution is stirred at room temperature for a further 2 h, and the temperature is then raised to 50° C., and the mixture is stirred for a further 45 h. After removal of the chloroform in vacuo, the residue is chromatographed on silica gel with diethyl ether:n-heptane (1:1, vv). Yield: 8.9 g (51 mmol), 51%; purity: about 97% according to $^{1}$H-NMR.

The following compounds are prepared analogously:

| Ex. | Starting materials | Product | Yield |
|---|---|---|---|
| S25 | 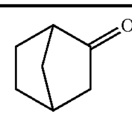 497-38-1 | 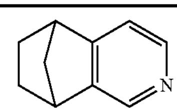 105275-30-7 S25 | 42% |
| S26 | 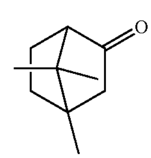 70897-07-3 | 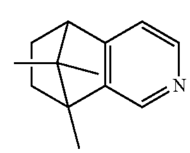 S26 | 37% |

Example S27

5,6-Dibromo-1,1,2,2,3,3-hexamethylindane, S27

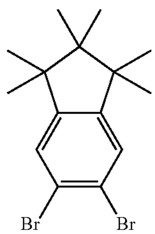

1.3 g of anhydrous iron(III) chloride and then, dropwise with exclusion of light, a mixture of 64.0 ml (1.25 mol) of bromine and 300 ml of dichloromethane are added to a solution of 101.2 g (500 mmol) of 1,1,2,2,3,3-hexamethylindane [91324-94-6] in 2000 ml of dichloromethane at such a rate that the temperature does not exceed 25° C., if necessary counter-cooling using a cold-water bath. The reaction mixture is stirred at room temperature for a further 16 h, 500 ml of saturated sodium sulfite solution are then slowly added, the aqueous phase is separated off, the organic phase is washed three times with 1000 ml of water each time, dried over sodium sulfate, filtered through a short silica-gel column, and the solvent is then stripped off. Finally, the solid is recrystallised once from a little (about 100 ml) ethanol. Yield: 135.8 g (377 mmol), 75%; purity: about 95% according to $^{1}$H-NMR.

The following compounds are prepared analogously:

| Ex. | Starting materials | Product | Yield |
|---|---|---|---|
| S28 | 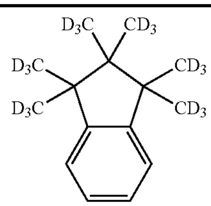 S1 | 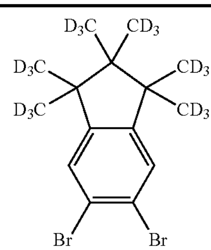 S28 | 78% |
| S29 | 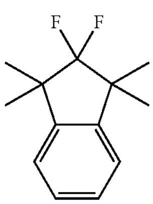 59508-28-0 | 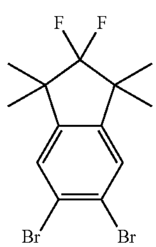 S29 | 73% |
| S30 | 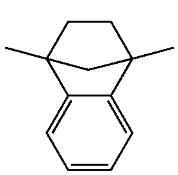 66684-45-5 | 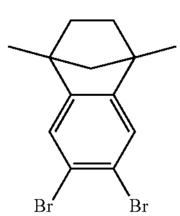 S30 | 76% |

-continued

| Ex. | Starting materials | Product | Yield |
|---|---|---|---|
| S31 | 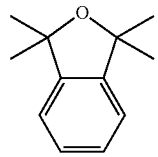 113710-83-1 | 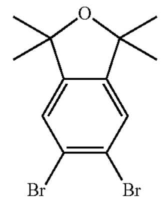 S31 | 80% |
| S32 | 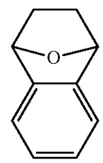 35185-96-7 | 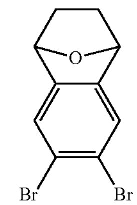 749859-07-2 S32 | 77% |
| S33 | 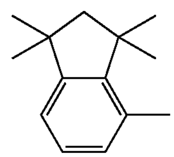 | 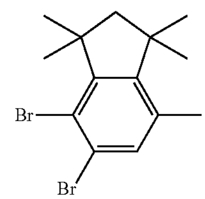 S33 Chromatographic separation of the regioisomers | 19% |
| S34 | 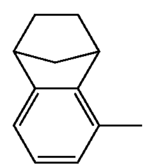 | 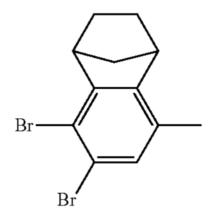 S34 Chromatographic separation of the regioisomers | 23% |

Example S35

5,6-Diamino-1,1,2,2,3,3-hexamethylindane, S35

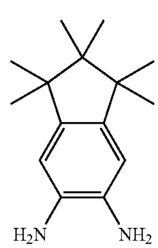

A: 5,6-Dinitro-1,1,2,2,3,3-tetramethylindane, S35a

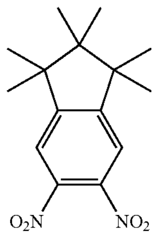

350 ml of 100% by weight nitric acid are slowly added dropwise to a vigorously stirred mixture, cooled to 0° C., of 101.2 g (500 mmol) of 1,1,2,2,3,3-hexamethylindane [91324-94-6] and 350 ml of 95% by weight sulfuric acid at such a rate that the temperature does not exceed +5° C. The reaction mixture is subsequently allowed to warm slowly to room temperature over 2-3 h and is then poured into a vigorously stirred mixture of 6 kg of ice and 2 kg of water. The pH is adjusted to 8-9 by addition of 40% by weight NaOH, the mixture is extracted three times with 1000 ml of ethyl acetate each time, the combined org. phases are washed twice with 1000 ml of water each time, dried over magnesium sulfate, the ethyl acetate is then removed virtually completely in vacuo until crystallisation commences, and the crystallisation is completed by addition of 500 ml of heptane. The beige crystals obtained in this way are filtered off with suction and dried in vacuo. Yield: 136.2 g (466 mmol), 93%; purity: about 94% according to $^1$H-NMR, remainder about 4% of 4,6-dinitro-1,1,3,3-tetramethylindane. About 3% of 4,5-dinitro-1,1,3,3-tetramethylindane, S35b, can be isolated from the mother liquor.

B: 5,6-Diamino-1,1,2,2,3,3-hexamethylindane, S35

136.2 g (466 mmol) of 5,6-dinitro-1,1,2,2,3,3-hexamethylindane, S35a, are hydrogenated at room temperature in 1200 ml of ethanol on 10 g of palladium/carbon at a hydrogen pressure of 3 bar for 24 h. The reaction mixture is filtered twice through a Celite bed, the brown solid obtained after removal of the ethanol is subjected to a bulb-tube distillation (T about 160° C., p about $10^{-4}$ mbar). Yield: 98.5 g (424 mmol), 91%; purity: about 95% according to $^1$H-NMR.

The following compounds are prepared analogously:

| Ex. | Starting materials | Product | Yield |
|---|---|---|---|
| S35b | 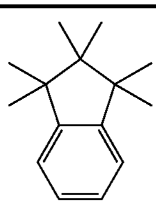 91324-94-6 | 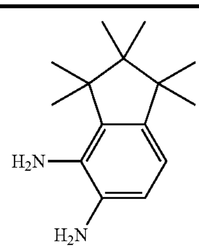 S35b | 2% |

-continued

| Ex. | Starting materials | Product | Yield |
|---|---|---|---|
| S36 | 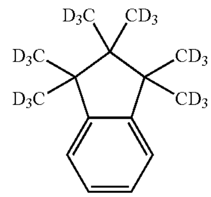 S1 | 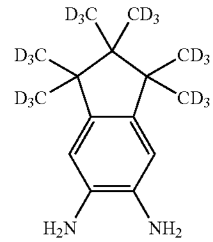 S36 | 80% |
| S37 | 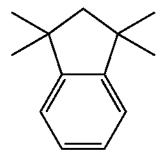 4834-33-7 | 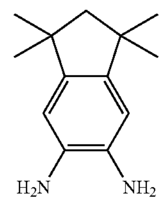 S37 | 84% |
| S38 | 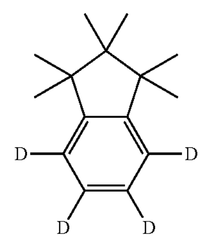 142076-41-3 | 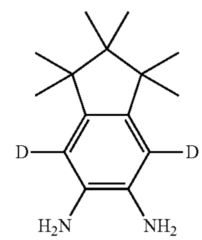 S38 | 76% |
| S39 | 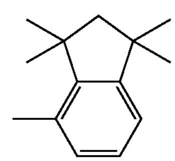 479070-73-0 | 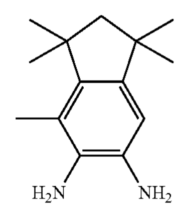 S39 | 68% |
| S40 | 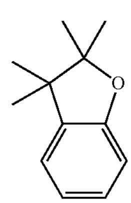 124797-68-8 | 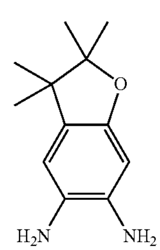 S40 | 63% |
| S41 | 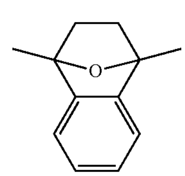 61200-08-6 | 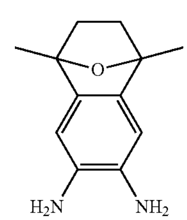 S41 | 77% |

-continued

| Ex. | Starting materials | Product | Yield |
|---|---|---|---|
| S42 | 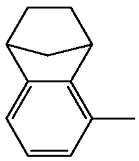 215725-16-9 | 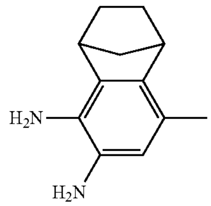 S42 Chromatographic separation of the regioisomers | 16% |

Example S43

N-[2-(1,1,2,2,3,3-Hexamethylindan-5-yl)ethyl]benzamide, S43

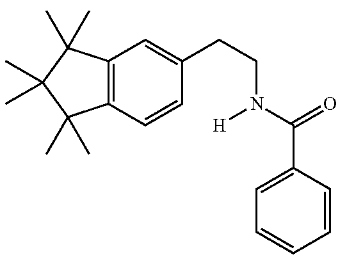 [SMILES: CC1(C)c2ccc(CCNC(=O)c3ccccc3)cc2C(C)(C)C1(C)C]

A: 1,1,2,2,3,3-Hexamethylindane-5-carboxaldehyde, S43a

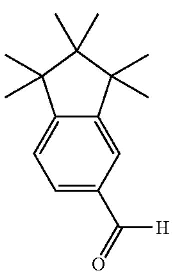 [SMILES: CC1(C)c2ccc(C=O)cc2C(C)(C)C1(C)C]

200 ml (500 mmol) of n-BuLi, 2.5 M in n-hexane, are added dropwise to a vigorously stirred solution, cooled to −78° C., of 140.6 g (500 mmol) of 5-bromo-1,1,2,2,3,3-hexamethylindane, S5-Br, in 1000 ml of THF at such a rate that the temperature does not exceed −55° C. When the addition is complete, the mixture is stirred for a further 30 min., and a mixture of 42.3 ml (550 mmol) of DMF and 50 ml of THF is then allowed to run in with vigorous stirring. The mixture is stirred at −78° C. for a further 1 h, then allowed to warm to room temperature and quenched by addition of 300 ml of saturated ammonium chloride solution. The organic phase is separated off, the THF is removed in vacuo, the residue is taken up in 500 ml of ethyl acetate, washed once with 300 ml of 5% hydrochloric acid, twice with 300 ml of water each time, once with 300 ml of saturated sodium chloride solution, the organic phase is dried over magnesium sulfate, and the solvent is then removed in vacuo. The residue is employed in step B without further purification. Yield: 107.1 g (465 mmol), 93%; purity: about 95% according to $^{1}$H-NMR.

The following compounds can be prepared analogously:

| Ex. | Starting material | Product | Yield |
|---|---|---|---|
| S44a | 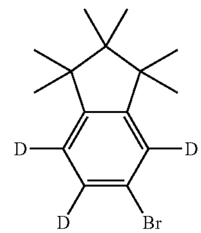 S8-Br | 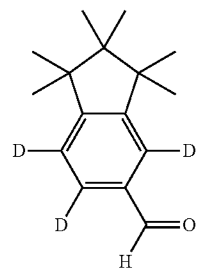 S44a | 91% |
| S45a | 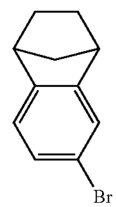 16499-72-2 S11-Br | 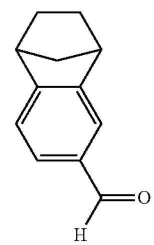 S45a | 89% |
| S46a | 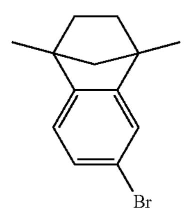 S13-Br | 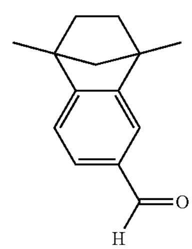 S46a | 95% |
| S47a | 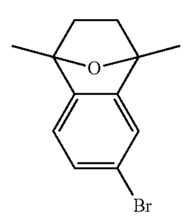 S21-Br | 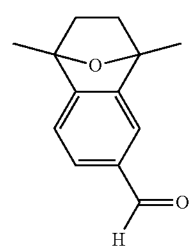 S47a | 90% |

B: 2-(1,1,2,2,3,3-Hexamethyl-5-indanyl)ethylamine, S43b

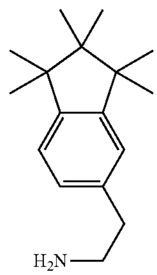

A mixture of 80.6 g (350 mmol) of 1,1,2,2,3,3-Hexamethylindane-5-carboxaldehyde, S43a, 400 ml of nitromethane and 4.6 g (70 mmol) of ammonium acetate, anhydrous, is heated under reflux for 2 h until the starting material has been consumed (TLC check). After cooling, the reaction mixture is poured into 1000 ml of water, extracted three times with 300 ml of dichloromethane each time, the combined organic phases are washed three times with saturated sodium hydrogencarbonate solution, three times with 300 ml of water each time and once with 300 ml of saturated sodium chloride solution, dried over magnesium sulfate, and the solvent is removed in vacuo. The dark oily residue is dissolved in 100 ml of THF and slowly added dropwise with ice-cooling to a solution of 38.0 g (1.0 mol) of lithium aluminium hydride in 1000 ml of THF (care: exothermic reaction!). When the addition is complete, the reaction mixture is allowed to warm to room temperature and is stirred at room temperature for a further 20 h. The reaction mixture is hydrolysed with ice-cooling by slow addition of 500 ml of saturated sodium sulfate solution. The salts are filtered off with suction, rinsed with 500 ml of THF, the THF is removed in vacuo, the residue is taken up in 1000 ml of dichloromethane, the solution is washed three times with 300 ml of water each time, once with 300 ml of saturated sodium chloride solution, dried over magnesium sulfate, and the solvent is then removed in vacuo. The purification is carried out by bulb-tube distillation (p about $10^{-4}$ mbar, T=200° C.). Yield: 67.0 g (273 mmol), 78%; purity: about 95% according to $^{1}$H-NMR.

The following compounds can be prepared analogously:

| Ex. | Starting material | Product | Yield |
|---|---|---|---|
| S44b | 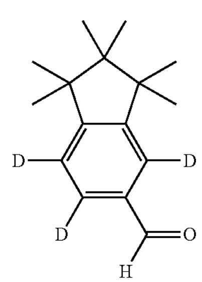 S44a | 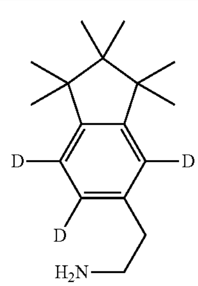 S44b | 74% |

-continued

| Ex. | Starting material | Product | Yield |
|---|---|---|---|
| S45b | 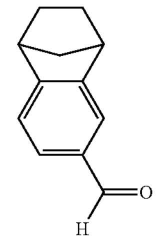 S45a | 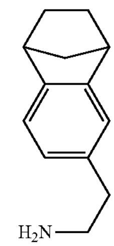 S45b | 77% |
| S46b | 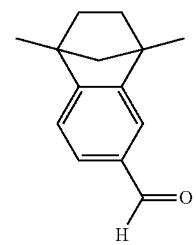 S46a | 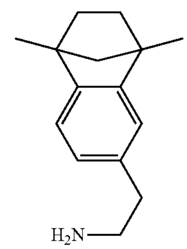 S46b | 75% |
| S47b | 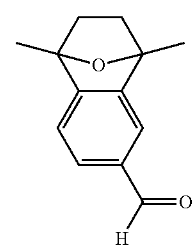 S47a | 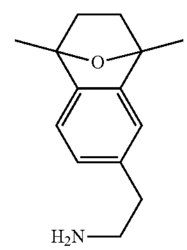 S47b | 71% |

C: N-[2-(1,1,2,2,3,3-Hexamethylindan-5-yl)ethyl]benzamide, S43

A solution of 14.1 ml (100 mmol) of benzoyl chloride [98-88-4] in 100 ml of dichloromethane is added dropwise with vigorous stirring at 0° C. to a mixture of 24.5 g (100 mmol) of 2-(1,1,2,2,3,3-hexamethyl-5-indanyl)ethylamine, S43b, 14.1 ml (100 mmol) of triethylamine and 150 ml of dichloromethane at such a rate that the temperature does not exceed 30° C. The mixture is subsequently stirred at room temperature for a further 1 h. The dichloromethane is removed in vacuo, 100 ml of methanol are added to the colourless solid, which is filtered off with suction, washed three times with 50 ml of methanol and dried in vacuo. Yield: 31.1 g (89 mmol), 89%; purity: about 98% according to $^{1}$H-NMR.

The following compounds can be prepared analogously:
| Ex. | Starting material | Carboxylic acid chloride | Product | Yield |
|---|---|---|---|---|
| S44 | 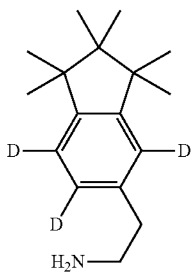 S44b | 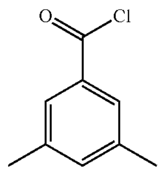 | 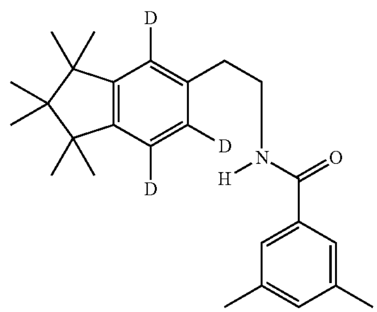 S44 | 74% |
| S45 | 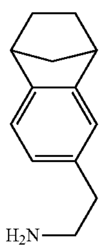 S45b | 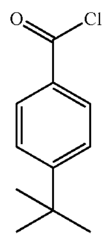 | 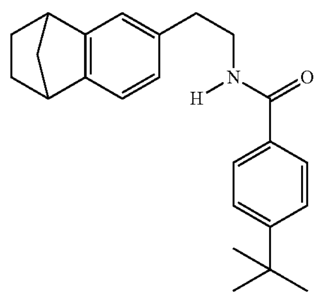 S45 | 77% |
| S46 | 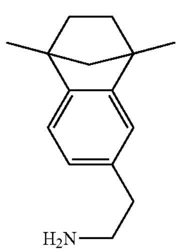 S46b | 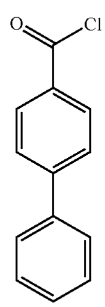 | 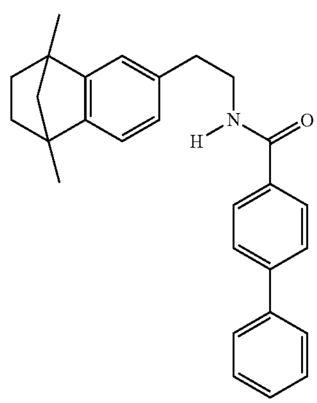 S46 | 75% |
| S47 | 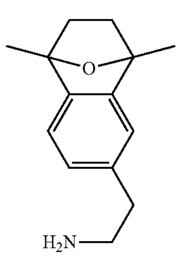 S47b | 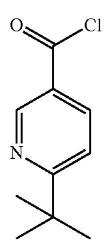 | 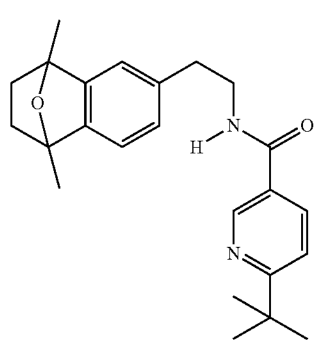 S47 | 71% |

-continued

| Ex. | Starting material | Carboxylic acid chloride | Product | Yield |
|---|---|---|---|---|
| S48 | 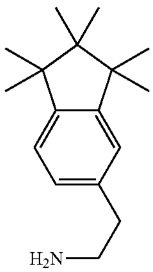 S43b | 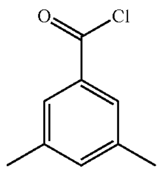 | 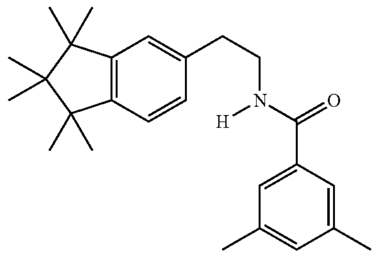 S48 | 86% |
| S49 | 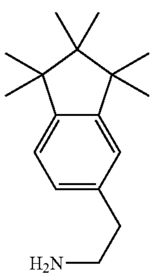 S43b | 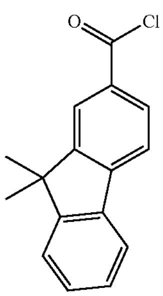 [SMILES: CC1(C)c2ccccc2-c2ccc(C(=O)Cl)cc21] | 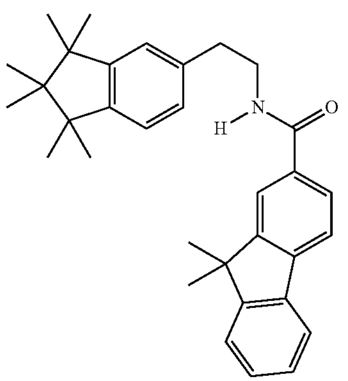 S49 | 88% |

Example S50

2,7-Di-tert-butyl-9,9'-(6-bromopyridin-2-yl)xanthene, S50

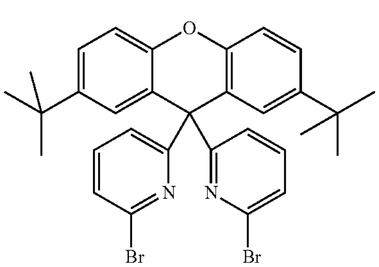 [SMILES: CC(C)(C)c1ccc2c(c1)C(c1cccc(Br)n1)(c1cccc(Br)n1)c1cc(C(C)(C)C)ccc1O2]

120 ml (300 mmol) of n-BuLi, 2.5 M in n-hexane, are added at room temperature to a solution of 84.7 g (300 mmol) of di(4-tert-butylphenyl) ether [24085-65-2] in 1500 ml of diethyl ether, and the mixture is then stirred under reflux for 60 h. After the reaction mixture has been cooled to −10° C., 82.1 g (240 mmol) of bis(6-bromopyridin-2-yl) methanone are added in portions, and the mixture is then stirred at −10° C. for a further 1.5 h. The reaction mixture is quenched by addition of 30 ml of ethanol, the solvent is removed completely in vacuo in a rotary evaporator, the residue is taken up in 1000 ml of glacial acetic acid, 150 ml of acetic anhydride and then, dropwise, 30 ml of conc. sulfuric acid are added with stirring, and the mixture is stirred at 60° C. for a further 3 h. The solvent is then removed in vacuo, the residue is taken up in 1000 ml of dichloromethane, and the mixture is rendered alkaline by addition of 10% by weight aqueous NaOH with ice-cooling. The organic phase is separated off, washed three times with 500 ml of water each time, dried over magnesium sulfate, the organic phase is evaporated to dryness, and the residue is taken up in 500 ml of methanol, homogenised at elevated temperature and then stirred for a further 12 h, during which the product crystallises. The solid obtained after filtration with suction is dissolved in 1000 ml of dichloromethane, the solution is filtered through a Celite bed, the filtrate is evaporated to dryness, the residue is recrystallised twice from toluene:methanol (1:1) and then dried in vacuo. Yield: 56.3 g (87 mmol), 36%; purity: about 95% according to $^{1}$H-NMR.

The following compound can be prepared analogously:

| Ex. | Starting material | Product | Yield |
|---|---|---|---|
| S51 | 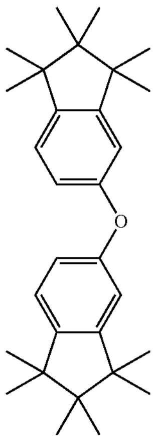 S52 | 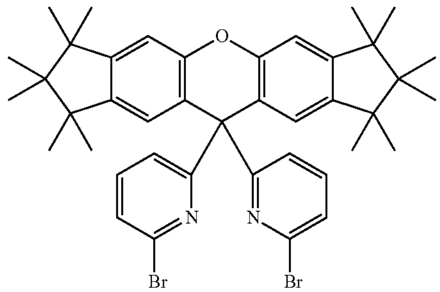 S51 | 28% |

Example S52

2,7-Di-tert-butyl-9,9'-(6-bromopyridin-2-yl)xanthene, S52

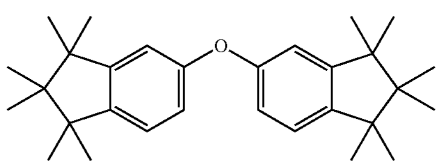

Procedure analogous to G. Chen et al., Tetrahedron Letters 2007, 48, 3, 47. A vigorously stirred mixture of 56.2 g (200 mmol) of 5-bromo-1,1,2,2,3,3-hexamethylindane, S5-Br, 212.2 g (800 mmol) of tripotassium phosphate trihydrate, 300 g of glass beads (diameter 3 mm), 449 mg (2 mmol) of palladium(II) acetate, 809 mg (4 mmol) of tri-tert-butylphosphine and 1000 ml of dioxane is heated under reflux for 20 h. After cooling, the salts are filtered off with suction, rinsed with 300 ml of dioxane, the filtrate is evaporated in vacuo, the residue is taken up in 500 ml of ethyl acetate, the solution is washed three times with 300 ml of water each time, once with 300 ml of saturated sodium chloride solution, dried over magnesium sulfate, and the ethyl acetate is then removed in vacuo. The residue is purified by bulb-tube distillation (p about $10^{-4}$ mbar, T about 180° C.). Yield: 32.6 g (78 mmol), 78%; purity: about 97% according to 1H-NMR.

Example S53

7-Bromo-1,2,3,4-tetrahydro-1,4-methanonaphthalene-6-carbaldehyde, S53

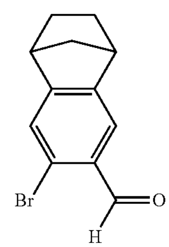 [SMILES: O=Cc1cc2c(cc1Br)C1CCC2C1]

Procedure analogous to L. S. Chen et al., J. Organomet. Chem. 1980, 193, 283-292. 40 ml (100 mmol) of n-BuLi, 2.5 M in hexane, pre-cooled to −110° C., are added to a solution, cooled to −110° C., of 30.2 g (100 mmol) of 6,7-dibromo-1,2,3,4-tetrahydro-1,4-methanonaphthalene [42810-32-2] in a mixture of 1000 ml of THF and 1000 ml of diethyl ether at such a rate that the temperature does not exceed −105° C. The mixture is stirred for a further 30 min., a mixture, pre-cooled to −110° C., of 9.2 ml (120 mmol) of DMF and 100 ml of diethyl ether is then added dropwise, the mixture is then stirred for a further 2 h, allowed to warm to −10° C., 1000 ml of 2 N HCl are added, and the mixture is stirred at room temperature for a further 2 h. The organic phase is separated off, washed once with 500 ml of water, once with 500 ml of saturated sodium chloride solution, dried over magnesium sulfate, the solvent is removed in vacuo, and the residue is subjected to a bulb-tube distillation (T about 90° C., p about $10^{-4}$ mbar). Yield: 15.8 g (63 mmol), 63%; purity: about 95% according to $^{1}$H-NMR.

The following compounds can be prepared analogously:

| Ex. | Starting materials | Product | Yield |
|---|---|---|---|
| S54 | 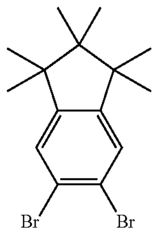 S27 | 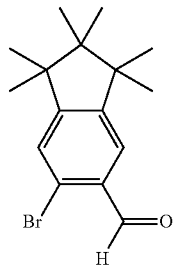 S27 | 68% |
| S55 | 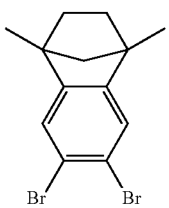 S30 | 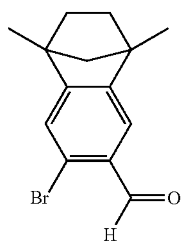 S55 | 66% |
| S56 | 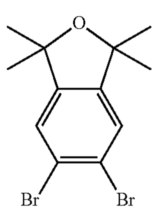 S31 | 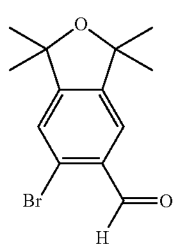 S56 | 60% |
| S57 | 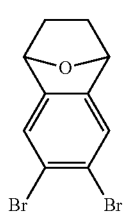 749859-07-2 S32 | 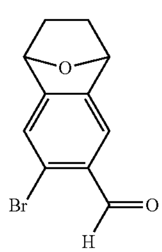 S57 | 54% |

Example S58

7-(3,3-Dimethylbut-1-ynyl)-1,2,3,4-tetrahydro-1,4-methanonaphthalene-6-carbaldehyde, S58

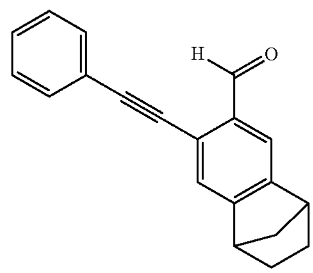 [SMILES: O=Cc1cc2c(cc1C#Cc1ccccc1)C1CCC2C1]

1.6 g (6 mmol) of triphenylphosphine, 674 mg (3 mmol) of palladium(II) acetate, 571 mg (30 mmol) of copper(I) iodide and 15.3 g (150 mmol) of phenylacetylene [536-74-3] are added consecutively to a solution of 25.1 g (100 mmol) of 7-bromo-1,2,3,4-tetrahydro-1,4-methanonaphthalene-6-carbaldehyde, S53, in a mixture of 200 ml of DMF and 100 ml of triethylamine, and the mixture is stirred at 65° C. for 4 h. After cooling, the precipitated triethylammonium hydrochloride is filtered off with suction, rinsed with 30 ml of DMF. The filtrate is freed from the solvents in vacuo. The oily residue is taken up in 300 ml of ethyl acetate, the solution is washed five times with 100 ml of water each time and once with 100 ml of saturated sodium chloride solution, and the organic phase is dried over magnesium sulfate. After removal of the ethyl acetate in vacuo, the oily residue is chromatographed on silica gel (n-heptane:ethyl acetate 99:1). Yield: 19.6 g (72 mmol), 72%; purity: about 97% according to $^{1}$H-NMR.

The following derivatives can be prepared analogously:
| Ex. | Bromo- aryl-aldehyde | Alkyne | Product | Yield |
|---|---|---|---|---|
| S59 | 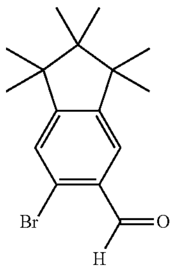 S54 | 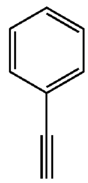 536-74-3 | 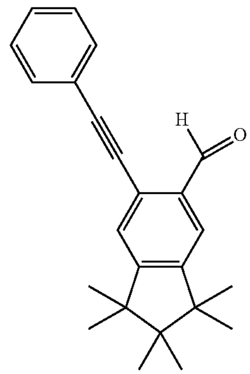 S59 | 69% |
| S60 | 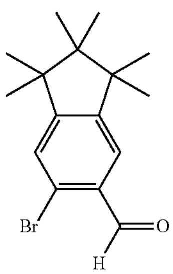 S54 | 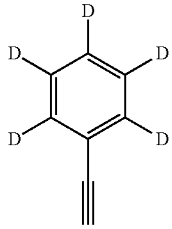 25837-46-1 | 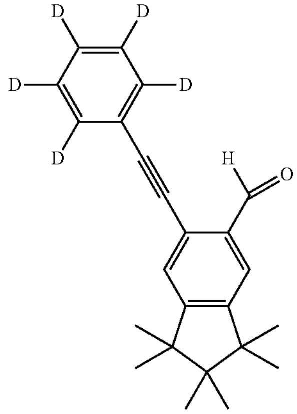 S60 | 69% |
| S61 | 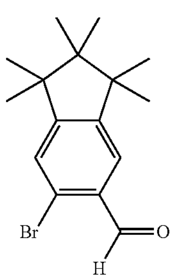 S54 | 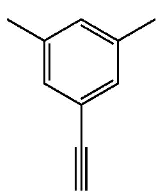 6366-06-9 | 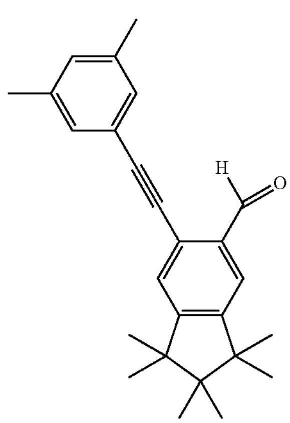 S61 | 70% |

-continued
| Ex. | Bromo- aryl- aldehyde | Alkyne | Product | Yield |
|---|---|---|---|---|
| S62 | 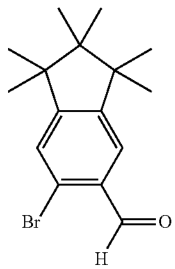 S54 | 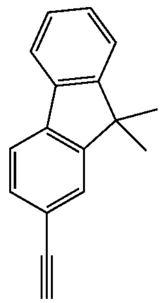 876726-86-2 | 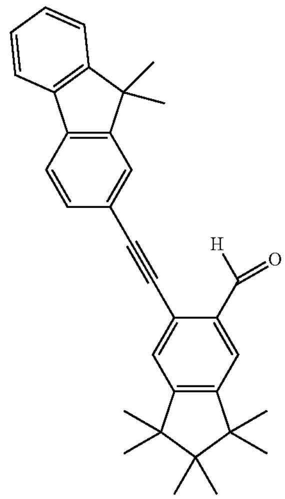 S62 | 66% |
| S63 | 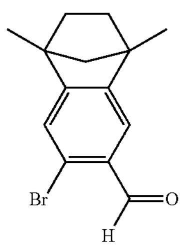 S55 | 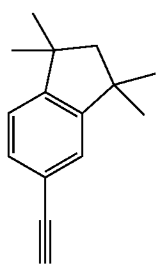 188889-51-2 | 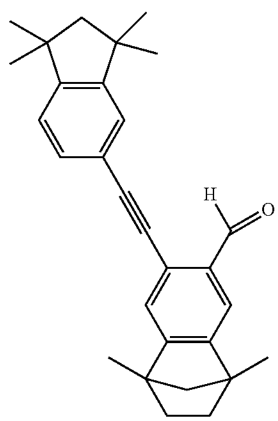 S63 | 67% |
| S64 | 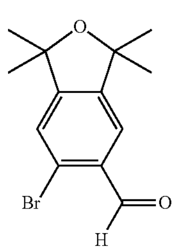 S56 | 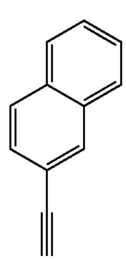 2949-26-0 | 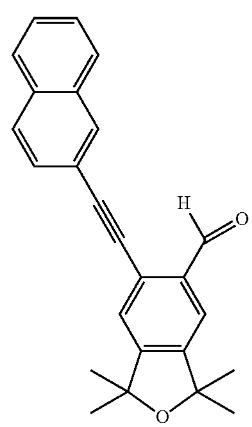 S64 | 70% |

-continued

| Ex. | Bromo- aryl-aldehyde | Alkyne | Product | Yield |
|---|---|---|---|---|
| S65 | 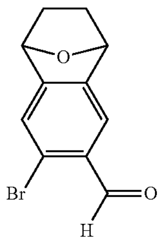 S57 | 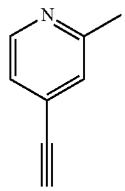 30413-56-0 | 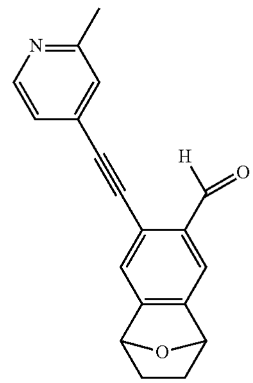 S65 | 56% |

B: Synthesis of the Ligands L

Example L1

2-(1,1,3,3-Tetramethylindan-5-yl)pyridine

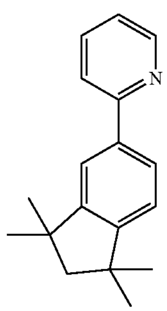 [SMILES: CC1(C)CC(C)(C)c2cc(-c3ccccn3)ccc21]

821 mg (2 mmol) of S-Phos and then 249 mg (1 mmol) of palladium(II) acetate are added to a mixture of 30.0 g (100 mmol) of pinacolyl 1,1,3,3-tetramethylindane-5-boronate, S4-B, 17.4 g (110 mmol) of 2-bromopyridine [109-04-6], 46.1 g (200 mmol) of tripotassium phosphate monohydrate, 300 ml of dioxane and 100 ml of water, and the mixture is heated under reflux for 16 h. After cooling, the aqueous phase is separated off, the organic phase is evaporated to dryness, the residue is taken up in 500 ml of ethyl acetate, the organic phase is washed three times with 200 ml of water each time, once with 200 ml of saturated sodium chloride solution, dried over magnesium sulfate, the desiccant is filtered off via a Celite bed, and the filtrate is re-evaporated to dryness. The oil obtained in this way is freed from low-boiling components and non-volatile secondary components by fractional bulb-tube distillation twice. Yield: 15.3 g (61 mmol), 61%; purity: about 99.5% according to $^1$H-NMR.

The following compounds are prepared analogously. Solids are freed from low-boiling components and non-volatile secondary components by recrystallisation and fractional sublimation (p about $10^{-4}$-$10^{-5}$ mbar, T about 160-240° C.). Oils are purified by chromatography, subjected to fractional bulb-tube distillation or dried in vacuo in order to remove low-boiling components.

| Ex. | Product Boronic acid ester | Bromide | Ligand | Yield |
|---|---|---|---|---|
| L2 | 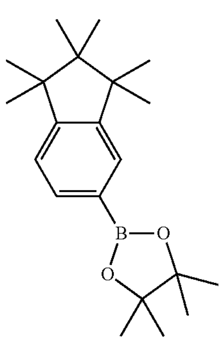 S5-B | 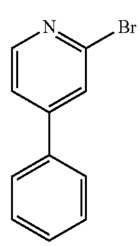 54151-74-5 | 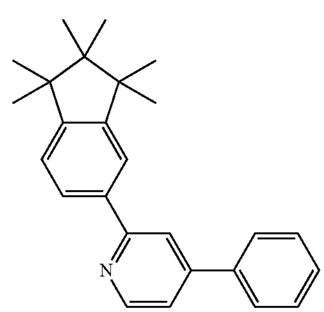 [SMILES: CC1(C)c2ccc(-c3cc(-c4ccccc4)ccn3)cc2C(C)(C)C1(C)C] | 66% |

-continued
| Ex. | Product Boronic acid ester | Bromide | Ligand | Yield |
|---|---|---|---|---|
| L3 | 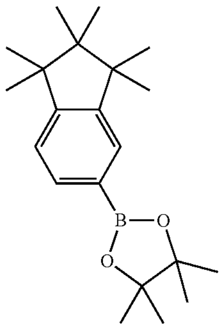 S5-B | 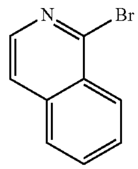 1532-71-4 | 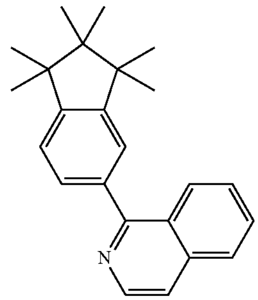 [SMILES: CC1(C)c2ccc(-c3nccc4ccccc34)cc2C(C)(C)C1(C)C] | 67% |
| L4 | 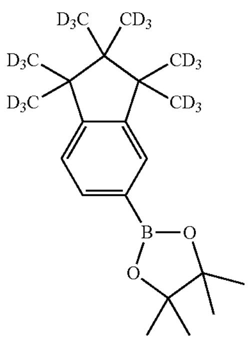 S6-B | 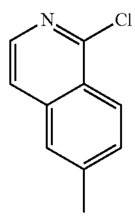 24188-79-2 | 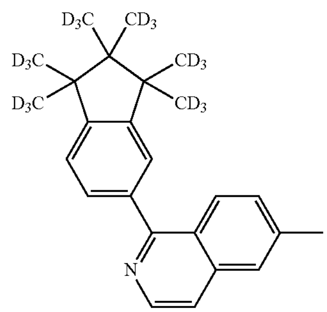 [SMILES: [2H]C([2H])([2H])C1(C([2H])([2H])[2H])c2ccc(-c3nccc4cc(C)ccc34)cc2C(C([2H])([2H])[2H])(C([2H])([2H])[2H])C1(C([2H])([2H])[2H])C([2H])([2H])[2H]] | 64% |
| L5 | 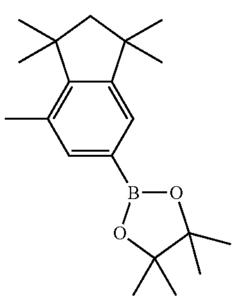 S7-B | 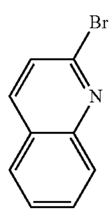 612-62-4 | 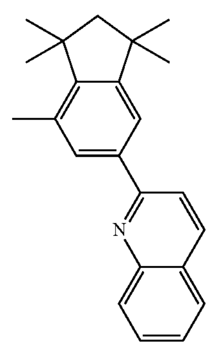 [SMILES: Cc1cc(-c2ccc3ccccc3n2)cc2c1C(C)(C)CC2(C)C] | 60% |
| L6 | 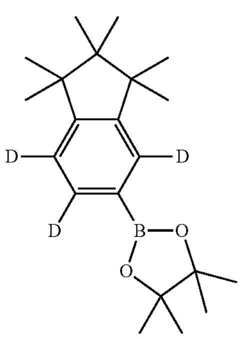 S8-B | 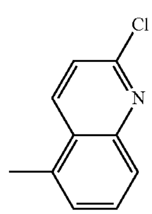 23952-31-0 | 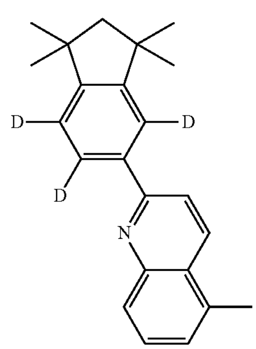 [SMILES: [2H]c1c([2H])c2c(c([2H])c1-c1ccc3c(C)cccc3n1)C(C)(C)CC2(C)C] | 61% |

-continued
| Ex. | Product Boronic acid ester | Bromide | Ligand | Yield |
|---|---|---|---|---|
| L7 | 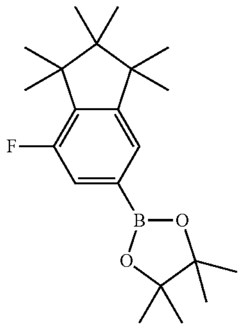 S9-B | 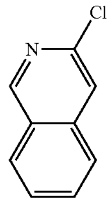 19493-45-9 | 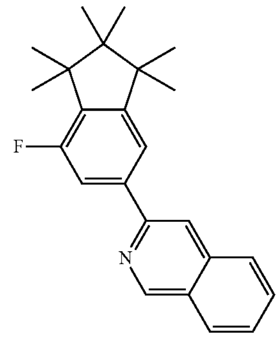 [SMILES: CC1(C)c2cc(-c3cc4ccccc4cn3)cc(F)c2C(C)(C)C1(C)C] | 63% |
| L8 | 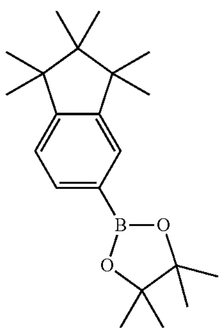 S10-B | 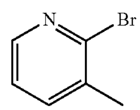 3430-17-9 | 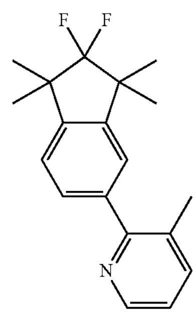 | 63% |
| L9 | 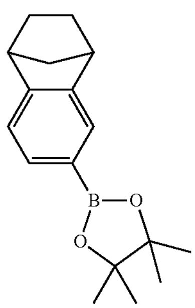 S11-B | 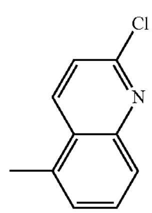 23952-31-0 | 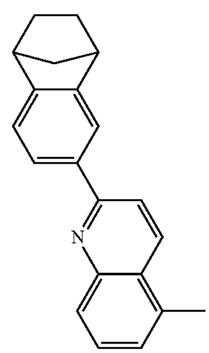 [SMILES: Cc1cccc2nc(-c3ccc4c(c3)C3CCC4C3)ccc12] | 58% |
| L10 | 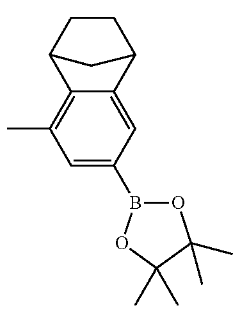 S12-B | 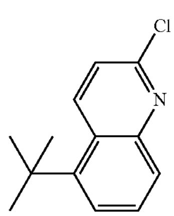 1251922-06-1 | 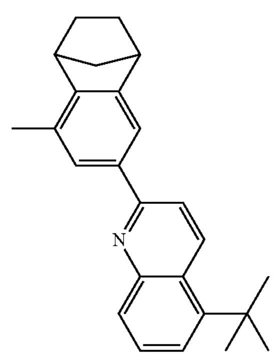 [SMILES: Cc1cc(-c2ccc3c(C(C)(C)C)cccc3n2)cc2c1C1CCC2C1] | 60% |

-continued
| Ex. | Product<br>Boronic acid ester | Bromide | Ligand | Yield |
| --- | --- | --- | --- | --- |
| L11 | 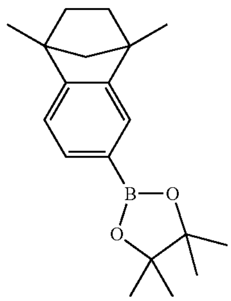<br>S13-B | 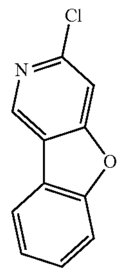<br>1251041-55-0 | 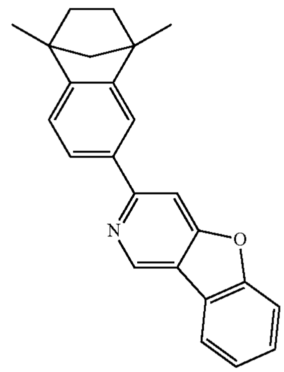 [SMILES: CC12CCC(C)(C1)c1cc(-c3cc4oc5ccccc5c4cn3)ccc12] | 54% |
| L12 | 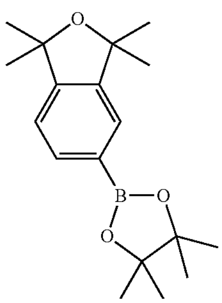<br>S-14-B | 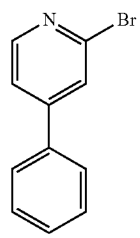<br>5451-74-5 | 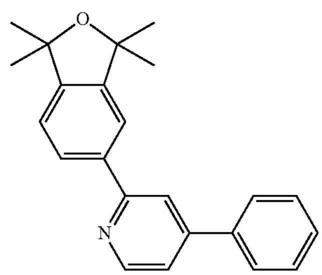 [SMILES: CC1(C)OC(C)(C)c2cc(-c3cc(-c4ccccc4)ccn3)ccc21] | 59% |
| L13 | 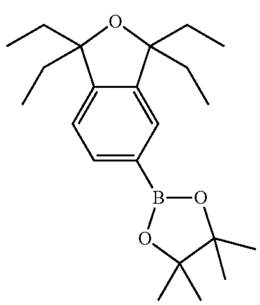<br>S15-B | 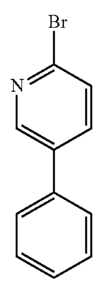<br>107351-82-6 | 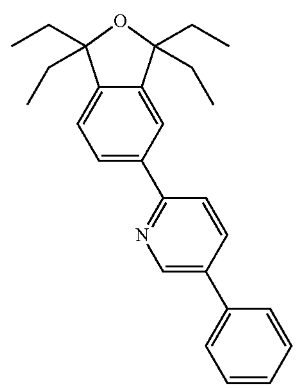 [SMILES: CCC1(CC)OC(CC)(CC)c2cc(-c3ccc(-c4ccccc4)cn3)ccc21] | 61% |
| L14 | 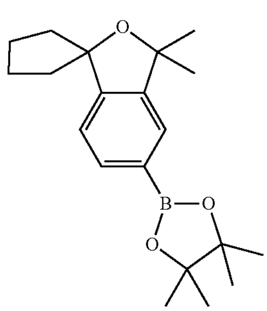<br>S16-B | 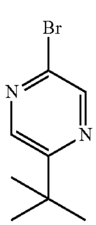<br>959238-69-8 | 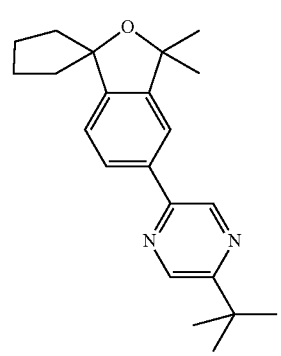 [SMILES: CC(C)(C)c1cnc(-c2ccc3c(c2)C(C)(C)OC32CCCC2)cn1] | 48% |

-continued
| Ex. | Product<br>Boronic acid ester | Bromide | Ligand | Yield |
|---|---|---|---|---|
| L15 | 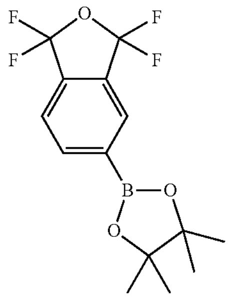<br>S17-B | 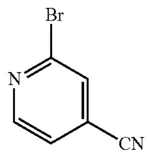<br>10386-27-3 | 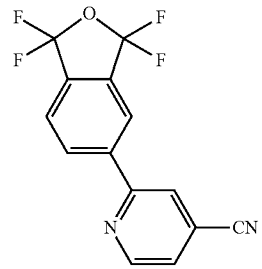 [SMILES: N#Cc1ccnc(-c2ccc3c(c2)C(F)(F)OC3(F)F)c1] | 46% |
| L16 | 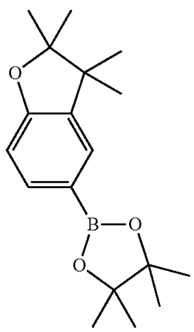<br>S18-B | 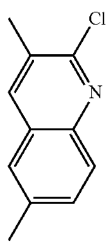<br>132118-28-6 | 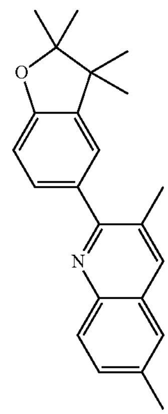 [SMILES: Cc1ccc2nc(-c3ccc4c(c3)C(C)(C)C(C)(C)O4)c(C)cc2c1] | 66% |
| L17 | 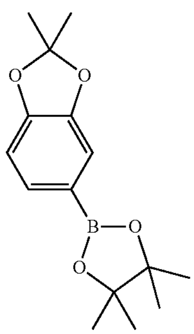<br>S19-B | 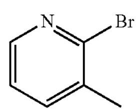<br>3430-17-9 | 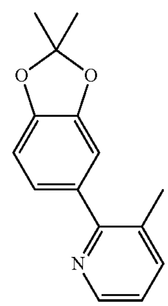 [SMILES: Cc1cccnc1-c1ccc2c(c1)OC(C)(C)O2] | 58% |
| L18 | 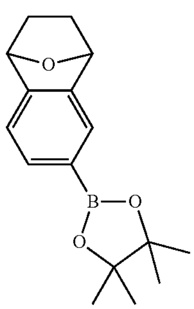<br>S20-B | 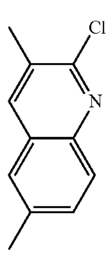<br>132118-28-6 | 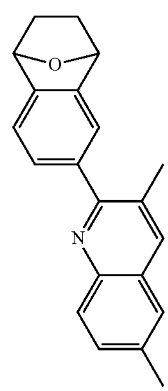 [SMILES: Cc1ccc2nc(-c3ccc4c(c3)C3CCC4O3)c(C)cc2c1] | 59% |

-continued
| Ex. | Product Boronic acid ester | Bromide | Ligand | Yield |
|---|---|---|---|---|
| L19 | 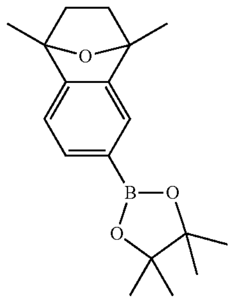 S21-B | 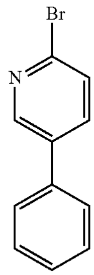 107351-82-6 | 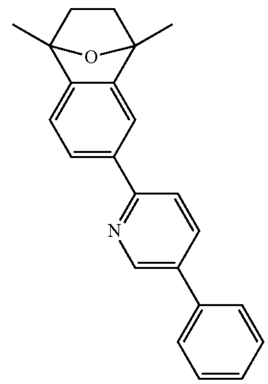 [SMILES: CC12CCC(C)(O1)c1cc(-c3ccc(-c4ccccc4)cn3)ccc12] | 63% |
| L20 | 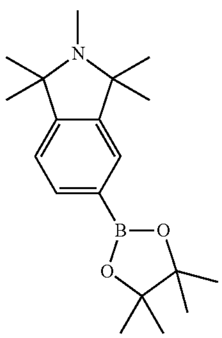 S22-B | 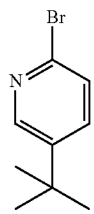 1142197-19-0 | 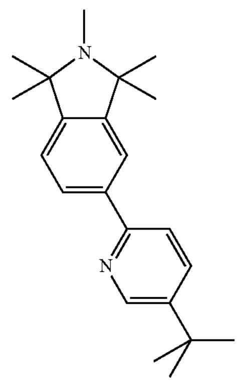 [SMILES: CN1C(C)(C)c2ccc(-c3ccc(C(C)(C)C)cn3)cc2C1(C)C] | 65% |
| L21 | 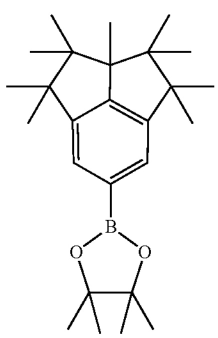 S23-B | 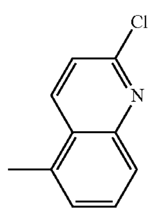 23952-31-0 | 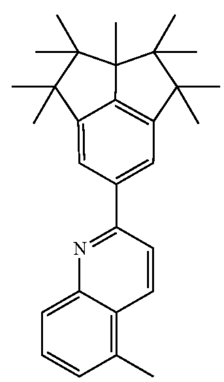 | 60% |
| L22 | 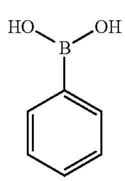 98-80-6 | 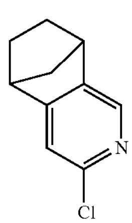 106203-65-0 | 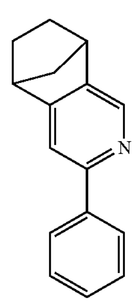 [SMILES: c1ccc(-c2cc3c(cn2)C2CCC3C2)cc1] | 64% |

-continued
| Ex. | Product Boronic acid ester | Bromide | Ligand | Yield |
| --- | --- | --- | --- | --- |
| L23 | 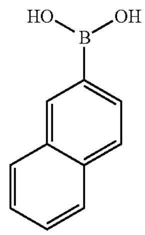 32316-92-0 | 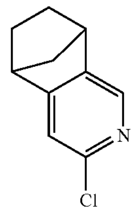 106203-65-0 | 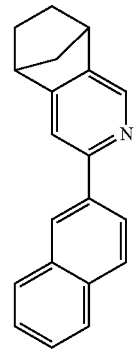 [SMILES: c1ccc2cc(-c3cc4c(cn3)C3CCC4C3)ccc2c1] | 66% |
| L24 | 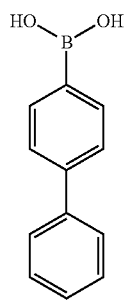 5122-94-1 | 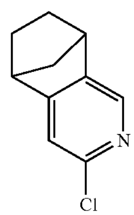 106203-65-0 | 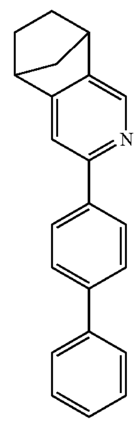 [SMILES: c1ccc(-c2ccc(-c3cc4c(cn3)C3CCC4C3)cc2)cc1] | 68% |
| L25 | 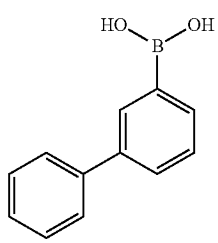 5122-95-2 | 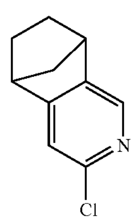 106203-65-0 | 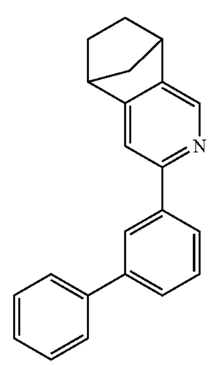 [SMILES: c1ccc(-c2cccc(-c3cc4c(cn3)C3CCC4C3)c2)cc1] | 63% |

-continued
| Ex. | Product<br>Boronic acid ester | Bromide | Ligand | Yield |
|---|---|---|---|---|
| L26 | 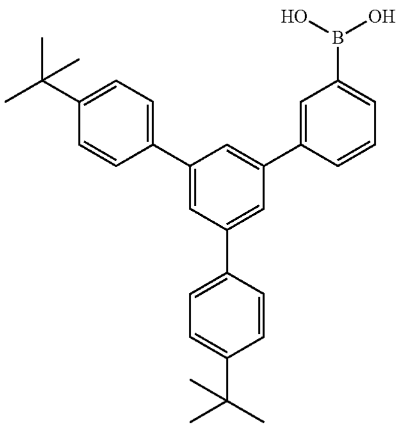<br>253280-21-6 | 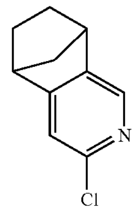<br>106203-65-0 | 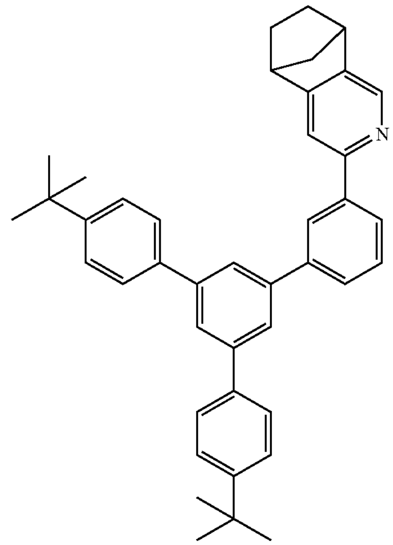 [SMILES: CC(C)(C)c1ccc(-c2cc(-c3ccc(C(C)(C)C)cc3)cc(-c3cccc(-c4cc5c(cn4)C4CCC5C4)c3)c2)cc1] | 45% |
| L27 | 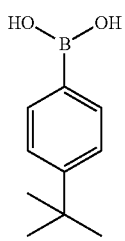<br>123324-71-0 | 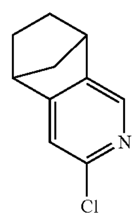<br>106203-65-0 | 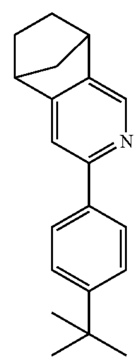 [SMILES: CC(C)(C)c1ccc(-c2cc3c(cn2)C2CCC3C2)cc1] | 64% |
| L28 | 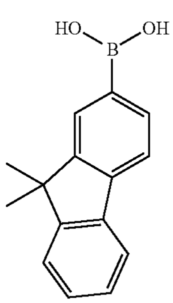<br>333432-28-3 | 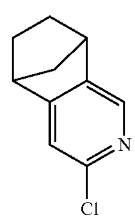<br>106203-65-0 | 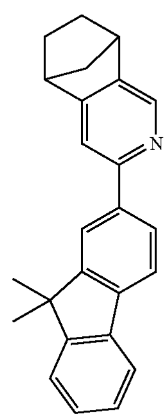 [SMILES: CC1(C)c2ccccc2-c2ccc(-c3cc4c(cn3)C3CCC4C3)cc21] | 65% |

-continued
| Ex. | Product Boronic acid ester | Bromide | Ligand | Yield |
|---|---|---|---|---|
| L29 | 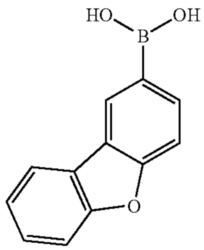 402936-15-6 | 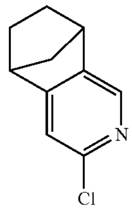 106203-65-0 | 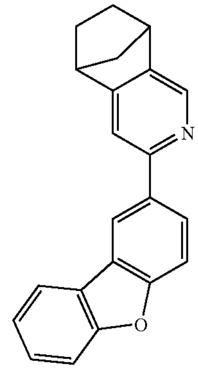 [SMILES: c1ccc2c(c1)oc1ccc(-c3cc4c(cn3)C3CCC4C3)cc12] | 66% |
| L30 | 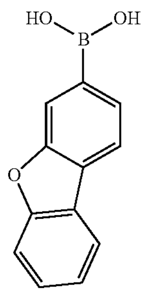 395087-89-5 | 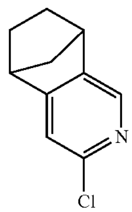 106203-65-0 | 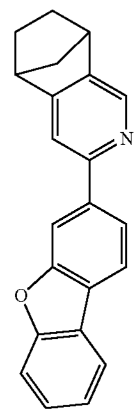 [SMILES: c1ccc2c(c1)oc1cc(-c3cc4c(cn3)C3CCC4C3)ccc12] | 67% |
| L31 | 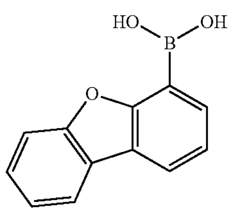 100124-06-9 | 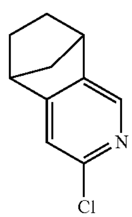 106203-65-0 | 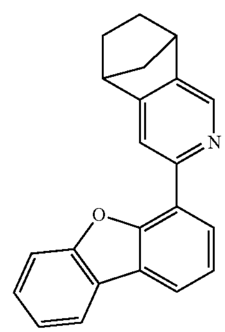 [SMILES: c1ccc2c(c1)oc1c(-c3cc4c(cn3)C3CCC4C3)cccc12] | 51% |
| L32 | 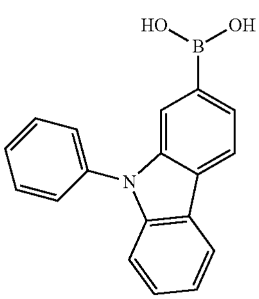 1001911-63-2 | 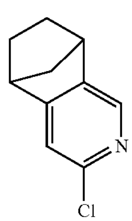 106203-65-0 | 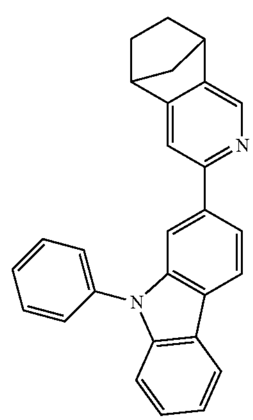 [SMILES: c1ccc(-n2c3ccccc3c3ccc(-c4cc5c(cn4)C4CCC5C4)cc32)cc1] | 64% |

-continued
| Ex. | Product<br>Boronic acid ester | Bromide | Ligand | Yield |
|---|---|---|---|---|
| L33 | 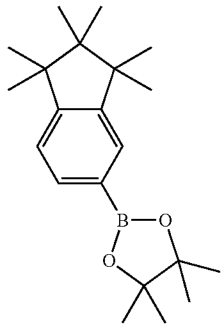<br>S5-B | 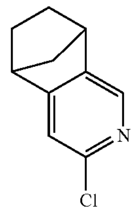<br>106203-65-0 | 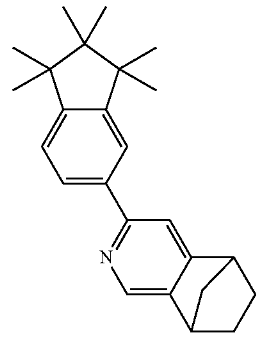 [SMILES: CC1(C)c2ccc(-c3cc4c(cn3)C3CCC4C3)cc2C(C)(C)C1(C)C] | 63% |
| L34 | 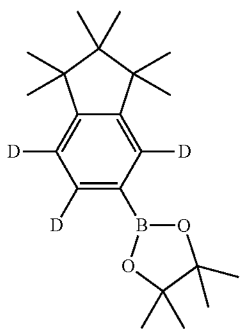<br>S8-B | 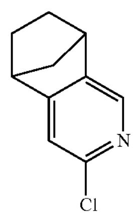<br>106203-65-0 | 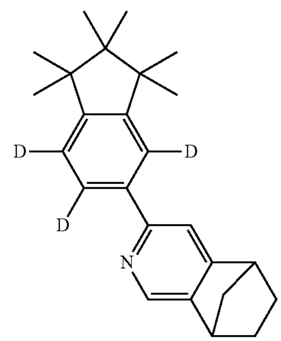 [SMILES: [2H]c1c([2H])c2c(c([2H])c1-c1cc3c(cn1)C1CCC3C1)C(C)(C)C(C)(C)C2(C)C] | 61% |
| L35 | 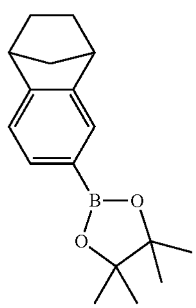<br>S11-B | 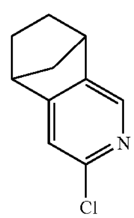<br>106203-65-0 | 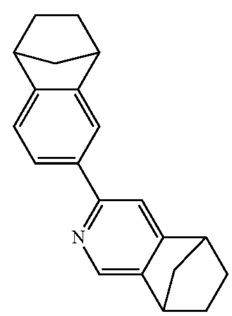<br>Diastereomer mixture | 61% |
| L36 | 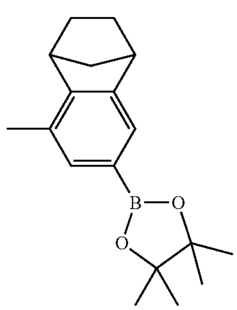<br>S12-B | 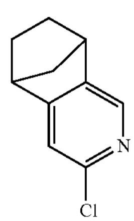<br>106203-65-0 | 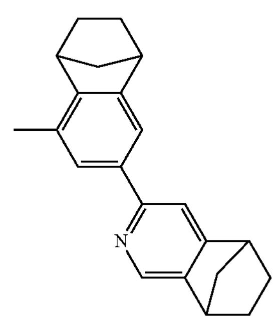<br>Diastereomer mixture | 62% |

-continued
| Ex. | Product<br>Boronic acid ester | Bromide | Ligand | Yield |
| --- | --- | --- | --- | --- |
| L37 | 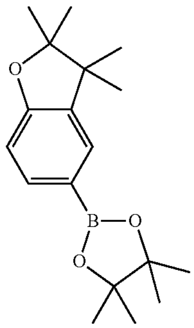<br>S18-B | 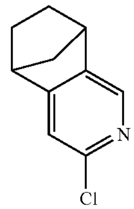<br>106203-65-0 | 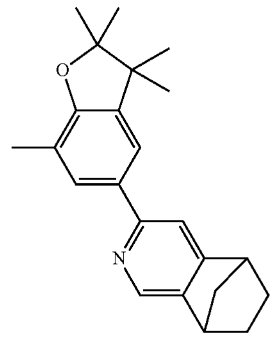 [SMILES: Cc1cc(-c2cc3c(cn2)C2CCC3C2)cc2c1OC(C)(C)C2(C)C] | 49% |
| L38 | 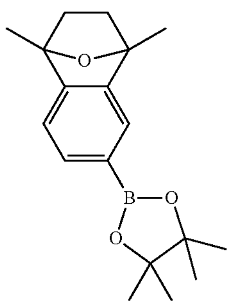<br>S21-B | 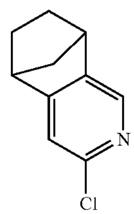<br>106203-65-0 | 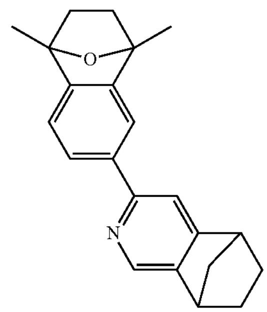<br>Diastereomer mixture | 57% |
| L39 | 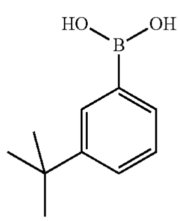<br>560132-24-3 | 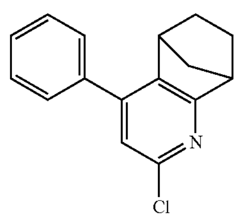<br>132813-32-2 | 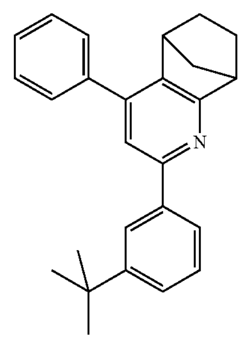 [SMILES: CC(C)(C)c1cccc(-c2cc(-c3ccccc3)c3c(n2)C2CCC3C2)c1] | 60% |
| L40 | 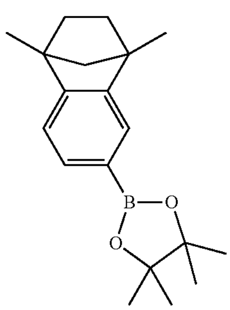<br>S13-B | 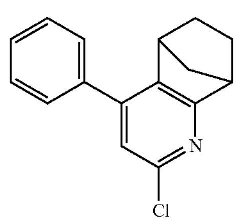<br>132813-32-2 | 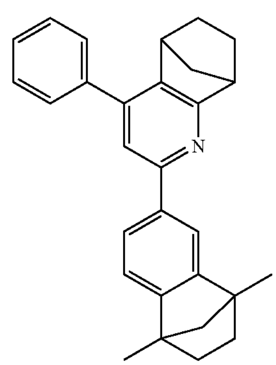<br>Diastereomer mixture | 59% |

-continued

| Ex. | Product Boronic acid ester | Bromide | Ligand | Yield |
|---|---|---|---|---|
| L41 | 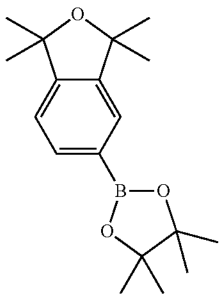 S-14-B | 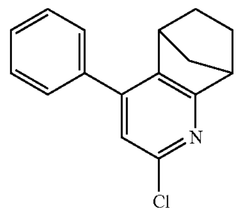 132813-32-2 | 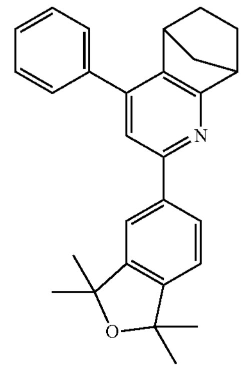 [SMILES: CC1(C)OC(C)(C)c2cc(-c3cc(-c4ccccc4)c4c(n3)C3CCC4C3)ccc21] | 53% |

Example 42

5,5,7,7-Tetramethyl-3-phenyl-6,7-dihydro-5H-[2]pyridine, L42

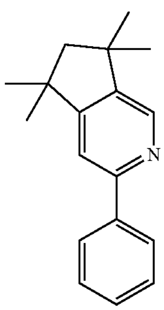 [SMILES: CC1(C)CC(C)(C)c2cc(-c3ccccc3)ncc21]

Procedure analogous to A. Mazzanti et al., Eur. J. Org. Chem., 2011, 6725.

40 ml (100 mmol) of n-butyllithium, 2.5 M in n-hexane, are added dropwise to a mixture, cooled to −78° C., of 10.5 ml (100 mmol) of bromobenzene and 500 ml of diethyl ether, and the mixture is stirred for a further 30 min. 17.5 g (100 mmol) of 5,5,7,7-tetramethyl-6,7-dihydro-5H-[2]pyridine, S24, are then added dropwise, the mixture is allowed to warm to room temperature, stirred for a further 12 h, quenched by addition of 100 ml of water, the organic phase is separated off, dried over magnesium sulfate. After removal of the solvent, the oily residue is chromatographed on silica gel with diethyl ether:n-heptane (3:7, v:v) and subsequently subjected to fractional bulb-tube distillation twice. Yield: 12.1 g (48 mmol), 48%; purity: about 99.5% according to $^1$H-NMR.

The following compounds can be prepared analogously. Solids are freed from low-boiling components and non-volatile secondary components by recrystallisation and fractional sublimation (p about $10^{-4}$-$10^{-5}$ mbar, T about 160-240° C.). Oils are purified by chromatography, subjected to fractional bulb-tube distillation or dried in vacuo in order to remove low-boiling components.

| Ex. | Pyridine | Bromide | Ligand | Yield |
|---|---|---|---|---|
| L43 | 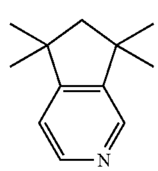 S24 | 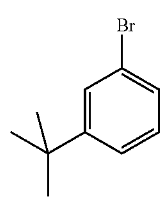 3972-64-3 | 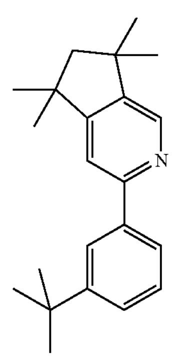 [SMILES: CC(C)(C)c1cccc(-c2cc3c(cn2)C(C)(C)CC3(C)C)c1] | 50% |

-continued
| Ex. | Pyridine | Bromide | Ligand | Yield |
|---|---|---|---|---|
| L44 | 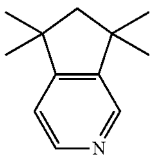 S24 | 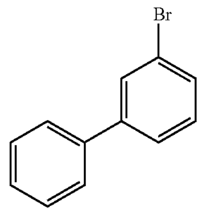 2113-57-7 | 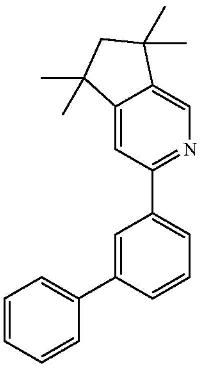 [SMILES: CC1(C)CC(C)(C)c2cc(-c3cccc(-c4ccccc4)c3)ncc21] | 48% |
| L45 | 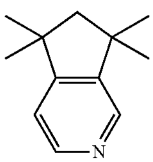 S24 | 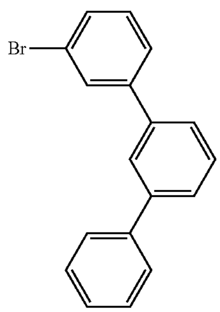 98905-03-4 | 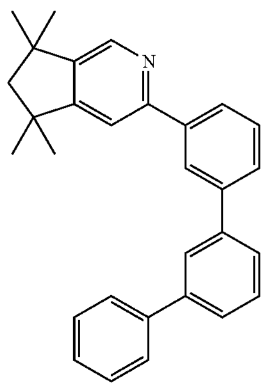 [SMILES: CC1(C)CC(C)(C)c2cc(-c3cccc(-c4cccc(-c5ccccc5)c4)c3)ncc21] | 46% |
| L46 | 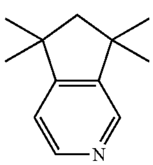 S24 | 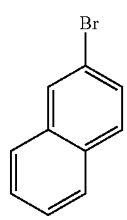 580-13-2 | 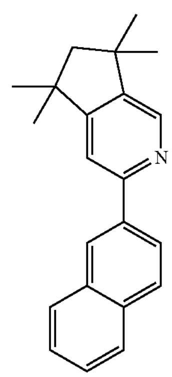 [SMILES: CC1(C)CC(C)(C)c2cc(-c3ccc4ccccc4c3)ncc21] | 50% |
| L47 | 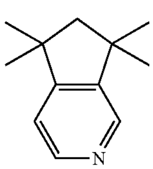 S24 | 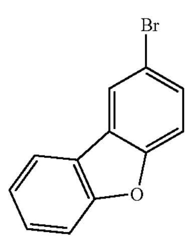 86-76-0 | 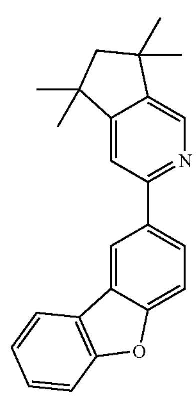 [SMILES: CC1(C)CC(C)(C)c2cc(-c3ccc4oc5ccccc5c4c3)ncc21] | 47% |

-continued
| Ex. | Pyridine | Bromide | Ligand | Yield |
|---|---|---|---|---|
| L48 | 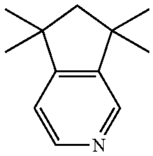 S24 | 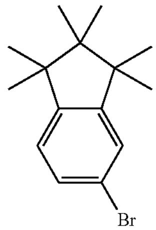 S5-Br | 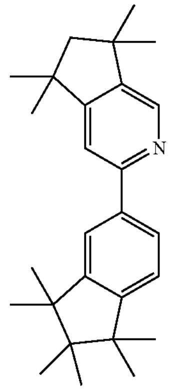 [SMILES: CC1(C)CC(C)(C)c2cc(-c3ccc4c(c3)C(C)(C)C(C)(C)C4(C)C)ncc21] | 51% |
| L49 | 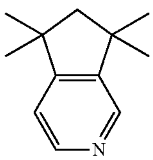 S24 | 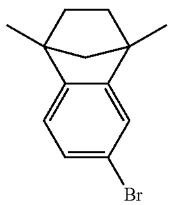 S13-Br | 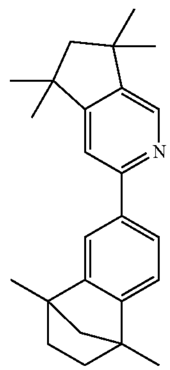 | 49% |
| L50 | 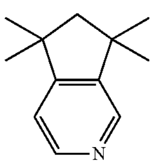 S24 | 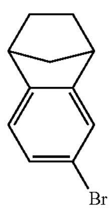 16499-72-2 S11-Br | 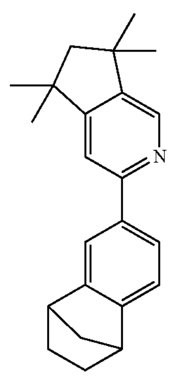 [SMILES: CC1(C)CC(C)(C)c2cc(-c3ccc4c(c3)C3CCC4C3)ncc21] | 45% |
| L51 | 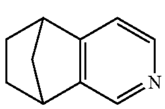 S25 | 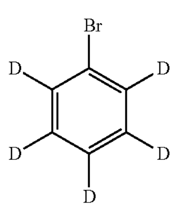 4165-57-5 | 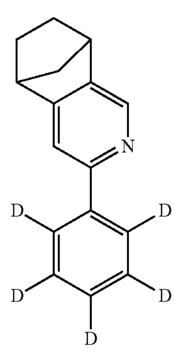 | 46% |

-continued

| Ex. | Pyridine | Bromide | Ligand | Yield |
|---|---|---|---|---|
| L52 | 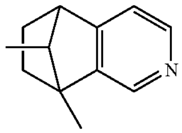 S26 | 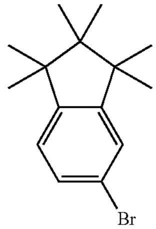 S5-Br | 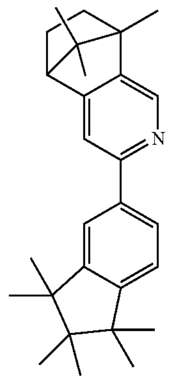 | 40% |

Example 53

6,6,7,7,8,8-Hexamethyl-2-phenyl-7,8-dihydro-6H-cyclopenta[g]quinoxaline, L53

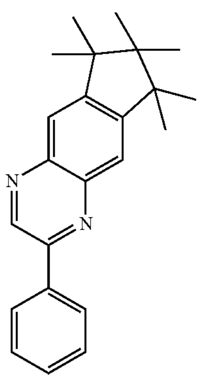 [SMILES: CC1(C)c2cc3ncc(-c4ccccc4)nc3cc2C(C)(C)C1(C)C]

Procedure analogous to S. V. More et al., Tetrahedron Lett. 2005, 46, 6345.

A mixture of 23.2 g (100 mmol) of 1,1,2,2,3,3-hexamethylindane-5,6-diamine, S35, 13.4 g (100 mmol) of oxophenylacetaldehyde [1074-12-0], 767 mg (3 mmol) of iodine and 75 ml of acetonitrile is stirred at room temperature for 16 h. The precipitated solid is filtered off with suction, washed once with 20 ml of acetonitrile, twice with 75 ml of n-heptane each time and then recrystallised twice from ethanol/ethyl acetate. Finally, the solid is freed from low-boiling components and non-volatile secondary components by fractional sublimation (p about $10^{-4}$-$10^{-5}$ mbar, T about 220° C.). Yield: 22.1 g (67 mmol), 67%; purity: about 99.5% according to $^{1}$H-NMR.

The following compounds are prepared analogously. Solids are freed from low-boiling components and non-volatile secondary components by recrystallisation and fractional sublimation (p about $10^{-4}$-$10^{-5}$ mbar, T about 160-240° C.). Oils are purified by chromatography, subjected to fractional bulb-tube distillation or dried in vacuo in order to remove low-boiling components.

| Ex. | Diamine | Diketone | Ligand | Yield |
|---|---|---|---|---|
| L54 | 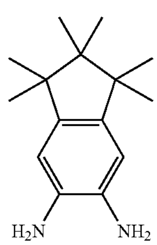 S35 | 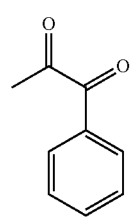 579-07-7 | 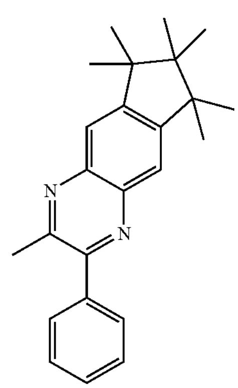 | 58% |

-continued
| Ex. | Diamine | Diketone | Ligand | Yield |
|---|---|---|---|---|
| L55 | 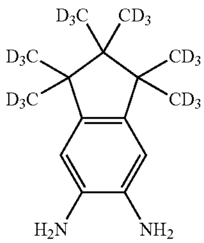 S36 | 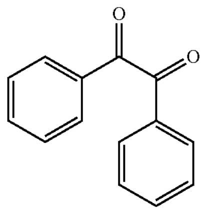 134-81-6 | 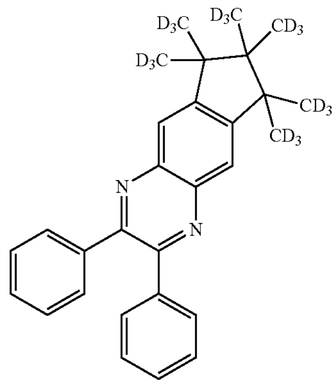 [SMILES: [2H]C([2H])([2H])C1(C([2H])([2H])[2H])c2cc3nc(-c4ccccc4)c(-c4ccccc4)nc3cc2C(C([2H])([2H])[2H])(C([2H])([2H])[2H])C1(C([2H])([2H])[2H])C([2H])([2H])[2H]] | 69% |
| L56 | 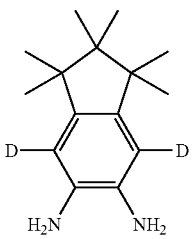 S38 | 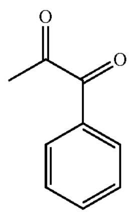 579-07-7 | 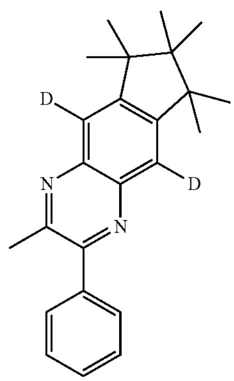 | 60% |
| L57 | 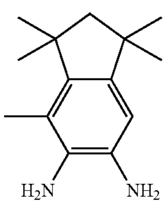 S39 | 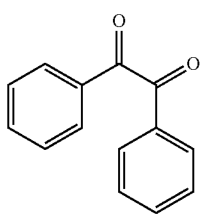 134-81-6 | 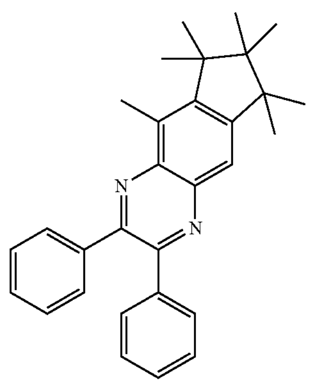 [SMILES: Cc1c2c(cc3nc(-c4ccccc4)c(-c4ccccc4)nc13)C(C)(C)C(C)(C)C2(C)C] | 70% |
| L58 | 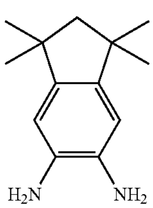 S37 | 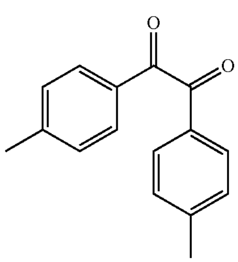 3457-48-5 | 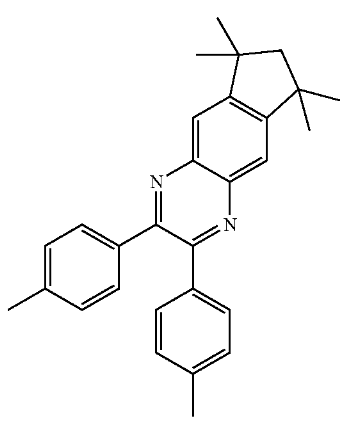 | 48% |

-continued
| Ex. | Diamine | Diketone | Ligand | Yield |
|---|---|---|---|---|
| L59 | 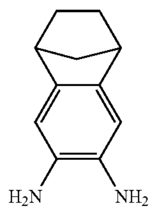 124639-03-8 | 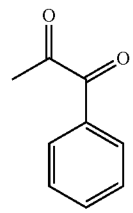 579-07-7 | 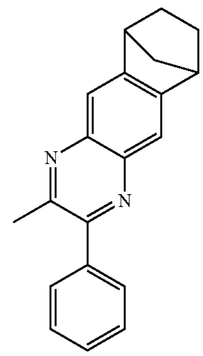 [SMILES: Cc1nc2cc3c(cc2nc1-c1ccccc1)C1CCC3C1] | 55% |
| L60 | 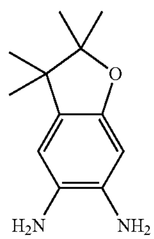 S40 | 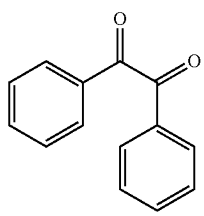 134-81-6 | 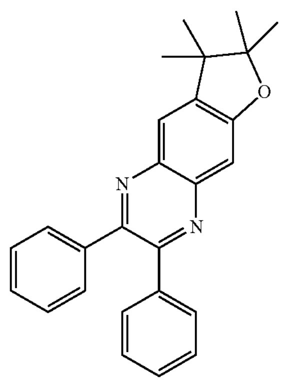 [SMILES: CC1(C)Oc2cc3nc(-c4ccccc4)c(-c4ccccc4)nc3cc2C1(C)C] | 68% |
| L61 | 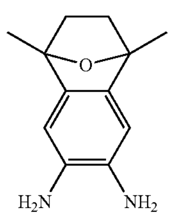 S41 | 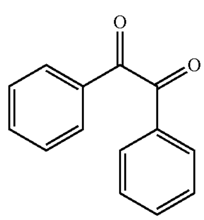 134-81-6 | 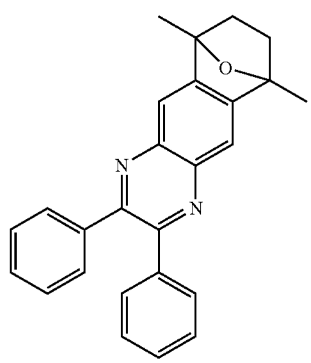 [SMILES: CC12CCC(C)(O1)c1cc3nc(-c4ccccc4)c(-c4ccccc4)nc3cc12] | 59% |
| L62 | 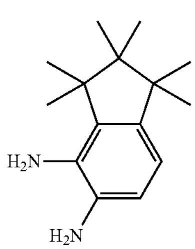 S35b | 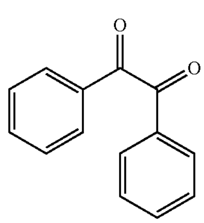 134-81-6 | 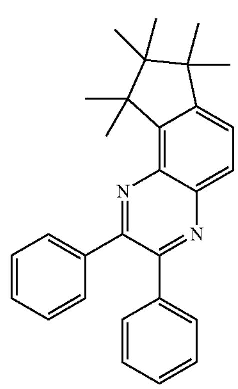 [SMILES: CC1(C)c2ccc3nc(-c4ccccc4)c(-c4ccccc4)nc3c2C(C)(C)C1(C)C] | 62% |

-continued

| Ex. | Diamine | Diketone | Ligand | Yield |
|---|---|---|---|---|
| L63 | 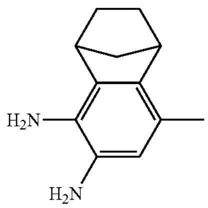<br>S42 | 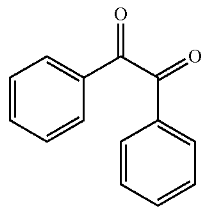<br>134-81-6 | 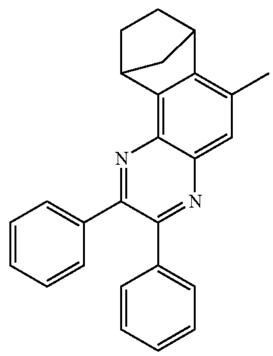 [SMILES: Cc1cc2nc(-c3ccccc3)c(-c3ccccc3)nc2c2c1C1CCC2C1] | 51% |

Example 64

5,5,6,6,7,7-Hexamethyl-1,2-diphenyl-1,5,6,7-tetrahydroindeno [5,6-d]imidazol, L64

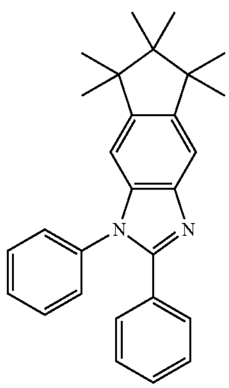 [SMILES: CC1(C)c2cc3nc(-c4ccccc4)n(-c4ccccc4)c3cc2C(C)(C)C1(C)C]

Procedure analogous to D. Zhao et al., Org. Lett., 2011, 13, 24, 6516. A mixture of 36.0 g (100 mmol) of 5,6-dibromo-1,1,2,2,3,3-hexamethylindane, 21.6 g (110 mmol) of N-phenylbenzamidine [1527-91-9], 97.8 g (300 mmol) of caesium carbonate, 100 g of molecular sieve 4A, 1.2 g (2 mmol) of xantphos, 449 mg (2 mmol) of palladium(II) acetate and 600 ml of o-xylene is heated under reflux with vigorous stirring for 24 h. After cooling, the salts are filtered off with suction via a Celite bed, rinsed with 500 ml of o-xylene, the solvent is removed in vacuo, and the residue is recrystallised three times from cyclohexane/ethyl acetate. Finally, the solid is freed from low-boiling components and non-volatile secondary components by fractional sublimation (p about $10^{-4}$-$10^{-5}$ mbar, T about 230° C.). Yield: 28.0 g (71 mmol), 71%; purity: about 99.5% according to $^{1}$H-NMR.

The following compounds are prepared analogously. Solids are freed from low-boiling components and non-volatile secondary components by recrystallisation and fractional sublimation (p about $10^{-4}$-$10^{-5}$ mbar, T about 160-240° C.). Oils can be purified by chromatography, subjected to fractional bulb-tube distillation or dried in vacuo in order to remove low-boiling components.

| Ex. | 1,2-Dihalogen compound | Benzamidine | Ligand | Yield |
|---|---|---|---|---|
| L65 | 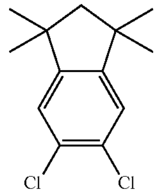<br>1311465-45-8 | 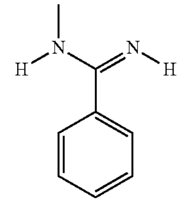<br>34028-17-6 | 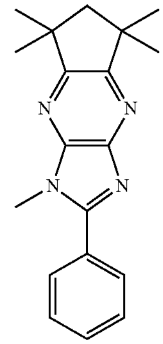 | 75% |

-continued
| Ex. | 1,2-Dihalogen compound | Benzamidine | Ligand | Yield |
|---|---|---|---|---|
| L66 | 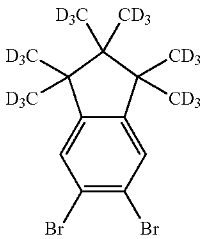 S28 | 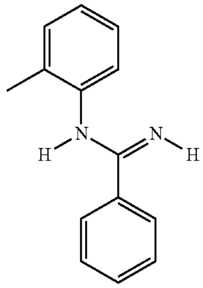 57327-73-8 | 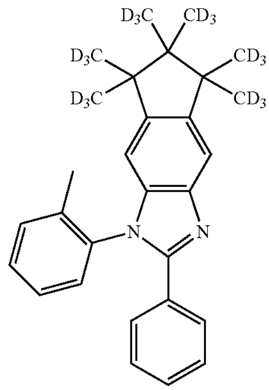 [SMILES: [2H]C([2H])([2H])C1(C([2H])([2H])[2H])c2cc3nc(-c4ccccc4)n(-c4ccccc4C)c3cc2C(C([2H])([2H])[2H])(C([2H])([2H])[2H])C1(C([2H])([2H])[2H])C([2H])([2H])[2H]] | 77% |
| L67 | 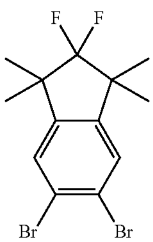 S29 | 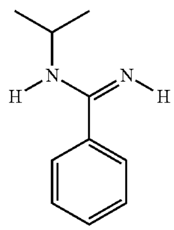 53510-31-9 | 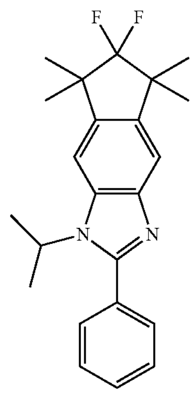 [SMILES: CC(C)n1c(-c2ccccc2)nc2cc3c(cc21)C(C)(C)C(F)(F)C3(C)C] | 73% |
| L68 | 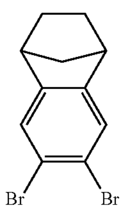 42810-32-2 | 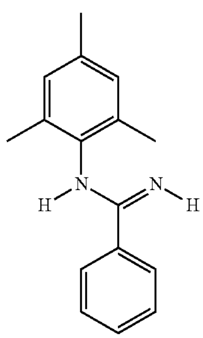 72340-27-3 | 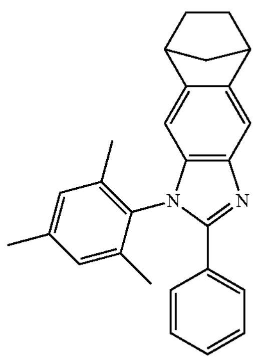 [SMILES: Cc1cc(C)c(-n2c(-c3ccccc3)nc3cc4c(cc32)C2CCC4C2)c(C)c1] | 68% |
| L69 | 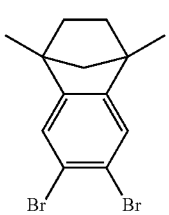 S30 | 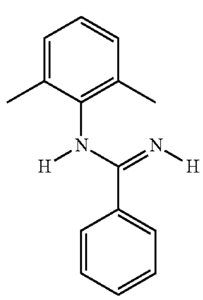 16239-27-3 | 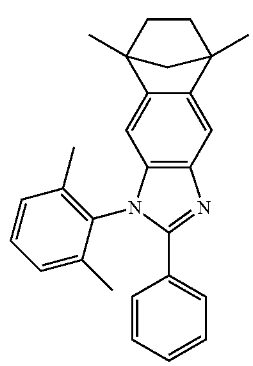 [SMILES: Cc1cccc(C)c1-n1c(-c2ccccc2)nc2cc3c(cc21)C1(C)CCC3(C)C1] | 69% |

-continued
| Ex. | 1,2-Dihalogen compound | Benzamidine | Ligand | Yield |
|---|---|---|---|---|
| L70 | 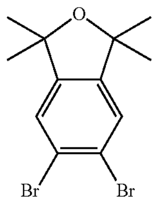 S31 | 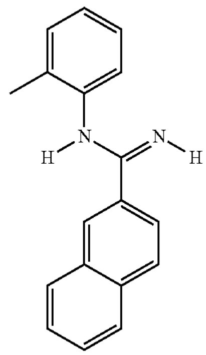 856062-57-2 | 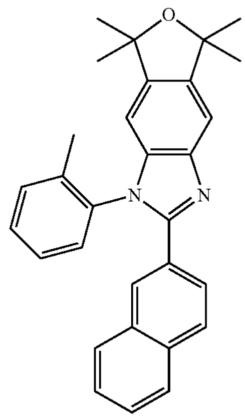 [SMILES: Cc1ccccc1-n1c(-c2ccc3ccccc3c2)nc2cc3c(cc21)C(C)(C)OC3(C)C] | 71% |
| L71 | 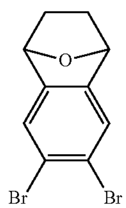 S32 | 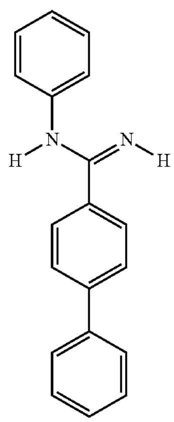 64499-61-2 | 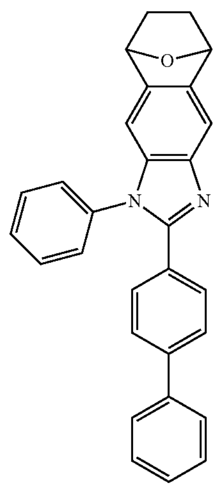 [SMILES: c1ccc(-c2ccc(-c3nc4cc5c(cc4n3-c3ccccc3)C3CCC5O3)cc2)cc1] | 64% |
| L72 | 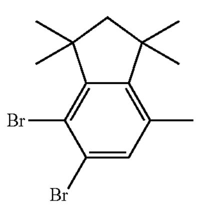 S33 | 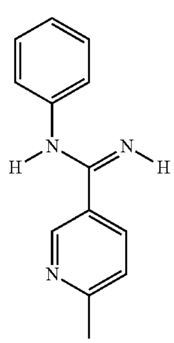 787563-35-3 | 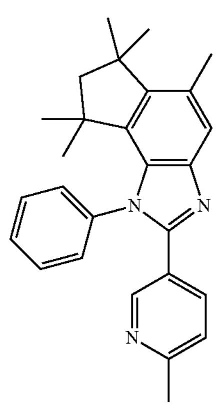 [SMILES: Cc1ccc(-c2nc3cc(C)c4c(c3n2-c2ccccc2)C(C)(C)CC4(C)C)cn1] | 36% |

-continued
| Ex. | 1,2-Dihalogen compound | Benzamidine | Ligand | Yield |
|---|---|---|---|---|
| L73 | 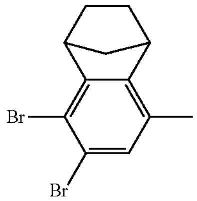 S34 | 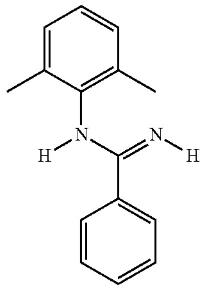 16239-27-3 | 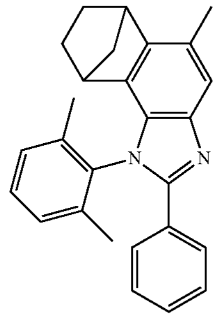 [SMILES: Cc1cc2nc(-c3ccccc3)n(-c3c(C)cccc3C)c2c2c1C1CCC2C1] | 44% |
| L74 | 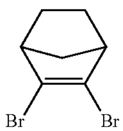 75267-72-0 | 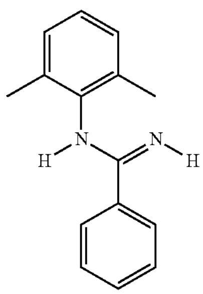 16239-27-3 | 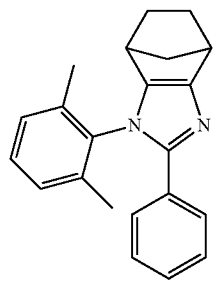 [SMILES: Cc1cccc(C)c1-n1c(-c2ccccc2)nc2c1C1CCC2C1] | 43% |
| L75 | 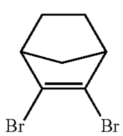 75267-72-0 | 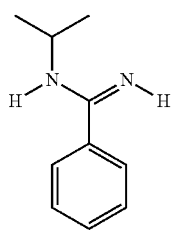 53510-31-9 | 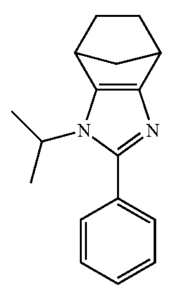 [SMILES: CC(C)n1c(-c2ccccc2)nc2c1C1CCC2C1] | 40% |
| L76 | 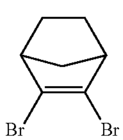 75267-72-0 | 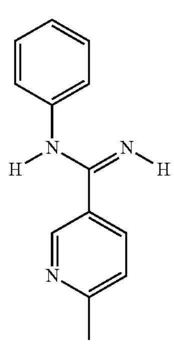 787563-35-3 | 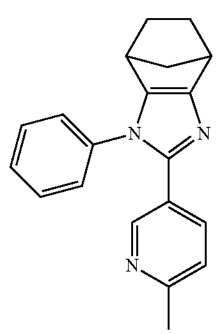 [SMILES: Cc1ccc(-c2nc3c(n2-c2ccccc2)C2CCC3C2)cn1] | 38% |

-continued

| Ex. | 1,2-Dihalogen compound | Benzamidine | Ligand | Yield |
|---|---|---|---|---|
| L77 | 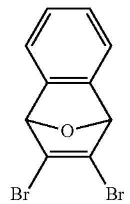 301829-08-3 | 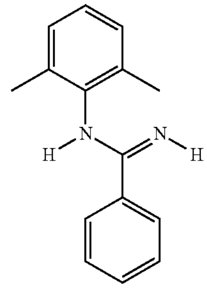 16239-27-3 | 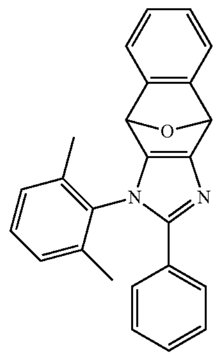 [SMILES: Cc1cccc(C)c1-n1c(-c2ccccc2)nc2c1C1OC2c2ccccc21] | 39% |

Example 78

1,5,5,6,6,7,7-Heptamethyl-3-phenyl-1,5,6,7-tetrahydroindeno[5,6-d]imidazolium iodide, L78

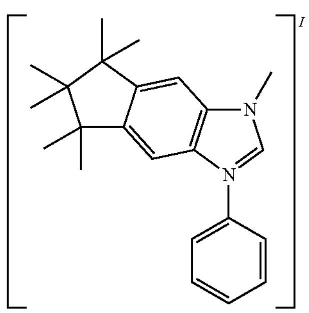

A) 5,5,6,6,7,7-Hexamethyl-1,5,6,7-tetrahydroindeno [5,6-d]imidazole

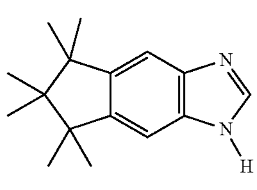 [SMILES: CC1(C)c2cc3nc[nH]c3cc2C(C)(C)C1(C)C]

Procedure analogous to Z.-H. Zhang et al., J. Heterocycl. Chem. 2007, 44, 6, 1509. 1.3 g (5 mmol) of iodine are added to a vigorously stirred mixture of 116.2 g (500 mmol) of 1,1,2,2,3,3-hexamethylindane-5,6-diamine, S35, 90.9 ml (550 mmol) of triethoxymethane [122-51-0] and 400 ml of acetonitrile, and the mixture is stirred at room temperature for 5 h. The precipitated solid is filtered off with suction, washed once with a little acetonitrile, three times with 100 ml of n-heptane each time and dried in vacuo. Yield: 108.8 g (449 mmol), 90%; purity: about 97% according to $^1$H-NMR.

B) 5,5,6,6,7,7-Hexamethyl-1-phenyl-1,5,6,7-tetrahydroindeno[5,6-d]-imidazole

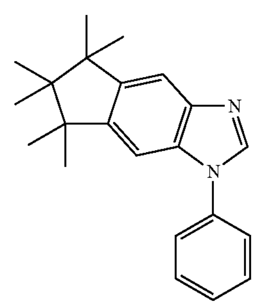 [SMILES: CC1(C)c2cc3ncn(-c4ccccc4)c3cc2C(C)(C)C1(C)C]

Procedure analogous to S. Zhang et al., Chem. Commun. 2008, 46, 6170. A mixture of 24.2 g (100 mmol) of 5,5,6,6,7,7-hexamethyl-1,5,6,7-tetrahydroindeno[5,6-d]imidazole, A), 12.6 ml (120 mmol) of bromobenzene [108-86-1], 27.6 g (200 mmol) of potassium carbonate, 952 mg (5 mmol) of copper(I) iodide, 1.0 g (10 mmol) of N,N-dimethylglycine, 200 g of glass beads (diameter 3 mm) and 300 ml of DMSO is heated at 120° C. with vigorous stirring for 36 h. After cooling, the salts are filtered off with suction, rinsed with 1000 ml of ethyl acetate, the combined org. phases are washed five times with 500 ml of water each time, once with 500 ml of sat. sodium chloride solution, dried over magnesium sulfate, the solvent is removed in vacuo, and the residue is recrystallised twice from cyclohexane. Yield: 28.3 g (89 mmol), 89%; purity: about 97% according to $^1$H-NMR.

C) 1,5,5,6,6,7,7-Heptamethyl-3-phenyl-1,5,6,7-tetrahydroindeno-[5,6-d]imidazolium iodide, L78

12.6 ml (200 mmol) of methyl iodide [74-88-4] are added with stirring to a suspension of 28.3 g (89 mmol) of 5,5,6,6,7,7-hexamethyl-1-phenyl-1,5,6,7-tetrahydroindeno [5,6-d]imidazole, B), in 100 ml of THF, and the mixture is stirred at 45° C. for 24 h. After cooling, the precipitated solid is filtered off with suction, washed three times with 50 ml of ethanol each time and dried in vacuo. Yield: 23.5 g (51 mmol), 57%; purity: about 99% according to $^1$H-NMR.

The following compounds are prepared analogously:
| Ex. | 1,2-Diamine | Brominated aromatic compound Alkyl halide | Ligand | Yield 3 steps |
|---|---|---|---|---|
| L79 | 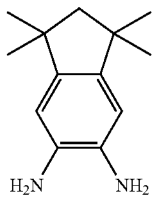 S37 | 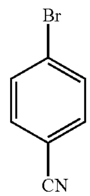 623-00-7 MeI | 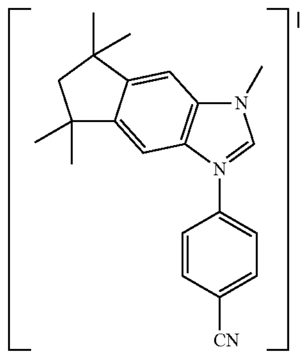 | 46% |
| L80 | 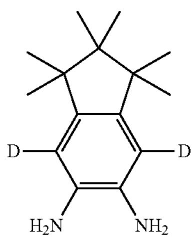 S38 | 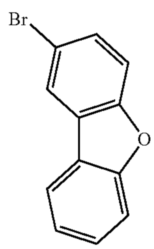 86-76-0 MeI | 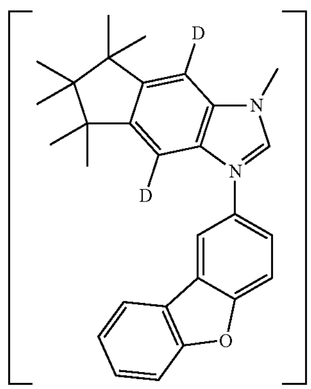 | 43% |
| L81 | 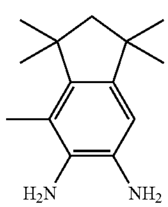 S39 | 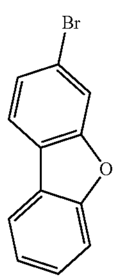 26608-06-0 MeI | 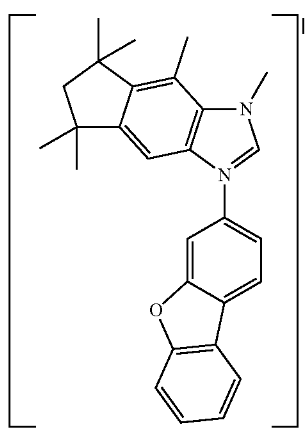 | 34% |
| L82 | 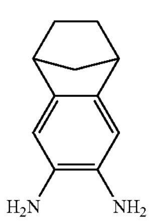 124639-03-8 | 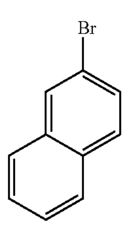 580-13-2 MeI | 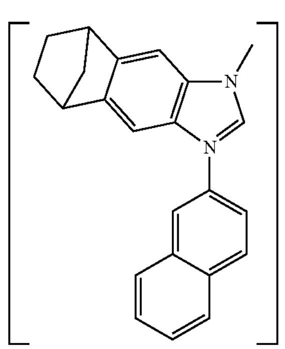 | 41% |

-continued
| Ex. | 1,2-Diamine | Brominated aromatic compound Alkyl halide | Ligand | Yield 3 steps |
|---|---|---|---|---|
| L83 | 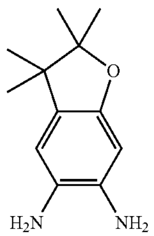 S40 | 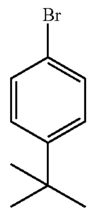 3972-65-4 MeI | 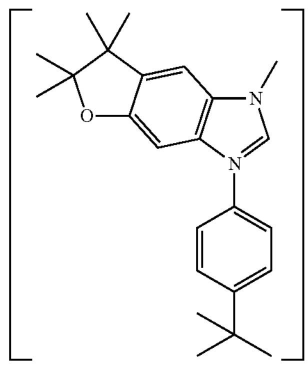 I Chromatographic separation of the regioisomers | 19% |
| L84 | 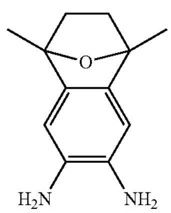 S41 | 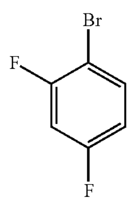 348-57-2 MeI | 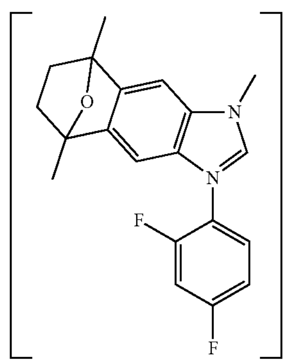 I | 37% |
| L85 | 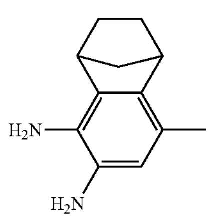 S42 | 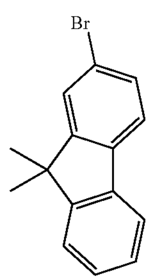 28320-31-2 MeI | 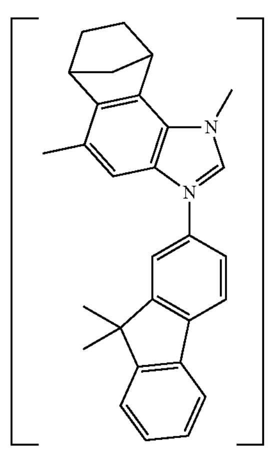 I | 34% |

-continued
| Ex. | 1,2-Diamine | Brominated aromatic compound Alkyl halide | Ligand | Yield 3 steps |
|---|---|---|---|---|
| L86 | 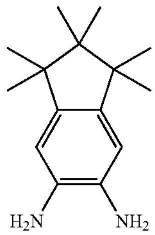 95-54-5 S35 | 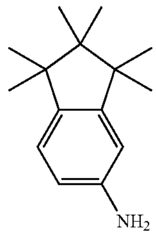 S5-Br MeI | 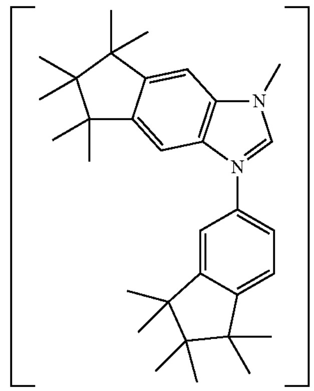 | 43% |
| L87 |  95-54-5 | 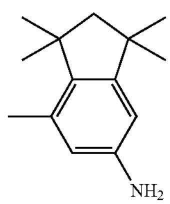 S7-Br MeI | 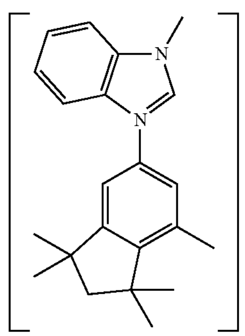 | 45% |
| L88 | 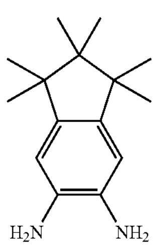 95-54-5 S35 | 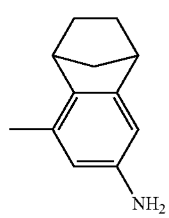 S12-Br MeI | 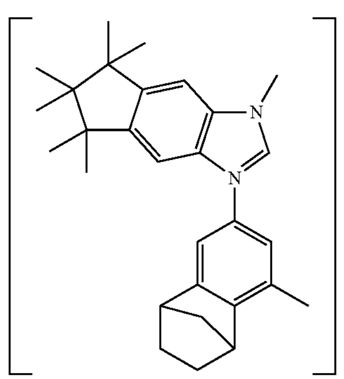 | 40% |

Example 89

1,4,4,6,6-Pentamethyl-3-phenyl-1,4,5,6-tetrahydro-cyclopentaimidazolium iodide, L89

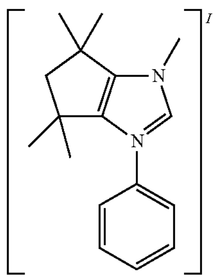

A) 4,4,6,6-Tetramethyl-1,4,5,6-tetrahydrocyclopentaimidazole

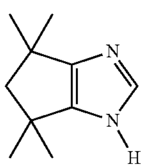

Preparation analogous to G. Bratulescu, Synthesis, 2009, 14, 2319. An intimate mixture of 1.54 g (10.0 mmol) of 3,3,5,5-tetramethylcyclopentane-1,2-dione [20633-06-1], 4.21 g (3.0 mmol) of urotropin, 7.7 g (10 mmol) of ammonium acetate and 0.3 ml of glacial acetic acid is heated in a temperature-controlled microwave until an internal temperature of about 120° C. has been reached, and is then held at this temperature for about 15 min.

After cooling, the mass is added to 150 ml of water, the pH is adjusted to 8 using aqueous ammonia solution (10% by weight) with stirring, the precipitated solid is then filtered off with suction and washed with water. After drying, the product is recrystallised from ethanol/ethyl acetate. Yield: 1.17 g (7.1 mmol), 71%; purity: about 98% according to $^{1}$H-NMR.

B) 4,4,6,6-Tetramethyl-1-phenyl-1,4,5,6-tetrahydro-cyclopentaimidazole

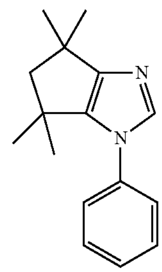 [SMILES: CC1(C)CC(C)(C)c2c1ncn2-c1ccccc1]

Preparation analogous to Example 78, B). Use of 1.64 g (10.0 mmol) of 4,4,6,6-tetramethyl-1,4,5,6-tetrahydrocyclopentaimidazole, A), the remaining starting materials and solvents are correspondingly adapted stoichiometrically. Yield: 1.53 g (6.3 mmol), 63%; purity: about 98% according to $^{1}$H-NMR.

C) 1,4,4,6,6-Pentamethyl-3-phenyl-1,4,5,6-tetrahydrocyclopentaimidazolium iodide, L89

Preparation analogous to Example 78, C). Use of 2.4 g (10.0 mmol) of 4,4,6,6-tetramethyl-1-phenyl-1,4,5,6-tetrahydrocyclopentaimidazole, B), the remaining starting materials and solvents are correspondingly adapted stoichiometrically. Yield: 2.26 g (5.9 mmol), 59%; purity: about 99% according to $^{1}$H-NMR.

The following compounds are prepared analogously:

| Ex. | 1,2-Dione | Brominated aromatic compound Alkyl halide | Ligand | Yield 3 steps |
|---|---|---|---|---|
| L90 | 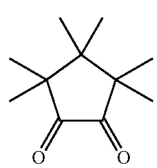 16980-19-1 | 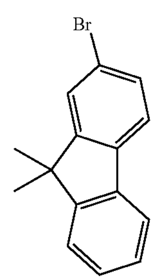 28320-31-2 MeI | 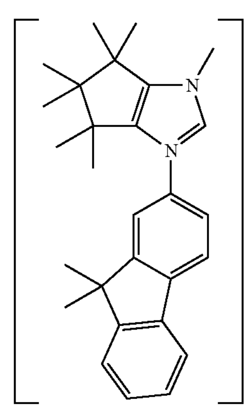 | 36% |

-continued

| Ex. | 1,2-Dione | Brominated aromatic compound Alkyl halide | Ligand | Yield 3 steps |
|---|---|---|---|---|
| L91 | 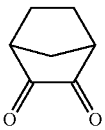 6236-71-1 | 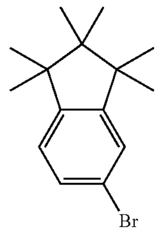 S5-Br Mel | 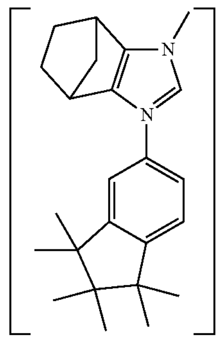 | 40% |
| L92 | 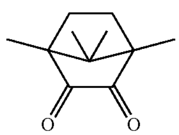 62292-65-3 | 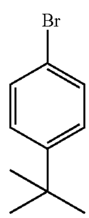 3972-65-4 Mel | 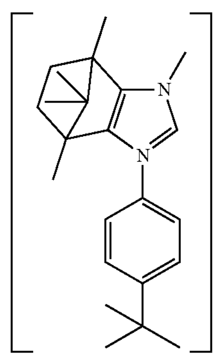 | 33% |

Example 93

Ligands of the benzo[4,5]imidazo[2,1-c]quinazoline type

General Ligand Synthesis

From 2-amidoarylaldehydes and 1,2-diaminobenzenes

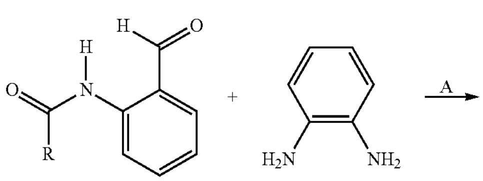

-continued

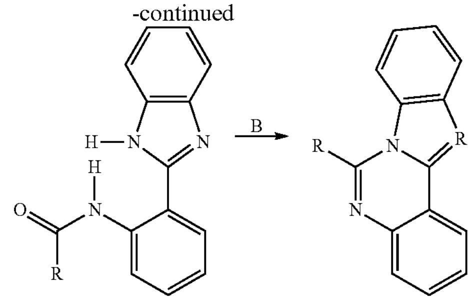

R = alkyl, aryl

Step A:

A solution of 100 mmol of the 2-amidoarylaldehyde and 110 mmol of the 1,2-diaminobenzene in 70 ml of ethanol is placed in a 500 ml round-bottomed flask with water separator and stirred at 50° C. for 30 min. 70 ml of nitrobenzene are then added, and the temperature is increased stepwise to gentle reflux of the nitrobenzene, with the ethanol and water formed being distilled off during the heating. After 4 h under gentle reflux, the mixture is allowed to cool to 50° C., 40 ml of methanol are added, the mixture is then allowed to cool fully with stirring, stirred at room temperature for a further 2 h, the crystals of 2-(2-amidophenyl)benzimidazole formed are then filtered off with suction, washed twice with 20 ml of methanol each time and dried in vacuo. If the 2-(2-amidophenyl)benzimidazole does not crystallise out, the solvent is removed in vacuo, and the residue is employed in step B.

Step B:

Variant A:

350 mmol of the corresponding carbonyl chloride and 50 mmol of the corresponding carboxylic acid are added to a vigorously stirred mixture (precision glass stirrer) of 100 mmol of the 2-(2-amidophenyl)benzimidazole and 150 ml of dioxane or diethylene glycol dimethyl ether, and the mixture is heated under reflux (typically 4-48 h) until the 2-(2-amidophenyl)benzimidazole has reacted. Corresponding carbonyl chlorides and carboxylic acids are those which form the respective amide radical. After cooling, the reaction mixture is introduced with vigorous stirring into a mixture of 1000 g of ice and 300 ml of aqueous conc. ammonia. If the product is produced in the form of a solid, this is filtered off with suction, washed with water and sucked dry. If the product is produced in the form of an oil, this is extracted with three portions of 300 ml each of ethyl acetate or dichloromethane. The organic phase is separated off, washed with 500 ml of water and evaporated in vacuo. The crude product is taken up in ethyl acetate or dichloromethane, filtered through a short column of aluminium oxide, basic, activity grade 1, or silica gel in order to remove brown impurities. After recrystallisation (methanol, ethanol, acetone, dioxane, DMF, etc.) of the benzo[4,5]-imidazo[2,1-c]quinazoline obtained in this way, the latter is freed from low-boiling components and non-volatile secondary components by bulb-tube distillation or fractional sublimation (p about $10^{-4}$-$10^{-5}$ mbar, T about 160-240° C.). Compounds containing aliphatic radicals having more than 6 C atoms, or those containing aralkyl groups having more than 9 C atoms, are typically purified by chromatography and then dried in vacuo in order to remove low-boiling components. Purity according to $^1$H-NMR typically >99.5%.

Variant B:

Analogous procedure to variant A, but 50 mmol of water are added instead of the carboxylic acid.

Variant C:

Analogous procedure to variant A, but no carboxylic acid is added.

Example L93

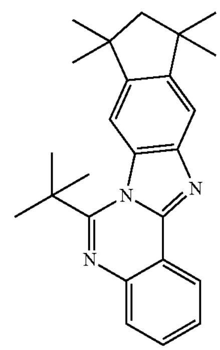 [SMILES: CC(C)(C)c1nc2ccccc2c2nc3cc4c(cc3n12)C(C)(C)CC4(C)C]

Step A:

Use of 20.5 g (100 mmol) of S69 and 22.5 g (110 mmol) of S16.

The 2,2-dimethyl-N-[2-(5,5,7,7-tetramethyl-1,5,6,6-tetrahydroindeno[5,6-d]-imidazol-2-yl)phenyl]propionamide crystallises out, yield 31.6 g (81 mmol) 81%; purity: 97% according to 1H-NMR.

Step B, variant A:

Use of 31.6 g (81 mmol) of 2,2-dimethyl-N-[2-(5,5,7,7-tetramethyl-1,5,6,6-tetrahydroindeno[5,6-d]imidazol-2-yl)phenyl]propionamide (step A), 120 ml of dioxane, 33.8 g (280 mmol) of pivaloyl chloride [3282-30-2] and 4.1 g (40 mmol) of pivalic acid [75-98-9], reaction time 16 h, the crude product is produced in the form of a solid on neutralisation, recrystallisation from DMF/ethanol, fractional sublimation of the product twice at T about 170° C., p about $10^{-4}$ mbar. Yield: 19.3 g (52 mmol), 64%; purity: about 99.5% according to $^1$H-NMR.

The following compound is prepared analogously:

| Ex. | 2-Amidoaryl-aldehyde | 1,2-Diamino-benzene | Ligand | Yield 2 steps |
|---|---|---|---|---|
| L94 | 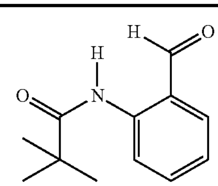 6141-21-5 | 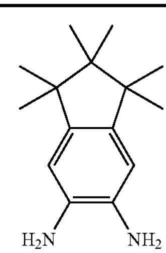 S35 | 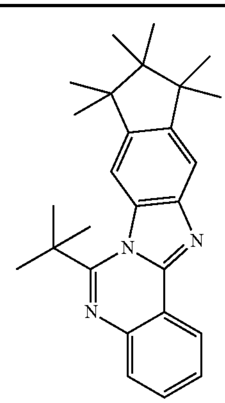 | 55% |

Example L95

1,1,2,2,3,3-Hexamethyl-5-phenyl-2,3-dihydro-1H-6-aza-cyclopenta[b]naphthalene, L95

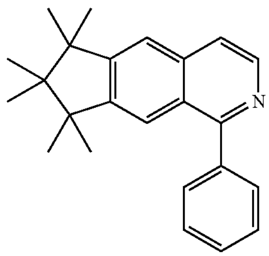 [SMILES: CC1(C)c2cc3ccnc(-c4ccccc4)c3cc2C(C)(C)C1(C)C]

17.0 g (120 mmol) of phosphorus pentoxide are added in portions with vigorous stirring at 90° C. to a solution of 34.8 g (100 mmol) of N-[2-(1,1,2,2,3,3-hexamethylindan-5-yl) ethyl]benzamide, S43, in 150 ml of o-xylene. 28.0 ml (300 mmol) of phosphoryl chloride are added dropwise to this reaction mixture, which is then stirred under reflux for a further 4 h. The reaction mixture cooled to 80° C. is poured onto 1000 g of ice with vigorous stirring and then rendered alkaline (pH about 12) by addition of solid NaOH. The mixture is extracted three times with 300 ml of toluene each time, the organic phase is washed three times with water, dried over magnesium sulfate, and the solvent is removed in vacuo. The oily residue is dissolved in 200 ml of o-dichlorobenzene, 86.9 g (1 mol) of manganese dioxide are added to the solution, and the mixture is subsequently boiled under reflux on a water separator for 16 h. After cooling, the manganese dioxide is filtered off via a Celite bed, the solid is washed with 500 ml of a mixture of dichloromethane and ethanol (10:1), and the combined filtrates are freed from the solvents in vacuo. The residue is recrystallised from cyclohexane/ethyl acetate and finally freed from low-boiling components and non-volatile secondary components by fractional sublimation (p about $10^{-4}$-$10^{-5}$ mbar, T about 230° C.). Yield: 20.1 g (61 mmol), 61%; purity: about 99.5% according to $^{1}$H-NMR.

The following compounds can be prepared analogously:

| Ex. | Starting material | Product | Yield |
| --- | --- | --- | --- |
| L96 | 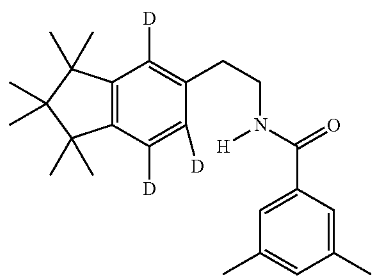 S44 | 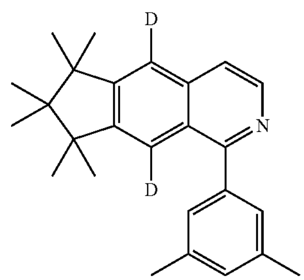 | 66% |
| L97 | 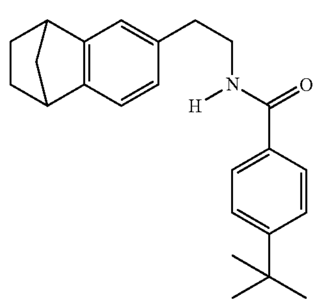 S45 | 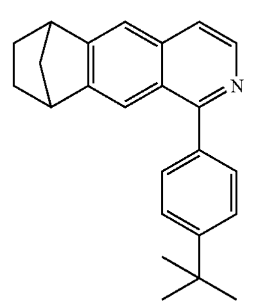 [SMILES: CC(C)(C)c1ccc(-c2nccc3cc4c(cc23)C2CCC4C2)cc1] | 64% |

-continued
| Ex. | Starting material | Product | Yield |
| --- | --- | --- | --- |
| L98 | 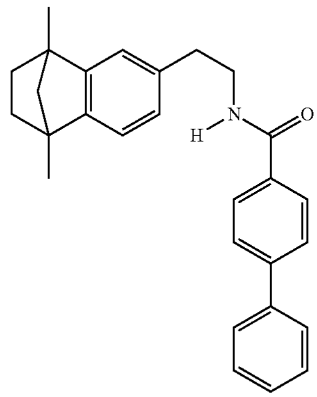 S46 | 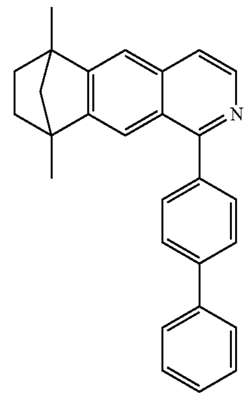 [SMILES: CC12CCC(C)(C1)c1cc3c(-c4ccc(-c5ccccc5)cc4)nccc3cc12] | 60% |
| L99 | 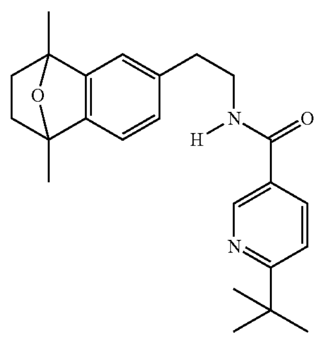 S47 | 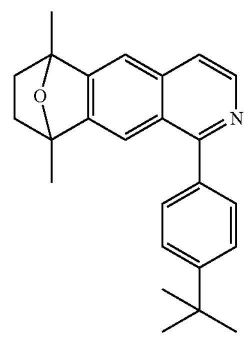 [SMILES: CC(C)(C)c1ccc(-c2nccc3cc4c(cc23)C2(C)CCC4(C)O2)cc1] | 41% |
| L100 | 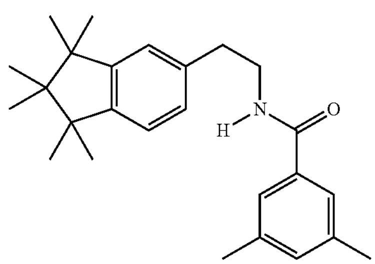 S48 | 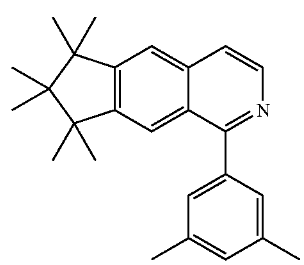 | 67% |
| L101 | 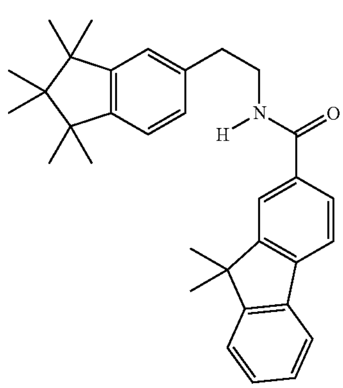 S49 | 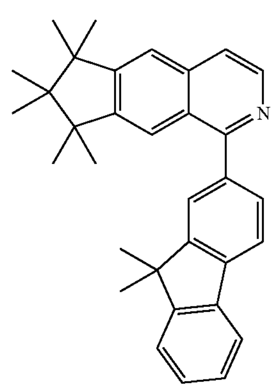 [SMILES: CC1(C)c2ccccc2-c2ccc(-c3nccc4cc5c(cc34)C(C)(C)C(C)(C)C5(C)C)cc21] | 65% |

Example L102

7,8,9,10-Tetrahydro-7,10-methano-6-phenylphenanthridine, L102

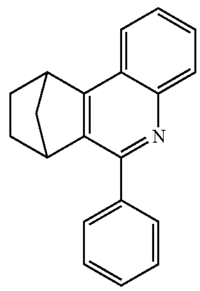 [SMILES: c1ccc(-c2nc3ccccc3c3c2C2CCC3C2)cc1]

14.2 g (100 mmol) of boron trifluoride etherate are added dropwise to a vigorously stirred mixture of 46.6 g (500 mmol) of aniline, 58.4 g (550 mmol) of benzaldehyde, 94.2 g (1 mol) of norbornene and 1300 ml of dichloromethane, and the mixture is then heated under reflux for 40 h. After cooling, the reaction mixture is washed twice with 400 ml of water each time, the organic phase is dried over magnesium sulfate, and the dichloromethane is then removed in vacuo. The residue is taken up in 1000 ml of o-dichlorobenzene, 435 g (5 mol) of manganese dioxide are added, and the mixture is heated under reflux on a water separator for 16 h. After cooling, 1000 ml of ethyl acetate are added, the manganese dioxide is filtered off with suction via a Celite bed, the manganese dioxide is rinsed with 1000 ml of ethyl acetate, and the combined filtrates are freed from the solvents in vacuo. The residue is recrystallised twice from cyclohexane and finally freed from low-boiling components and non-volatile secondary components by fractional sublimation (p about $10^{-4}$-$10^{-5}$ mbar, T about 230° C.). Yield: 76.0 g (280 mmol), 56%; purity: about 99.5% according to $^{1}$H-NMR.

The following compounds can be prepared analogously:

| Ex. | Starting material | Product | Yield |
|---|---|---|---|
| L103 | 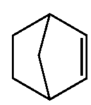 498-66-8 62-53-3 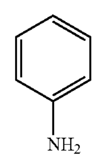 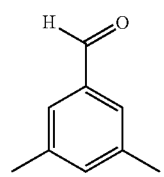 5779-95-3 | 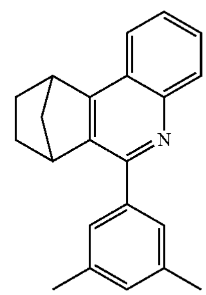 L103 | 66% |
| L104 | 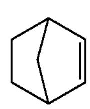 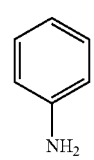 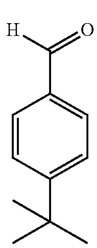 939-97-9 | 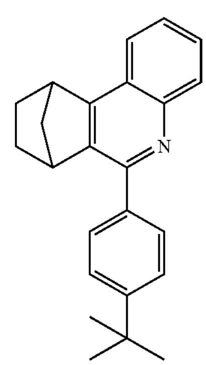 L104 | 64% |

-continued
| Ex. | Starting material | Product | Yield |
|---|---|---|---|
| L105 | 106-49-0 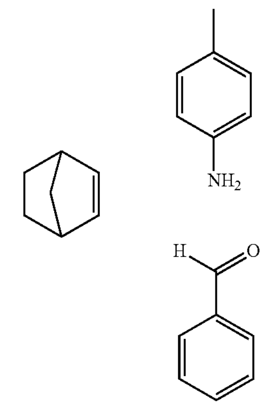 | 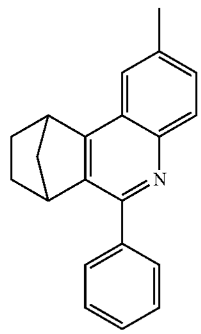 L105 | 56% |
| L106 | 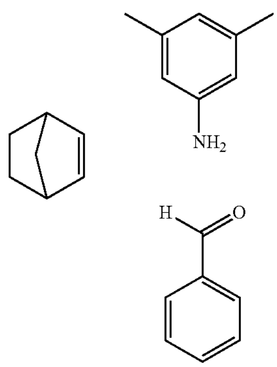 100-52-7 | 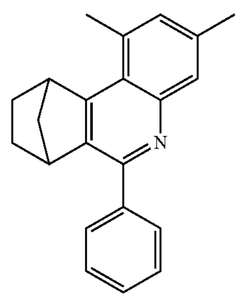 L106 | 58% |
| L107 | 769-92-6 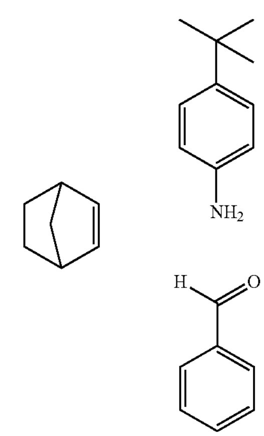 | 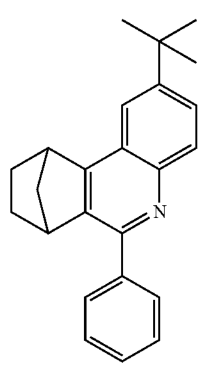 L107 | 61% |

-continued
| Ex. | Starting material | Product | Yield |
|---|---|---|---|
| L108 | 92-67-1 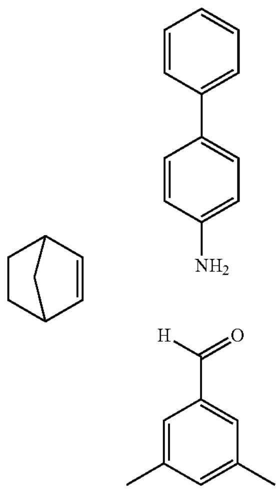 | 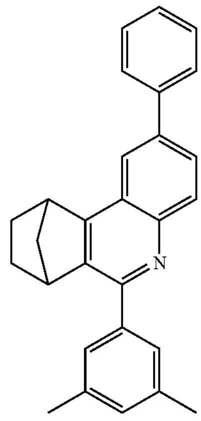 L108 | 63% |
| L109 | 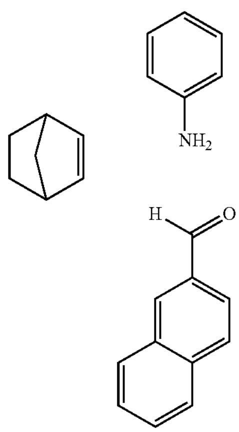 66-99-9 | 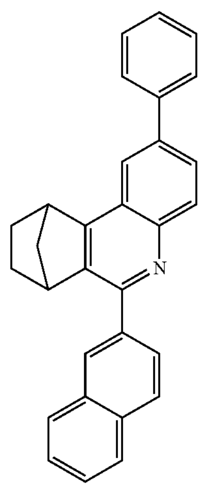 L109 | 58% |
| L110 | 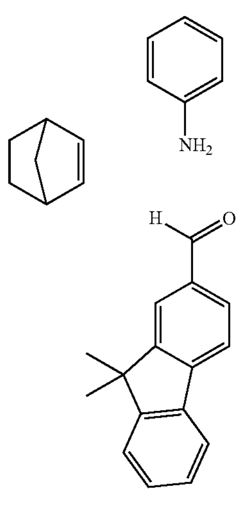 848300-71-8 | 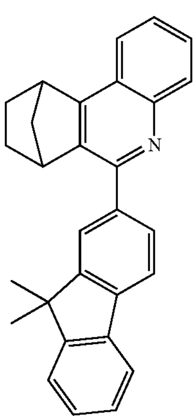 L110 | 55% |

-continued
| Ex. | Starting material | Product | Yield |
| --- | --- | --- | --- |
| L111 | 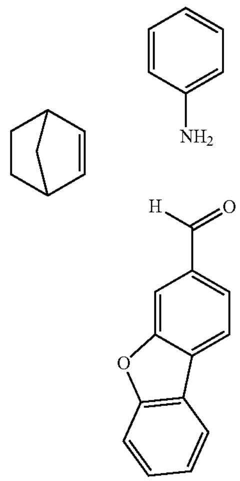 51818-91-8 | 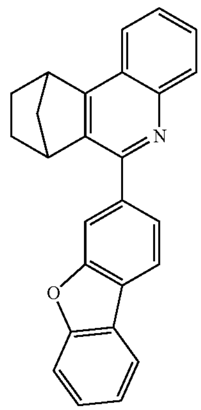 L111 | 60% |
| L112 | 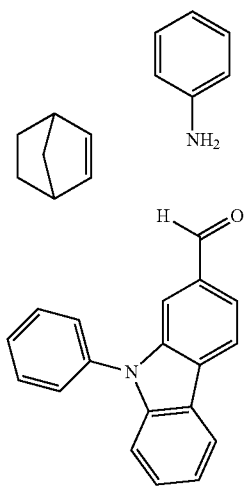 1353684-87-3 | 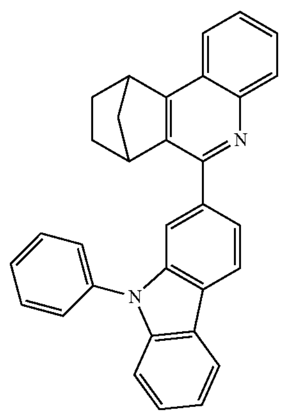 L112 | 34% |
| L113 | 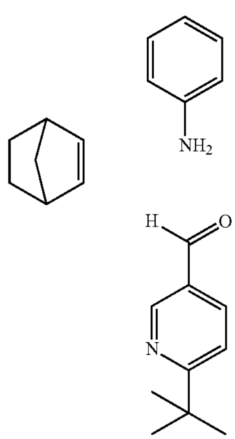 391900-69-9 | 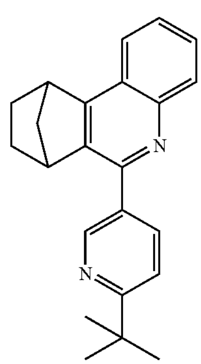 L113 | 69% |

-continued
| Ex. | Starting material | Product | Yield |
| --- | --- | --- | --- |
| L114 | 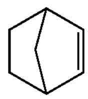 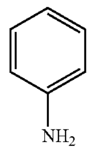 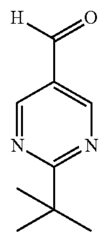 104461-06-5 | 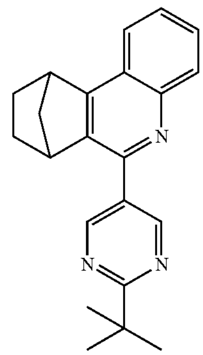 L114 | 67% |
| L115 | 39919-70-5 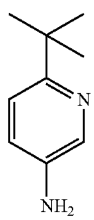 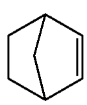 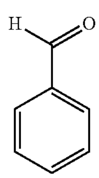 | 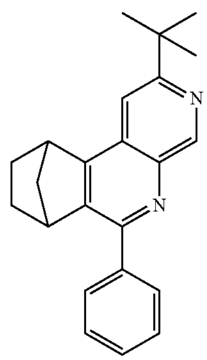 L115a | 23% |
| | | 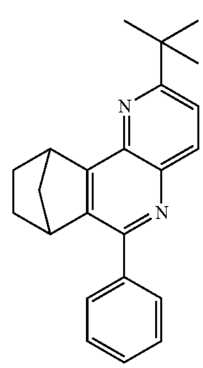 L115b Chromatographic separation of the regioisomers | 17% |

-continued
| Ex. | Starting material | Product | Yield |
|---|---|---|---|
| L116 | 59950-55-9 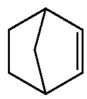 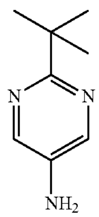 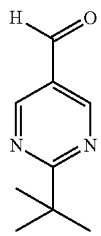 | 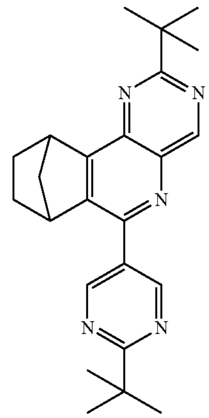 L116 | 50% |
| L117 | 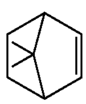 6541-60-2 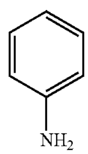 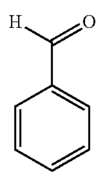 | 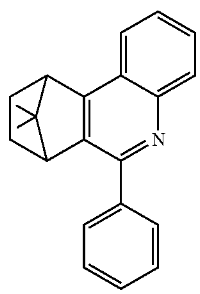 L117 | 48% |
| L118 | 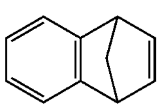 4453-90-1 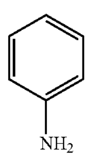 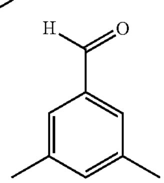 | 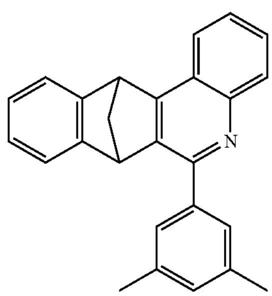 L118 | 68% |
| L119 | 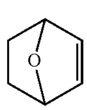 6705-50-6 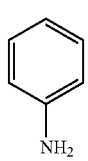 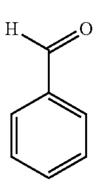 | 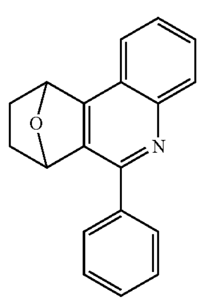 L119 | 45% |

-continued
| Ex. | Starting material | Product | Yield |
|---|---|---|---|
| L120 | 95-64-7 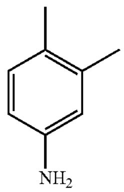 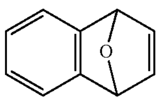 573-57-9 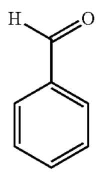 | 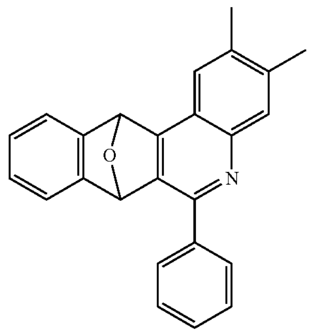 L120 | 65% |
| L121 | 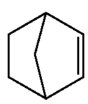 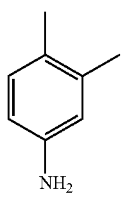 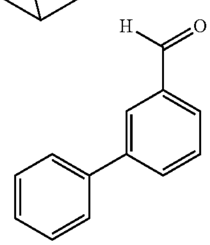 1204-60-0 | 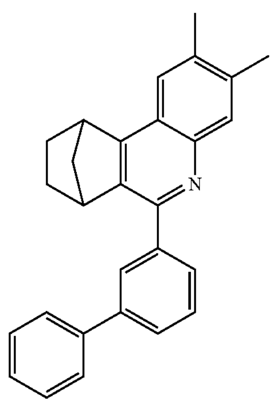 L121 | 54% |
| L122 | 139266-08-3 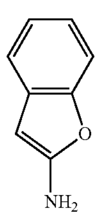 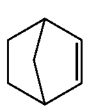 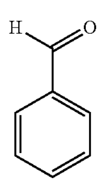 | 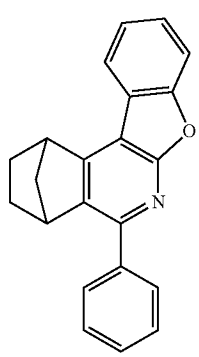 L122 | 38% |

-continued
| Ex. | Starting material | Product | Yield |
| --- | --- | --- | --- |
| L123 | 4521-30-6 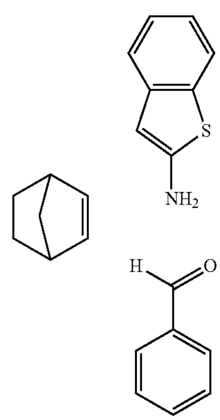 | 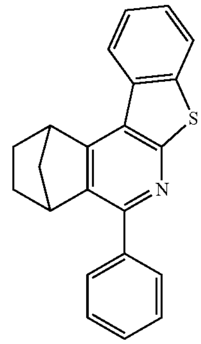 L123 | 34% |
| L124 | 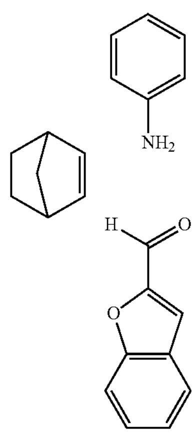 4265-16-1 | 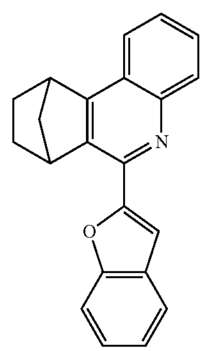 L124 | 36% |
| L125 | 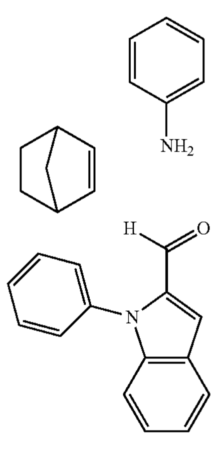 343238-30-2 | 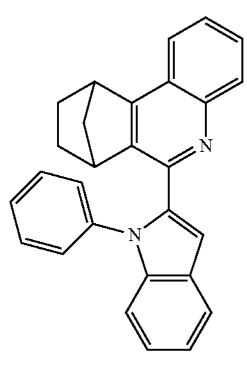 L125 | 28% |

-continued

| Ex. | Starting material | Product | Yield |
|---|---|---|---|
| L126 | 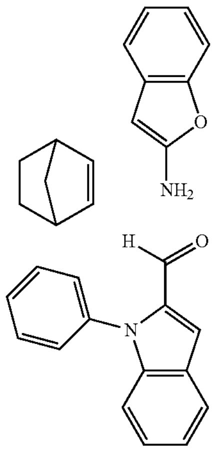 | 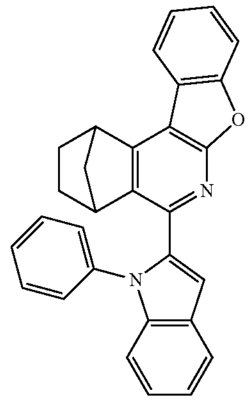 L126 | 32% |
| L127 | 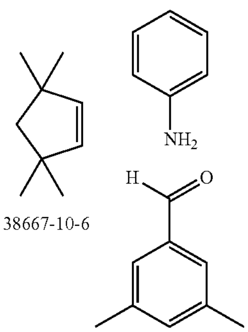 38667-10-6 | 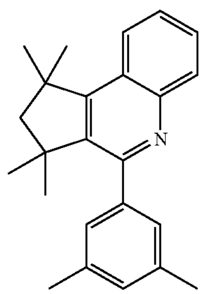 L127 | 25% |

Example L128

5,8-Methano-5,6,7,8-tetrahydro-3-phenyl-2-aza-anthracene, L128

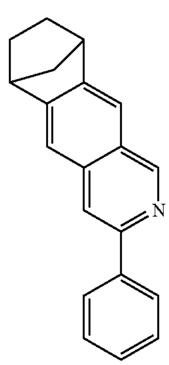 [SMILES: c1ccc(-c2cc3cc4c(cc3cn2)C2CCC4C2)cc1]

A mixture of 13.6 g (50 mmol) of 7-(3,3-dimethylbut-1-ynyl)-1,2,3,4-tetrahydro-1,4-methanonaphthalene-6-carbaldehyde, S58, and 500 ml of methanolic ammonia solution (2 M) is stirred at 140° C. for 5 h in an autoclave. After cooling, the methanol is removed in vacuo, the oily residue is chromatographed on silica gel (n-heptane:ethyl acetate 95:5) and finally freed from low-boiling components and non-volatile secondary components by fractional sublimation (p about $10^{-4}$-$10^{-5}$ mbar, T about 230° C.). Yield: 5.1 g (17 mmol), 34%; purity: about 99.5% according to $^{1}$H-NMR.

The following derivatives can be prepared analogously:
| Ex. | Starting material | Product | Yield |
|---|---|---|---|
| L129 | 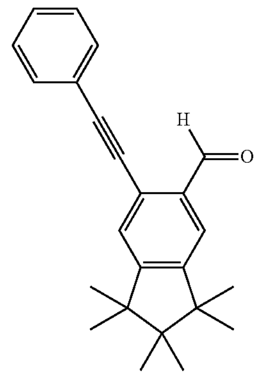 S59 | 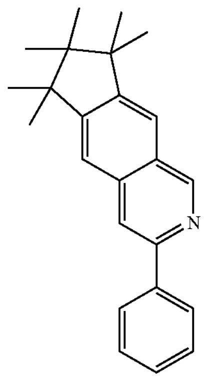 L129 | 37% |
| L130 | 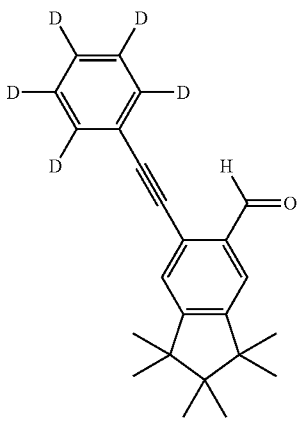 S60 | 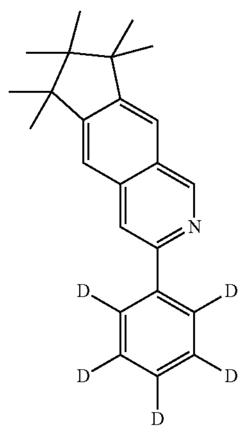 L130 | 29% |
| L131 | 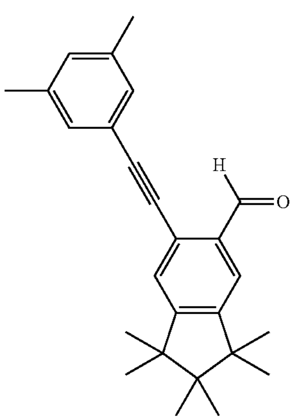 S61 | 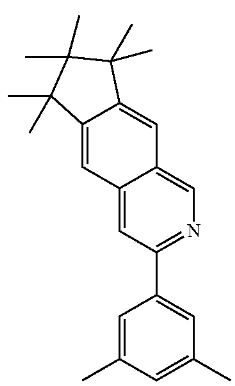 L131 | 30% |

-continued
| Ex. | Starting material | Product | Yield |
|---|---|---|---|
| L132 | 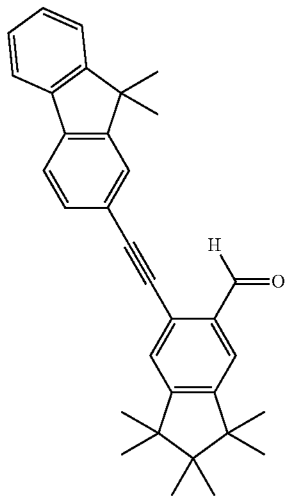 S62 | 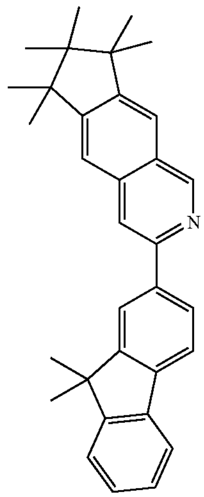 L132 | 32% |
| L133 | 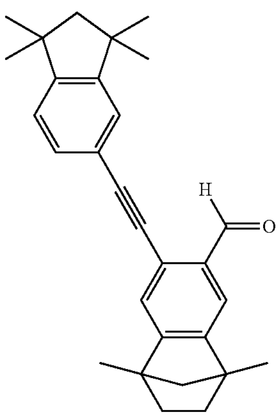 S63 | 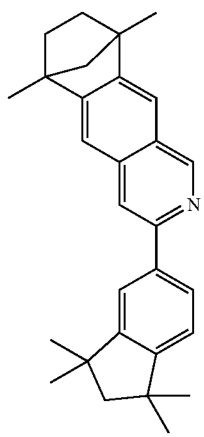 L133 | 27% |
| L134 | 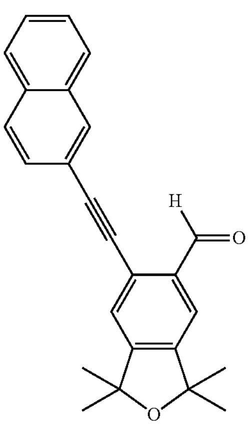 S64 | 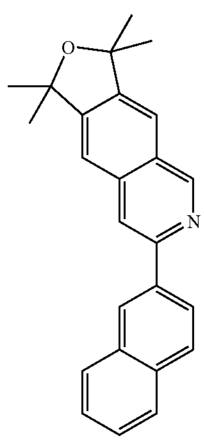 L134 | 30% |

-continued

| Ex. | Starting material | Product | Yield |
|---|---|---|---|
| L135 | 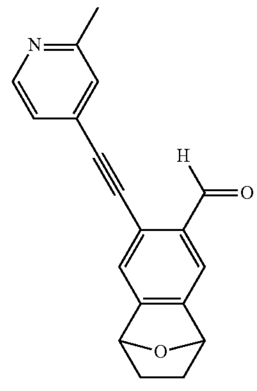 S65 | 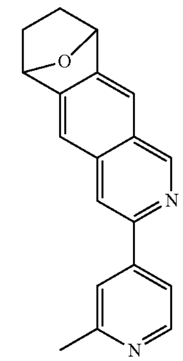 L135 | 36% |

Example L136

1R,4S-Methano-1,2,3,4-tetrahydro-9-phenyl-10-aza-phenanthrene, L136

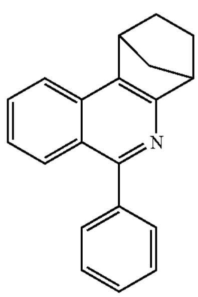 [SMILES: c1ccc(-c2nc3c(c4ccccc24)C2CCC3C2)cc1]

One drop of conc. sulfuric acid is added to a mixture of 26.1 g (100 mmol) of 2-bromophenylphenylmethanone [13047-06-8], 11.1 g (100 mmol) of (1R,2R,4S)-bicyclo [2.2.1]heptan-2-amine [7242-92-4] and 23.3 ml (105 mmol) of tetraethoxysilane [78-10-4], and the mixture is then heated at 160° C. in a water separator for 16 h, during which the ethanol distils off. After cooling, 500 ml of diethyl ether are added to the residue, the mixture is washed twice with 100 ml of saturated sodium hydrogencarbonate solution each time and twice with 300 ml of water each time and then dried over magnesium sulfate. After removal of the diethyl ether, 27.6 g (200 mmol) of potassium carbonate, 5 g of palladium/carbon (5% by weight), 2.6 g (10 mmol) of triphenylphosphine, 100 g of glass beads (diameter 3 mm) and 300 ml of mesitylene are added to the oily residue, and the mixture is again heated under reflux for 16 h. After cooling, the salts are filtered off with suction via a Celite bed, rinsed with 500 ml of toluene, and the combined filtrates are evaporated to dryness in vacuo. The residue is recrystallised three times from DMF/ethanol and finally freed from low-boiling components and non-volatile secondary components by fractional sublimation (p about $10^{-4}$-$10^{-5}$ mbar, T about 230° C.). Yield: 14.9 g (55 mmol), 55%; purity: about 99.5% according to $^{1}$H-NMR.

The following derivatives can be prepared analogously:

| Ex. | Starting material | Product | Yield |
|---|---|---|---|
| L137 | 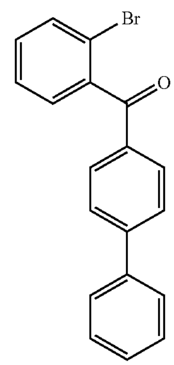 80874-61-9 | 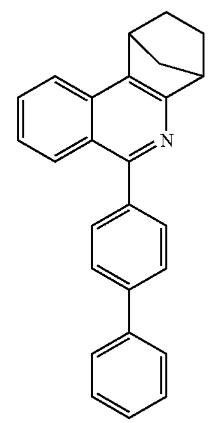 L137 | 47% |
| L138 | 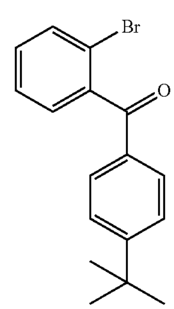 951889-08-0 | 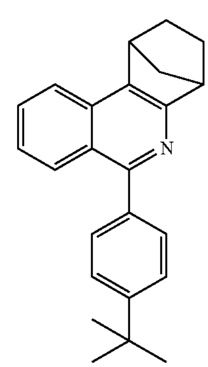 L138 | 45% |

Example L139

Tetradentate Ligands

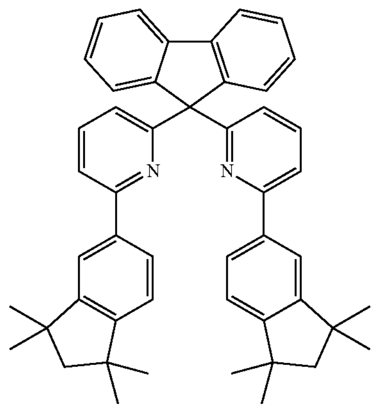

A mixture of 47.8 g (100 mmol) of 9,9-bis(6-bromopyrid-2-yl)fluorine [1323362-54-4], 69.1 g (230 mmol) of pinacolyl 1,1,3,3-tetramethylindane-5-boronate, S4-B, 42.4 g (400 mmol) of sodium carbonate, 1.2 g (1 mmol) of tetrakistriphenylphosphinopalladium(0), 300 ml of toluene, 200 ml of dioxane and 300 ml of water is heated under reflux for 30 h. After cooling, the organic phase is separated off, filtered through a Celite bed, with the Celite being rinsed with 300 ml of toluene, the combined filtrates are washed three times with 300 ml of water each time, dried over magnesium sulfate and then freed from toluene in vacuo. The residue is recrystallised three times from ethanol with addition of a little ethyl acetate and finally freed from low-boiling components and non-volatile secondary components by fractional sublimation (p about $10^{-5}$ mbar, T about 310° C.). Yield: 36.6 g (55 mmol), 55%; purity: about 99.5% according to $^{1}$H-NMR.

The following compounds can be prepared analogously:

| Ex. | Starting material | Starting material | Product | Yield |
|---|---|---|---|---|
| L140 | 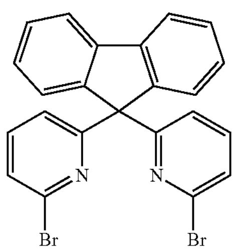 1323362-54-4 | 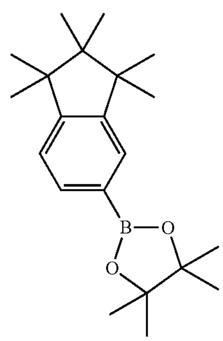 S5-B | 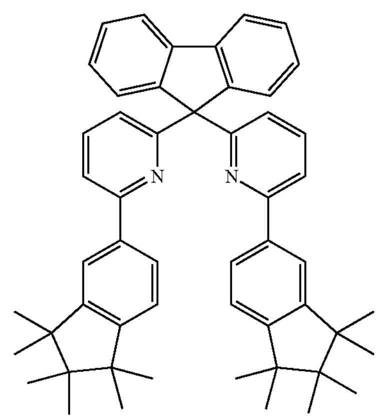 | 56% |
| L141 | 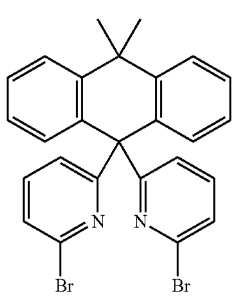 1421759-14-9 | 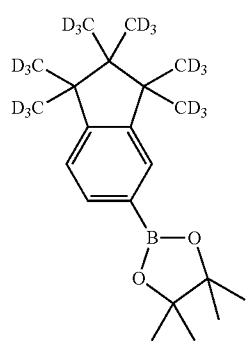 S6-B | 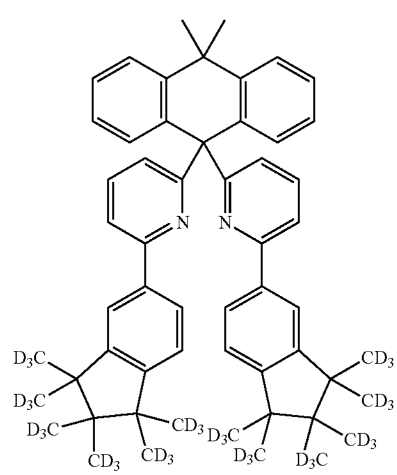 [SMILES: [2H]C([2H])([2H])C1(C([2H])([2H])[2H])c2ccc(-c3cccc(C4(c5cccc(-c6ccc7c(c6)C(C([2H])([2H])[2H])(C([2H])([2H])[2H])C(C([2H])([2H])[2H])(C([2H])([2H])[2H])C7(C([2H])([2H])[2H])C([2H])([2H])[2H])n5)c5ccccc5C(C)(C)c5ccccc54)n3)cc2C(C([2H])([2H])[2H])(C([2H])([2H])[2H])C1(C([2H])([2H])[2H])C([2H])([2H])[2H]] | 58% |

-continued
| Ex. | Starting material | Starting material | Product | Yield |
| --- | --- | --- | --- | --- |
| L142 | 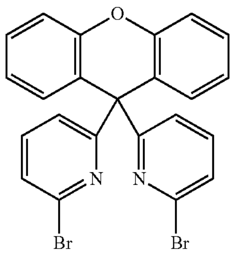 1421759-18-3 | 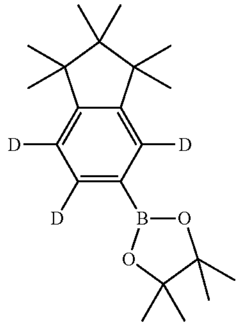 S8-B | 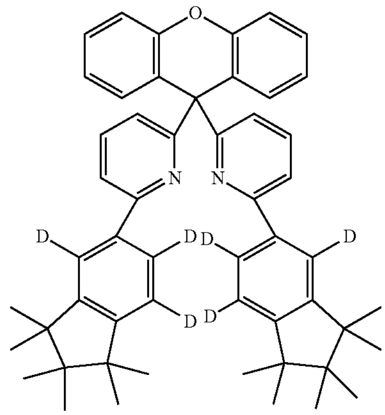 | 54% |
| L143 | 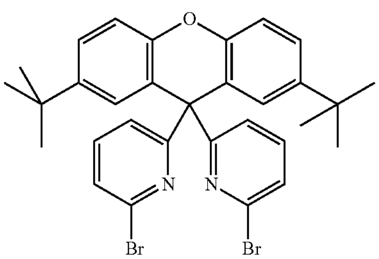 S50 | 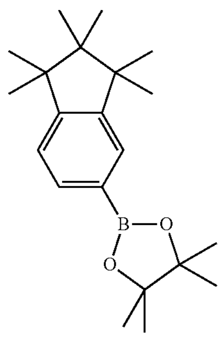 S5-B | 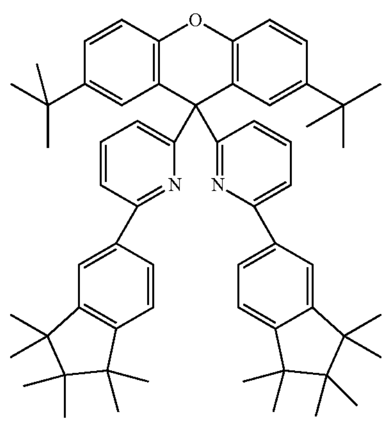 | 57% |
| L144 | 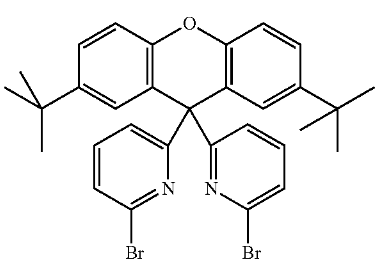 S50 | 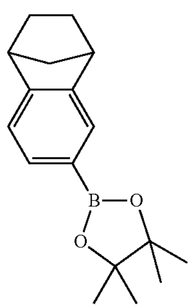 S11-B | 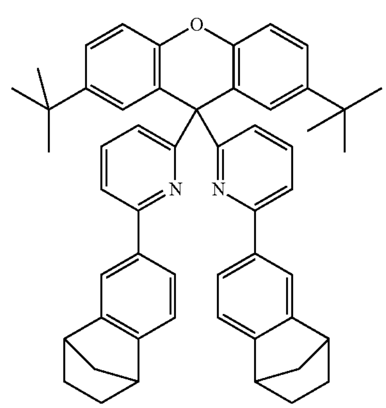 Diastereomer mixture | 32% |

-continued

| Ex. | Starting material | Starting material | Product | Yield |
|---|---|---|---|---|
| L145 | 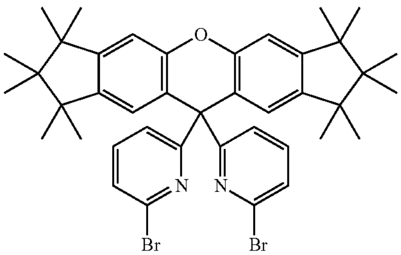 S51 | 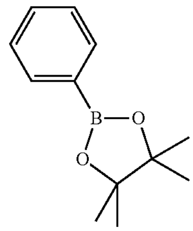 24388-23-6 | 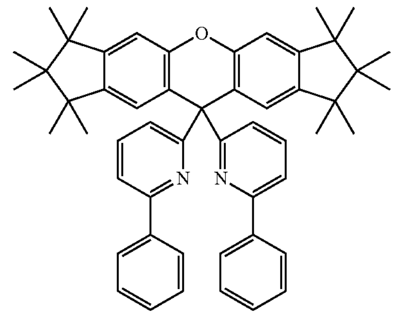 | 47% |
| L146 | 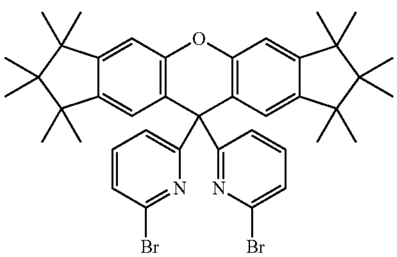 S51 | 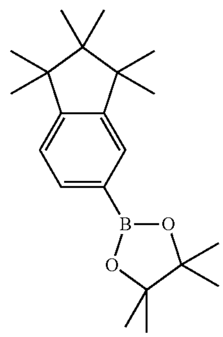 S5-B | 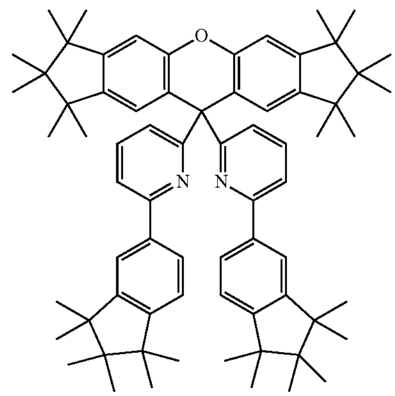 | 53% |

Example L147

Tetradentate Ligands

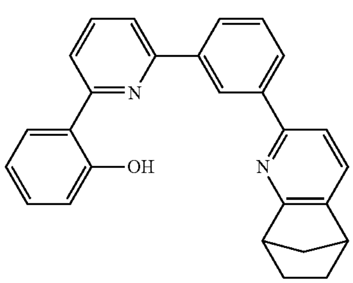 [SMILES: Oc1ccccc1-c1cccc(-c2cccc(-c3ccc4c(n3)C3CCC4C3)c2)n1]

20 ml (50 mmol) of n-BuLi, 2.5 M in n-hexane, are added dropwise to a vigorously stirred solution, cooled to −78° C., of 15.0 g (50 mmol) of 4-(3-bromophenyl)-3-azatricyclo [6.2.1.0*2,7*]undeca-2(7),3,5-triene [1421789-46-9] in 200 ml of THF, and the mixture is then stirred at −78° C. for a further 1 h. A mixture of 13.9 ml (60 mmol) of triisopropyl borate and 30 ml of THF is then added in one portion, the mixture is stirred at −78° C. for a further 1 h and then allowed to warm to room temperature. 200 ml of toluene, 200 ml of saturated sodium hydrogencarbonate solution, 13.8 g (55 mmol) of 2-(6-bromopyridin-2-yl)phenol [1394900-18-5], 1.2 g (1 mmol) of tetrakistriphenylphosphinopalladium(0) are added to the reaction mixture, which is then heated under reflux for 16 h. After cooling, 200 ml of saturated ammonium chloride solution and 300 ml of ethyl acetate are added, the aqueous phase is separated off, the organic phase is filtered through a Celite bed, the latter is rinsed with 200 ml of ethyl acetate, the combined filtrates are washed three times with water and once with saturated sodium chloride solution and dried over magnesium sulfate. The oily residue obtained after removal of the solvent is recrystallised three times from ethanol with addition of a little ethyl acetate and finally freed from low-boiling components and non-volatile secondary components by fractional sublimation (p about $10^{-5}$ mbar, T about 270° C.). Yield: 7.0 g (18 mmol), 36%; purity: about 99.5% according to 1H-NMR.

Example L148

Tetradentate Ligands

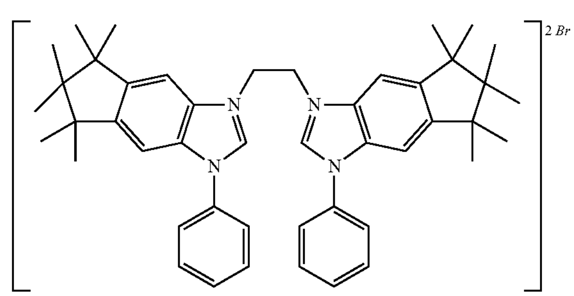

Procedure analogous to C. Cao et al., Synth. Commun. 2012, 42, 380. A mixture of 15.9 g (50 mmol) of 5,5,6,6,7, 7-hexamethyl-1-phenyl-1,5,6,7-tetrahydroindeno[5,6-d] imidazole, L78 B), and 4.7 g (25 mmol) of 1,2-dibromoethane [106-93-4] is heated at 120° C. for 6 h in an autoclave. After cooling, the solid mass is taken up in 100 ml of tert-butyl methyl ether, homogenised with stirring, the white solid is filtered off, washed twice with 50 ml of tert-butyl methyl ether each time and dried in vacuo. Yield: 18.1 g (22 mmol), 88%; purity: about 98.0% according to $^{1}H$-NMR.

The following compounds can be prepared analogously:

| Ex. | Imidazole | Ligand | Yield |
|---|---|---|---|
| L149 | 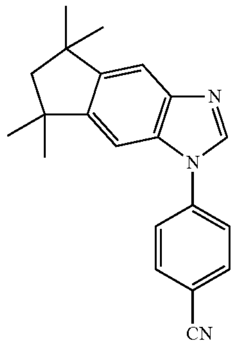 L79 B) | 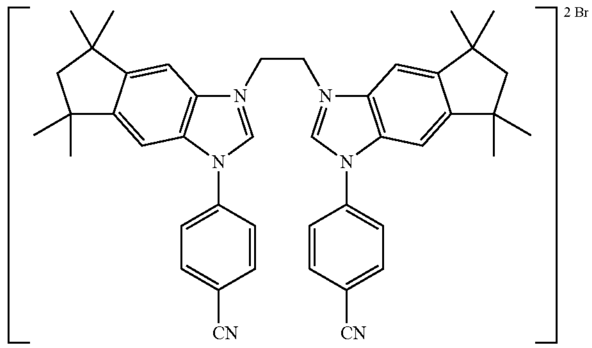 | 86% |
| L150 | 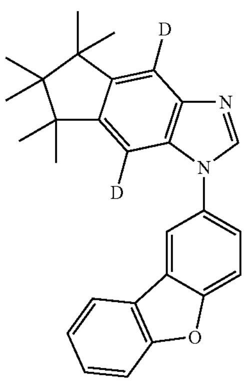 L80 B) | 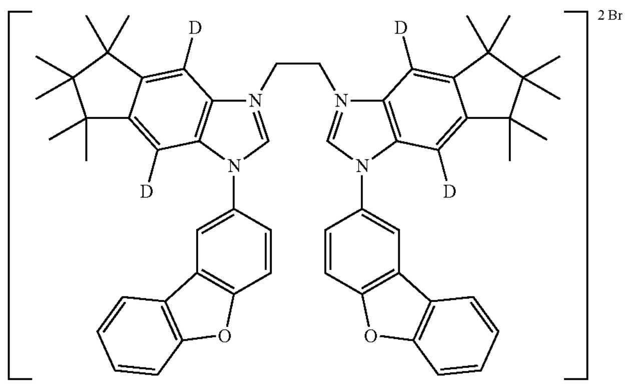 | 83% |
| L151 | 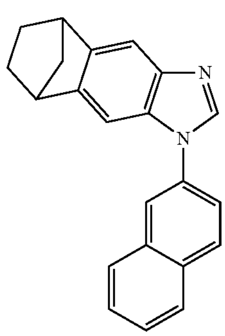 L82 B) | 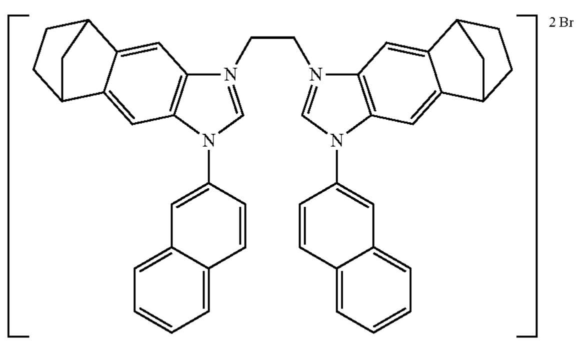 Diastereomer mixture | 91% |

-continued

| Ex. | Imidazole | Ligand | Yield |
| --- | --- | --- | --- |
| L152 | 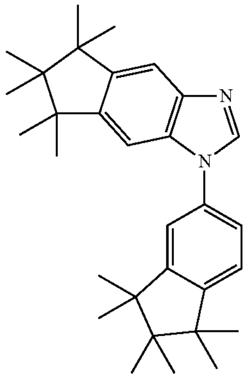 L86 B) | 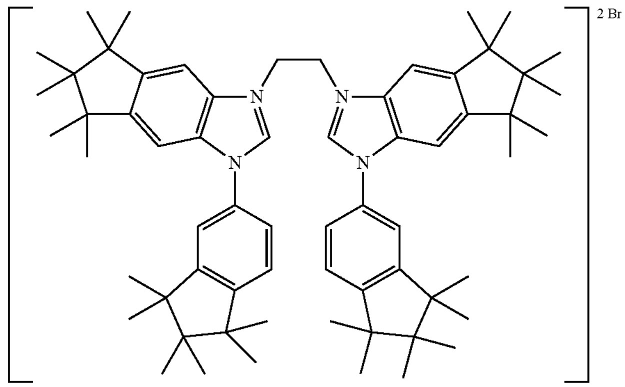 | 87% |
| L153 | 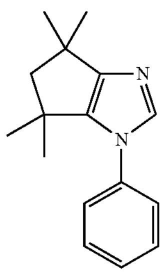 L89 B) $C_2D_4Br_2$ 22581-63-1 | 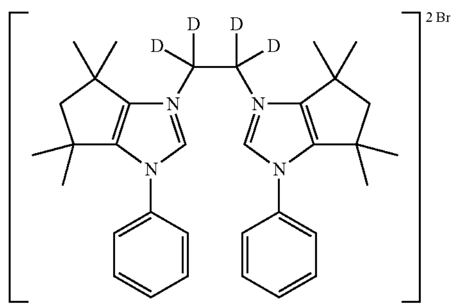 | 74% |

Example L154

Hexadentate Ligands

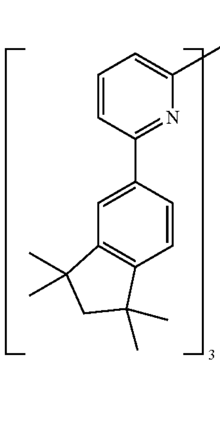

A mixture of 51.4 g (100 mmol) of tris(6-bromopyridin-2-yl)methoxymethane [336158-91-9], 99.1 g (330 mmol) of pinacolyl 1,1,3,3-tetramethylindane-5-boronate, 84-B, 42.4 g (400 mmol) of sodium carbonate, 1.2 g (1 mmol) of tetrakistriphenylphosphinopalladium(0), 500 ml of toluene, 300 ml of dioxane and 500 ml of water is heated under reflux for 36 h. After cooling, the organic phase is separated off, filtered through a Celite bed, with the Celite being rinsed with 400 ml of toluene, the combined filtrates are washed three times with 300 ml of water each time, dried over magnesium sulfate and then freed from toluene in vacuo. The residue is recrystallised three times from isopropanol with addition of a little ethyl acetate and finally freed from low-boiling components and non-volatile secondary components by fractional sublimation (p about $10^{-5}$ mbar, T about 310° C.). Yield: 40.5 g (51 mmol), 51%; purity: about 99.5% according to $^1$H-NMR.

The following compounds can be prepared analogously:

| Ex. | Starting material | Starting material | Product | Yield |
|---|---|---|---|---|
| L155 | 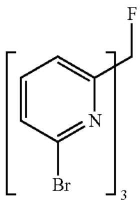 760177-68-2 | 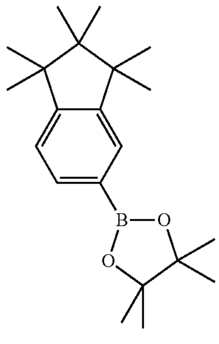 S5-B | 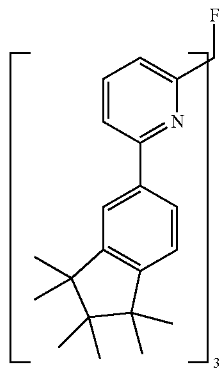 | 48% |
| L156 | 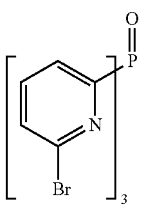 197776-47-9 | 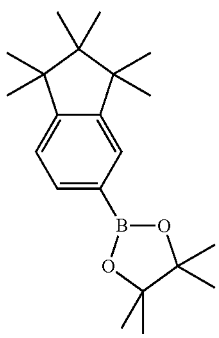 S5-B | 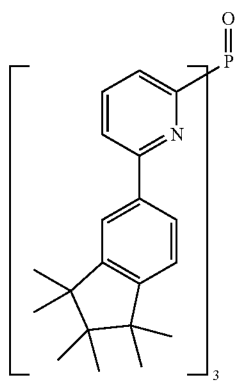 | 47% |

Example L157

Hexadentate Ligands

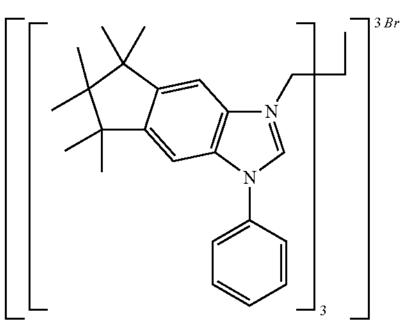

Procedure analogous to L148, where the 1,2-dibromoethane is replaced by 5.2 g (16.7 mmol) of 1,1,1-tris(bromomethyl)ethane [60111-68-4]. Yield: 19.0 g (15 mmol), 90%; purity: about 99.0% according to $^{1}$H-NMR.

The following compound can be prepared analogously:

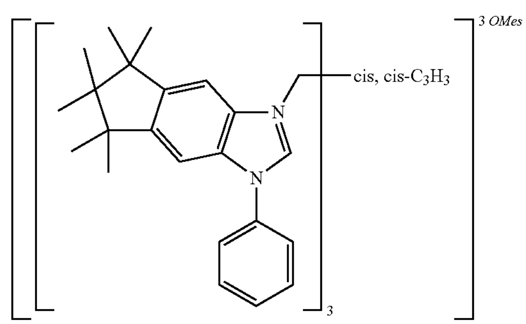

1,1,1-Tris(bromomethyl)ethane is replaced by 6.1 g (16.7 mmol) of cis,cis-1,2,3-cyclopropanetrimethanol trimethanesulfonate [945230-85-3]. Yield: 15.9 g (12 mmol), 72%; purity: about 99.0% according to 1H-NMR.

C: Synthesis of the Metal Complexes

1) Homoleptic Tris-Facial Iridium Complexes of the Phenylpyridine, Phenylimidazole or Phenylbenzimidazole Type:

Variant A: Trisacetylacetonatoiridium(III) as Iridium Starting Material

A mixture of 10 mmol of trisacetylacetonatoiridium(III) [15635-87-7] and 60 mmol of the ligand L and a glass-clad magnetic stirrer bar are melted into a thick-walled 50 ml glass ampoule in vacuo ($10^{-5}$ mbar). The ampoule is heated at the temperature indicated for the time indicated, during which the molten mixture is stirred with the aid of a magnetic stirrer. In order to prevent sublimation of the ligands onto relatively cold parts of the ampoule, the entire ampoule must have the temperature indicated. Alternatively, the synthesis can be carried out in a stirred autoclave with glass insert. After cooling (NOTE: the ampoules are usually under pressure!), the ampoule is opened, the sinter cake is stirred for 3 h with 100 g of glass beads (diameter 3 mm) in 100 ml of a suspension medium (the suspension medium is selected so that the ligand is readily soluble, but the metal complex has low solubility therein, typical suspension media are methanol, ethanol, dichloromethane, acetone, THF, ethyl acetate, toluene, etc.) and mechanically digested in the process. The fine suspension is decanted off from the glass beads, the solid is filtered off with suction, rinsed with 50 ml of the suspension medium and dried in vacuo. The dry solid is placed on a 3-5 cm deep aluminium oxide bed (aluminium oxide, basic, activity grade 1) in a continuous hot extractor and then extracted with an extractant (initially introduced amount about 500 ml, the extractant is selected so that the complex is readily soluble therein at elevated temperature and has low solubility therein when cold, particularly suitable extractants are hydrocarbons, such as toluene, xylenes, mesitylene, naphthalene, o-dichlorobenzene, halogenated aliphatic hydrocarbons are generally unsuitable since they may halogenate or decompose the complexes). When the extraction is complete, the extractant is evaporated to about 100 ml in vacuo. Metal complexes which have excessively good solubility in the extractant are brought to crystallisation by dropwise addition of 200 ml of methanol. The solid of the suspensions obtained in this way is filtered off with suction, washed once with about 50 ml of methanol and dried. After drying, the purity of the metal complex is determined by means of NMR and/or HPLC. If the purity is below 99.5%, the hot extraction step is repeated, omitting the aluminium oxide bed from the 2nd extraction. When a purity of 99.5-99.9% has been reached, the metal complex is heated or sublimed. The heating is carried out in a high vacuum (p about $10^{-6}$ mbar) in the temperature range from about 200-300° C. The sublimation is carried out in a high vacuum (p about $10^{-6}$ mbar) in the temperature range from about 230-400° C., with the sublimation preferably being carried out in the form of a fractional sublimation. Complexes which are readily soluble in organic solvents may alternatively also be chromatographed on silica gel.

If ligands in point group C1 are employed in the form of a racemic mixture, the derived fac-metal complexes are produced in the form of a diastereomer mixture. The enantiomer pair Λ,Δ in point group C3 generally has significantly lower solubility in the extractant than that in point group Cl, which is consequently enriched in the mother liquor. Separation of the diastereomers by this method is frequently possible. In addition, the diastereomers can also be separated by chromatography. If ligands in point group Cl are employed in enantiomerically pure form, the enantiomer pair Λ,Δ in point group C3 is formed.

Variant B: Tris-(2,2,6,6-tetramethyl-3,5-heptanedionato) iridium(III) as iridium starting material Procedure analogous to variant A, using 10 mmol of tris(2,2,6,6-tetramethyl-3,5-heptanedionato)iridium [99581-86-9] instead of 10 mmol of trisacetylacetonatoiridium(III) [15635-87-7]. The use of this starting material is advantageous since the purity of the crude products obtained is frequently better than in the case of variant A. In addition, the build-up of pressure in the ampoule is frequently not so pronounced.

Variant C: Sodium [cis,trans-dichloro(bisacetylacetonato)] iridate(III) as iridium starting material A mixture of 10 mmol of sodium [cis,trans-dichloro (bisacetylacetonato)]-iridate(III) [876296-21-8] and 60 mmol of the ligand in 50 ml of ethylene glycol, propylene glycol or diethylene glycol is heated under gentle reflux under a gentle stream of argon for the time indicated. After cooling to 60° C., the reaction mixture is diluted with a mixture of 50 ml of ethanol and 50 ml of 2 N hydrochloric acid with stirring and stirred for a further 1 h, the precipitated solid is filtered off with suction, washed three times with 30 ml of ethanol each time and then dried in vacuo. Purification by hot extraction or chromatography and fractional sublimation, as described under A.

| Ex. | Ligand L | Ir complex Diastereomer | Variant Reaction medium Reaction temp. Reaction time Suspension medium Extractant | Yield |
|---|---|---|---|---|
| $Ir(L1)_3$ | L1 | 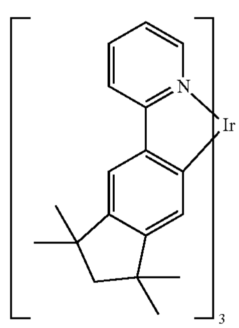 | C<br>Propylene glycol<br>Reflux<br>100 h<br>—<br>o-Xylene | 43% |
| $Ir(L2)_3$ | L2 | $Ir(L2)_3$ | as $Ir(L1)_3$ | 38% |

-continued
| Ex. | Ligand L | Ir complex Diastereomer | Variant Reaction medium Reaction temp. Reaction time Suspension medium Extractant | Yield |
|---|---|---|---|---|
| $Ir(L3)_3$ | L3 | 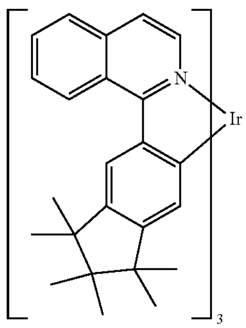 | A<br>—<br>230° C.<br>100 h<br>Acetone<br>o-Xylene | 42% |
| $Ir(L4)_3$ | L4 | $Ir(L4)_3$ | as $Ir(L1)_3$ | 44% |
| $Ir(L5)_3$ | L5 | 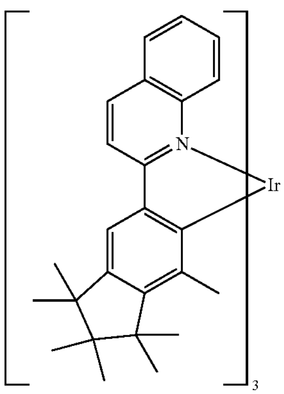 | A<br>—<br>280° C.<br>130 h<br>Acetone<br>o-Xylene | 38% |
| $Ir(L6)_3$ | L6 | 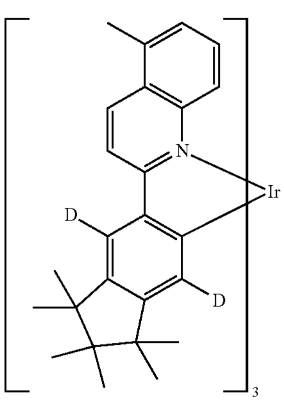 | C<br>Propylene glycol<br>Reflux<br>130 h<br>—<br>o-Xylene | 39% |

-continued
| Ex. | Ligand L | Ir complex Diastereomer | Variant Reaction medium Reaction temp. Reaction time Suspension medium Extractant | Yield |
|---|---|---|---|---|
| $Ir(L7)_3$ | L7 | 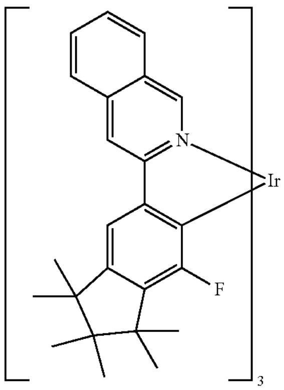 | B<br>—<br>240° C.<br>130 h<br>Acetone<br>o-Xylene | 28% |
| $Ir(L8)_3$ | L8 | $Ir(L8)_3$ | as $Ir(L1)_3$ | 44% |
| $Ir(L9)_3$ | L9 | 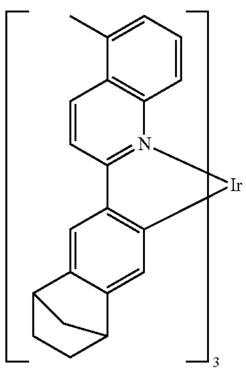<br>Λ,Δ-C3 | as $Ir(L6)_3$ | 28% |
| $Ir(L10)_3$ | L10 | 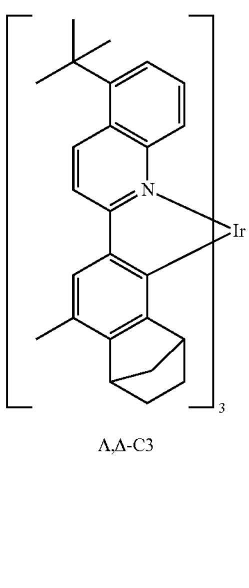<br>Λ,Δ-C3 | B<br>—<br>250° C.<br>130 h<br>Acetone<br>o-Xylene | 22% |

-continued

| Ex. | Ligand L | Ir complex Diastereomer | Variant Reaction medium Reaction temp. Reaction time Suspension medium Extractant | Yield |
|---|---|---|---|---|
| $Ir(L11)_3$ | L11 | 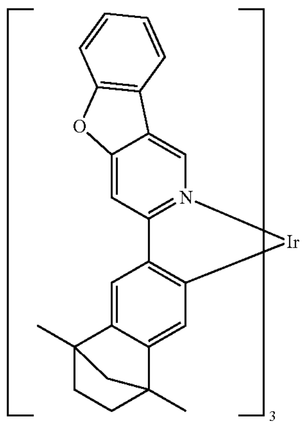 | B<br>—<br>230° C.<br>130 h<br>Acetone<br>o-Xylene | 23% |
| $Ir(L12)_3$ | L12 | $Ir(L12)_3$ | as $Ir(L1)_3$ | 38% |
| $Ir(L13)_3$ | L13 | $Ir(L13)_3$ | as $Ir(L1)_3$ | 35% |
| $Ir(L15)_3$ | L15 | 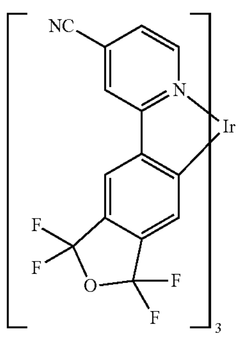<br>$Ir(L15)_3$ | A<br>—<br>230° C.<br>100 h<br>Acetone<br>o-Xylene | 28% |
| $Ir(L16)_3$ | L16 | 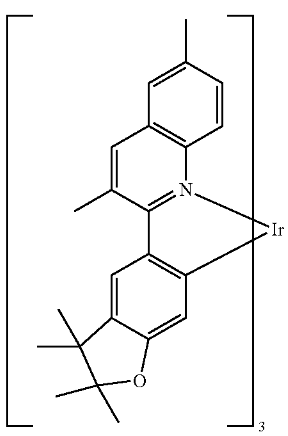 | C<br>Ethylene glycol<br>Reflux<br>140 h<br>—<br>Chromatographic purification | 34% |

-continued

| Ex. | Ligand<br>L | Ir complex<br>Diastereomer | Variant<br>Reaction medium<br>Reaction temp.<br>Reaction time<br>Suspension medium<br>Extractant | Yield |
| --- | --- | --- | --- | --- |
| Ir(L17)$_3$ | L17 | 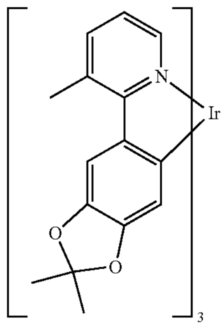<br>Ir(L17)$_3$ | B<br>—<br>210° C.<br>100 h<br>Acetone<br>o-Xylene | 26% |
| Ir(L18)$_3$ | L18 | Ir(L18)$_3$<br>Λ,Δ-C3 | as Ir(L9)$_3$ | 31% |
| Ir(L19)$_3$ | L19 | Ir(L19)$_3$<br>Λ,Δ-C3 | as Ir(L9)$_3$ | 26% |
| Ir(L20)$_3$ | L20 | Ir(L20)$_3$ | as Ir(L1)$_3$ | 20% |
| Ir(L22)$_3$ | L22 | 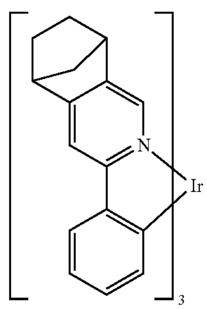<br>Λ,Δ-C3 | C<br>Propylene glycol<br>Reflux<br>130 h<br>—<br>o-Xylene | 26% |
| Ir(L23)$_3$ | L23 | 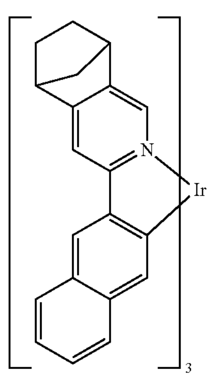<br>Λ,Δ-C3 | C<br>Propylene glycol<br>Reflux<br>120 h<br>—<br>o-Xylene | 24 & |
| Ir(L24)$_3$ | L24 | Ir(L24)$_3$<br>Λ,Δ-C3 | as Ir(L22)$_3$ | 25% |

-continued
| Ex. | Ligand L | Ir complex Diastereomer | Variant Reaction medium Reaction temp. Reaction time Suspension medium Extractant | Yield |
|---|---|---|---|---|
| $Ir(L25)_3$ | L25 | 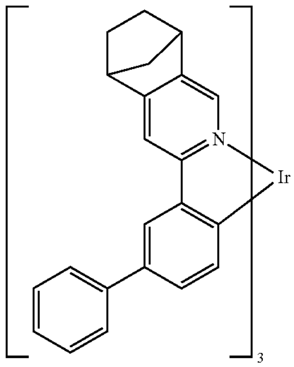 Λ,Δ-C3 | as $Ir(L16)_3$ | 23% |
| $Ir(L26)_3$ | L26 | $Ir(L26)_3$ Λ,Δ-C3 | C<br>Diethylene glycol<br>220° C.<br>140 h<br>—<br>Chrom. purification<br>Metal complex is heated | 25% |
| $Ir(L27)_3$ | L27 | $Ir(L27)_3$ Λ,Δ-C3 | as $Ir(L22)_3$ | 27% |
| $Ir(L28)_3$ | L28 | 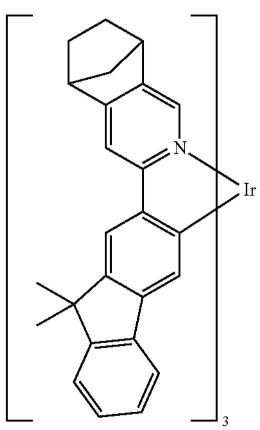 Λ,Δ-C3 | B<br>—<br>230° C.<br>130 h<br>Acetone<br>o-Xylene | 26% |

-continued
| Ex. | Ligand L | Ir complex Diastereomer | Variant Reaction medium Reaction temp. Reaction time Suspension medium Extractant | Yield |
|---|---|---|---|---|
| $Ir(L29)_3$ | L29 | 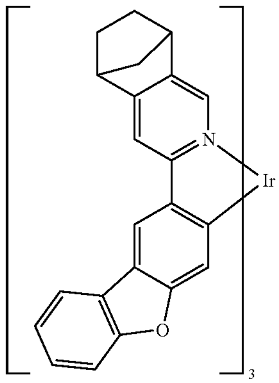 Λ,Δ-C3 | as $Ir(L28)_3$ | 24% |
| $Ir(L30)_3$ | L30 | 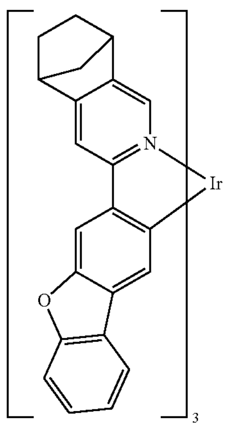 Λ,Δ-C3 | as $Ir(L28)_3$ | 25% |
| $Ir(L31)_3$ | L31 | $Ir(L31)_3$ Λ,Δ-C3 | as $Ir(L28)_3$ | 19% |
| $Ir(L32)_3$ | L32 | 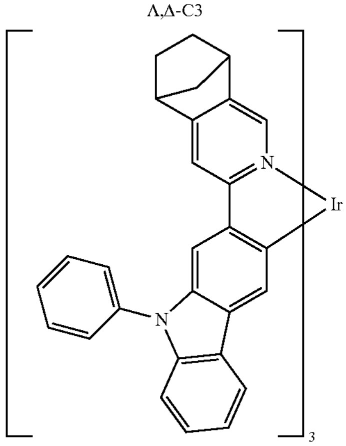 Λ,Δ-C3 | as $Ir(L26)_3$ | 23% |

-continued
| Ex. | Ligand L | Ir complex Diastereomer | Variant Reaction medium Reaction temp. Reaction time Suspension medium Extractant | Yield |
|---|---|---|---|---|
| $Ir(L33)_3$ | L33 | 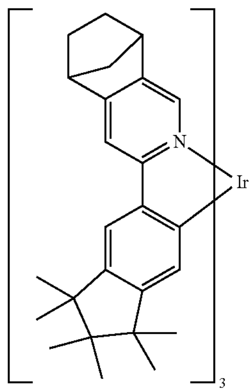 Λ,Δ-C3 | as $Ir(L3)_3$ | 27% |
| $Ir(L34)_3$ | L34 | as $Ir(L34)_3$ Λ,Δ-C3 | as $Ir(L3)_3$ | 24% |
| $Ir(L35)_3$ | L35 | 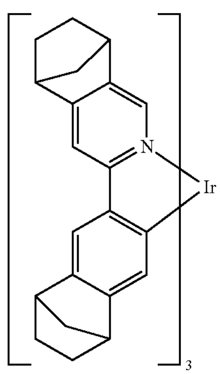 Diastereomer mixture | as $Ir(L11)_3$ | 46% |
| $Ir(L36)_3$ | L36 | 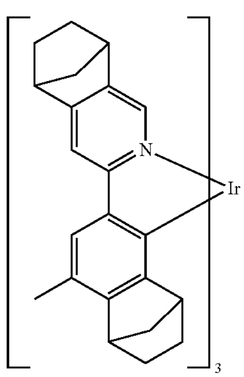 Diastereomer mixture | as $Ir(L11)_3$ | 16% |

-continued
| Ex. | Ligand L | Ir complex Diastereomer | Variant Reaction medium Reaction temp. Reaction time Suspension medium Extractant | Yield |
|---|---|---|---|---|
| $Ir(L37)_3$ | L37 | 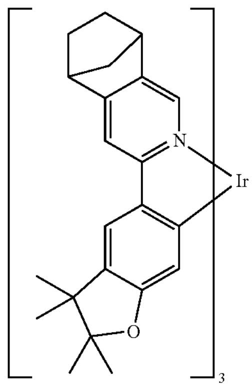 Λ,Δ-C3 | C<br>Ethylene glycol<br>Reflux<br>140 h<br>—<br>Chromatographic purification | 24% |
| $Ir(L38)_3$ | L38 | 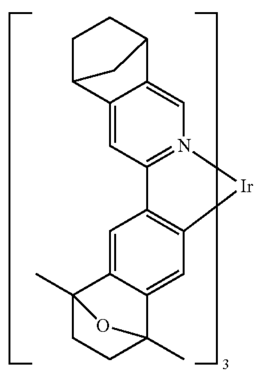 Diastereomer mixture | as $Ir(L11)_3$ | 39% |
| $Ir(L39)_3$ | L39 | 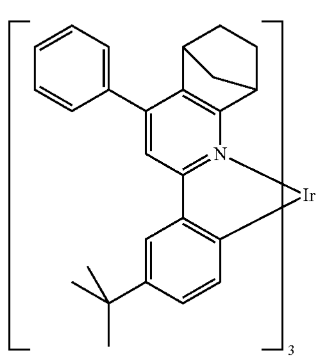 Λ,Δ-C3 | C<br>Diethylene glycol<br>Reflux<br>130 h<br>—<br>Chromatographic purification | 23% |

-continued
| Ex. | Ligand L | Ir complex Diastereomer | Variant Reaction medium Reaction temp. Reaction time Suspension medium Extractant | Yield |
|---|---|---|---|---|
| $Ir(L40)_3$ | L40 | 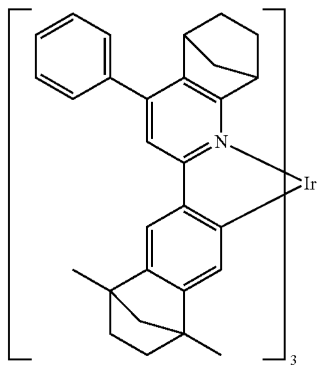 Diastereomer mixture | C Diethylene glycol Reflux 130 h — Chromatographic purification | 19% |
| $Ir(L41)_3$ | L41 | 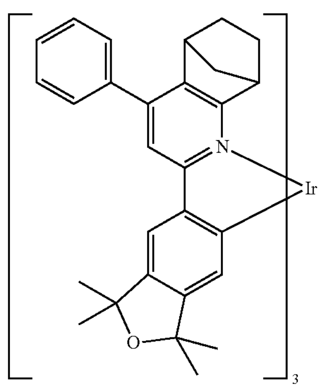 Λ,Δ-C3 | C Diethylene glycol Reflux 130 h — Chromatographic purification | 26% |
| $Ir(L42)_3$ | L42 | 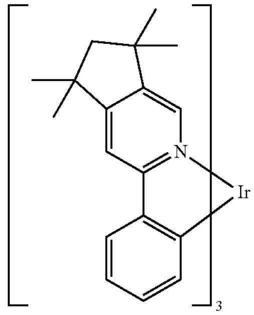 | as $Ir(L1)_3$ | 50% |
| $Ir(L43)_3$ | L43 | as $Ir(L42)_3$ | as $Ir(L42)_3$ | 54% |

-continued
| Ex. | Ligand L | Ir complex Diastereomer | Variant Reaction medium Reaction temp. Reaction time Suspension medium Extractant | Yield |
|---|---|---|---|---|
| $Ir(L44)_3$ | L44 | 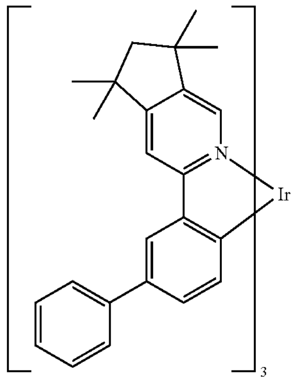 | as $Ir(L16)_3$ | 47% |
| $Ir(L45)_3$ | L45 | as $Ir(L44)_3$ | as $Ir(L44)_3$ | 48% |
| $Ir(L46)_3$ | L46 | 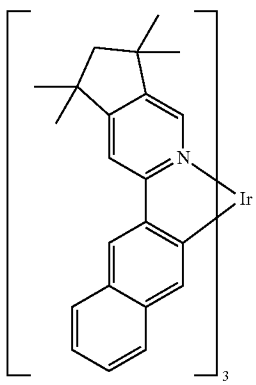 | B<br>—<br>220° C.<br>130 h<br>Acetone<br>o-Xylene | 44% |
| $Ir(L47)_3$ | L47 | 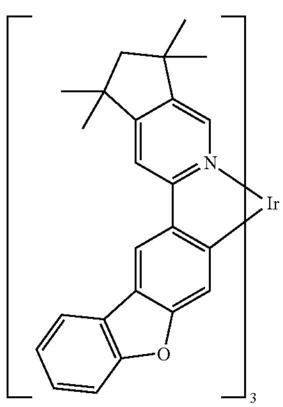 | A<br>—<br>230° C.<br>130 h<br>Acetone<br>o-Xylene | 45% |

-continued
| Ex. | Ligand L | Ir complex Diastereomer | Variant Reaction medium Reaction temp. Reaction time Suspension medium Extractant | Yield |
|---|---|---|---|---|
| Ir(L48)$_3$ | L48 | 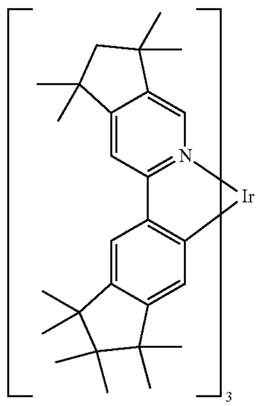 | A — 230° C. 150 h Acetone o-Xylene | 43% |
| Ir(L49)$_3$ | L49 | 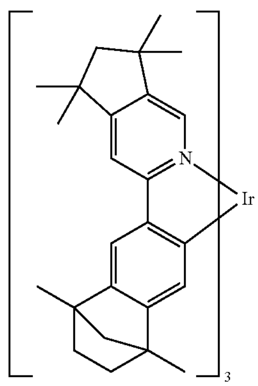 Λ,Δ-C3 | as Ir(L48)$_3$ | 23% |
| Ir(L50)$_3$ | L50 | Ir(L50)$_3$ Λ,Δ-C3 | as Ir(L48)$_3$ | 27% |
| Ir(L51)$_3$ | L51 | Ir(L51)$_3$ Λ,Δ-C3 | as Ir(L42)$_3$ | 38% |
| Ir(L52)$_3$ | L52 | 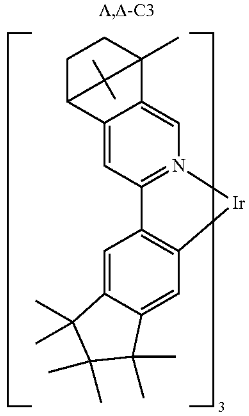 Λ,Δ-C3 | as Ir(L48)$_3$ | 25% |

-continued

| Ex. | Ligand L | Ir complex Diastereomer | Variant Reaction medium Reaction temp. Reaction time Suspension medium Extractant | Yield |
|---|---|---|---|---|
| $Ir(L64)_3$ | L64 | 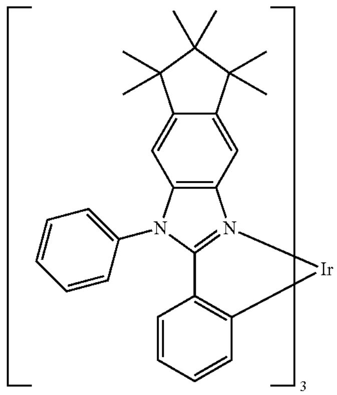 | B — 240° C. 120 h Acetone o-Xylene | 48% |
| $Ir(L65)_3$ | L65 | $Ir(L65)_3$ | as $Ir(L64)_3$ | 42% |
| $Ir(L66)_3$ | L66 | $Ir(L66)_3$ | as $Ir(L64)_3$ | 45% |
| $Ir(L67)_3$ | L67 | $Ir(L67)_3$ | as $Ir(L64)_3$ | 39% |
| $Ir(L68)_3$ | L68 | 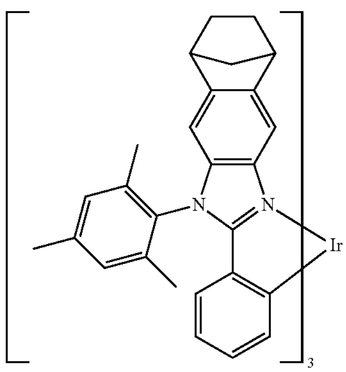 Λ,Δ-C3 | B — 240° C. 130 h Acetone o-Xylene | 26% |
| $Ir(L69)_3$ | L69 | $Ir(L69)_3$ Λ,Δ-C3 | as $Ir(L68)_3$ | 16% |
| $Ir(L70)_3$ | L70 | $Ir(L70)_3$ | as $Ir(L68)_3$ | 37% |
| $Ir(L71)_3$ | L71 | $Ir(L71)_3$ Λ,Δ-C3 | as $Ir(L68)_3$ | 21% |
| $Ir(L72)_3$ | L72 | 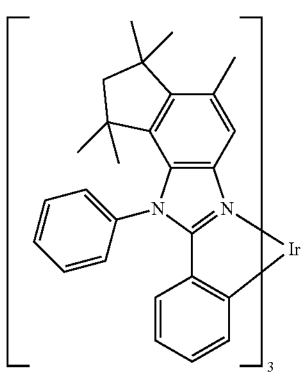 | B — 260° C. 150 h Acetone o-Xylene | 22% |

-continued
| Ex. | Ligand L | Ir complex Diastereomer | Variant Reaction medium Reaction temp. Reaction time Suspension medium Extractant | Yield |
|---|---|---|---|---|
| Ir(L73)$_3$ | L73 | 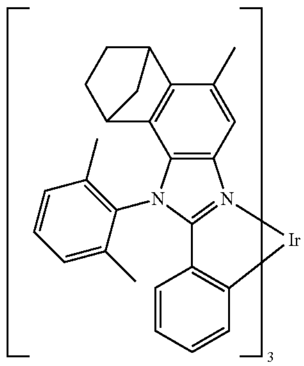 Λ,Δ-C3 | as Ir(L68)$_3$ | 23% |
| Ir(L74)$_3$ | L74 | 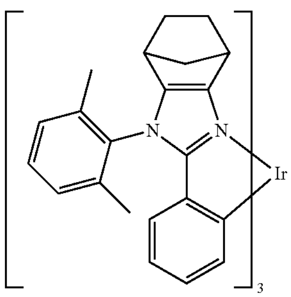 Λ,Δ-C3 | B<br>—<br>245° C.<br>130 h<br>Acetone<br>o-Xylene | 38% |
| Ir(L75)$_3$ | L75 | Ir(L75)$_3$ Λ,Δ-C3 | as Ir(L74)$_3$ | 31% |
| Ir(L76)$_3$ | L76 | 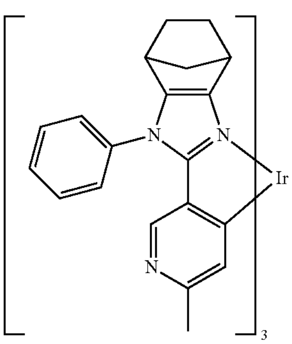 Λ,Δ-C3 | B<br>—<br>260° C.<br>140 h<br>Acetone<br>o-Xylene | 28% |

-continued

| Ex. | Ligand L | Ir complex Diastereomer | Variant Reaction medium Reaction temp. Reaction time Suspension medium Extractant | Yield |
|---|---|---|---|---|
| $Ir(L77)_3$ | L77 | 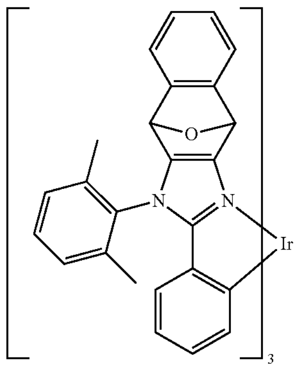 Λ,Δ-C3 | as $Ir(L74)_3$ | 34% |
| $Ir(L95)_3$ | L95 | 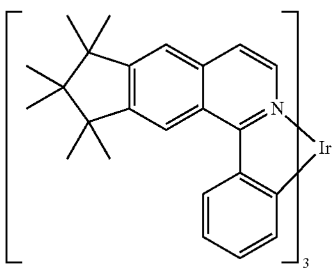 | A<br>—<br>250° C.<br>40 h<br>Ethanol<br>Cyclohexane | 33% |
| $Ir(L97)_3$ | L97 | $Ir(L97)_3$<br>Λ,Δ-C3 + C1 | as $Ir(L95)_3$ | 30% |
| $Ir(L98)_3$ | L98 | $Ir(L98)_3$<br>Λ,Δ-C3 + C1 | as $Ir(L95)_3$ | 26% |
| $Ir(L99)_3$ | L99 | $Ir(L99)_3$<br>Λ,Δ-C3 + C1 | as $Ir(L95)_3$ | 23% |
| $Ir(L101)_3$ | L101 | $Ir(L101)_3$ | as $Ir(L95)_3$ | 39% |
| $Ir(L102)_3$ | L102 | 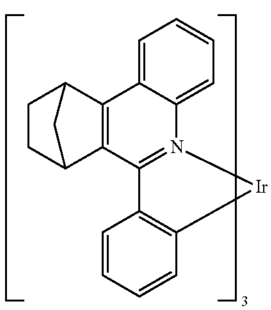 Λ,Δ-C3 | A<br>—<br>270° C.<br>60 h<br>Ethanol<br>Cyclohexane | 3.6% |

-continued

| Ex. | Ligand L | Ir complex Diastereomer | Variant Reaction medium Reaction temp. Reaction time Suspension medium Extractant | Yield |
|---|---|---|---|---|
| $Ir(L128)_3$ | L128 | 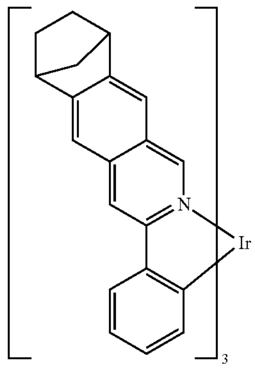 Λ,Δ-C3 + C1 | B<br>—<br>250° C.<br>40 h<br>Ethanol<br>Cyclohexane/ethyl acetate 8/2, v:v | 34% |
| $Ir(L129)_3$ | L129 | 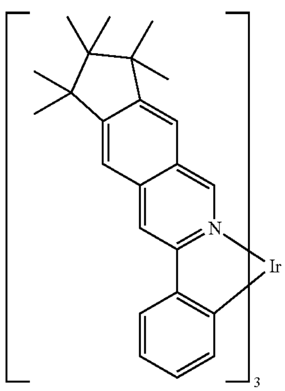 | as $Ir(L128)_3$ | 35% |
| $Ir(L130)_3$ | L130 | $Ir(L130)_3$ | B<br>—<br>260° C.<br>40 h<br>Ethanol<br>Cyclohexane/ethyl acetate 8/2, v:v | 28% |
| $Ir(L131)_3$ | L131 | $Ir(L131)_3$ | as $Ir(L128)_3$ | 8% |
| $Ir(L132)_3$ | L132 | $Ir(L132)_3$ | as $Ir(L128)_3$ | 32% |
| $Ir(L133)_3$ | L133 | $Ir(L133)_3$ Λ,Δ-C3 + C1 | as $Ir(L128)_3$ | 25% |
| $Ir(L134)_3$ | L134 | $Ir(L134)_3$ | as $Ir(L128)_3$ | 26% |
| $Ir(L135)_3$ | L135 | $Ir(L135)_3$ Λ,Δ-C3 + C1 | as $Ir(L130)_3$ | 20% |

2) Homoleptic Iridium Complexes of the Arduengo Carbene Type:

Preparation analogous to K. Tsuchiya, et al., Eur. J. Inorg. Chem., 2010, 926.

A mixture of 10 mmol of the ligand, 3 mmol of iridium (III) chloride hydrate, 10 mmol of silver carbonate, 10 mmol of sodium carbonate in 75 ml of 2-ethoxyethanol is warmed under reflux for 24 h. After cooling, 300 ml of water are added, the precipitated solid is filtered off with suction, washed once with 30 ml of water and three times with 15 ml of ethanol each time and dried in vacuo. The fac/mer isomer mixture obtained in this way is chromatographed on silica gel. The isomers obtained in this way are subjected to fractional sublimation as described under 1) variant A.

| Ex. | Ligand L | Ir complex Diastereomer | Yield |
|---|---|---|---|
| fac-Ir $(L78)_3$ mer-Ir $(L78)_3$ | L78 | 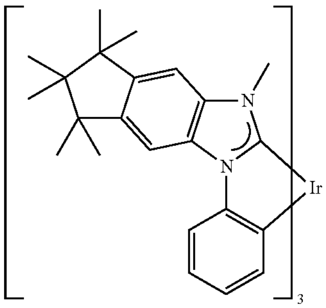 | 36% 17% |
| fac-Ir $(L79)_3$ mer-Ir $(L79)_3$ | L79 | fac-Ir$(L79)_3$ mer-Ir$(L79)_3$ | 11% 24% |
| fac-Ir $(L80)_3$ mer-Ir $(L80)_3$ | L80 | 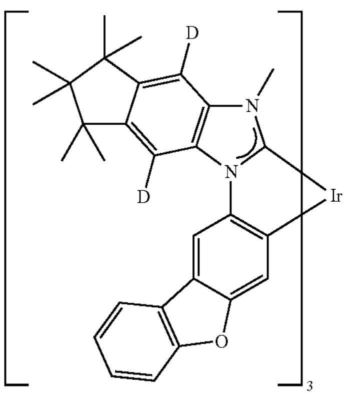 | 44% 11% |
| fac-Ir $(L81)_3$ mer-Ir $(L81)_3$ | L81 | 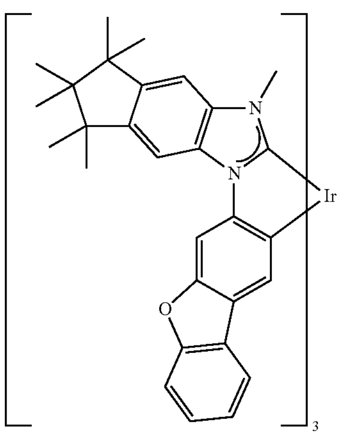 | 38% 17% |
-continued
| Ex. | Ligand L | Ir complex Diastereomer | Yield |
|---|---|---|---|
| fac-Ir $(L82)_3$ mer-Ir $(L82)_3$ | L82 | 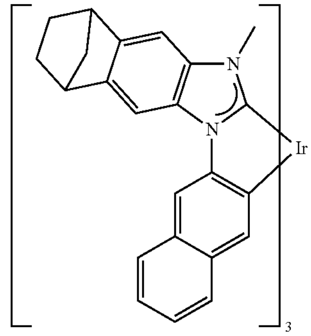 fac-Λ,Δ-C3 | 23% — |
| fac-Ir $(L83)_3$ mer-Ir $(L83)_3$ | L83 | 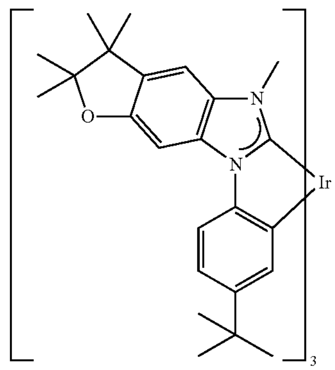 | 34% 12% |
| fac-Ir $(L84)_3$ mer-Ir $(L84)_3$ | L84 | 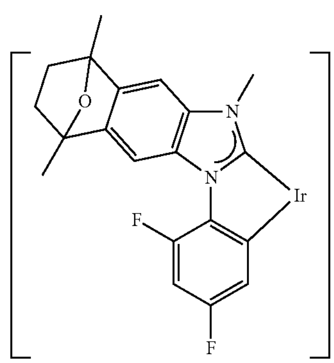 fac-Λ,Δ-C3 | 12% 16% |

-continued
| Ex. | Ligand L | Ir complex Diastereomer | Yield |
|---|---|---|---|
| fac-Ir $(L85)_3$ mer-Ir $(L85)_3$ | L85 | 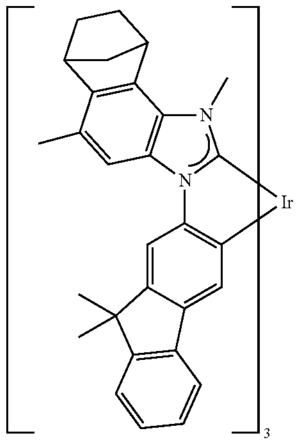 fac-Λ,Δ-C3 | 25% — |
| fac-Ir $(L86)_3$ mer-Ir $(L86)_3$ | L86 | 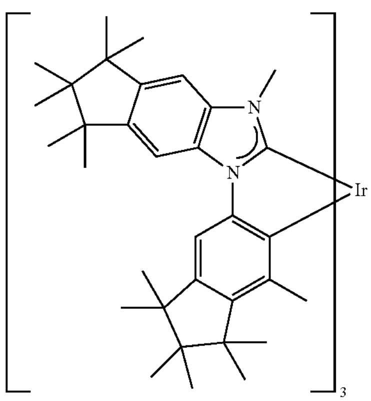 | 33% 12% |
| fac-Ir $(L87)_3$ mer-Ir $(L87)_3$ | L87 | 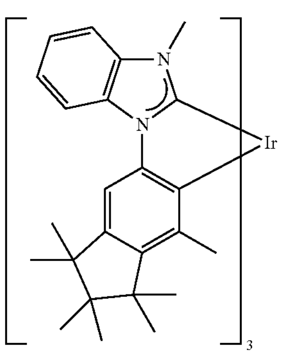 | 6% 13% |
| fac-Ir $(L88)_3$ mer-Ir $(L88)_3$ | L88 | 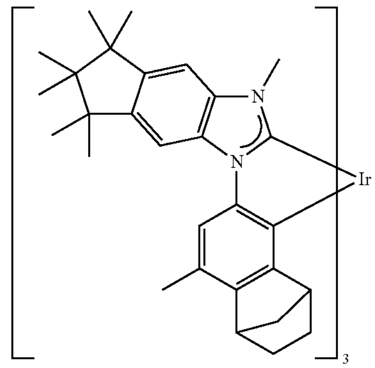 fac-Λ,Δ-C3 | 19% 15% |
| fac-Ir $(L89)_3$ mer-Ir $(L89)_3$ | L89 | 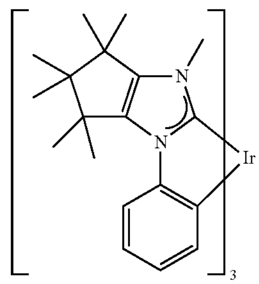 | 24% 9% |
| fac-Ir $(L90)_3$ mer-Ir $(L90)_3$ | L90 | 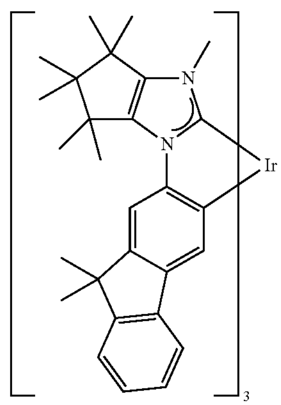 | 26% 11% |
| fac-Ir $(L91)_3$ mer-Ir $(L91)_3$ | L91 | 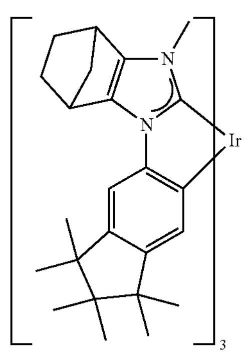 fac-Λ,Δ-C3 | 18% — |

-continued

| Ex. | Ligand L | Ir complex Diastereomer | Yield |
|---|---|---|---|
| fac-Ir $(L92)_3$ mer-Ir $(L92)_3$ | L92 | 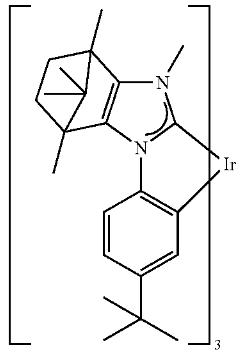 fac-Λ,Δ-C3 | 16% — |

3) Iridium Complexes of the $[Ir(L)_2Cl]_2$ Type

Variant A:

A mixture of 22 mmol of the ligand, 10 mmol of iridium (III) chloride hydrate, 75 ml of 2-ethoxyethanol and 25 ml of water is heated under reflux for 16 24 h with vigorous stirring. If the ligand does not dissolve or does not dissolve completely in the solvent mixture under reflux, 1,4-dioxane is added until a solution has formed. After cooling, the precipitated solid is filtered off with suction, washed twice with ethanol/water (1:1, vv) and then dried in vacuo. The chloro dimer of the formula $[Ir(L)_2Cl]_2$ obtained in this way is reacted further without purification.

Variant B:

A mixture of 10 mmol of sodium bisacetylacetonatodichloroiridate(III) [770720-50-8], 24 mmol of ligand L and a glass-clad magnetic stirrer bar are melted into a thick-walled 50 ml glass ampoule in vacuo ($10^{-5}$ mbar). The ampoule is heated at the temperature indicated for the time indicated, during which the molten mixture is stirred with the aid of a magnetic stirrer. After cooling—NOTE: the ampoules are usually under pressure!— the ampoule is opened, the sinter cake is stirred for 3 h with 100 g of glass beads (diameter 3 mm) in 100 ml of the suspension medium indicated (the suspension medium is selected so that the ligand is readily soluble, but the chloro dimer of the formula $[Ir(L)_2Cl]_2$ has low solubility therein, typical suspension media are dichloromethane, acetone, ethyl acetate, toluene, etc.) and mechanically digested at the same time. The fine suspension is decanted off from the glass beads, the solid $[Ir(L)_2Cl]_2$ which still contains about 2 eq. of NaCl, referred to below as the crude chloro dimer) is filtered off with suction and dried in vacuo. The crude chloro dimer of the formula $[Ir(L)_2Cl]_2$ obtained in this way is reacted further without purification.

| Ex. | Ligand L | Ir complex Variant Temp./time Diastereomer | Yield |
|---|---|---|---|
| $[Ir(L1)_2Cl]_2$ | L1 | 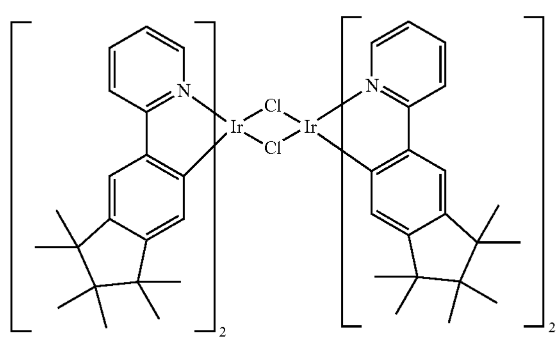 A | 76% |
| $[Ir(L2)_2Cl]_2$ | L2 | $Ir[L2)Cl]_2$ A | 81% |

-continued
| Ex. | Ligand L | Ir complex Variant Temp./time Diastereomer | Yield |
|---|---|---|---|
| $[Ir(L5)_2Cl]_2$ | L5 | 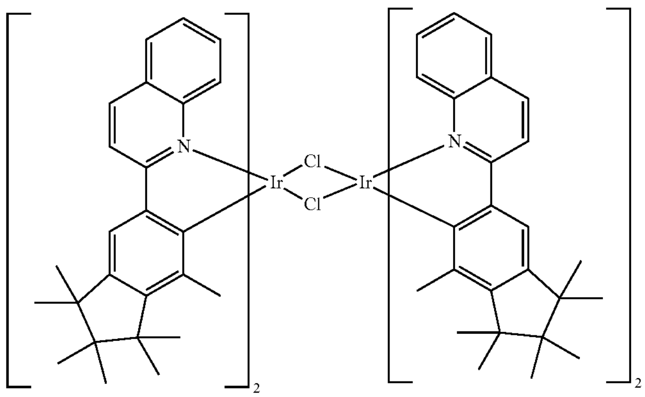 A | 61% |
| $[Ir(L6)_2Cl]_2$ | L6 | $Ir[(L6)Cl]_2$ A | 74% |
| $[Ir(L10)_2Cl]_2$ | L10 | 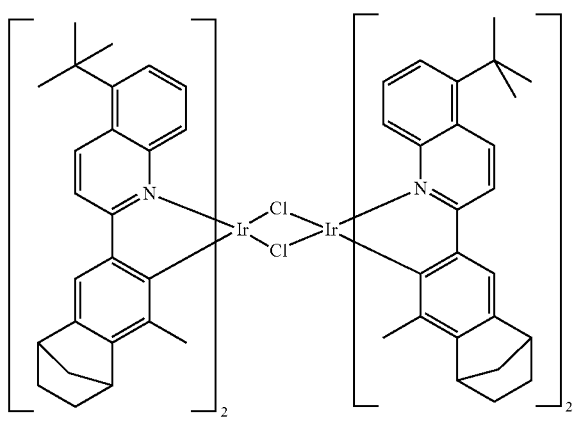 A Diastereomer mixture | 63% |
| $[Ir(L11)_2Cl]_2$ | L11 | 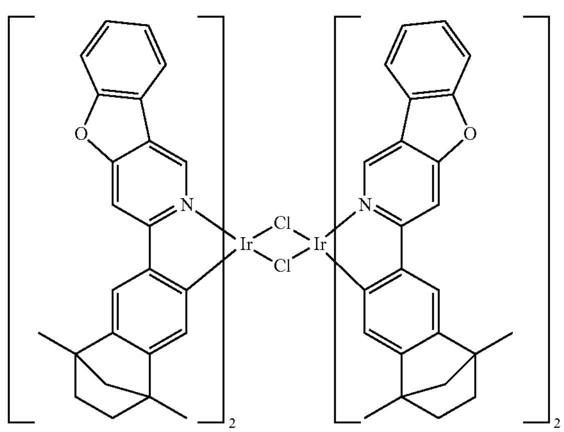 A Diastereomer mixture | 69% |

-continued
| Ex. | Ligand L | Ir complex Variant Temp./time Diastereomer | Yield |
|---|---|---|---|
| $[Ir(L12)_2Cl]_2$ | L12 | $Ir[(L12)Cl]_2$<br>B | 75% |
| $[Ir(L14)_2Cl]_2$ | L14 | 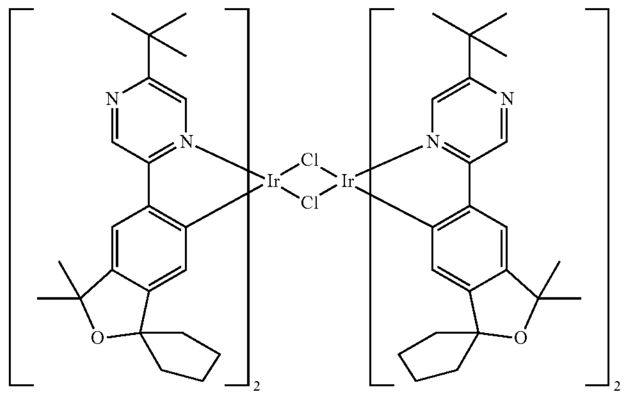 | |
| $[Ir(L21)_2Cl]_2$ | L21 | $Ir[(L21)Cl]_2$<br>A<br>Diastereomer mixture | 53% |
| $[Ir(L25)_2Cl]_2$ | L25 | 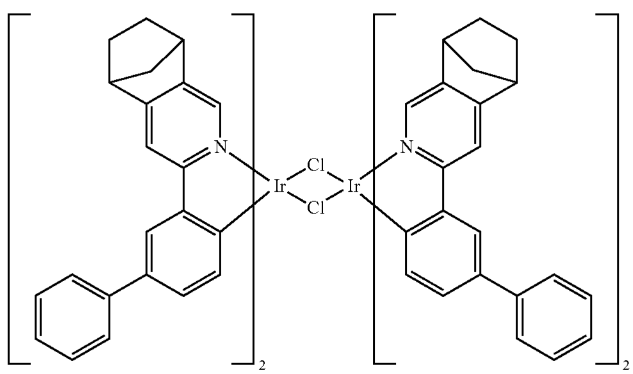<br>A<br>Diastereomer mixture | 73% |
| $[Ir(L42)_2Cl]_2$ | L42 | 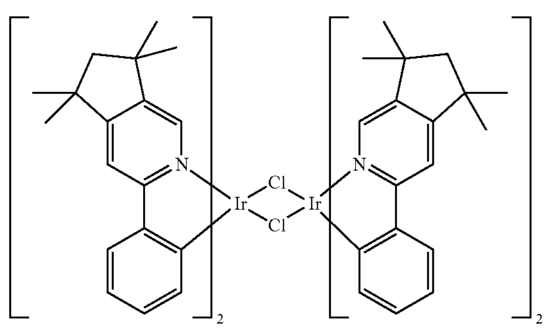<br>A | 84% |

-continued
| Ex. | Ligand L | Ir complex Variant Temp./time Diastereomer | Yield |
|---|---|---|---|
| $[Ir(L47)_2Cl]_2$ | L47 | 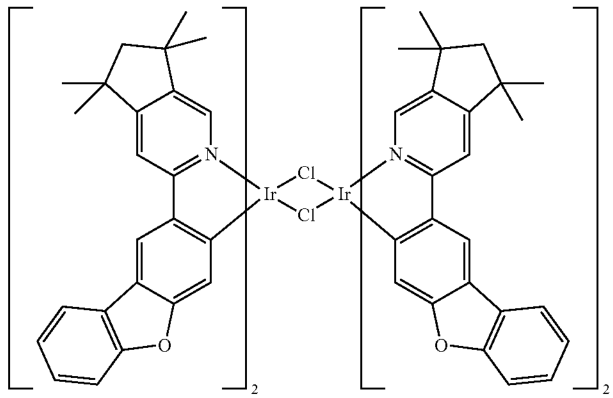 A | 80% |
| $[Ir(L48)_2Cl]_2$ | L48 | 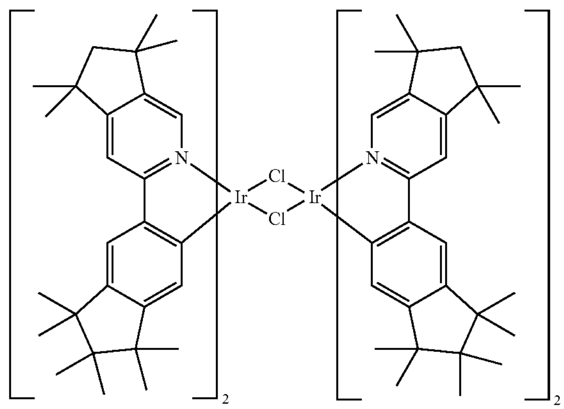 B 200° C./80 h | 78% |
| $[Ir(L53)_2Cl]_2$ | L53 | 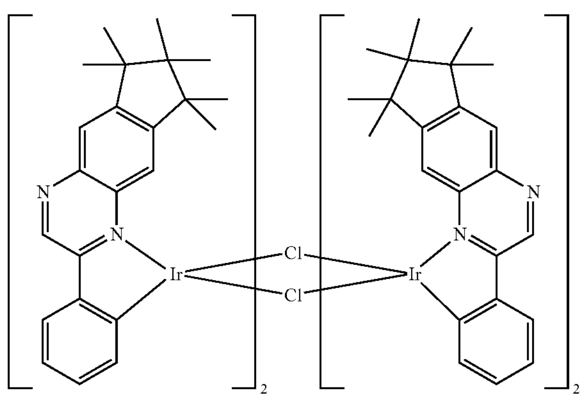 A | 46% |
| $[Ir(L55)_2Cl]_2$ | L55 | $Ir[(L55)Cl]_2$ A | 44% |

-continued
| Ex. | Ligand L | Ir complex Variant Temp./time Diastereomer | Yield |
|---|---|---|---|
| $[Ir(L59)_2Cl]_2$ | L59 | 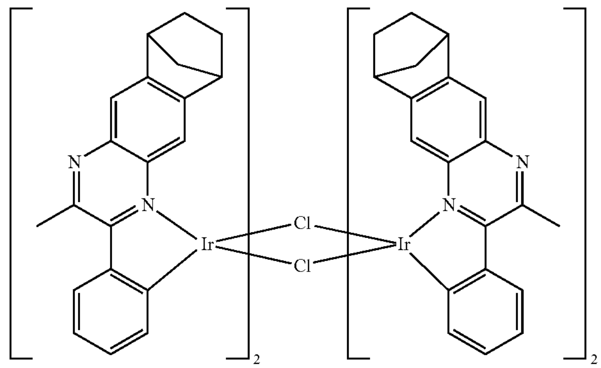 A Diastereomer mixture | 57% |
| $[Ir(L60)_2Cl]_2$ | L60 | 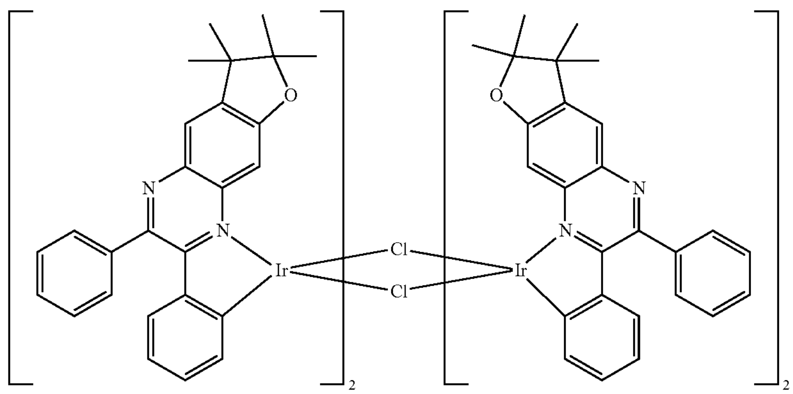 A | 63% |
| $[Ir(L62)_2Cl]_2$ | L62 | 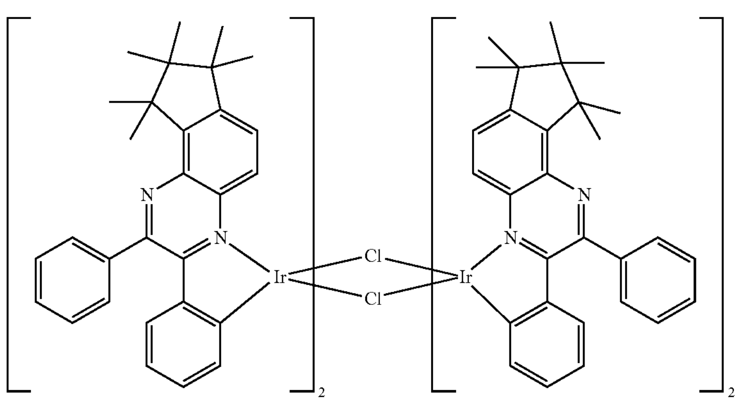 B 240° C./48 h | 65% |

-continued
| Ex. | Ligand L | Ir complex Variant Temp./time Diastereomer | Yield |
|---|---|---|---|
| $[Ir(L64)_2Cl]_2$ | L64 | 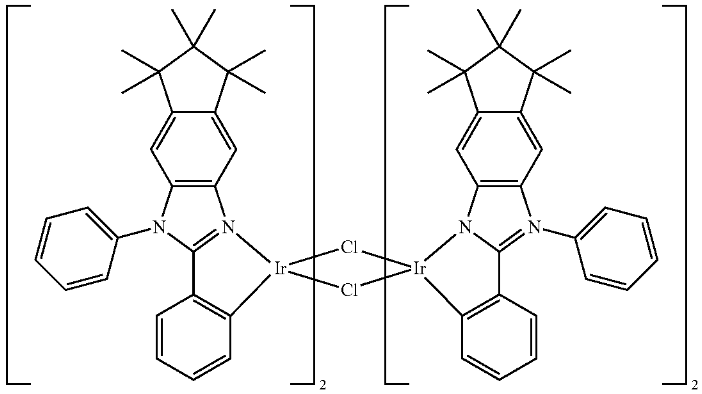 B 250° C./80 h | 88% |
| $[Ir(L72)_2Cl]_2$ | L72 | 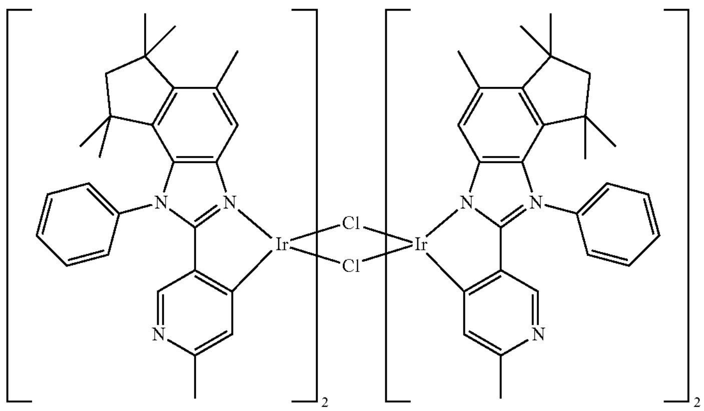 B 270° C./80 h | 78% |
| $[Ir(L74)_2Cl]_2$ | L74 | 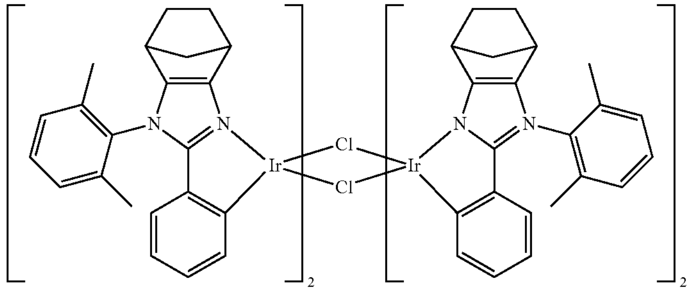 B 250° C./80 h | 66% |

-continued

| Ex. | Ligand L | Ir complex<br>Variant<br>Temp./time<br>Diastereomer | Yield |
|---|---|---|---|
| $[Ir(L95)_2Cl]_2$ | L95 | 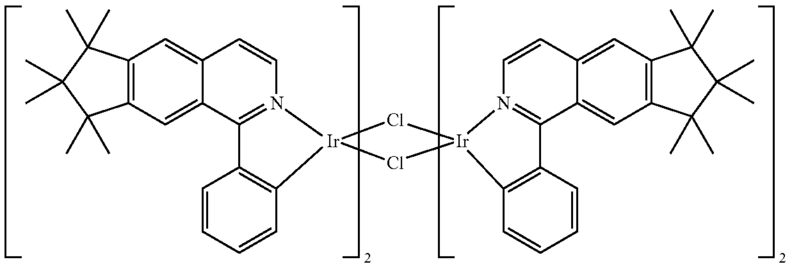<br>B<br>240° C./60 h | 88% |
| $[Ir(L96)_2Cl]_2$ | L96 | $[Ir(L96)_2Cl]_2$<br>as $[Ir(L95)_2Cl]_2$ | 86% |
| $[Ir(L100)_2Cl]_2$ | L100 | $[Ir(L100)_2Cl]_2$<br>as $[Ir(L95)_2Cl]_2$ | 87% |
| $[Ir(L102)_2Cl]_2$ | L102 | 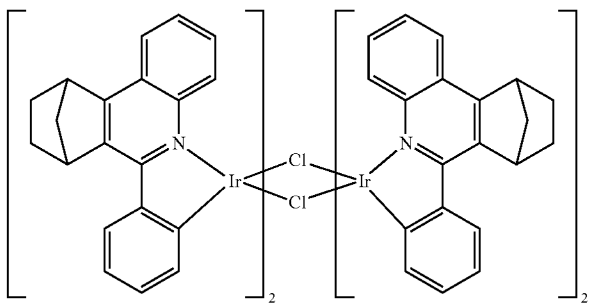<br>B<br>250° C./60 h<br>Diastereomer mixture | 92% |
| $[Ir(L103)_2Cl]_2$ | L103 | $[Ir(L103)_2Cl]_2$<br>as $[Ir(L102)_2Cl]_2$ | 90% |
| $[Ir(L104)_2Cl]_2$ | L104 | $[Ir(L104)_2Cl]_2$<br>as $[Ir(L102)_2Cl]_2$ | 90% |
| $[Ir(L105)_2Cl]_2$ | L105 | $[Ir(L105)_2Cl]_2$<br>as $[Ir(L102)_2Cl]_2$ | 83% |
| $[Ir(L106)_2Cl]_2$ | L106 | $[Ir(L106)_2Cl]_2$<br>as $[Ir(L102)_2Cl]_2$ | 91% |
| $[Ir(L107)_2Cl]_2$ | L107 | $[Ir(L107)_2Cl]_2$<br>as $[Ir(L102)_2Cl]_2$ | 90% |
| $[Ir(L108)_2Cl]_2$ | L108 | $[Ir(L108)_2Cl]_2$<br>as $[Ir(L102)_2Cl]_2$ | 87% |
| $[Ir(L109)_2Cl]_2$ | L109 | $[Ir(L109)_2Cl]_2$<br>as $[Ir(L102)_2Cl]_2$ | 90% |
| $[Ir(L110)_2Cl]_2$ | L110 | $[Ir(L110)_2Cl]_2$<br>as $[Ir(L102)_2Cl]_2$ | 92% |
| $[Ir(L111)_2Cl]_2$ | L111 | $[Ir(L111)_2Cl]_2$<br>as $[Ir(L102)_2Cl]_2$ | 89% |
| $[Ir(L112)_2Cl]_2$ | L112 | $[Ir(L112)_2Cl]_2$<br>as $[Ir(L102)_2Cl]_2$ | 84% |
| $[Ir(L113)_2Cl]_2$ | L113 | $[Ir(L113)_2Cl]_2$<br>B<br>260° C./60 h<br>Diastereomer mixture | 78% |
| $[Ir(L114)_2Cl]_2$ | L114 | $[Ir(L114)_2Cl]_2$<br>B<br>280° C./60 h<br>Diastereomer mixture | 64% |
| $[Ir(L115a)_2Cl]_2$ | L115a | $[Ir(L115a)_2Cl]_2$<br>as $[Ir(L102)_2Cl]_2$ | 89% |
| $[Ir(L115b)_2Cl]_2$ | L115b | $[Ir(L115b)_2Cl]_2$<br>as $[Ir(L102)_2Cl]_2$ | 91% |

-continued

| Ex. | Ligand L | Ir complex Variant Temp./time Diastereomer | Yield |
|---|---|---|---|
| $[Ir(L116)_2Cl]_2$ | L116 | $[Ir(L116)_2Cl]_2$ as $[Ir(L114)_2Cl]_2$ | 87% |
| $[Ir(L117)_2Cl]_2$ | L117 | $[Ir(L117)_2Cl]_2$ as $[Ir(L102)_2Cl]_2$ | 88% |
| $[Ir(L118)_2Cl]_2$ | L118 | $[Ir(L118)_2Cl]_2$ as $[Ir(L102)_2Cl]_2$ | 88% |
| $[Ir(L119)_2Cl]_2$ | L119 | $[Ir(L119)_2Cl]_2$ as $[Ir(L102)_2Cl]_2$ | 90% |
| $[Ir(L120)_2Cl]_2$ | L120 | $[Ir(L120)_2Cl]_2$ as $[Ir(L102)_2Cl]_2$ | 89% |
| $[Ir(L121)_2Cl]_2$ | L121 | $[Ir(L121)_2Cl]_2$ as $[Ir(L102)_2Cl]_2$ | 89% |
| $[Ir(L122)_2Cl]_2$ | L122 | $[Ir(L122)_2Cl]_2$ as $[Ir(L102)_2Cl]_2$ | 87% |
| $[Ir(L123)_2Cl]_2$ | L123 | $[Ir(L123)_2Cl]_2$ as $[Ir(L102)_2Cl]_2$ | 93% |
| $[Ir(L124)_2Cl]_2$ | L124 | $[Ir(L124)_2Cl]_2$ B 250° C./30 h Diastereomer mixture | 78% |
| $[Ir(L125)_2Cl]_2$ | L125 | $[Ir(L125)_2Cl]_2$ as $[Ir(L124)_2Cl]_2$ | 80% |
| $[Ir(L126)_2Cl]_2$ | L126 | $[Ir(L126)_2Cl]_2$ as $[Ir(L124)_2Cl]_2$ | 67% |
| $[Ir(L127)_2Cl]_2$ | L127 | $[Ir(L127)_2Cl]_2$ B 260° C./28 h | 69% |
| $[Ir(L129)_2Cl]_2$ | L129 | 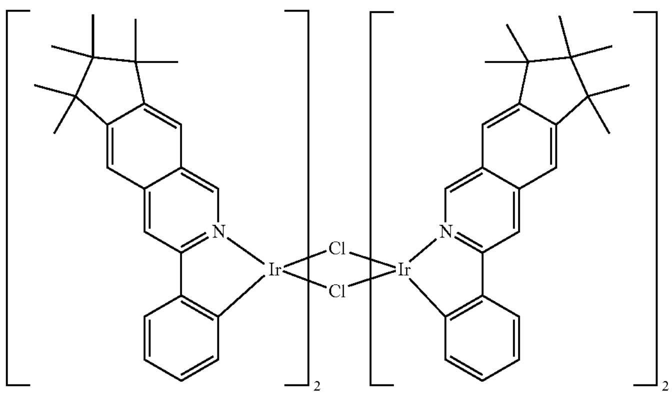 B 260° C./30 h | 91% |
| $[Ir(L136)_2Cl]_2$ | L136 | 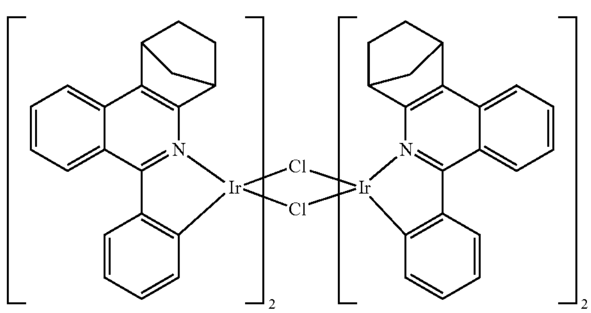 B 280° C./40 h Diastereomer mixture | 85% |
| $[Ir(L137)_2Cl]_2$ | L137 | $[Ir(L137)_2Cl]_2$ as $[Ir(L136)_2Cl]_2$ | 86% |
| $[Ir(L138)_2Cl]_2$ | L138 | $[Ir(L138)_2Cl]_2$ as $[Ir(L136)_2Cl]_2$ | 84% |

4) Iridium Complexes of the $[Ir(L)_2(HOMe)_2]OTf$ Type 5 ml of methanol and then 10 mmol of silver(I) trifluoromethanesulfonate [2923-28-6] are added to a suspension of 5 mmol of the chloro dimer $[Ir(L)_2Cl]_2$ in 150 ml of dichloromethane, and the mixture is stirred at room temperature for 18 h. The precipitated silver(I) chloride is filtered off with suction via a Celite bed, the filtrate is evaporated to dryness, the yellow residue is taken up in 30 ml of toluene or cyclohexane, the solid is filtered off, washed with n-heptane and dried in vacuo. The product of the formula $[Ir(L)_2(HOMe)_2]OTf$ obtained in this way is reacted further without purification.

| Ex. | $[Ir(L)_2Cl]_2$ | $[Ir(L)_2(HOMe)_2]OTf$ | Yield |
|---|---|---|---|
| $[Ir(L1)_2(HOMe)_2]OTf$ | $Ir[(L1)Cl]_2$ | 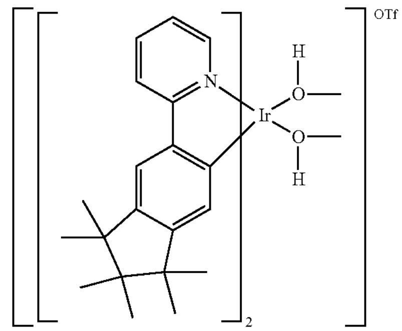 | 81% |
| $[Ir(L2)_2(HOMe)_2]OTf$ | $[Ir(L2)_2Cl]_2$ | $[Ir(L2)_2(HOMe)_2]OTf$ | 79% |
| $[Ir(L5)_2(HOMe)_2]OTf$ | $[Ir(L5)_2Cl]_2$ | $[Ir(L5)_2(HOMe)_2]OTf$ | 77% |
| $[Ir(L6)_2(HOMe)_2]OTf$ | $[Ir(L6)_2Cl]_2$ | $[Ir(L6)_2(HOMe)_2]OTf$ | 77% |
| $[Ir(L10)_2(HOMe)_2]OTf$ | $[Ir(L10)_2Cl]_2$ | $[Ir(L10)_2(HOMe)_2]OTf$ | 80% |
| $[Ir(L11)_2(HOMe)_2]OTf$ | $[Ir(L11)_2Cl]_2$ | $[Ir(L11)_2(HOMe)_2]OTf$ | 76% |
| $[Ir(L12)_2(HOMe)_2]OTf$ | $[Ir(L12)_2Cl]_2$ | $[Ir(L12)_2(HOMe)_2]OTf$ | 64% |
| $[Ir(L14)_2(HOMe)_2]OTf$ | $[Ir(L14)_2Cl]_2$ | $[Ir(L14)_2(HOMe)_2]OTf$ | 82% |
| $[Ir(L21)_2(HOMe)_2]OTf$ | $[Ir(L21)_2Cl]_2$ | $[Ir(L21)_2(HOMe)_2]OTf$ | 79% |
| $[Ir(L25)_2(HOMe)_2]OTf$ | $[Ir(L25)_2Cl]_2$ | $[Ir(L25)_2(HOMe)_2]OTf$ | 80% |
| $[Ir(L42)_2(HOMe)_2]OTf$ | $[Ir(L42)_2Cl]_2$ | $[Ir(L42)_2(HOMe)_2]OTf$ | 75% |
| $[Ir(L47)_2(HOMe)_2]OTf$ | $[Ir(L47)_2Cl]_2$ | $[Ir(L47)_2(HOMe)_2]OTf$ | 86% |
| $[Ir(L48)_2(HOMe)_2]OTf$ | $[Ir(L48)_2Cl]_2$ | $[Ir(L48)_2(HOMe)_2]OTf$ | 78% |
| $[Ir(L53)_2(HOMe)_2]OTf$ | $[Ir(L53)_2Cl]_2$ | $[Ir(L53)_2(HOMe)_2]OTf$ | 81% |
| $[Ir(L55)_2(HOMe)_2]OTf$ | $[Ir(L55)_2Cl]_2$ | $[Ir(L55)_2(HOMe)_2]OTf$ | 82% |
| $[Ir(L59)_2(HOMe)_2]OTf$ | $[Ir(L59)_2Cl]_2$ | $[Ir(L59)_2(HOMe)_2]OTf$ | 80% |
| $[Ir(L60)_2(HOMe)_2]OTf$ | $[Ir(L60)_2Cl]_2$ | $[Ir(L60)_2(HOMe)_2]OTf$ | 78% |
| $[Ir(L62)_2(HOMe)_2]OTf$ | $[Ir(L62)_2Cl]_2$ | $[Ir(L62)_2(HOMe)_2]OTf$ | 77% |
| $[Ir(L64)_2(HOMe)_2]OTf$ | $[Ir(L64)_2Cl]_2$ | $[Ir(L64)_2(HOMe)_2]OTf$ | 76% |
| $[Ir(L72)_2(HOMe)_2]OTf$ | $[Ir(L72)_2Cl]_2$ | $[Ir(L72)_2(HOMe)_2]OTf$ | 79% |
| $[Ir(L74)_2(HOMe)_2]OTf$ | $[Ir(L74)_2Cl]_2$ | $[Ir(L74)_2(HOMe)_2]OTf$ | 83% |
| $[Ir(L95)_2(HOMe)_2]OTf$ | $[Ir(L95)_2Cl]_2$ | $[Ir(L95)_2(HOMe)_2]OTf$ | 83% |
| $[Ir(L96)_2(HOMe)_2]OTf$ | $[Ir(L96)_2Cl]_2$ | $[Ir(L96)_2(HOMe)_2]OTf$ | 77% |
| $[Ir(L100)_2(HOMe)_2]OTf$ | $[Ir(L100)_2Cl]_2$ | $[Ir(L100)_2(HOMe)_2]OTf$ | 74% |
| $[Ir(L102)_2(HOMe)_2]OTf$ | $[Ir(L102)_2Cl]_2$ | $[Ir(L102)_2(HOMe)_2]OTf$ | 76% |
| $[Ir(L129)_2(HOMe)_2]OTf$ | $[Ir(L129)_2Cl]_2$ | $[Ir(L129)_2(HOMe)_2]OTf$ | 86% |

-

5) Heteroleptic Tris-Facial Iridium Complexes of the Phenylpyridine, Phenylimidazole or Phenylbenzimidazole Type:

A mixture of 10 mmol of the ligand L, 10 mmol of bis(methanol)bis[2-(2-pyridinyl-κN)phenyl-κC]iridium(III) trifluoromethanesulfonate [1215692-14-0] or bis(methanol)bis[2-(6-methyl-2-pyridinyl-κN)phenyl-κC]iridium(III) trifluoromethanesulfonate [1215692-29-7] or iridium complexes of the $[Ir(L)_2(HOMe)_2]OTf$ type according to the invention, 11 mmol of 2,6-dimethylpyridine and 150 ml of ethanol is heated under reflux for 40 h. After cooling, the precipitated solid is filtered off with suction, washed three times with 30 ml of ethanol each time and dried in vacuo. The crude product obtained in this way is chromatographed on silica gel (solvent or mixtures thereof, for example DCM, THF, toluene, n-heptane, cyclohexane) and subjected to fractional sublimation as described under 1) variant A.

| Ex. | $[Ir(L)_2(HOMe)_2]OTf$ Ligand L | Ir complex Diastereomer | Yield |
|---|---|---|---|
| Ir500 | 1215692-14-0 L1 | 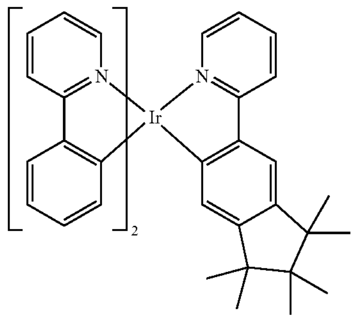 | 46% |
| Ir501 | 1215692-14-0 L2 | 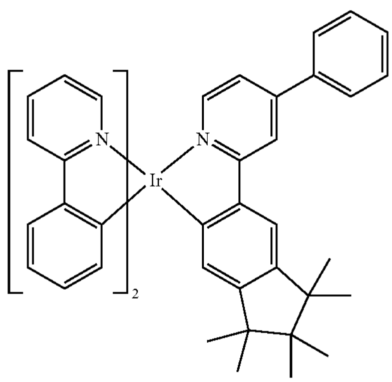 | 48% |
| Ir502 | 1215692-29-7 L17 | 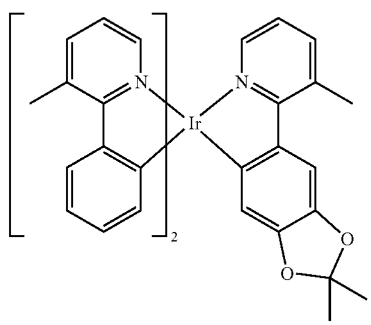 | 43% |
| Ir503 | 1215692-29-7 L24 | 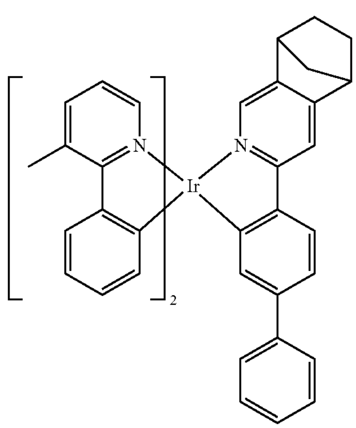 | 45% |

-continued
| Ex. | $[Ir(L)_2(HOMe)_2]OTf$ Ligand L | Ir complex Diastereomer | Yield |
|---|---|---|---|
| Ir504 | 1215692-14-0 L36 | 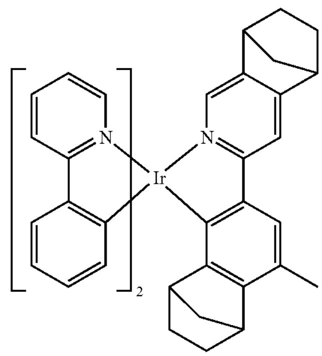 Diastereomer mixture | 24% |
| Ir505 | 1215692-14-0 L42 | 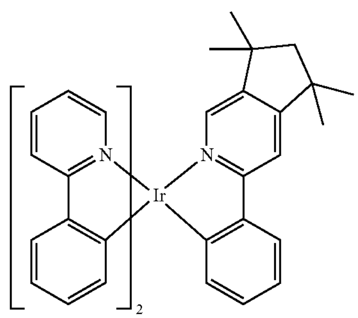 | 56% |
| Ir506 | 1215692-14-0 L48 | 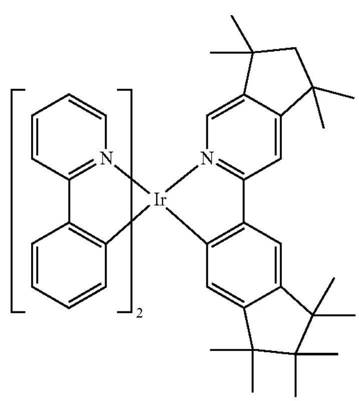 | 51% |
| Ir507 | 1215692-14-0 L54 | 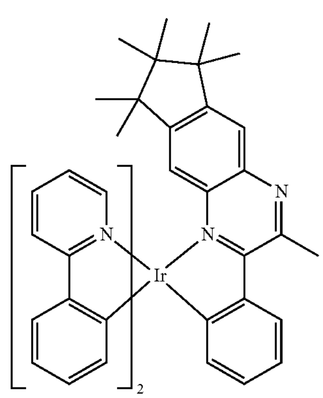 | 38% |

-continued
| Ex. | $[Ir(L)_2(HOMe)_2]OTf$ Ligand L | Ir complex Diastereomer | Yield |
|---|---|---|---|
| IR508 | 1215692-14-0 L57 | 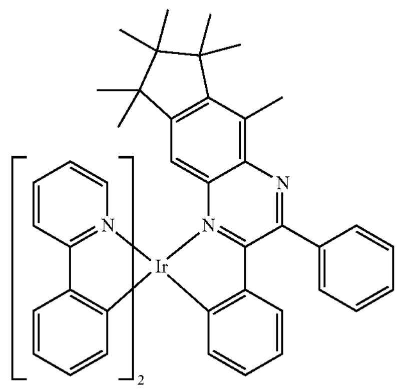 | 40% |
| Ir509 | 1215692-14-0 L61 | 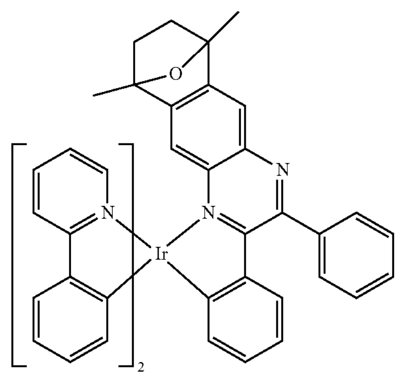 | 45% |
| Ir510 | 1215692-14-0 L63 | 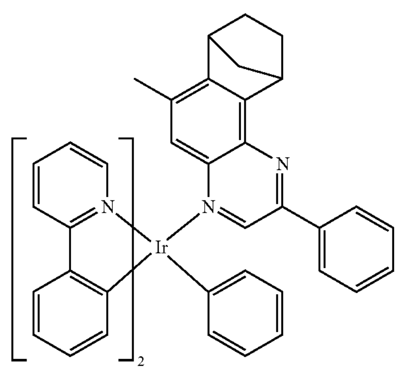 | 41% |
| Ir511 | 1215692-29-7 L69 | 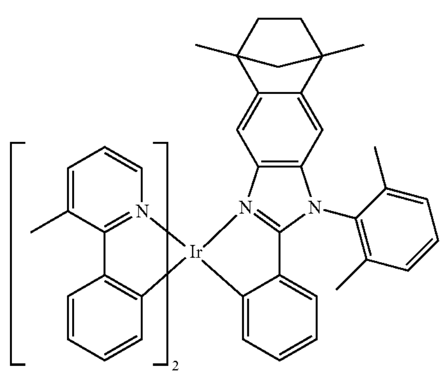 | 37% |

-continued
| Ex. | $[Ir(L)_2(HOMe)_2]OTf$ Ligand L | Ir complex Diastereomer | Yield |
|---|---|---|---|
| Ir512 | 1215692-29-7 L75 | 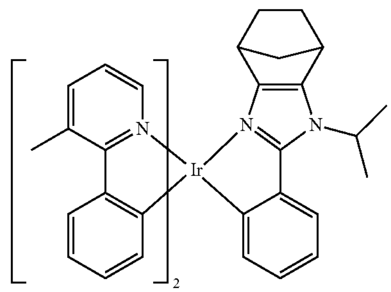 | 39% |
| Ir513 | $[Ir(L1)_2HOMe)]_{2]}OTf$ 1008-89-56 | 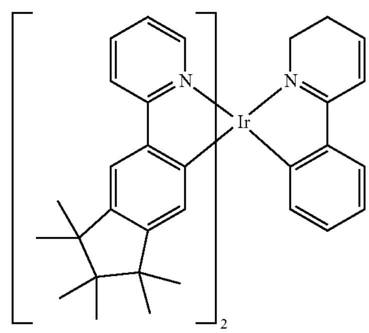 | 43% |
| Ir514 | $[Ir(L2)_2HOMe)]_{2]}OTf$ 1008-89-56 | 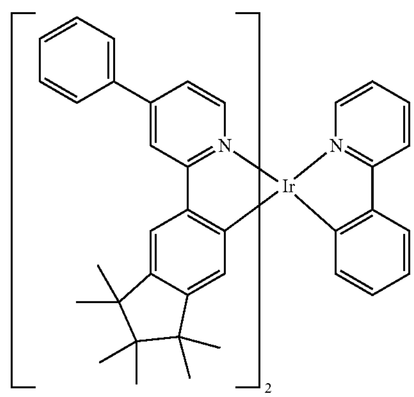 | 41% |
| Ir515 | $[Ir(L5)_2HOMe)]_{2]}OTf$ 612-96-4 | 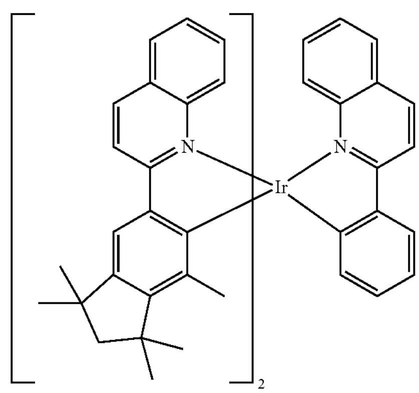 | 39% |

-continued
| Ex. | $[Ir(L)_2(HOMe)_2]OTf$ Ligand L | Ir complex Diastereomer | Yield |
|---|---|---|---|
| Ir516 | $[Ir(L6)_2HOMe)]_{2]}OTf$ 1008-89-56 | 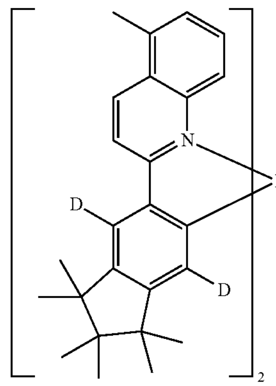 | 40% |
| Ir517 | $[Ir(L10)_2HOMe)]_{2]}OTf$ L42 | 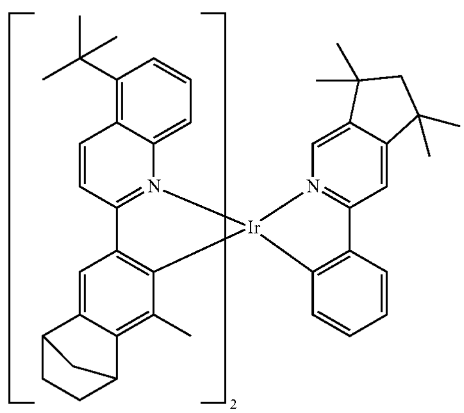 Diasteromer mixture | 45% |
| IrL518 | $[Ir(L11)_2HOMe)]_{2]}OTf$ L44 | 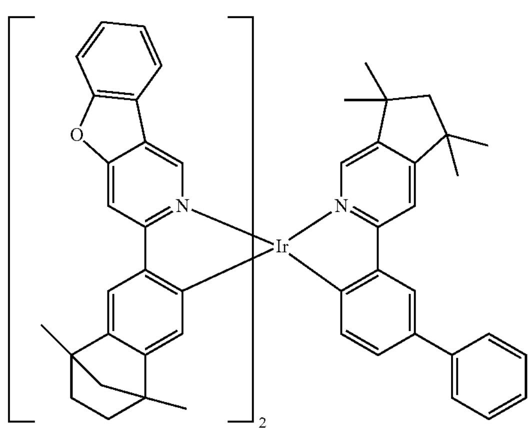 Diastereomer mixture | 33% |

-continued
| Ex. | $[Ir(L)_2(HOMe)_2]OTf$ Ligand L | Ir complex Diastereomer | Yield |
|---|---|---|---|
| IrL519 | $[Ir(L12)_2HOMe)]_2]OTf$ 230-27-3 | 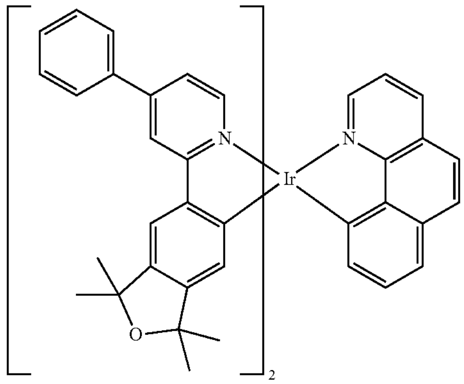 | 28% |
| IrL520 | $[Ir(L14)_2HOMe)]_2]OTf$ 156021-08-8 | 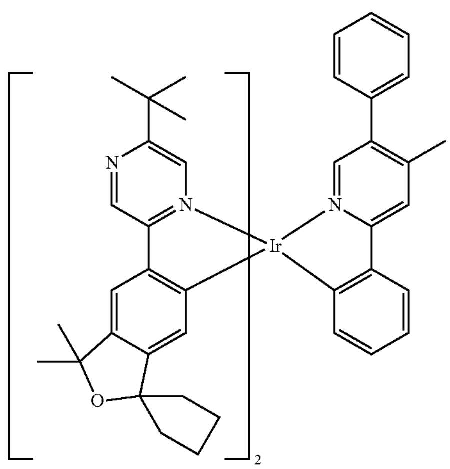 | 46% |
| Ir521 | $[I[(L21)_2HOMe)]_2]OTf$ 1008-89-56 | 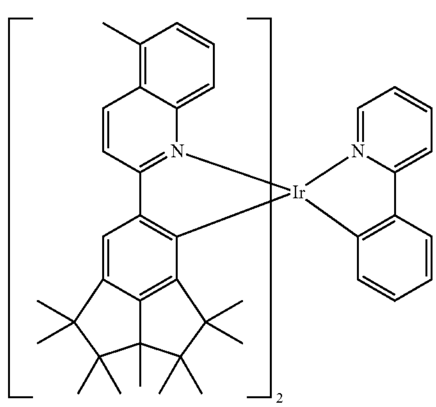 Diastereomer mixture | 26% |

-continued
| Ex. | [Ir(L)$_2$(HOMe)$_2$]OTf Ligand L | Ir complex Diastereomer | Yield |
|---|---|---|---|
| Ir522 | [Ir(L25)$_2$HOMe)]$_2$]OTf 10273-90-2 | 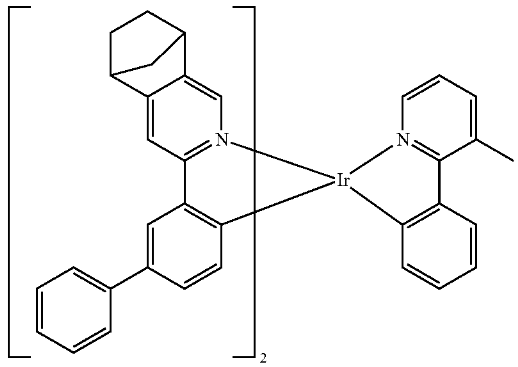 Diastereomer mixture | 42% |
| Ir523 | [Ir(L42)$_2$HOMe)]$_2$]OTf 10273-90-2 | 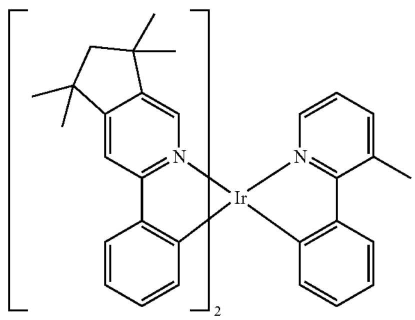 | 40% |
| Ir524 | [Ir(L47)$_2$HOMe)]$_2$]OTf 80635-91-2 | 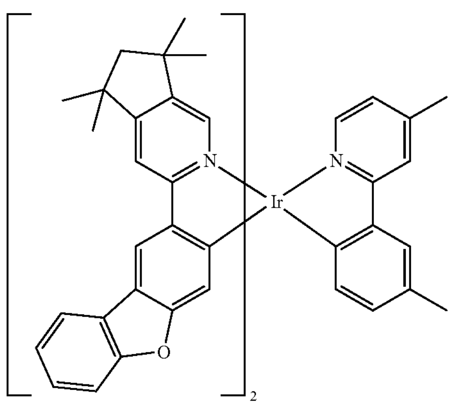 | 39% |
| Ir525 | [Ir(L48)$_2$HOMe)]$_2$]OTf 10273-90-2 | 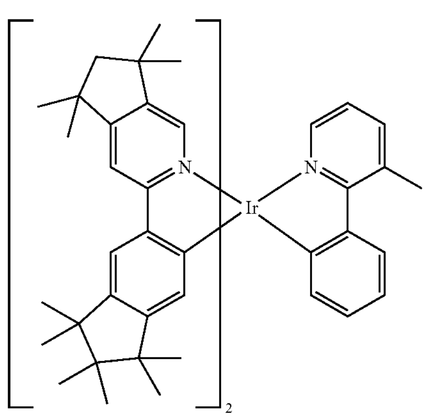 | 46% |

-continued
| Ex. | $[Ir(L)_2(HOMe)_2]OTf$ Ligand L | Ir complex Diastereomer | Yield |
|---|---|---|---|
| Ir526 | $[Ir(L53)_2HOMe)]_2]OTf$ 1008-89-56 | 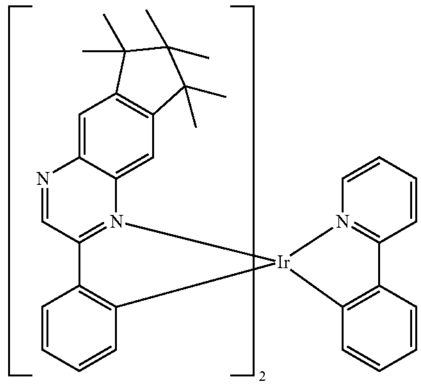 | 25% |
| Ir527 | $[Ir(L55)_2HOMe)]_2]OTf$ 230-27-3 | 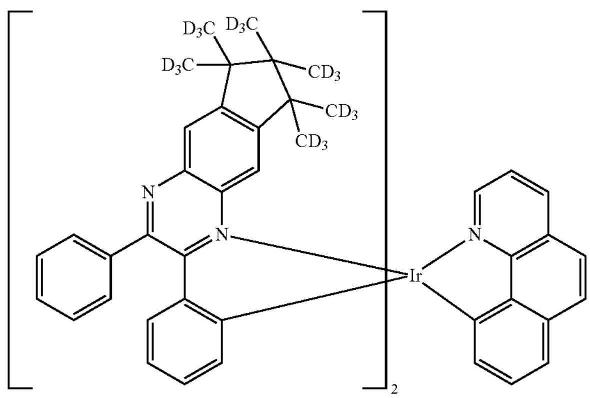 | 27% |
| Ir528 | $[Ir(L59)_2HOMe)]_2]OTf$ 458541-39-4 | 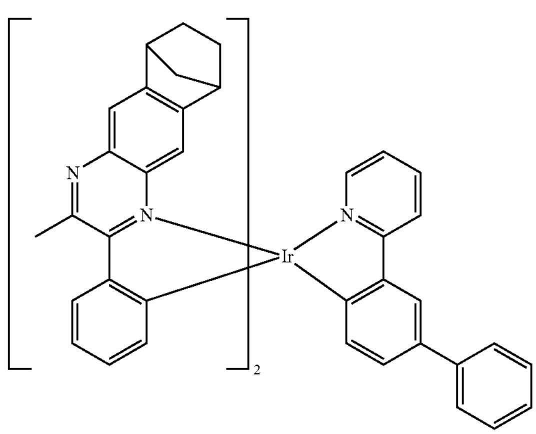 Diastereomer mixture | 33% |

-continued
| Ex. | $[Ir(L)_2(HOMe)_2]OTf$ Ligand L | Ir complex Diastereomer | Yield |
|---|---|---|---|
| Ir529 | $[Ir(L60)_2HOMe)]_2]OTf$ 1008-89-56 | 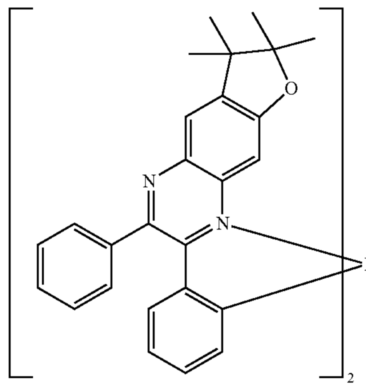 | 36% |
| Ir530 | $[Ir(L62)_2HOMe)]_2]OTf$ 612-96-4 | 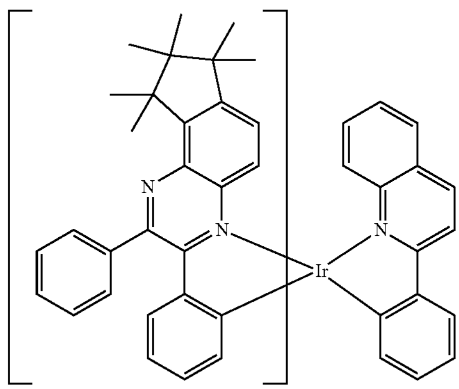 | 46% |
| Ir531 | $[Ir(L64)_2HOMe)]_2]OTf$ 1008-89-56 | 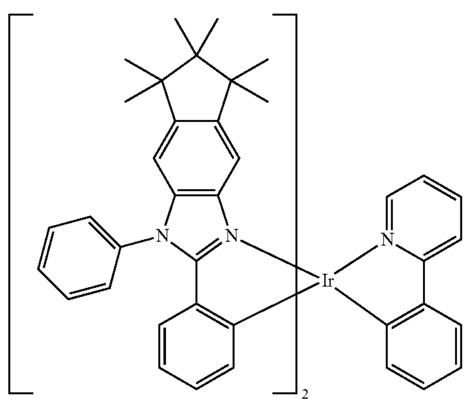 | 43% |
| Ir532 | $[Ir(L72)_2HOMe)]_2]OTf$ L74 | 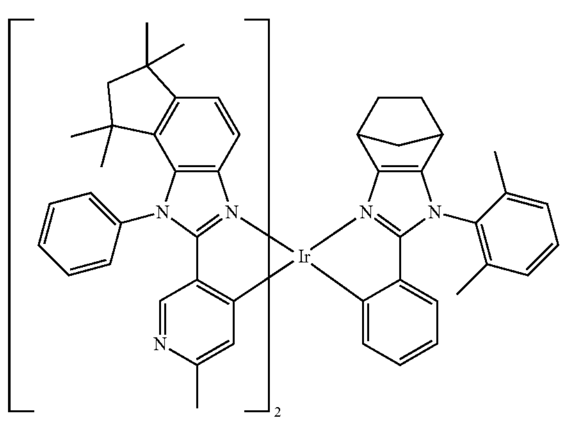 | 37% |

-continued
| Ex. | $[Ir(L)_2(HOMe)_2]OTf$<br>Ligand L | Ir complex<br>Diastereomer | Yield |
|---|---|---|---|
| Ir533 | $[Ir(L74)_2HOMe)]_2]OTf$<br>L75 | 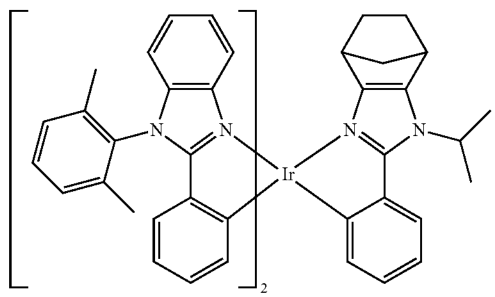<br>Diastereomer mixture | 35% |
| Ir534 | $[Ir(L74)_2HOMe)]_2]OTf$<br>L93 | 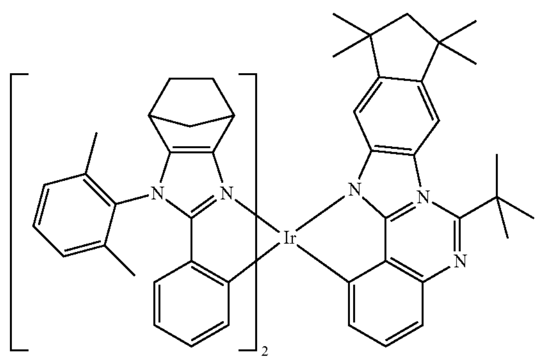<br>Diastereomer mixture | 21% |
| Ir535 | $[Ir(L74)_2HOMe)]_2]OTf$<br>L94 | 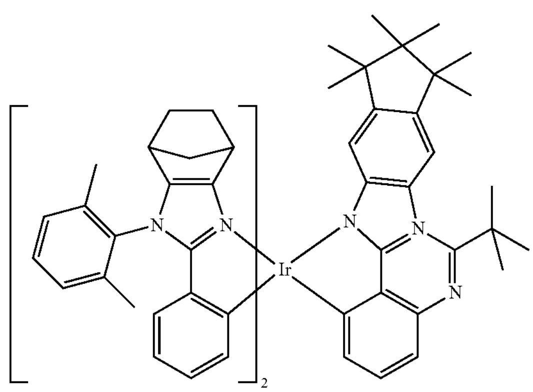<br>Diastereomer mixture | 19% |
| Ir536 | $[Ir(L74)_2HOMe)]_2]OTf$<br>22 mmol of L94<br>Solvent 1,2-propylene glycol<br>160° C. | 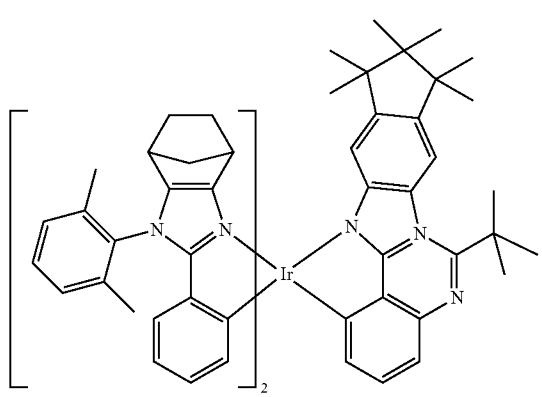 | 26% |

-continued
| Ex. | $[Ir(L)_2(HOMe)_2]OTf$ Ligand L | Ir complex Diastereomer | Yield |
|---|---|---|---|
| Ir548 | $[Ir(L95)_2(HOMe)_2]OTf$ 1008-89-56 | 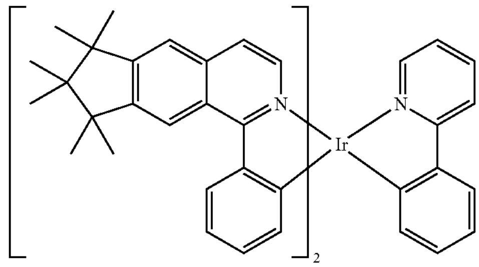 | 39% |
| Ir549 | [Ir(L96)2(HOMe)$_2$]OTf 458541-39-4 | 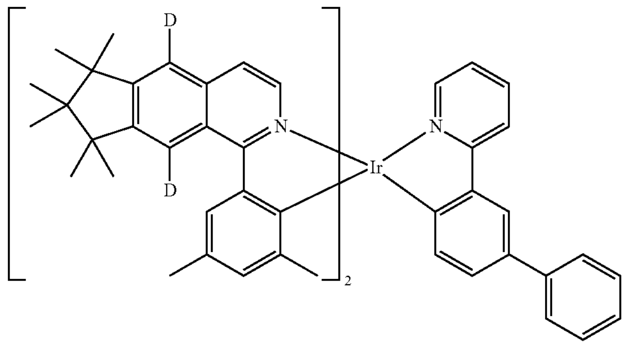 | 36% |
| Ir550 | $[Ir(L100)_2(HOMe)_2]OTf$ 1008-89-56 | 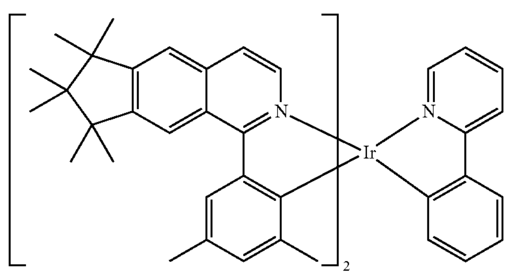 | 22% |
| Ir551 | $[Ir(L102)_2(HOMe)_2]OTf$ 1008-89-56 Solvent 1,2-propylene glycol 140° C. | 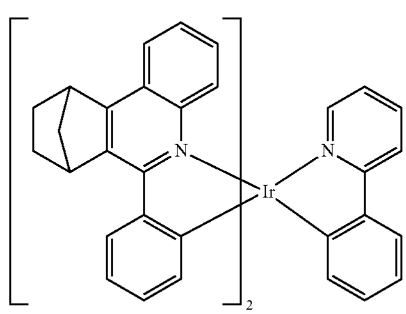 Diastereomer mixture | 26% |

-continued

| Ex. | $[Ir(L)_2(HOMe)_2]OTf$ Ligand L | Ir complex Diastereomer | Yield |
|---|---|---|---|
| Ir552 | $[Ir(L129)_2(HOMe)_2]OTf$ 156021-08-8 | 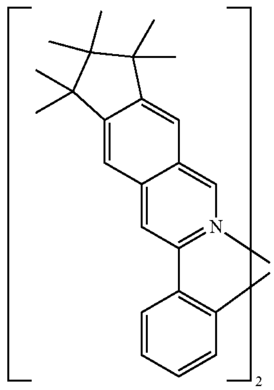 | 42% |

6) Heteroleptic Tris-Facial Iridium Complexes Containing Ligands of the Arduengo Carbene Type:

Preparation analogous to A. G. Tennyson et al., Inorg. Chem., 2009, 48, 6924.

A mixture of 22 mmol of the ligand, 10 mmol of iridium chloro dimer $[Ir(L)_2Cl]_2$, 10 mmol of silver(l) oxide and 300 ml of 1,2-dichloroethane is stirred at 90° C. for 30 h. After cooling, the precipitated solid is filtered off with suction via a Celite bed, washed once with 30 ml of 1,2-dichloroethane, and the filtrate is evaporated to dryness in vacuo. The crude product obtained in this way is chromatographed on silica gel (solvent or mixtures thereof, for example dichloromethane, THF, toluene, n-heptane, cyclohexane) and subjected to fractional sublimation as described under 1) variant A.

| Ex. | $[Ir(L)_2Cl]_2$ Ligand L | Ir complex Diastereomer | Yield |
|---|---|---|---|
| Ir537 | $[Ir(PPy)_2Cl]_2$ 603109-48-4 L78 | 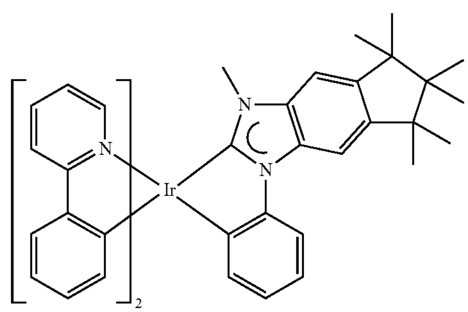 | 56% |
| Ir538 | $[Ir(PPy)_2Cl]_2$ 603109-48-4 L81 | 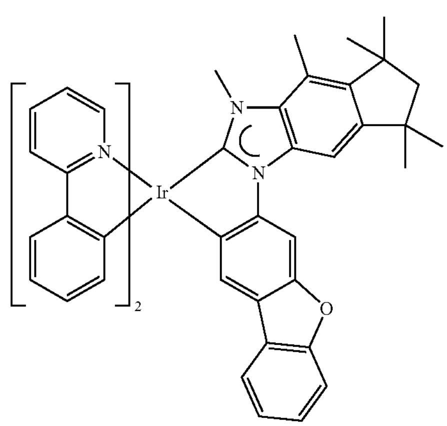 | 41% |

-continued

| Ex. | $[Ir(L)_2Cl]_2$ Ligand L | Ir complex Diastereomer | Yield |
|---|---|---|---|
| Ir539 | $[Ir(L64)_2Cl]_2$ L79 | 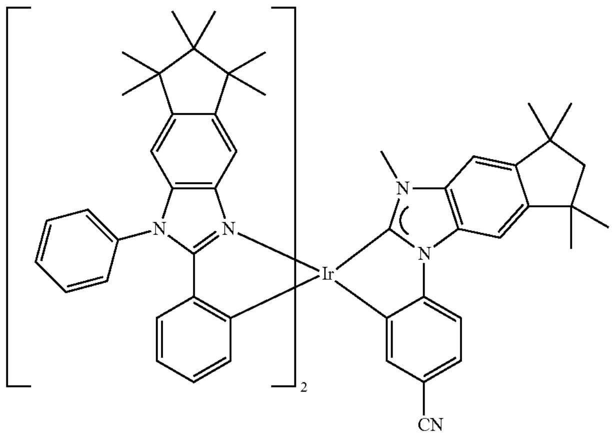 | 44% |
| Ir540 | $[Ir(L74)_2Cl]_2$ L86 | 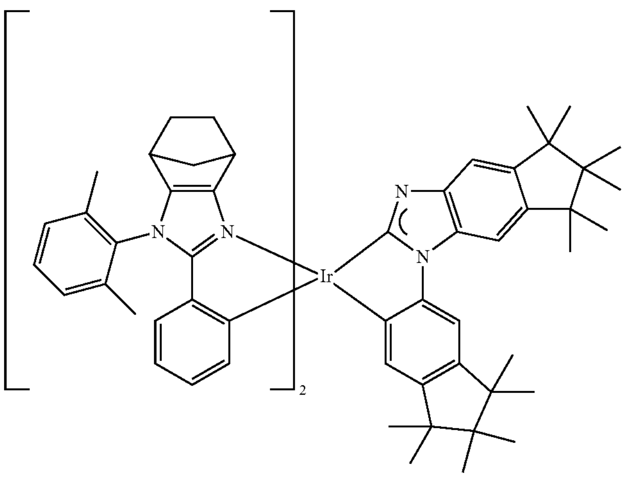 Diastereomer mixture | 39% |
| Ir541 | $[Ir(L74)_2Cl]_2$ L91 | 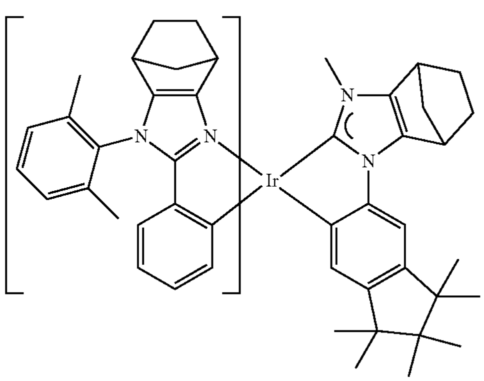 fac-Λ,Δ-pseudo-C3 | 21% |

7) Iridium Complexes of the $Ir(L)_2L'$ Type Containing Non-o-Metallated Ligands L':

A mixture of 25 mmol of the ligand L', 10 mmol of iridium chloro dimer $[Ir(L)_2Cl]_2$, 30 mmol of sodium hydrogencarbonate, 100 ml of 2-ethoxyethanol and 30 ml of water is stirred at 90° C. for 16 h. After cooling, the precipitated solid is filtered off with suction, washed three times with 30 ml of ethanol each time and dried in vacuo. The crude product obtained in this way is chromatographed on silica gel (solvent or mixtures thereof, for example dichloromethane, THF, toluene, n-heptane, cyclohexane) or recrystallised, and subjected to fractional sublimation as described under 1) variant A.

| Ex. | $[Ir(L)_2Cl]_2$ Ligand L' | Ir complex Diastereomer | Yield |
|---|---|---|---|
| Ir542 | $[Ir(L1)_2Cl]_2$ 123-54-6 | 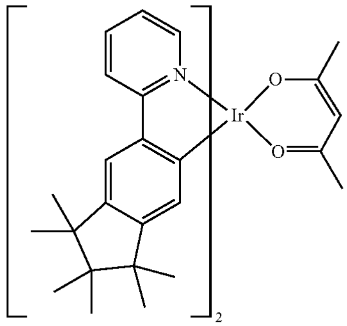 | 66% |
| Ir543 | $[Ir(L5)_2Cl]_2$ 123-54-6 | 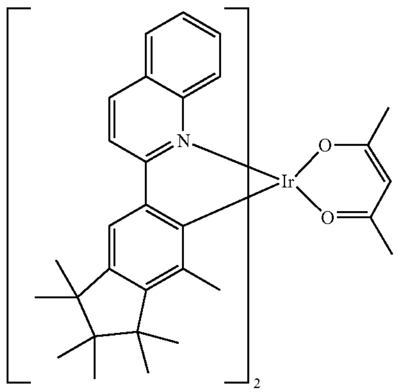 | 70% |
| Ir544 | $[Ir(L10)_2Cl]_2$ 1118-71-4 | 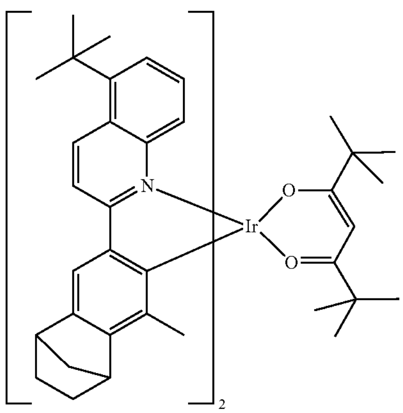 Diastereomer mixture | 58% |
| Ir545 | $[Ir(L53)_2Cl]_2$ 123-54-6 | 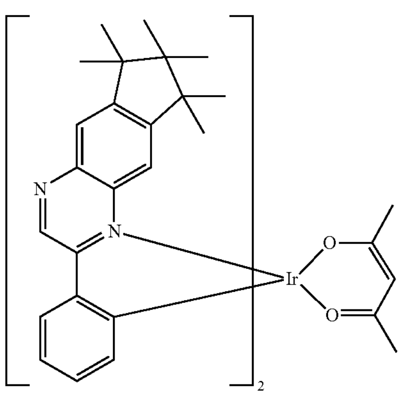 | 60% |

-continued
| Ex. | $[Ir(L)_2Cl]_2$ Ligand L' | Ir complex Diastereomer | Yield |
|---|---|---|---|
| Ir546 | $[Ir(L62)_2Cl]_2$ 123-54-6 | 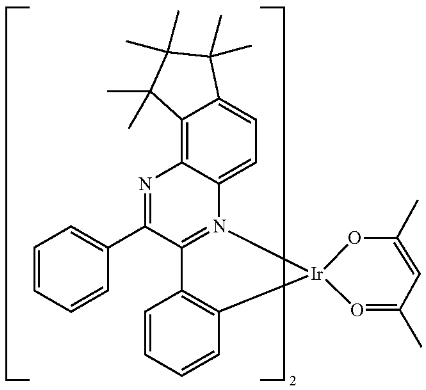 | 58% |
| Ir547 | $[Ir(L74)_2Cl]_2$ 98-98-6 | 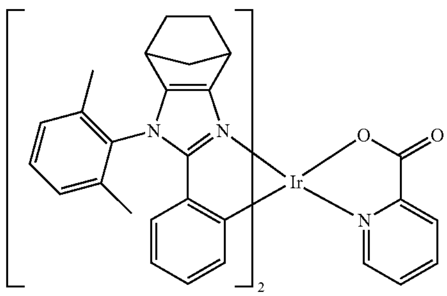 Diastereomer mixture | 71% |
| Ir553 | $[Ir(L95)_2Cl]_2$ 123-54-6 | 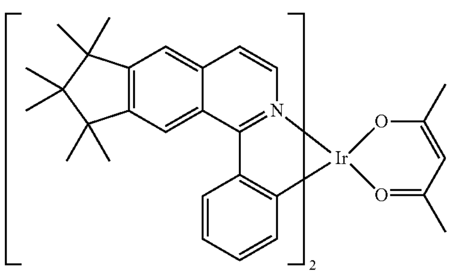 | 76% |
| Ir554 | $[Ir(L96)_2Cl]_2$ 123-54-6 | 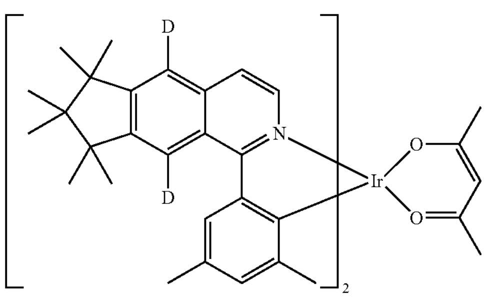 | 77% |
| Ir555 | $[Ir(L100)_2Cl]_2$ 123-54-6 | 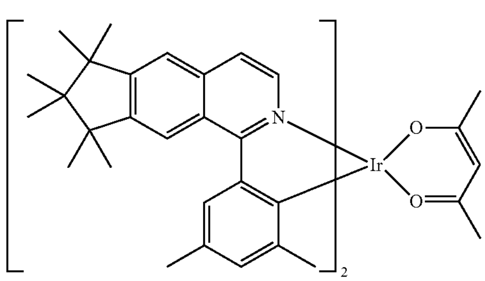 | 67% |

-continued
| Ex. | [Ir(L)$_2$Cl]$_2$ Ligand L' | Ir complex Diastereomer | Yield |
|---|---|---|---|
| Ir556 | [Ir(L102)$_2$Cl]$_2$ 123-54-6 | 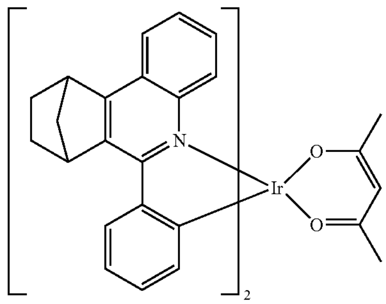 Diastereomer mixture | 70% |
| Ir557 | [Ir(L103)$_2$Cl]$_2$ 123-54-6 | 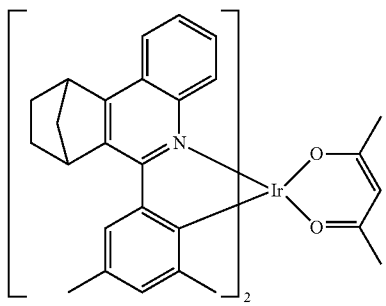 C2 | 28% |
| Ir558 | [Ir(L104)$_2$Cl]$_2$ 123-54-6 | 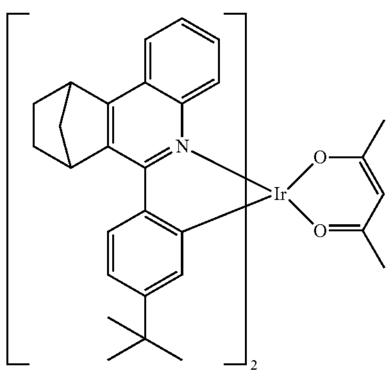 Diastereomer mixture | 58% |
| Ir559 | [Ir(L105)$_2$Cl]$_2$ 123-54-6 | 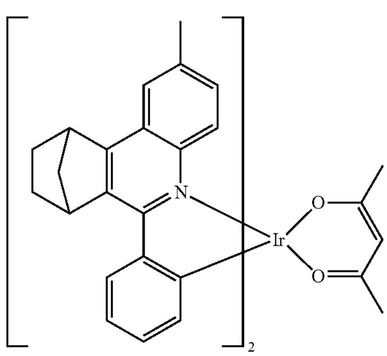 Diastereomer mixture | 66% |

-continued
| Ex. | $[Ir(L)_2Cl]_2$ Ligand L' | Ir complex Diastereomer | Yield |
|---|---|---|---|
| Ir560 | $[Ir(L106)_2Cl]_2$ 123-54-6 | 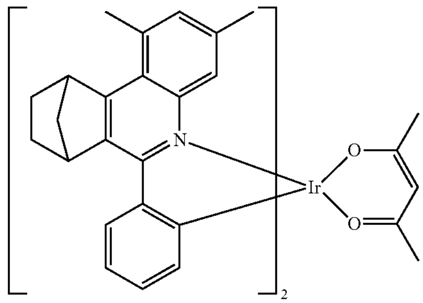 Diastereomer mixture | 63% |
| Ir561 | $[Ir(L107)_2Cl]_2$ 123-54-6 | 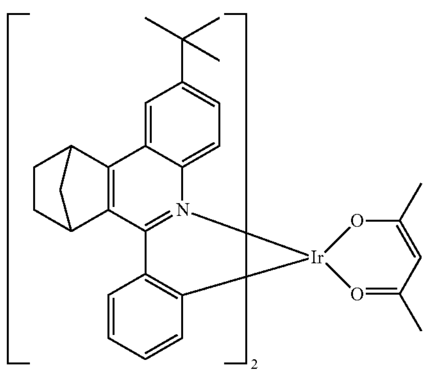 Diastereomer mixture | 76% |
| Ir562 | $[Ir(L108)_2Cl]_2$ 123-54-6 | 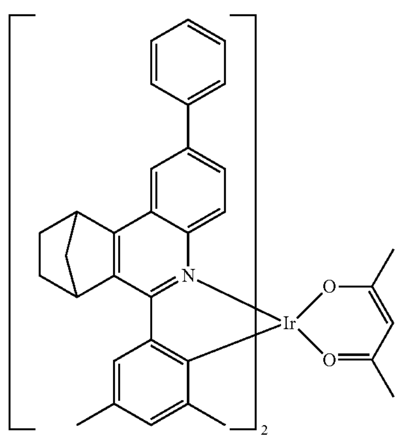 C2 | 35% |

-continued
| Ex. | $[Ir(L)_2Cl]_2$ Ligand L' | Ir complex Diastereomer | Yield |
|---|---|---|---|
| Ir563 | $[Ir(L109)_2Cl]_2$ 123-54-6 | 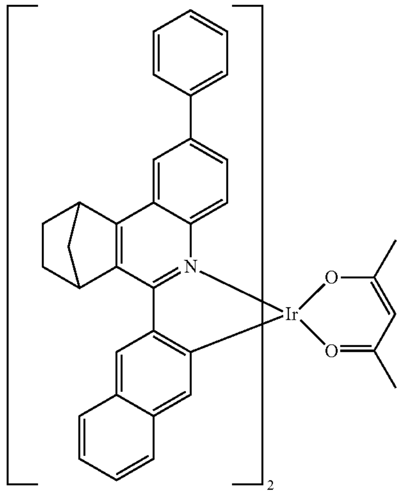 C2 | 35% |
| Ir564 | $[Ir(L110)_2Cl]_2$ 123-54-6 | 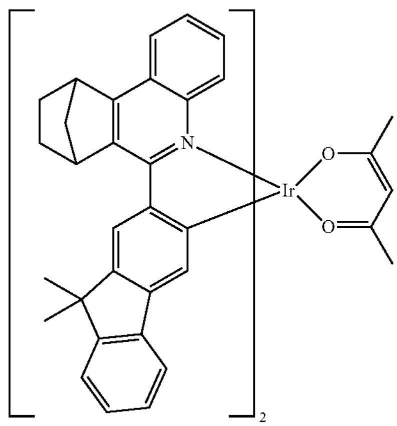 Diastereomer mixture | 73% |
| Ir565 | $[Ir(L111)_2Cl]_2$ 123-54-6 | 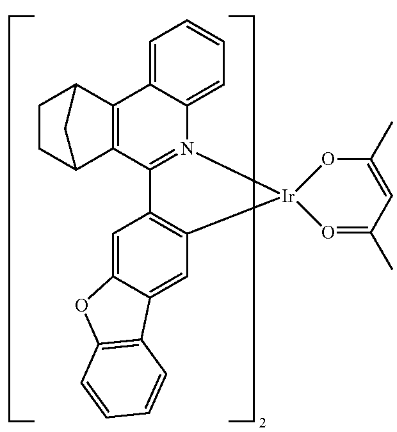 Diastereomer mixture | 75% |

-continued
| Ex. | $[Ir(L)_2Cl]_2$ Ligand L' | Ir complex Diastereomer | Yield |
|---|---|---|---|
| Ir567 | $[Ir(L112)_2Cl]_2$ 123-54-6 | 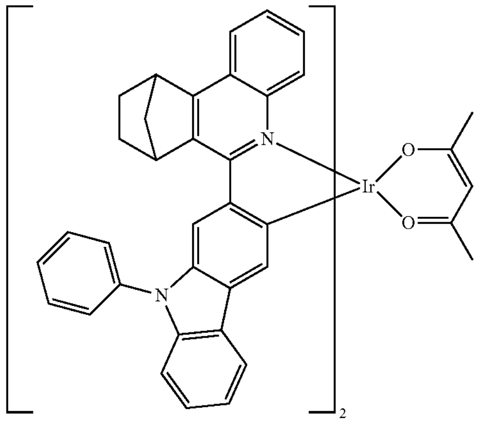 Diastereomer mixture | 67% |
| Ir568 | $[Ir(L113)_2Cl]_2$ 123-54-6 | 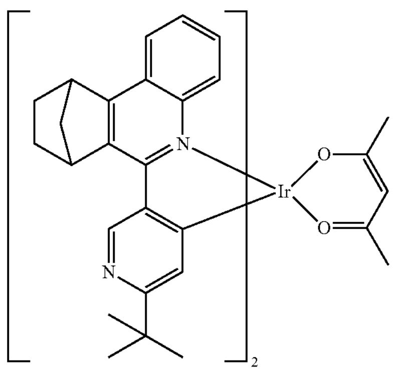 Diastereomer mixture | 70% |
| Ir569 | $[Ir(L114)_2Cl]_2$ 123-54-6 | 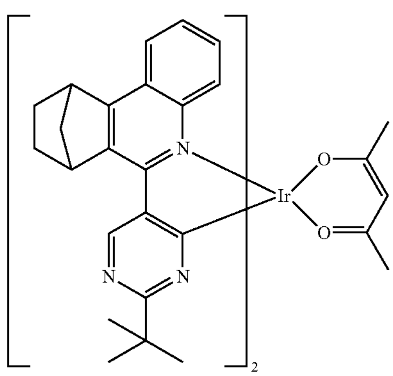 Diastereomer mixture | 58% |

-continued
| Ex. | $[Ir(L)_2Cl]_2$ Ligand L' | Ir complex Diastereomer | Yield |
|---|---|---|---|
| Ir570 | $[Ir(L115a)_2Cl]_2$ 123-54-6 | 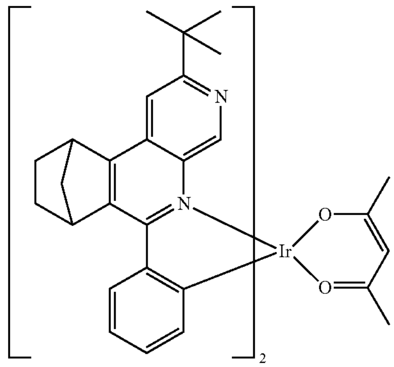 Diastereomer mixture | 50% |
| Ir571 | $[Ir(L115b)_2Cl]_2$ 123-54-6 | 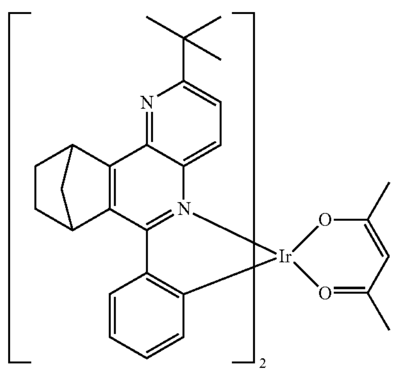 Diastereomer mixture | 70% |
| Ir572 | $[Ir(L116)_2Cl]_2$ 123-54-6 | 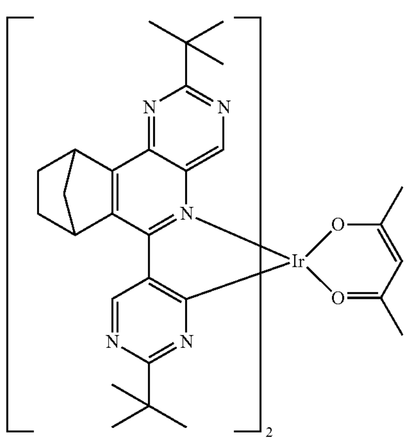 Diastereomer mixture | 48% |

-continued
| Ex. | [Ir(L)$_2$Cl]$_2$ Ligand L' | Ir complex Diastereomer | Yield |
|---|---|---|---|
| Ir573 | [Ir(L117)$_2$Cl]$_2$ 123-54-6 | 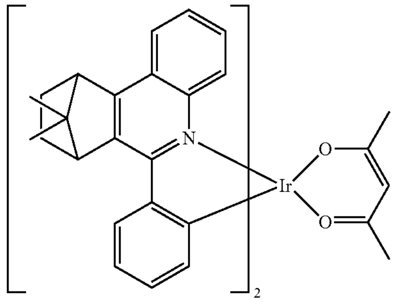 Diastereomer mixture | 67% |
| It574 | [Ir(L118)$_2$Cl]$_2$ 123-54-6 | 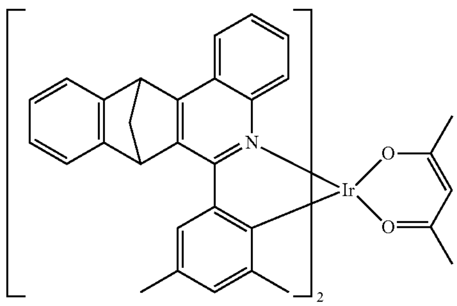 Diastereomer mixture | 59% |
| It575 | [Ir(L119)$_2$Cl]$_2$ 123-54-6 | 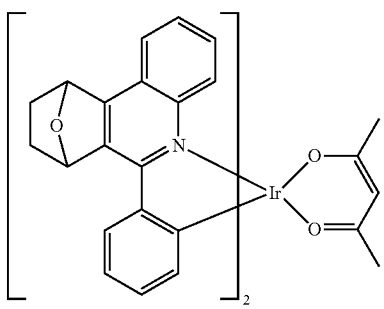 Diastereomer mixture | 56% |
| Ir576 | [Ir(L120)$_2$Cl]$_2$ 123-54-6 | 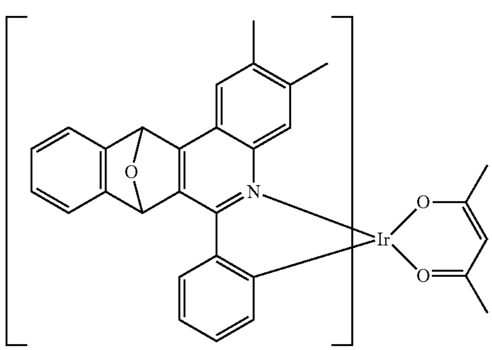 Diastereomer mixture | 60% |

-continued
| Ex. | $[Ir(L)_2Cl]_2$ Ligand L' | Ir complex Diastereomer | Yield |
|---|---|---|---|
| Ir577 | $[Ir(L121)_2Cl]_2$ 123-54-6 | 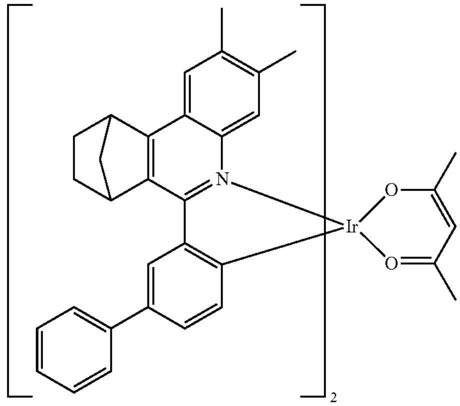 C2 | 46% |
| Ir578 | $[Ir(L122)_2Cl]_2$ 123-54-6 | 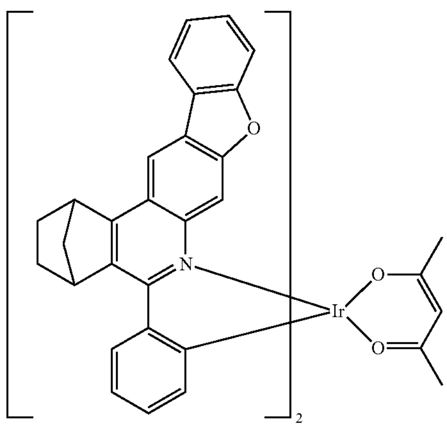 Diastereomer mixture | 55% |
| Ir579 | $[Ir(L123)_2Cl]_2$ 123-54-6 | 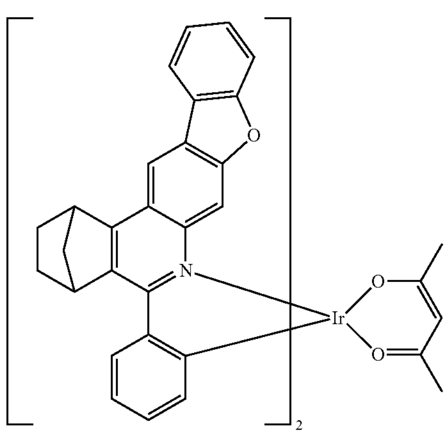 Diastereomer mixture | 43% |

-continued
| Ex. | $[Ir(L)_2Cl]_2$ Ligand L' | Ir complex Diastereomer | Yield |
|---|---|---|---|
| Ir580 | $[Ir(L124)_2Cl]_2$ 123-54-6 | 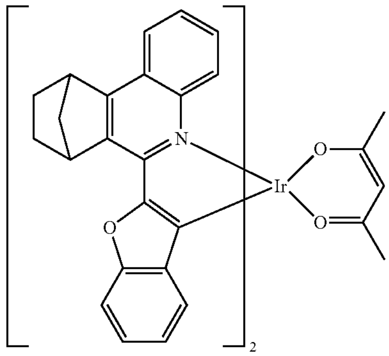 Diastereomer mixture | 47% |
| Ir581 | $[Ir(L125)_2Cl]_2$ 123-54-6 | 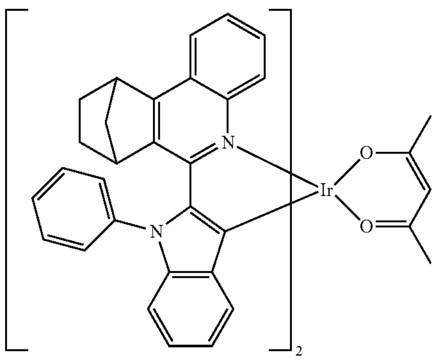 Diastereomer mixture | 32% |
| Ir582 | $[Ir(L126)_2Cl]_2$ 123-54-6 | 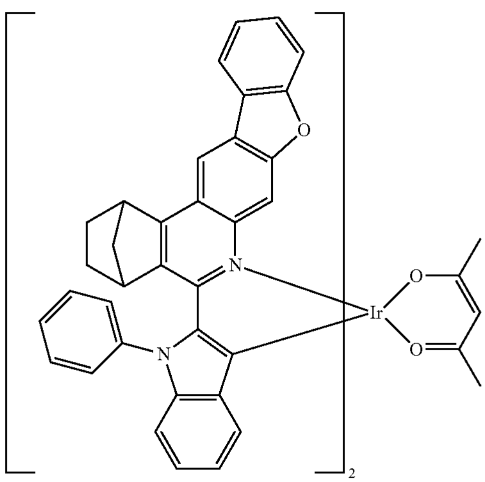 Diastereomer mixture | 45% |
| Ir583 | $[Ir(L127)_2Cl]_2$ 123-54-6 | 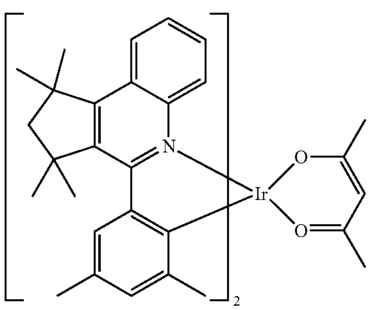 | 56% |

-continued
| Ex. | [Ir(L)$_2$Cl]$_2$ Ligand L' | Ir complex Diastereomer | Yield |
|---|---|---|---|
| Ir584 | [Ir(L129)$_2$Cl]$_2$ 123-54-6 | 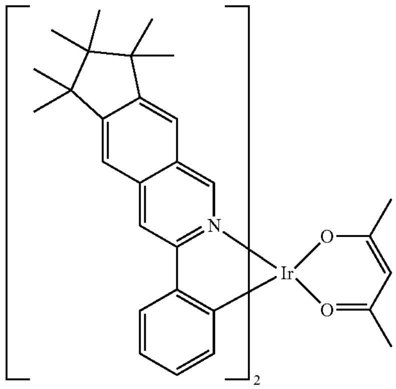 | 80% |
| Ir585 | [Ir(L136)$_2$Cl]$_2$ 123-54-6 | 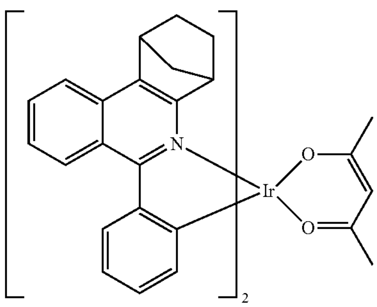 Diastereomer mixture | 51% |
| Ir586 | [Ir(L137)$_2$Cl]$_2$ 123-54-6 | 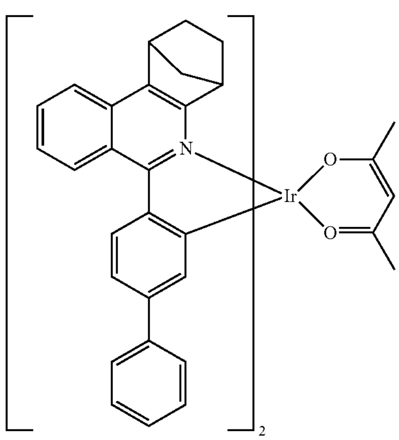 C2 | 33% |

-continued

| Ex. | [Ir(L)$_2$Cl]$_2$ Ligand L' | Ir complex Diastereomer | Yield |
|---|---|---|---|
| Ir587 | [Ir(L138)$_2$Cl]$_2$ 123-54-6 | 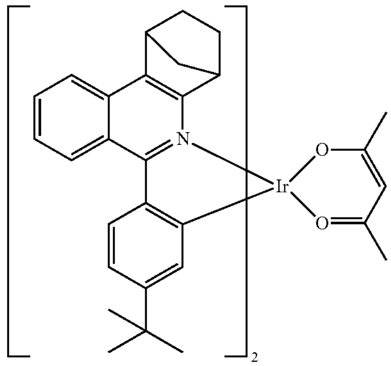 C2 | 37% |

8) Platinum Complexes of the PtLL' Type Containing Non-o-Metallated Ligands L':

Preparation analogous to J. Brooks et al., Inorg. Chem. 2002, 41, 3055. A mixture of 20 mmol of the ligand L, 10 mmol of $K_2PtCl_4$, 75 ml of 2-ethoxyethanol and 25 ml of water is heated under reflux for 16 h. After cooling and addition of 100 ml of water, the precipitated solid is filtered off with suction, washed once with 30 ml of water and dried in vacuo. The platinum chloro dimer of the formula $[PtLCl]_2$ obtained in this way is suspended in 100 ml of 2-ethoxyethanol, 30 mmol of the ligands L' and 50 mmol of sodium carbonate are added, the reaction mixture is stirred at 100° C. for 16 h and then evaporated to dryness in vacuo. The crude product obtained in this way is chromatographed on silica gel (solvent or mixtures thereof, for example dichloromethane, THF, toluene, n-heptane, cyclohexane) or recrystallised, and subjected to fractional sublimation as described under 1) variant A.

| Ex. | Ligand L Ligand L' | Pt complex | Yield |
|---|---|---|---|
| Pt001 | L1 123-54-6 | 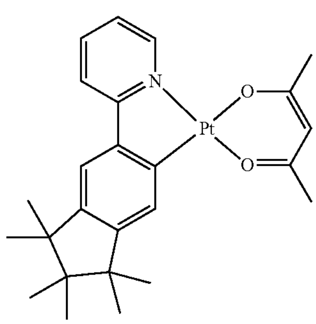 | 36% |

-continued

| Ex. | Ligand L Ligand L' | Pt complex | Yield |
|---|---|---|---|
| Pt002 | L10 1118-71-4 | 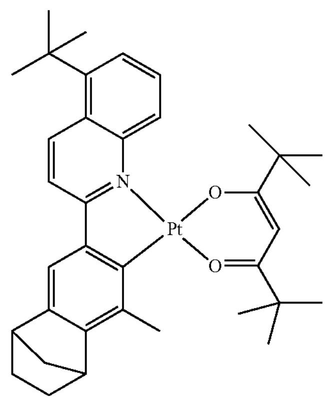 | 31% |
| Pt003 | L54 123-54-6 | 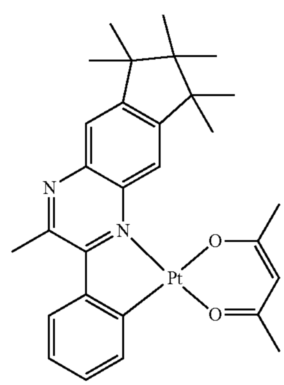 | 34% |

-continued

| Ex. | Ligand L Ligand L' | Pt complex | Yield |
|---|---|---|---|
| Pt004 | L48 1118-71-4 | 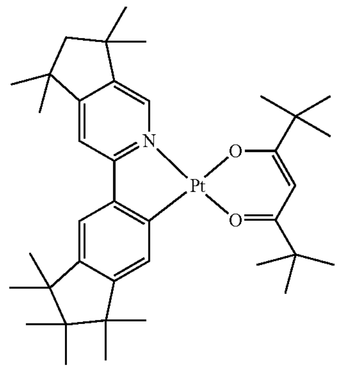 | 29% |
| Pt005 | L64 98-98-6 | 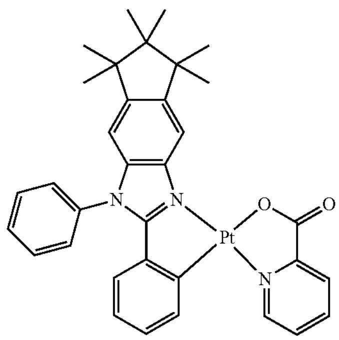 | 33% |

-continued

| Ex. | Ligand L Ligand L' | Pt complex | Yield |
|---|---|---|---|
| Pt006 | L74 77429-59-5 | 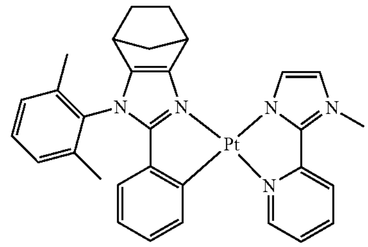 | 36% |

9) Platinum Complexes of Tetradentate Ligands:

A mixture of 10 mmol of the ligand L, 10 mmol of $K_2PtCl_4$, 400 mmol of lithium acetate, anhydrous, and 200 ml of glacial acetic acid is heated under reflux for 60 h. After cooling and addition of 200 ml of water, the mixture is extracted twice with 250 ml of toluene each time, dried over magnesium sulfate, filtered through a Celite bed, the Celite is rinsed with 200 ml of toluene, and the toluene is then removed in vacuo. The solid obtained in this way is purified as described under 1) variant A by hot extraction and then subjected to fractional sublimation.

| Ex. | Ligand L | Pt complex | Extractant | Yield |
|---|---|---|---|---|
| Pt(L139) | L139 | 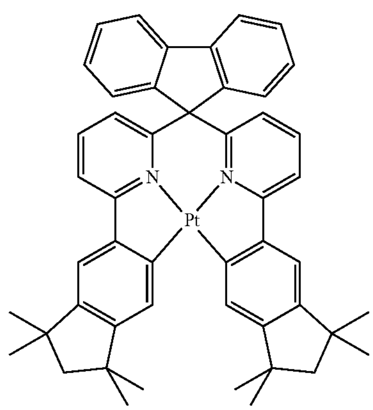 | Acetone | 43% |
| Pt(L140) | L140 | Pt(L140) | Ethyl acetate Cyclohexane 2:8, vv | 39% |
| Pt(L141) | L141 | Pt(L141) | as Pt(L140) | 35% |
| Pt(L142) | L142 | Pt(L142) | as Pt(L140) | 41% |
| Pt(L143) | L143 | Pt(L143) | Cyclohexane | 40% |
| Pt(L144) | L144 | Pt(L144) Diastereomer mixture | as Pt(L143) | 29% |
| Pt(L145) | L145 | Pt(L145) | as Pt(L143) | 46% |
| Pt(L146) | L146 | Pt(L146) | as Pt(L143) | 43% |
| Pt(L147) | L147 | Pt(L147) | o-Xylene | 46% |

10) Platinum Complexes of Tetradentate Ligands of the Arduengo Carbene Type:

A mixture of 10 mmol of the ligand, 10 mmol of silver(I) oxide and 200 ml of dioxane is stirred at room temperature for 16 h, 100 ml of butanone, 20 mmol of sodium carbonate and 10 mmol of cyclooctadienylplatinum dichloride are then added, and the mixture is heated under reflux for 16 h. After removal of the solvent, the solid is extracted by stirring with 500 ml of hot toluene, the suspension is filtered through a Celite bed, and the filtrate is evaporated to dryness. The solid obtained in this way is chromatographed on silica gel with DCM and then subjected to fractional sublimation as described under 1) variant A.

| Ex. | Ligand | Complex | Yield |
|---|---|---|---|
| Pt(L148) | L148 | 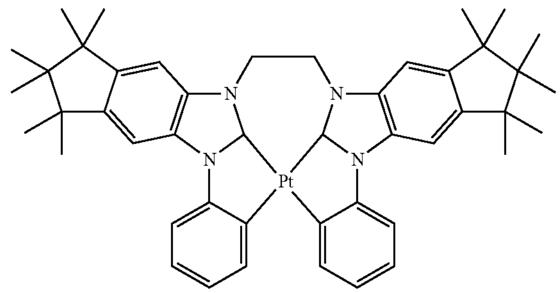 | 23% |
| Pt(L149) | L149 | 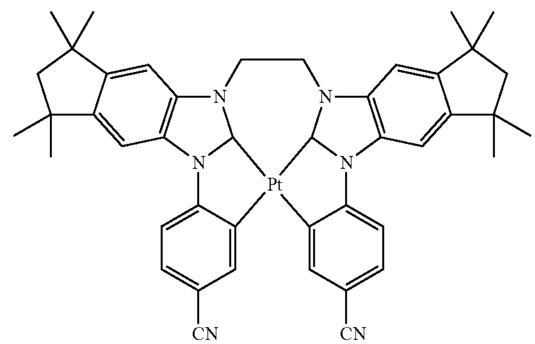 | 26% |
| Pt(L150) | L150 | 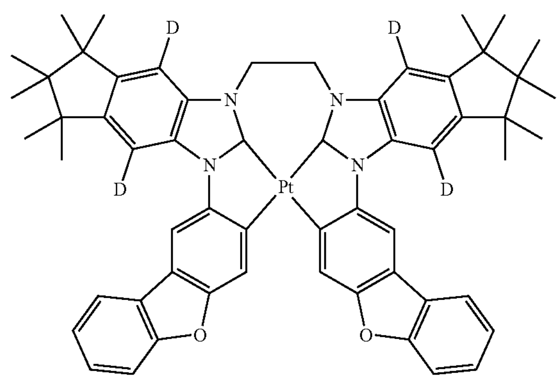 | 30% |
| Pt(L151) | L151 | 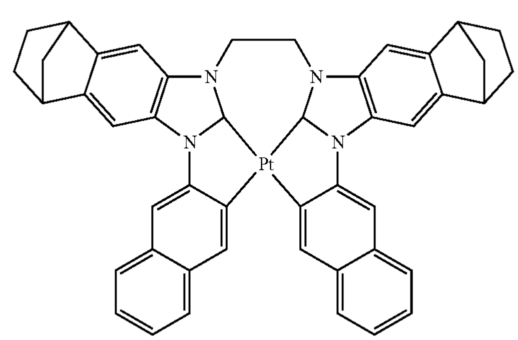 Diastereomer mixture | 31% |

-continued

| Ex. | Ligand | Complex | Yield |
|---|---|---|---|
| Pt(L152) | L152 | 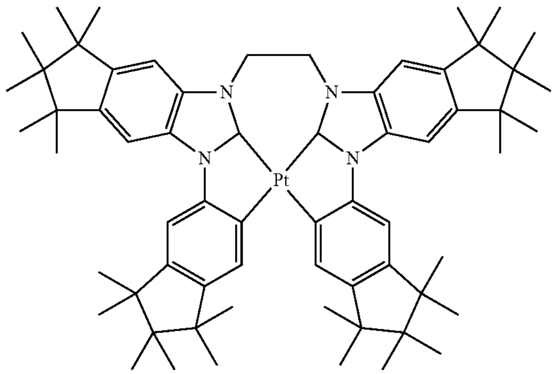 | 27% |
| Pt(L153) | L153 | 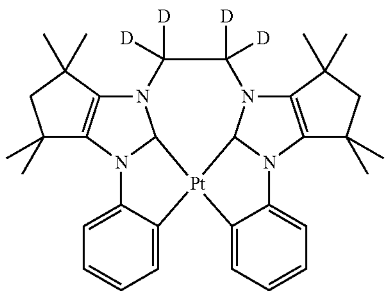 | 28% |

11) Iridium Complexes of Hexadentate Ligands:

A mixture of 10 mmol of the ligand L, 10 mmol of sodium bisacetylacetonatodichloroiridate(III) [770720-50-8] and 200 ml of triethylene glycol dimethyl ether is heated at 210° C. on a water separator for 48 h (the acetylacetone and thermal cleavage products of the solvent distil off). After cooling and addition of 200 ml of water, the precipitated solid is filtered off with suction and dried in vacuo. The solid is extracted by stirring with 500 ml of hot THF, the suspension is filtered through a Celite bed while still hot, the Celite is rinsed with 200 ml of THF, and the combined filtrates are evaporated to dryness. The solid obtained in this way is purified as described under 1) variant A by hot extraction with toluene and then subjected to fractional sublimation.

| Ex. | Ligand | Product | Yield |
|---|---|---|---|
| Ir(L154) | L154 | 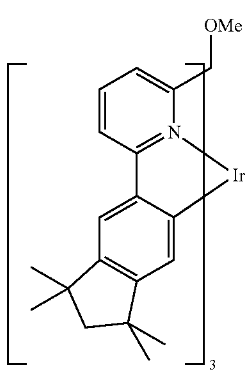 | 19% |

-continued

| Ex. | Ligand | Product | Yield |
|---|---|---|---|
| Ir(L155) | L155 | 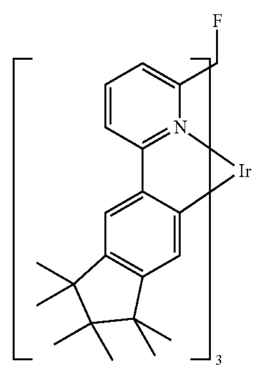 | 28% |
| Ir(L156) | L156 | 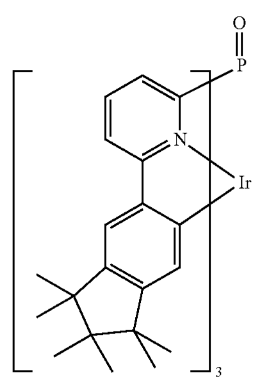 | 34% |

12) Iridium Complexes of Hexadentate Ligands of the Arduengo Carbene Type:

Preparation analogous to K. Tsuchiya et al., Eur. J. Inorg. Chem. 2010, 926.

A mixture of 3 mmol of the ligand, 3 mmol of iridium(III) chloride hydrate, 10 mmol of silver carbonate and 10 mmol of sodium carbonate in 75 ml of 2-ethoxyethanol is warmed under reflux for 48 h. After cooling, 300 ml of water are added, the precipitated solid is filtered off with suction, washed once with 30 ml of water and three times with 15 ml of ethanol each time and dried in vacuo. The crude product obtained in this way is chromatographed on silica gel (DCM) and then subjected to fractional sublimation as described under 1) variant A.

| Ex. | Ligand | Product | Yield |
|---|---|---|---|
| Ir(L157) | L157 | 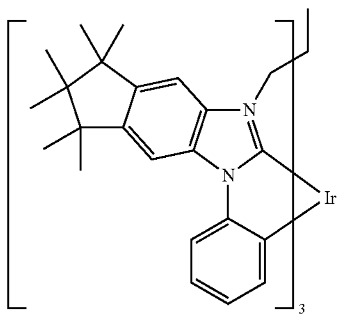 | 22% |
| Ir(L158) | L158 | 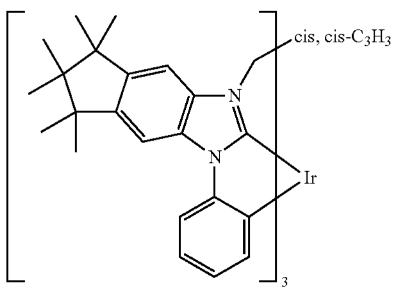 | 26% |

Derivatisation of the Metal Complexes

1) Halogenation of the Iridium Complexes:

A×10.5 mmol of N-halosuccinimide (halogen: Cl, Br, I) are added to a solution or suspension of 10 mmol of a complex carrying A×C—H groups (where A=1, 2 or 3) in the para-position to the iridium in 1000 ml of dichloromethane at 30° C. with exclusion of light and air, and the mixture is stirred for 20 h. Complexes which have low solubility in DCM can also be reacted in other solvents (TCE, THF, DMF, etc.) and at elevated temperature. The solvent is subsequently substantially removed in vacuo. The residue is boiled with 100 ml of MeOH, the solid is filtered off with suction, washed three times with 30 ml of methanol and then dried in vacuo.

Synthesis of Ir(L22-Br)$_3$

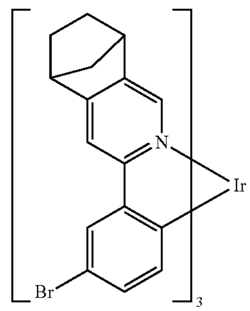

5.6 g (31.5 mmol) of N-bromosuccinimide are added in one portion to a suspension, stirred at 30° C., of 8.5 g (10 mmol) of Ir(L22)$_3$ in 1000 ml of DCM, and the mixture is then stirred for a further 20 h. After removal of about 900 ml of the DCM in vacuo, 100 ml of methanol are added to the lemon-yellow suspension, the solid is filtered off with suction, washed three times with about 30 ml of methanol and then dried in vacuo. Yield: 10.4 g (9.5 mmol), 95%; purity: about 99.5% according to NMR.

The following compounds can be prepared analogously:

| Ex. | Complex | Brominated complex | Yield |
|---|---|---|---|
| Ir(L42-Br)$_3$ | 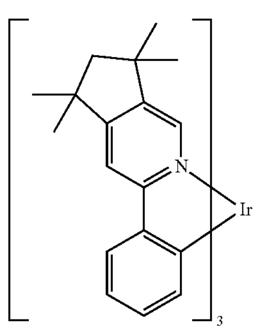 Ir(L42)$_3$ | 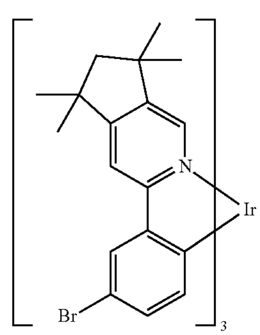 Ir(L42-Br)$_3$ | 93% |

-continued
| Ex. | Complex | Brominated complex | Yield |
|---|---|---|---|
| Ir(L95-Br)$_3$ | 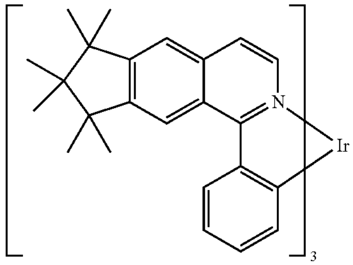 Ir(L95)$_3$ | 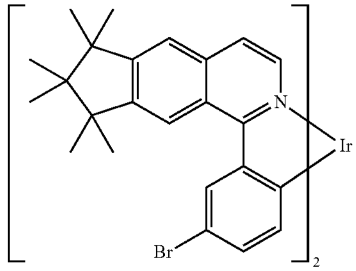 Ir(L95-Br)$_3$ | 95% |
| Ir(L102-Br)$_3$ | 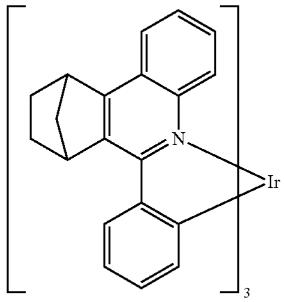 Ir(L102)$_3$ | 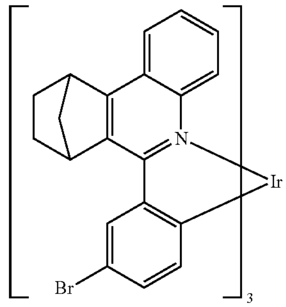 Ir(L102-Br)$_3$ | 92% |
| Ir(L129-Br)$_3$ | 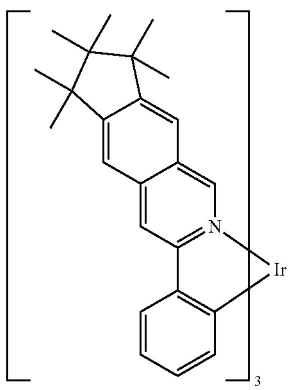 Ir(L129)$_3$ | 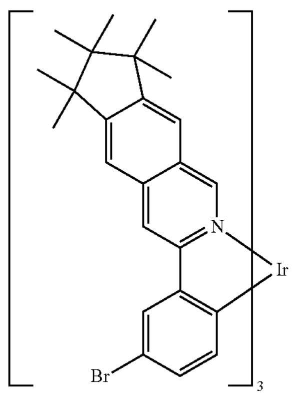 Ir(L129-Br)$_3$ | 96% |
| fac-Ir(L78-Br)$_3$ | 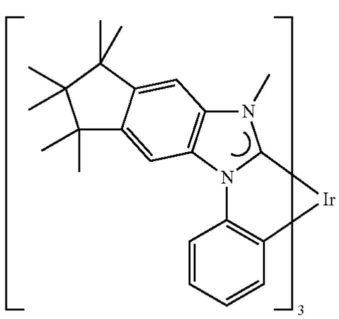 fac-Ir(L78)$_3$ | 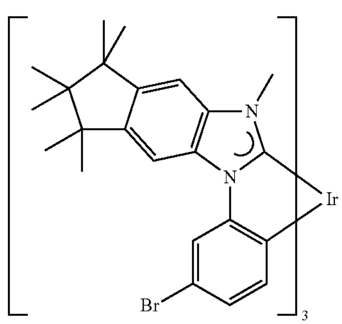 fac-Ir(L78-Br)$_3$ | 85% |

-continued
| Ex. | Complex | Brominated complex | Yield |
| --- | --- | --- | --- |
| Ir500-$Br_2$ | 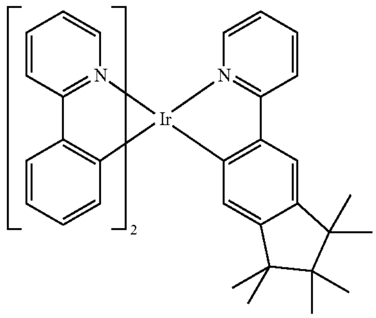 Ir500 | 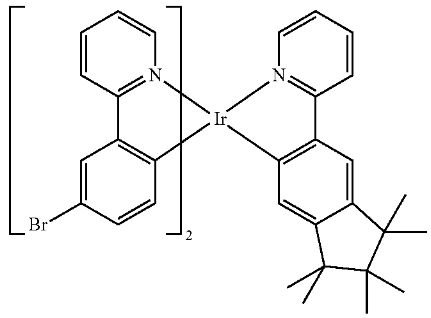 Ir500-$Br_2$ | 89% |
| Ir505-$Br_3$ | 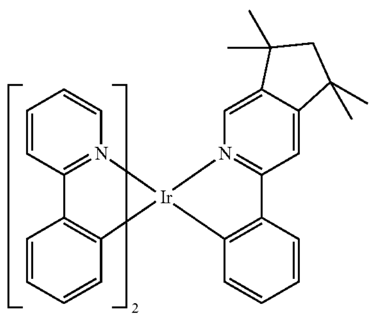 Ir505 | 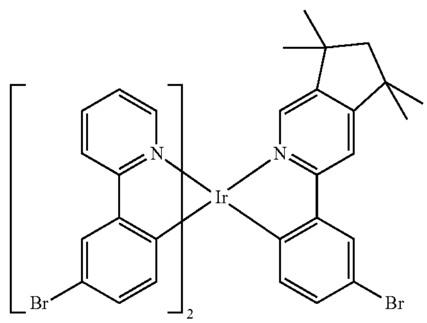 Ir505-$Br_3$ | 93% |
| Ir506-$Br_2$ | 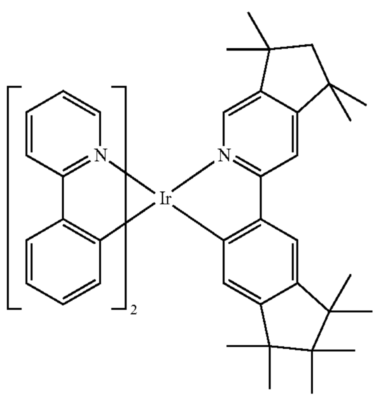 Ir506 | 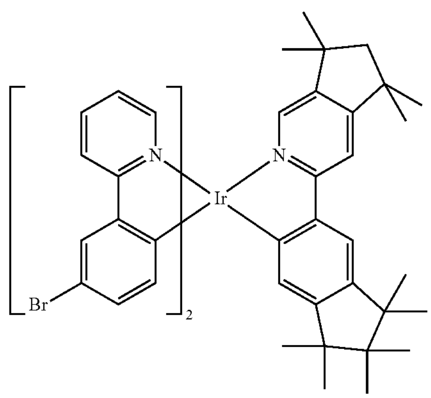 Ir506-$Br_2$ | 92% |
| Ir513-Br | 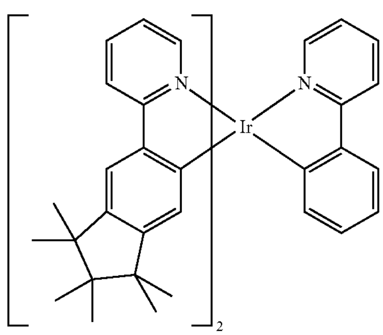 Ir513 | 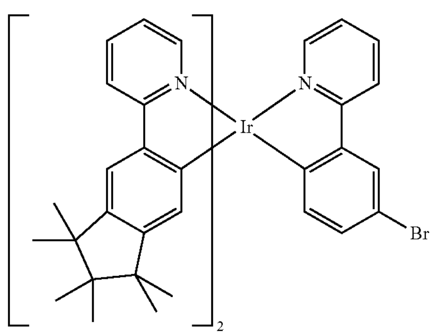 Ir513-Br | 96% |

2) Suzuki Coupling on the Iridium Complexes:

Variant a, Two-Phase Reaction Mixture:

0.6 mmol of tri-o-tolylphosphine and then 0.1 mmol of palladium(II) acetate are added to a suspension of 10 mmol of a brominated complex, 40-80 mmol of the boronic acid or boronic acid ester and 80 mmol of tripotassium phosphate in a mixture of 300 ml of toluene, 100 ml of dioxane and 300 ml of water, and the mixture is heated under reflux for 16 h. After cooling, 500 ml of water and 200 ml of toluene are added, the aqueous phase is separated off, the organic phase is washed three times with 200 ml of water, once with 200 ml of saturated sodium chloride solution and dried over magnesium sulfate. The solid material is filtered off through a Celite bed and rinsed with toluene, the toluene is removed virtually completely in vacuo, 300 ml of ethanol are added, the precipitated crude product is filtered off with suction, washed three times with 100 ml of EtOH each time and dried in vacuo. The crude product is passed through a silica-gel column with toluene twice. The metal complex is finally heated or sublimed. The heating is carried out in a high vacuum (p about $10^{-6}$ mbar) in the temperature range from about 200-300° C. The sublimation is carried out in a high vacuum (p about $10^{-6}$ mbar) in the temperature range from about 300-400° C., with the sublimation preferably being carried out in the form of a fractional sublimation.

Variant B, One-Phase Reaction Mixture:

0.6 mmol of tri-o-tolylphosphine and then 0.1 mmol of palladium(II) acetate are added to a suspension of 10 mmol of a brominated complex, 40-80 mmol of the boronic acid or boronic acid ester and 60-100 mmol of the base (potassium fluoride, tripotassium phosphate, potassium carbonate, caesium carbonate, etc., in each case anhydrous) and 100 g of glass beads (diameter 3 mm) in 100 ml-500 ml of an aprotic solvent (THF, dioxane, xylene, mesitylene, dimethylacetamide, NMP, DMSO, etc.), and the mixture is heated under reflux for 1-24 h. Alternatively, other phosphines, such as tri-tert-butylphosphine, S-Phos, S-Phos, xantphos, etc., can be employed, where the preferred phosphine:palladium ratio in the case of these phosphines is 2:1 to 1.2:1. The solvent is removed in vacuo, the product is taken up in a suitable solvent (toluene, dichloromethane, ethyl acetate, etc.) and purified as described under Variant A.

Synthesis of $Ir588_3$

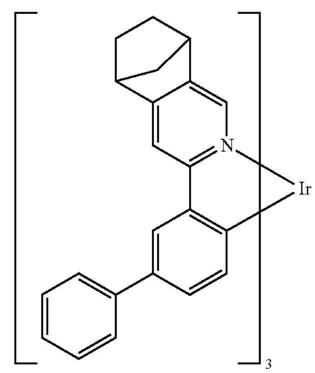

Variant B:

Use of 10.9 g (10.0 mmol) of $Ir(L22-Br)_3$ and 4.9 g (40.0 mmol) of phenylboronic acid [98-80-6], 32.5 g (100 mmol) of caesium carbonate, 62 mg (0.15 mmol) of S-Phos [657408-07-6], 25 mg (0.1 mmol) of palladium(II) acetate, 200 ml of dioxane, 100° C., 8 h. Chromatographic separation on silica gel with toluene/ethyl acetate (90:10, vv). Yield: 6.9 g (6.4 mmol), 64%; purity: about 99.8% according to HPLC.

The following compounds can be prepared analogously:

| Ex. | Complex Boronic acid Variant | Product | Yield |
|---|---|---|---|
| Ir589 | $Ir(L42-Br)_3$ 1233200-59-3 B S-Phos Chromatographic separation using toluene | 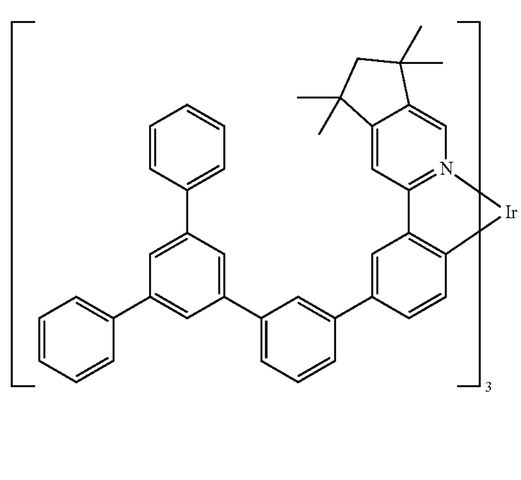 | 63% |

-continued
| Ex. | Complex Boronic acid Variant | Product | Yield |
|---|---|---|---|
| Ir590 | Ir(L95-Br)$_3$ 1071924-15-6 B S-Phos Chromatographic separation using toluene | 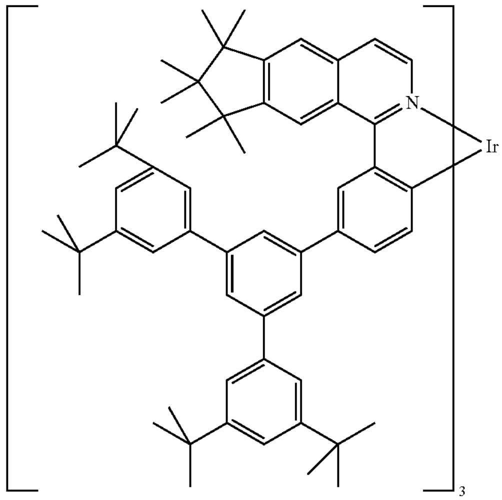 | 55% |
| Ir591 | Ir(L102-Br)$_3$ 333432-28-3 A Chromatographic separation using DCM | 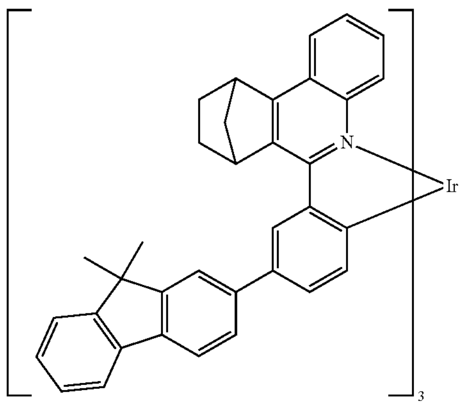 | 42% |
| Ir592 | Ir(L129-Br)$_3$ 5122-95-2 A Chromatographic separation using toluene | 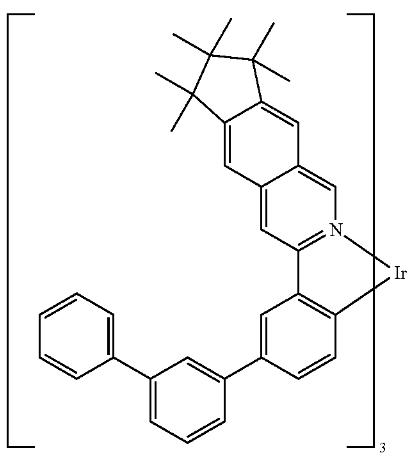 | 96% |

-continued

| Ex. | Complex Boronic acid Variant | Product | Yield |
|---|---|---|---|
| Ir593 | Ir500-$Br_2$ 100379-00-8 B S-Phos Chromatographic separation using EA/DCM (95:5 vv) | 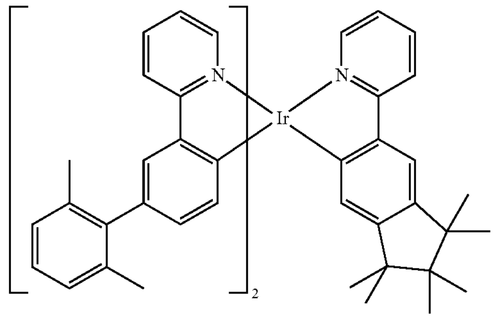 | 39% |
| Ir594 | Ir513-Br 1251825-65-6 A Chromatographic separation using DCM | 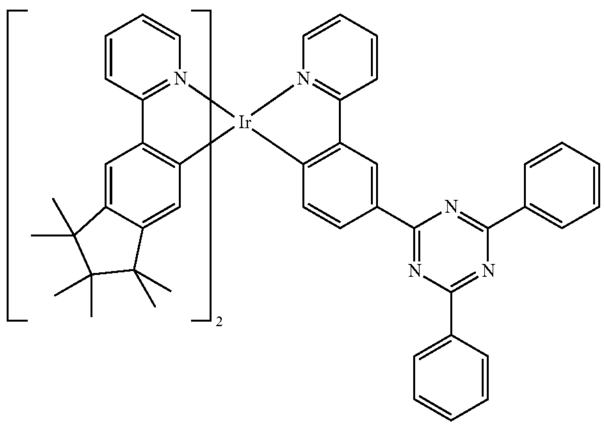 | 46% |

3) Buchwald Coupling on the Iridium Complexes:

0.4 mmol of tri-tert-butylphosphine and then 0.3 mmol of palladium(II) acetate are added to a mixture of 10 mmol of the brominated complex, 40 mmol of the diarylamine or carbazole, 45 mmol of sodium tert-butoxide in the case of amines or 80 mmol of tripotassium phosphate, anhydrous, in the case of carbazoles, 100 g of glass beads (diameter 3 mm) and 300-500 ml of toluene, and the mixture is heated under reflux for 16 h with vigorous stirring. After cooling, the aqueous phase is separated off, washed twice with 200 ml of water, once with 200 ml of saturated sodium chloride solution and dried over magnesium sulfate. The solid material is filtered off through a Celite bed and rinsed with toluene, the solvent is removed virtually completely in vacuo, 300 ml of ethanol are added, the precipitated crude product is filtered off with suction, washed three times with 100 ml of EtOH each time and dried in vacuo. The crude product is purified by chromatography on silica gel with toluene twice. The metal complex is finally heated or sublimed. The heating is carried out in a high vacuum (p about $10^{-6}$ mbar) in the temperature range from about 200-300° C. The sublimation is carried out in a high vacuum (p about $10^{-6}$ mbar) in the temperature range from about 300-400° C., with the sublimation preferably being carried out in the form of a fractional sublimation.

Synthesis of Ir595

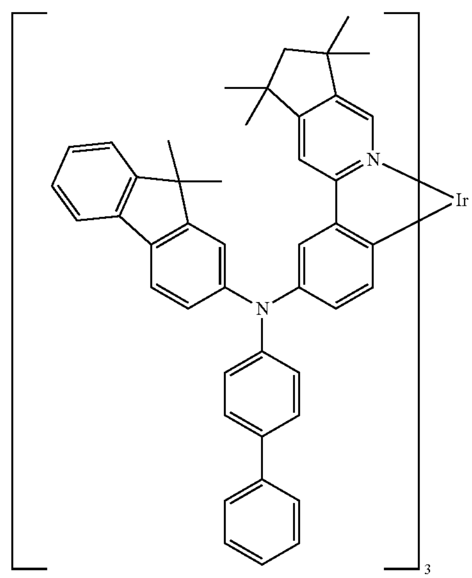

Use of 11.8 g (10 mmol) of Ir(L42-Br)$_3$ and 14.5 g (40 mmol) of N-[1,1'-biphenyl]-4-yl-9,9-dimethyl-9H-fluoren-2-amine [897671-69-1]. Heating. Yield: 7.9 g (3.9 mmol), 39%; purity: about 99.8% according to HPLC.

The following compounds can be prepared analogously:

| Ex. | Product<br>Starting material<br>Amine or carbazole | Yield |
|---|---|---|
| Ir596 | 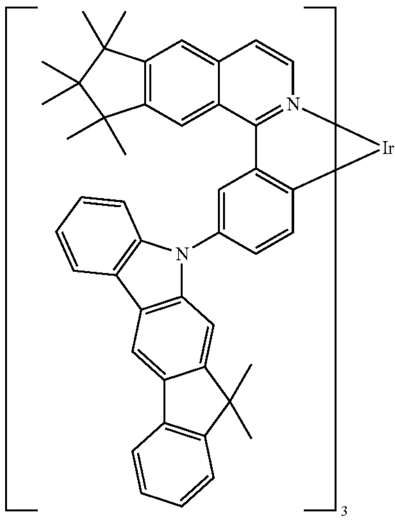<br>$Ir(L95-Br)_3$<br>[1257220-47-5] | 43% |
| Ir597 | 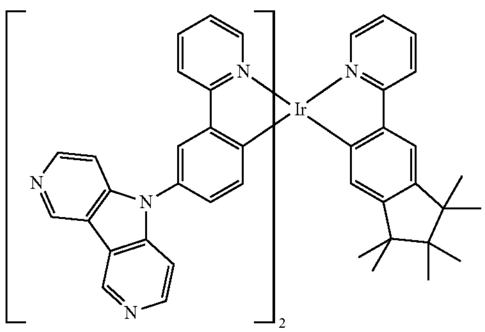<br>$Ir500-Br_2$<br>[244-78-0] | 40% |

4) Cyanation of the Iridium Complexes:

A mixture of 10 mmol of the brominated complex, 13 mmol of copper(I) cyanide per bromine function and 300 ml of NMP is stirred at 200° C. for 20 h. After cooling, the solvent is removed in vacuo, the residue is taken up in 500 ml of dichloromethane, the copper salts are filtered off via Celite, the dichloromethane is evaporated virtually to dryness in vacuo, 100 ml of ethanol are added, the precipitated solid is filtered off with suction, washed twice with 50 ml of ethanol each time and dried in vacuo. Chromatography or hot extraction and fractional sublimation of the crude product as described in 1) variant A.

Synthesis of Ir598

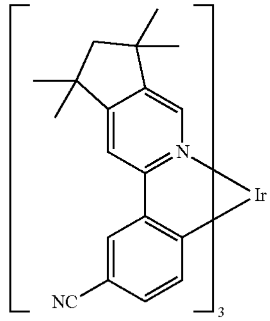

Use of 11.8 g (10 mmol) of $Ir(L42-Br)_3$ and 3.5 g (39 mmol) of copper(I) cyanide. Sublimation. Yield: 4.7 g (4.6 mmol), 46%; purity: about 99.8% according to HPLC.

The following compounds can be prepared analogously:

| Ex. | Product | Yield |
|---|---|---|
| Ir599 | 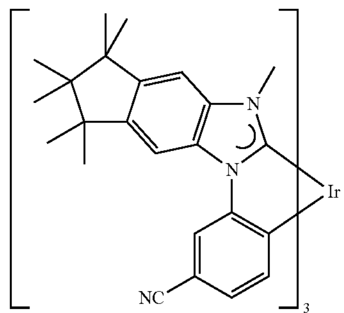<br>fac-$Ir(L78-Br)_3$ + CuCN > Ir599 | 39% |
| Ir600 | 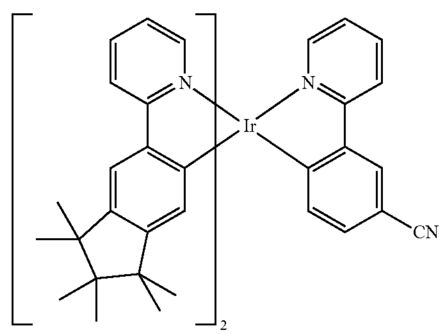<br>Ir513-Br + CuCN > Ir600 | 63% |

5) Borylation of the Iridium Complexes:

A mixture of 10 mmol of the brominated complex, 12 mmol of bis(pinacolato)diborane [73183-34-3] per bromine function, 30 mmol of potassium acetate, anhydrous, per bromine function, 0.2 mmol of tricyclohexylphosphine, 0.1 mmol of palladium(II) acetate and 300 ml of solvent (dioxane, DMSO, NMP, etc.) is stirred at 80-160° C. for 4-16 h. After removal of the solvent in vacuo, the residue is taken up in 300 ml of dichloromethane, THF or ethyl acetate, filtered through a Celite bed, the filtrate is evaporated in vacuo until crystallisation commences, and finally about 100 ml of methanol are added dropwise in order to complete the crystallisation. The compounds can be recrystallised from dichloromethane, ethyl acetate or THF with addition of methanol or alternatively from cyclohexane.

Synthesis of $Ir(L42-B)_3$
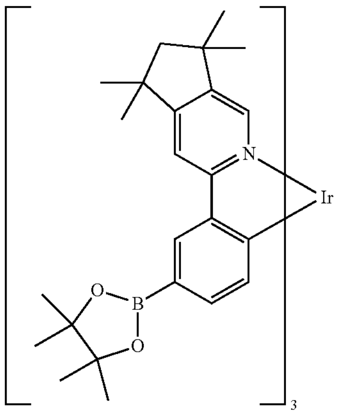
Use of 11.8 g (10 mmol) of $Ir(L42-Br)_3$ and 9.1 g (36 mmol) of bis(pinacolato)diborane [73183-34-3], DMSO, 120° C., 6 h, taking-up and Celite filtration in THF, recrystallisation from THF:methanol. Yield: 7.5 g (5.7 mmol), 57%; purity: about 99.8% according to HPLC.
The following compounds can be prepared analogously:
| Ex. | Starting material | Product | Yield |
|---|---|---|---|
| $Ir(L95-B)_3$ | 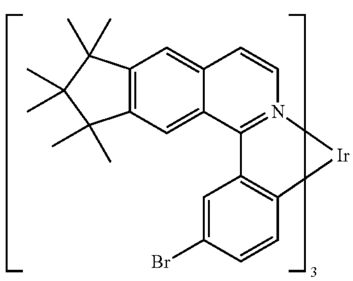 $Ir(L95-Br)_3$ | 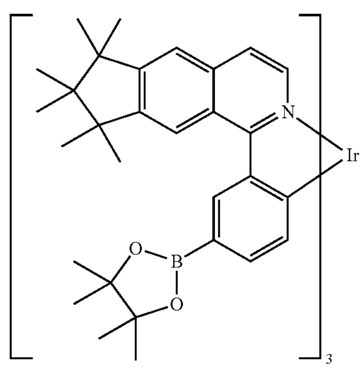 $Ir(L95-B)_3$ | 55% |
| $Ir500-B_2$ | 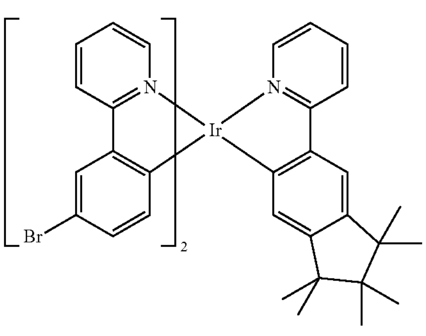 $Ir500-Br_2$ | 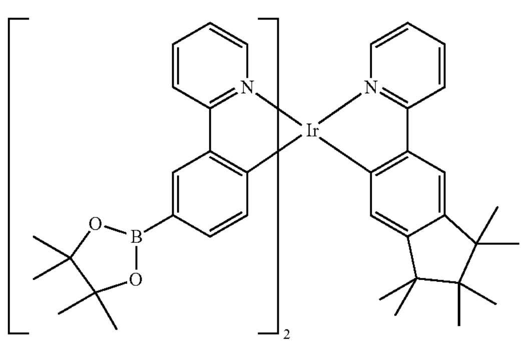 $Ir500-B_2$ | 59% |

-continued

| Ex. | Starting material | Product | Yield |
|---|---|---|---|
| Ir506-$B_2$ | 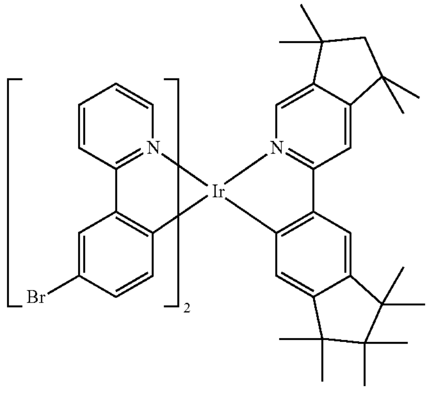 Ir506-$Br_2$ | 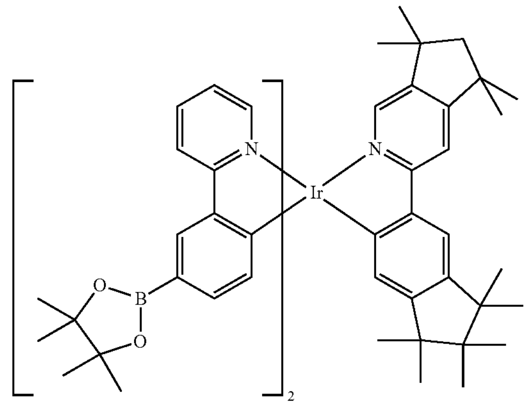 Ir506-$B_2$ | 64% |

Polymers Containing the Metal Complexes:

General Polymerisation Procedure for the Bromides or Boronic Acid Derivatives as Polymerisable Group, Suzuki Polymerisation Variant A—Two-Phase Reaction Mixture:

The monomers (bromides and boronic acids or boronic acid esters, purity according to HPLC>99.8%) in the composition indicated in the table are dissolved or suspended in a mixture of 2 parts by volume of toluene: 6 parts by volume of dioxane: 1 part by volume of water in a total concentration of about 100 mmol/l. 2 mol equivalents of tripotassium phosphate per Br functionality employed are then added, the mixture is stirred for a further 5 min., 0.03 to 0.003 mol equivalent of tri-ortho-tolylphosphine and then 0.005 to 0.0005 mol equivalent of palladium(II) acetate (phosphine to Pd ratio preferably 6:1) per Br functionality employed are then added, and the mixture is heated under reflux for 2-3 h with very vigorous stirring. If the viscosity of the mixture increases excessively, it can be diluted with a mixture of 2 parts by volume of toluene: 3 parts by volume of dioxane. After a total reaction time of 4-6 h, 0.05 mol equivalent per boronic acid functionality employed of a monobromoaromatic compound are added for end capping, and then, 30 min. later, 0.05 mol equivalent per Br functionality employed of a monoboronic acid or a monoboronic acid ester is added, and the mixture is boiled for a further 1 h. After cooling, the mixture is diluted with 300 ml of toluene. The aqueous phase is separated off, the organic phase is washed twice with 300 ml of water each time, dried over magnesium sulfate, filtered through a Celite bed in order to remove palladium and then evaporated to dryness. The crude polymer is dissolved in THF (concentration about 10-30 g/l), and the solution is allowed to run slowly, with very vigorous stirring, into twice the volume of methanol. The polymer is filtered off with suction and washed three times with methanol.

The reprecipitation process is repeated three times, the polymer is then dried to constant weight at 30-50° C. in vacuo.

Variant B—One-Phase Reaction Mixture:

The monomers (bromides and boronic acids or boronic acid esters, purity according to HPLC>99.8%) in the composition indicated in the table are dissolved or suspended in a solvent (THF, dioxane, xylene, mesitylene, dimethylacetamide, NMP, DMSO, etc.) in a total concentration of about 100 mmol/l. 3 mol equivalents of base (potassium fluoride, tripotassium phosphate, potassium carbonate, caesium carbonate, etc., in each case anhydrous) per Br functionality are then added, and the weight equivalent of glass beads (diameter 3 mm) is added, the mixture is stirred for a further 5 min., 0.03 to 0.003 mol equivalent of tri-ortho-tolylphosphine and then 0.005 to 0.0005 mol equivalent of palladium (II) acetate (phosphine to Pd ratio preferably 6:1) per Br functionality are then added, and the mixture is then heated under reflux for 2-3 h with very vigorous stirring. Alternatively, other phosphines, such as tri-tert-butylphosphine, S-Phos, X-Phos, xantphos, etc., can be employed, where the preferred phosphine:palladium ratio in the case of these phosphines is 2:1 to 1.3:1. After a total reaction time of 4-12 h, 0.05 mol equivalent of a monobromoaromatic compound and then, 30 min. later, 0.05 mol equivalent of a monoboronic acid or a monoboronic acid ester is added for end capping, and the mixture is boiled for a further 1 h. The solvent is substantially removed in vacuo, the residue is taken up in toluene, and the polymer is purified as described under variant A.

Monomers/End Cappers:

M1

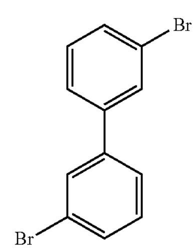

16400-51-4

-continued

M2

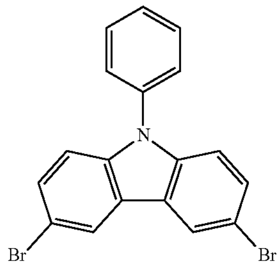

57103-20-5

M3

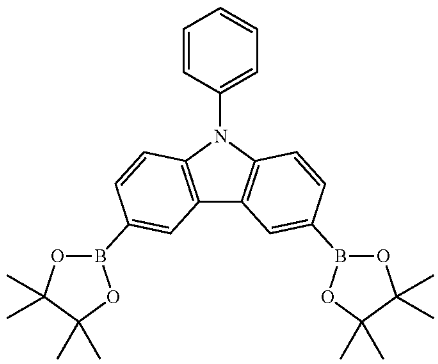

618442-57-2

M4

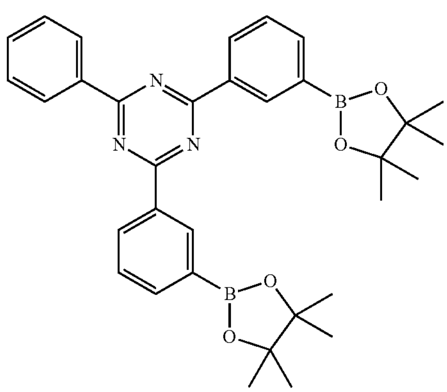

1238752-26-5

E1

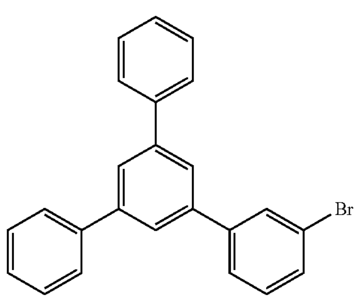

1233200-57-1

-continued

E2

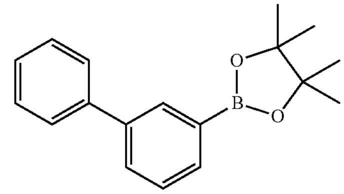

912844-88-3

Polymers:

Composition of the polymers, mol %:

| Polymer | M1 [%] | M2 [%] | M3 [%] | M4 [%] | Ir complex/ [%] |
|---|---|---|---|---|---|
| P1 | — | 30 | — | 45 | $Ir(L95\text{-}Br)_3$/10 |
| P2 | 10 | 10 | — | 35 | $Ir505\text{-}Br_3$/10 |
| P3 | — | 30 | — | 40 | $Ir500\text{-}Br_2$/10 |
| P4 | 10 | 30 | 10 | 20 | $Ir506\text{-}B_2$ /10 |

Molecular weights and yield of the polymers according to the invention:

| Polymer | Mn [$gmol^{-1}$] | Polydispersity | Yield |
|---|---|---|---|
| P1 | 147,000 | 4.6 | 60% |
| P2 | 158,000 | 5.1 | 57% |
| P3 | 239,000 | 2.4 | 63% |
| P4 | 235,000 | 2.3 | 67% |

Example

Comparison of the Photoluminescence Spectra

The FIGURE shows the photoluminescence spectrum of complex $Ir(L3)_3$, i.e. a tris(phenylisoquinoline)iridium complex which contains a group of the formula (3), compared with the spectrum of the corresponding complex without the group of the formula (3). The spectra were measured in an approx. $10^{-5}$ molar solution in degassed toluene at room temperature. The narrower emission band having a full width at half maximum (FWHM) value of 48 nm compared with 74 nm in the case of the compound without a group of the formula (3) is clearly evident. The complex according to the invention furthermore has higher photoluminescence quantum efficiency.

Example

Production of OLEDs

1) Vacuum-Processed Devices:

OLEDs according to the invention and OLEDs in accordance with the prior art are produced by a general process in accordance with WO 2004/058911, which is adapted to the circumstances described here (layer-thickness variation, materials used).

The results for various OLEDs are presented in the following examples. Glass plates with structured ITO (50 nm, indium tin oxide) form the substrates to which the OLEDs are applied. The OLEDs have in principle the following layer structure: substrate/hole-transport layer 1 (HTL1) consisting of HTM doped with 3% of NDP-9

(commercially available from Novaled), 20 nm/hole-transport layer 2 (HTL2)/optional electron-blocking layer (EBL)/emission layer (EML)/optional hole-blocking layer (HBL)/electron-transport layer (ETL)/optional electron-injection layer (EIL) and finally a cathode. The cathode is formed by an aluminium layer with a thickness of 100 nm Firstly, vacuum-processed OLEDs are described. For this purpose, all materials are applied by thermal vapour deposition in a vacuum chamber. The emission layer here always consists of at least one matrix material (host material) and an emitting dopant (emitter), which is admixed with the matrix material or matrix materials in a certain proportion by volume by coevaporation. An expression such as M3:M2:$Ir(L1)_3$ (55%:35%:10%) here means that material M3 is present in the layer in a proportion by volume of 55%, M2 is present in the layer in a proportion of 35% and $Ir(L1)_3$ is present in the layer in a proportion of 10%. Analogously, the electron-transport layer may also consist of a mixture of two materials. The precise structure of the OLEDs is shown in Table 1. The materials used for the production of the OLEDs are shown in Table 7.

The OLEDs are characterised by standard methods. For this purpose, the electroluminescence spectra, the current efficiency (measured in cd/A) and the voltage (measured at 1000 cd/m$^2$ in V) are determined from current/voltage/luminance characteristic lines (IUL characteristic lines). For selected experiments, the lifetime is determined. The lifetime is defined as the time after which the luminous density has dropped to a certain proportion from a certain initial luminous density. The expression LT50 means that the lifetime given is the time at which the luminous density has dropped to 50% of the initial luminous density, i.e. from, for example, 1000 cd/m$^2$ to 500 cd/m$^2$. Depending on the emission colour, different initial luminances were selected. The values for the lifetime can be converted to a figure for other initial luminous densities with the aid of conversion formulae known to the person skilled in the art. The lifetime for an initial luminous density of 1000 cd/m$^2$ is a usual figure here.

Use of Compounds According to the Invention as Emitter Materials in Phosphorescent OLEDs The compounds according to the invention can be employed, inter alia, as phosphorescent emitter materials in the emission layer in OLEDs. The iridium compounds shown in Table 7 are used as comparison in accordance with the prior art. The results for the OLEDs are summarised in Table 2.

TABLE 1

Structure of the OLEDs

| Ex. | HTL2 Thickness | EBL Thickness | EML Thickness | HBL Thickness | ETL Thickness |
|---|---|---|---|---|---|
| Red OLEDs | | | | | |
| D-IrR1 | HTM 280 nm | — | M7:M8:Ir-R1 (65%:30%:5%) 35 nm | — | ETM1:ETM2 (50%:50%) 40 nm |
| D-Ir(L3)$_3$ | HTM 280 nm | — | M7:M8:Ir(L3)$_3$ (65%:30%:5%) 35 nm | — | ETM1:ETM2 (50%:50%) 40 nm |
| D-Ir(L4))$_3$ | HTM 280 nm | — | M7:M8:Ir(L4)$_3$ (65%:30%:5%) 35 nm | — | ETM1:ETM2 (50%:50%) 40 nm |

TABLE 1-continued

Structure of the OLEDs

| Ex. | HTL2 Thickness | EBL Thickness | EML Thickness | HBL Thickness | ETL Thickness |
|---|---|---|---|---|---|
| D-Ir(L95)$_3$ | HTM 280 nm | — | M7:M8:Ir(L95)$_3$ (55%:40%:5%) 35 nm | — | ETM1:ETM2 (50%:50%) 40 nm |
| D-Ir(L101)$_3$ | HTM 280 nm | — | M7:M8:Ir(L101)$_3$ (65%:30%:5%) 35 nm | — | ETM1:ETM2 (50%:50%) 40 nm |
| D-Ir548 | HTM 280 nm | — | M7:M8:Ir548 (65%:30%:5%) 35 nm | — | ETM1:ETM2 (50%:50%) 40 nm |
| D-Ir555 | HTM 280 nm | — | M6:M8:Ir555 (65%:30%:5%) 35 nm | — | ETM1:ETM2 (50%:50%) 40 nm |
| D-Ir587 | HTM 280 nm | — | M6:M8:Ir587 (65%:30%:5%) 35 nm | — | ETM1:ETM2 (50%:50%) 40 nm |
| D-IrR2 | HTM 280 nm | — | M9:Ir-R2 (92%:8%) 35 nm | | ETM1:ETM2 (50%:50%) 40 nm |
| D-Ir543 | HTM 280 nm | — | M9:Ir543 (92%:8%) 35 nm | — | ETM1:ETM2 (50%:50%) 40 nm |
| D-Ir544 | HTM 280 nm | — | M9:Ir544 (92%:8%) 35 nm | — | ETM1:ETM2 (50%:50%) 40 nm |
| D-Ir556 | HTM 280 nm | — | M9:Ir556 (95%:5%) 35 nm | — | ETM1:ETM2 (50%:50%) 40 nm |
| D-Ir557 | HTM 280 nm | — | M9:Ir557 (92%:8%) 35 nm | — | ETM1:ETM2 (50%:50%) 40 nm |
| D-Ir568 | HTM 280 nm | — | M9:Ir568 (95%:5%) 35 nm | — | ETM1:ETM2 (50%:50%) 40 nm |
| D-Ir583 | HTM 280 nm | — | M9:Ir583 (92%:8%) 35 nm | — | ETM1:ETM2 (50%:50%) 40 nm |
| D-IrR3 | HTM 280 nm | — | M7:M8:Ir-R3 (65%:30%:5%) 35 nm | — | ETM1:ETM2 (50%:50%) 40 nm |
| D-Ir545 | HTM 280 nm | — | M7:M8:Ir545 (65%:30%:5%) 35 nm | — | ETM1:ETM2 (50%:50%) 40 nm |
| D-IrR4 | HTM 280 nm | — | M7:M8:Ir-R4 (65%:30%:5%) 35 nm | — | ETM1:ETM2 (50%:50%) 40 nm |
| D-Ir546 | HTM 280 nm | — | M7:M8:Ir546 (65%:30%:5%) 35 nm | — | ETM1:ETM2 (50%:50%) 40 nm |
| D-Pt-R1 | HTM 280 nm | — | M7:M8:Pt-R1 (65%:30%:5%) 35 nm | — | ETM1:ETM2 (50%:50%) 40 nm |
| D-Pt003 | HTM 280 nm | — | M7:M8:Pt003 (65%:30%:5%) 35 nm | — | ETM1:ETM2 (50%:50%) 40 nm |
| D-Ir(L129)$_3$ | HTM 280 nm | — | M7:M8: D-Ir(L129)$_3$ | — | ETM1:ETM2 |

TABLE 1-continued

| Structure of the OLEDs | | | | | |
|---|---|---|---|---|---|
| Ex. | HTL2 Thickness | EBL Thickness | EML Thickness | HBL Thickness | ETL Thickness |
| | | | (60%:30%:10%) 35 nm | | (50%:50%) 40 nm |
| D-Ir(L132)$_3$ | HTM 280 nm | — | M7:M8: D-Ir(L132)$_3$ (60%:30%:10%) 35 nm | — | ETM1: ETM2 (50%:50%) 40 nm |
| D-Ir552 | HTM 280 nm | — | M6:M8: D-Ir552 (50%:45%:5%) 35 nm | — | ETM1: ETM2 (50%:50%) 40 nm |
| Yellow OLEDs | | | | | |
| D-Ir-Y1 | HTM 230 nm | — | M7:M8:Ir-Y1 (62%:30%:8%) 25 nm | — | ETM1: ETM2 (50%:50%) 45 nm |
| D-Ir(L28)$_3$ | HTM 230 nm | — | M7:M8:Ir(L28)$_3$ (62%:30%:8%) 25 nm | — | ETM1: ETM2 (50%:50%) 45 nm |
| D-Ir-Y2 | HTM 230 nm | — | M7:M8:Ir-Y2 (62%:30%:8%) 25 nm | — | ETM1: ETM2 (50%:50%) 45 nm |
| D-Ir501 | HTM 230 nm | — | M7:M8:Ir-501 (62%:30%:8%) 25 nm | — | ETM1: ETM2 (50%:50%) 45 nm |
| Green OLEDs | | | | | |
| D-Ir-G1 | HTM 230 nm | — | M7:M8:Ir-G1 (65%:30%:5%) 25 nm | HBM2 10 nm | ETM1: ETM2 (50%:50%) 35 nm |
| D-Ir(L1)$_3$ | HTM 230 nm | — | M7:M8:Ir(L1)$_3$ (65%:30%:5%) 25 nm | HBM2 10 nm | ETM1: ETM2 (50%:50%) 35 nm |
| D-Ir(L22)$_3$ | HTM 230 nm | — | M7:M8:Ir(L22)$_3$ (65%:30%:5%) 25 nm | HBM2 10 nm | ETM1: ETM2 (50%:50%) 35 nm |
| D-Ir(L33)$_3$ | HTM 230 nm | | M7:M8:Ir(L33)$_3$ (65%:30%:5%) 25 nm | HBM2 10 nm | ETM1: ETM2 (50%:50%) 35 nm |
| D-Ir(L34)$_3$ | HTM 230 nm | — | M7:M8:Ir(L34)$_3$ (65%:30%:5%) 25 nm | HBM2 10 nm | ETM1: ETM2 (50%:50%) 35 nm |
| D-Ir(L35)$_3$ | HTM 230 nm | — | M7:M8:Ir(L35)$_3$ (65%:30%:5%) 25 nm | HBM2 10 nm | ETM1: ETM2 (50%:50%) 35 nm |
| D-Ir(L38)$_3$ | HTM 230 nm | — | M7:M8:Ir(L38)$_3$ (65%:30%:5%) 25 nm | HBM2 10 nm | ETM1: ETM2 (50%:50%) 35 nm |
| D-Ir(L42)$_3$ | HTM 230 nm | — | M7:M8:Ir(L42)$_3$ (65%:30% :5%) 25 nm | HBM2 10 nm | ETM1: ETM2 (50%:50%) 35 nm |
| D-Ir(L48)$_3$ | HTM 230 nm | — | M7:M8:Ir(L48)$_3$ (65%:30%:5%) 25 nm | HBM2 10 nm | ETM1: ETM2 (50%:50%) 35 nm |
| D-Ir(L49)$_3$ | HTM 230 nm | — | M7:M8:Ir(L49)$_3$ (65%:30%:5%) 25 nm | HBM2 10 nm | ETM1: ETM2 (50%:50%) 35 nm |
| D-Ir(L50)$_3$ | HTM 230 nm | — | M7:M8:Ir(L50)$_3$ (65:30%:5%) 25 nm | HBM2 10 nm | ETM1: ETM2 (50%:50%) 35 nm |

TABLE 1-continued

| Structure of the OLEDs | | | | | |
|---|---|---|---|---|---|
| Ex. | HTL2 Thickness | EBL Thickness | EML Thickness | HBL Thickness | ETL Thickness |
| D-Ir(L52)$_3$ | HTM 230 nm | — | M7:M8:Ir(L52)$_3$ 25 nm | HBM2 10 nm | ETM1: ETM2 (50%:50%) 35 nm |
| D-Ir-G2 | HTM 230 nm | — | M7:M8:Ir-G2 (65%:30%:5%) 25 nm | HBM2 10 nm | ETM1: ETM2 (50%:50%) 35 nm |
| D-Ir(L8)$_3$ | HTM 230 nm | — | M7:M8:Ir(L8)$_3$ (65%:30%:5%) 25 nm | HBM2 10 nm | ETM1: ETM2 (50%:50%) 35 nm |
| D-Pt(L139) | HTM 230 nm | — | M7:M8:Pt(L139) (65%:33%:8%) 25 nm | HBM2 10 nm | ETM1: ETM2 (50%:50%) 35 nm |
| D-Pt(L143) | HTM 230 nm | — | M7:M8:Pt(L143) (65%:30%:5%) 25 nm | HBM2 10 nm | ETM1: ETM2 (50%:50%) 35 nm |
| D-Pt(L146) | HTM 230 nm | — | M7:M8:Pt(L146) (60%:30%:10%) 25 nm | HBM2 10 nm | ETM1: ETM2 (50%:50%) 35 nm |
| Blue OLEDs | | | | | |
| D-Ir-B1 | HTM 190 nm | EBM 10 nm | M1:M4:Ir-B1 (60%:35%:5%) 25 nm | HBM1 10 nm | ETM1: ETM2 (50%:50%) 15 nm |
| D-Ir(L74)$_3$ | HTM 190 nm | EBM 10 nm | M1:M4:Ir(L74)$_3$ (60%:35%:5%) 25 nm | HBM1 10 nm | ETM1: ETM2 (50%:50%) 15 nm |
| D-Ir(L77)$_3$ | HTM 190 nm | EBM 10 nm | M1:M4:Ir(L77)$_3$ (60%:35%:5%) 25 nm | HBM1 10 nm | ETM1: ETM2 (50%:50%) 15 nm |
| D-Ir-B2 | HTM 190 nm | EBM 10 nm | M10:M4:Ir-B2 (65%:25%:10%) 25 nm | HBM1 10 nm | ETM1: ETM2 (50%:50%) 15 nm |
| D-fac-Ir(L78)$_3$ | HTM 190 nm | EBM 10 nm | M10:M4:fac-Ir(L78)$_3$ (65%:25%:10%) 25 nm | HBM1 10 nm | ETM1: ETM2 (50%:50%) 15 nm |
| D-fac-Ir(L486)$_3$ | HTM 190 nm | EBM 10 nm | M10:M4:fac-Ir(L86)$_3$ (65%:25%:10%) 25 nm | HBM1 10 nm | ETM1: ETM2 (50%:50%) 15 nm |
| D-fac-Ir(L87)$_3$ | HTM 190 nm | EBM 10 nm | M10:M4:fac-Ir(L87)$_3$ (65%:25%:10%) 25 nm | HBM1 10 nm | ETM1: ETM2 (50%:50%) 15 nm |
| D-fac-Ir(L88)$_3$ | HTM 190 nm | EBM 10 nm | M10:M4:fac-Ir(L88)$_3$ (65%:25%:10%) 25 nm | HBM1 10 nm | ETM1: ETM2 (50%:50%) 15 nm |
| D-fac-Ir(89)$_3$ | HTM 190 nm | EBM 10 nm | M10:M4:fac-Ir(L89)$_3$ (65%:25%:10%) 25 nm | HBM1 10 nm | ETM1: ETM2 (50%:50%) 15 nm |
| D-Pt(L148) | HTM 190 nm | EBM 10 nm | M10:M4 Pt(L148) (60%:30%:10%) 25 nm | HBM1 10 nm | ETM1: ETM2 (50%:50%) 15 nm |
| D-Pt(L150) | HTM 190 nm | EBM 10 nm | M10:M4:Pt(L150) 65%:25%:10%) 25 nm | HBM1 10 nm | ETM1: ETM2 (50%:50%) 15 nm |

TABLE 1-continued

| Structure of the OLEDs | | | | | |
|---|---|---|---|---|---|
| Ex. | HTL2 Thickness | EBL Thickness | EML Thickness | HBL Thickness | ETL Thickness |
| D-Pt(L152) | HTM 190 nm | EBM 10 nm | M10:M4:Pt(L152) (60%:35%:5%) 25 nm | HBM1 10 nm | ETM1:ETM2 (50%:50%) 15 nm |

TABLE 2

| Results of vacuum-processed OLEDs | | | | |
|---|---|---|---|---|
| Ex. | EQE (%) 1000 cd/m$^2$ | Voltage (V) 1000 cd/m$^2$ | CIE x/y 1000 cd/m$^2$ | LT80 (h) 1000 cd/m$^2$ |
| Red OLEDs | | | | |
| D-IrR1 | 13.3 | 2.9 | 0.67/0.33 | 14000 |
| D-Ir(L3)$_3$ | 15.5 | 3.0 | 0.68/0.32 | 18000 |
| D-Ir(L4))$_3$ | 16.9 | 3.0 | 0.68/0.32 | 26000 |
| D-Ir(L95)$_3$ | 17.4 | 3.2 | 0.68/0.32 | 15000 |
| D-Ir(101)$_3$ | 17.9 | 3.1 | 0.68/0.32 | 16000 |
| D-Ir548 | 17.0 | 3.0 | 0.67/0.32 | 14500 |
| D-Ir555 | 18.7 | 3.0 | 0.67/0.32 | 13000 |
| D-Ir587 | 19.3 | 3.2 | 0.68/0.32 | 17000 |
| D-IrR2 | 18.9 | 3.8 | 0.66/0.34 | 30000 |
| D-Ir543 | 19.6 | 3.6 | 0.66/0.34 | 39000 |
| D-Ir544 | 22.4 | 3.6 | 0.65/0.34 | 54000 |
| D-Ir556 | 19.6 | 3.4 | 0.66/0.34 | 36000 |
| D-Ir557 | 19.2 | 3.3 | 0.67/0.33 | 40000 |
| D-Ir568 | 19.4 | 3.5 | 0.63/0.36 | 47000 |
| D-Ir583 | 19.0 | 3.3 | 0.67/0.33 | 42000 |
| D-IrR3 | 16.3 | 3.2 | 0.62/0.37 | 21000 |
| D-Ir542 | 21.0 | 3.2 | 0.64/0.35 | 33000 |
| D-IrR4 | 12.7 | 3.3 | 0.70/0.29 | 17000 |
| D-Ir546 | 18.0 | 3.2 | 0.71/0.28 | 39000 |
| D-Pt-R1 | 11.0 | 3.4 | 0.68/0.32 | 11000 |
| D-Pt003 | 15.8 | 3.4 | 0.69/0.31 | 16000 |
| D-Ir(L129)$_3$ | 19.4 | 3.2 | 0.66/0.33 | 17000 |
| D-Ir(L132)$_3$ | 17.9 | 3.2 | 0.67/0.32 | 15000 |
| D-Ir552 | 18.7 | 3.1 | 0.66/0.34 | 17500 |
| Yellow OLEDs | | | | |
| D-Ir-Y1 | 19.8 | 3.0 | 0.38/0.61 | 32000 |
| D-Ir(L28)$_3$ | 22.3 | 3.1 | 0.40/0.59 | 39000 |
| D-Ir-Y2 | 21.5 | 2.8 | 0.46/0.53 | 41000 |
| D-Ir501 | 23.8 | 2.9 | 0.48/0.52 | 49000 |
| Green OLEDs | | | | |
| D-Ir-G1 | 18.0 | 3.4 | 0.32/0.64 | 8000 |
| D-Ir(L1)$_3$ | 20.4 | 3.3 | 0.34/0.61 | 22000 |
| D-Ir(L22)$_3$ | 21.3 | 3.3 | 0.28/0.62 | 23000 |
| D-Ir(L33)$_3$ | 22.4 | 3.4 | 0.31/0.63 | 21000 |
| D-Ir(L34)$_3$ | 22.6 | 3.4 | 0.31/0.63 | 25000 |
| D-Ir(L35)$_3$ | 22.4 | 3.4 | 0.31/0.63 | 24000 |
| D-Ir(L38)$_3$ | 21.4 | 3.3 | 0.30/0.64 | 19000 |
| D-Ir(L42)$_3$ | 22.7 | 3.3 | 0.29/0.62 | 26000 |
| D-Ir(L48)$_3$ | 22.4 | 3.4 | 0.31/0.63 | 26000 |
| D-Ir(L49)$_3$ | 22.3 | 3.4 | 0.31/0.63 | 22000 |
| D-Ir(L50)$_3$ | 22.3 | 3.3 | 0.31/0.64 | 23000 |
| D-Ir(L52)$_3$ | 23.2 | 3.4 | 0.31/0.64 | 24000 |
| D-Ir-G2 | 19.1 | 3.2 | 0.35/0.61 | 19000 |
| D-Ir(L8)$_3$ | 22.1 | 3.3 | 0.36/0.62 | 19000 |
| D-Pt(L139) | 21.8 | 3.5 | 0.33/0.63 | 17000 |
| D-Pt(L143) | 22.0 | 3.6 | 0.34/0.62 | 18000 |
| D-Pt(L146) | 22.4 | 3.6 | 0.33/0.61 | 20500 |
| Blue OLEDs | | | | |
| | | | | LT50 (h) 1000 cd/m$^2$ |
| D-Ir-B1 | 16.3 | 4.8 | 0.18/0.37 | 1000 |
| D-Ir(L74)$_3$ | 22.5 | 4.7 | 0.16/0.38 | 1200 |
| D-Ir(L77)$_3$ | 21.0 | 4.8 | 0.15/0.36 | 700 |

TABLE 2-continued

| Results of vacuum-processed OLEDs | | | | |
|---|---|---|---|---|
| Ex. | EQE (%) 1000 cd/m$^2$ | Voltage (V) 1000 cd/m$^2$ | CIE x/y 1000 cd/m$^2$ | LT80 (h) 1000 cd/m$^2$ |
| D-Ir-B2 | 3.2 | 5.3 | 0.16/0.06 | 50 |
| D-fac-Ir(L78)$_3$ | 6.4 | 5.2 | 0.16/0.09 | 150 |
| D-fac-Ir(L86)$_3$ | 8.4 | 5.5 | 0.16/0.11 | 200 |
| D-fac-Ir(L87)$_3$ | 9.3 | 5.6 | 0.15/0.10 | — |
| D-fac-Ir(L88)$_3$ | 8.8 | 5.6 | 0.16/0.10 | 200 |
| D-fac-Ir(89)$_3$ | 6.7 | 6.0 | 0.15/0.08 | — |
| D-Pt(L148) | 15.4 | 5.4 | 0.15/0.19 | 800 |
| D-Pt(L150) | 17.7 | 5.2 | 0.15/0.23 | 1600 |
| D-Pt(L152) | 16.0 | 5.4 | 0.15/0.19 | 1100 |

2) Solution-Processed Devices:

A: From Soluble Functional Materials

The iridium complexes according to the invention can also be processed from solution, where they result in OLEDs which are significantly simpler as far as the process is concerned, compared with the vacuum-processed OLEDs, with nevertheless good properties. The production of components of this type is based on the production of polymeric light-emitting diodes (PLEDs), which has already been described many times in the literature (for example in WO 20041037887). The structure is composed of substrate/ITO/PEDOT (80 nm)/interlayer (80 nm)/emission layer (80 nm)/cathode. To this end, use is made of substrates from Technoprint (soda-lime glass), to which the ITO structure (indium tin oxide, a transparent, conductive anode) is applied. The substrates are cleaned with DI water and a detergent (Deconex 15 PF) in a clean room and then activated by a UV/ozone plasma treatment. An 80 nm layer of PEDOT (PEDOT is a polythiophene derivative (Baytron P VAI 4083sp.) from H. C. Starck, Goslar, which is supplied as an aqueous dispersion) is then applied as buffer layer by spin coating, likewise in the clean room. The spin rate required depends on the degree of dilution and the specific spin coater geometry (typically for 80 nm: 4500 rpm). In order to remove residual water from the layer, the substrates are dried by heating on a hotplate at 180° C. for 10 minutes. The interlayer used serves for hole injection, in this case HIL-012 from Merck is used. The interlayer may alternatively also be replaced by one or more layers, which merely have to satisfy the condition of not being detached again by the subsequent processing step of EML deposition from solution. In order to produce the emission layer, the emitters according to the invention are dissolved in toluene together with the matrix materials. The typical solids content of such solutions is between 16 and 25 g/l if, as here, the typical layer thickness of 80 nm for a device is to be achieved by means of spin coating. The solution-processed devices comprise an emission layer comprising (polystyrene):M5:M6:Ir(L)$_3$ (25%:25%:40%:10%). The emission layer is applied by spin coating in an inert-gas atmosphere, in the present case argon, and dried by heating at 130° C. for 30 min. Finally, a cathode is applied by vapour deposition from barium (5 nm) and then aluminium (100 nm) (high-purity metals from Aldrich, particularly barium 99.99% (Order No. 474711); vapour-deposition equipment from Lesker, inter alia, typical vapour-deposition pressure $5\times10^{-6}$ mbar). Optionally, firstly a hole-blocking layer and then an electron-transport layer and only then the cathode (for example Al or LiF/Al) can be applied by vacuum vapour deposition. In order to protect the device against air and atmospheric moisture, the device is finally encapsulated and then characterised. The OLED examples given have not yet been optimised, Table 3 summarises the data obtained.

TABLE 3

| Results with solution-processed materials | | | | |
|---|---|---|---|---|
| Ex. | Emitter | EQE (%) 1000 cd/m$^2$ | Voltage (V) 1000 cd/m$^2$ | CIE x/y 1000 cd/m$^2$ |
| Red OLEDs | | | | |
| Sol-D-Ir-R2 | Ir-R2 | 17.1 | 3.9 | 0.66/0.34 |
| Sol-D-Ir543 | Ir543 | 19.7 | 3.9 | 0.66/0.34 |
| Sol-D-Ir544 | Ir544 | 21.2 | 3.8 | 0.65/0.34 |
| Sol-D-Ir(L95)$_3$ | Ir(L95)$_3$ | 17.2 | 3.7 | 0.67/0.32 |
| Sol-D-Ir564 | Ir564 | 18.7 | 3.6 | 0.68/0.31 |
| Sol-D-Ir567 | Ir567 | 18.5 | 3.2 | 0.68/0.31 |
| Yellow OLEDs | | | | |
| Sol-D-Ir-Y3 | IrY3 | 19.5 | 3.9 | 0.48/0.49 |
| Sol-D-Ir(L2)$_3$ | Ir(L2)$_3$ | 22.1 | 4.0 | 0.49/0.50 |
| Sol-D-Ir(L12)$_3$ | Ir(L12)$_3$ | 21.3 | 4.1 | 0.50/0.47 |
| Green OLEDs | | | | |
| Sol-D-Ir-G3 | Ir-G3 | 18.5 | 4.3 | 0.34/0.61 |
| Sol-D-Ir(L26)$_3$ | Ir(L26)$_3$ | 21.7 | 4.4 | 0.34/0.61 |
| Sol-D-Ir589 | Ir589 | 21.0 | 4.2 | 0.36/0.60 |
| Sol-D-Ir593 | Ir593 | 21.7 | 4.2 | 0.33/0.65 |
| Sol-D-Pt(L146) | Pt(L146) | 21.4 | 4.3 | 0.33/0.61 |

B: From Polymeric Functional Materials:

Production of the OLEDs as described under A: For the production of the emission layer, the polymers according to the invention are dissolved in toluene. The typical solids content of such solutions is between 10 and 15 g/l if, as here, the typical layer thickness of 80 nm for a device is to be achieved by means of spin coating. The said OLED examples have not yet been optimised, Table 4 summarises the data obtained.

TABLE 4

| Results with solution-processed materials | | | | |
|---|---|---|---|---|
| Ex. | Polymer | EQE (%) 1000 cd/m$^2$ | Voltage (V) 1000 cd/m$^2$ | CIE x/y 1000 cd/m$^2$ |
| Red OLEDs | | | | |
| D-P1 | P1 | 16.6 | 3.7 | 0.68/0.32 |
| Green OLEDs | | | | |
| D-P2 | P2 | 17.5 | 4.2 | 0.34/0.61 |
| D-P3 | P3 | 18.1 | 4.2 | 0.33/0.63 |
| D-P4 | P4 | 18.6 | 4.3 | 0.33/0.62 |

1) White-Emitting OLEDs

A white-emitting OLED having the following layer structure is produced in accordance with the general processes from 1):

TABLE 5

| Structure of the white OLEDs | | | | | | |
|---|---|---|---|---|---|---|
| Ex. | HTL2 Thick-ness | EML Red Thick-ness | EML Blue Thick-ness | EML Green Thick-ness | HBL Thick-ness | ETL Thick-ness |
| D-W1 | HTM 230 nm | EBM: IrL544 (97%:3%) 9 nm | M1:M3: IrL536 (45%: 50%:5%) 8 nm | M3: Ir(L42)$_3$ (90%:10%) 7 nm | M3 10 nm | ETM1: ETM2 (50%:50%) 30 nm |

TABLE 6

| Device results | | | | |
|---|---|---|---|---|
| Ex. | EQE (%) 1000 cd/m$^2$ | Voltage (V) 1000 cd/m$^2$ | CIE x/y 1000 cd/m$^2$ | LT50 (h) 1000 cd/m$^2$ |
| D-W1 | 22.4 | 6.1 | 0.42/0.39 | 6000 |

TABLE 7

Structural formulae of the materials used

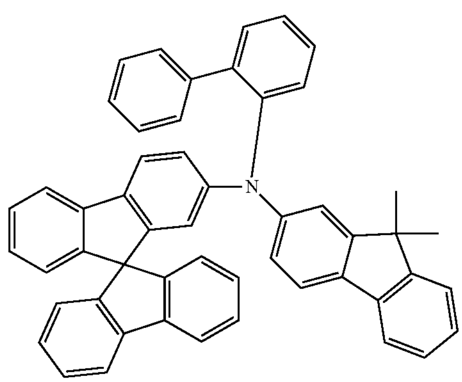 [SMILES: CC1(C)c2ccccc2-c2ccc(N(c3ccc4c(c3)C3(c5ccccc5-c5ccccc53)c3ccccc3-4)c3ccccc3-c3ccccc3)cc21]

HTM

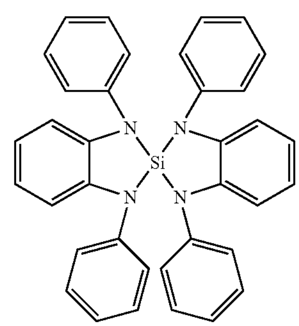 [SMILES: c1ccc(N2c3ccccc3N(c3ccccc3)[Si]23N(c2ccccc2)c2ccccc2N3c2ccccc2)cc1]

EBM = M10

TABLE 7-continued
| Structural formulae of the materials used |
| --- |
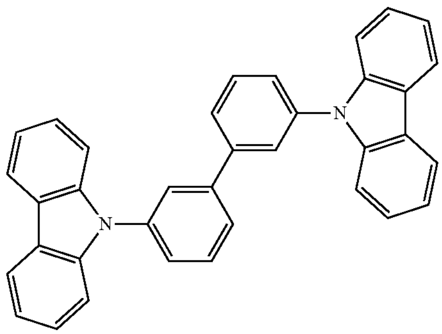 [SMILES: c1cc(-c2cccc(-n3c4ccccc4c4ccccc43)c2)cc(-n2c3ccccc3c3ccccc32)c1]
M1
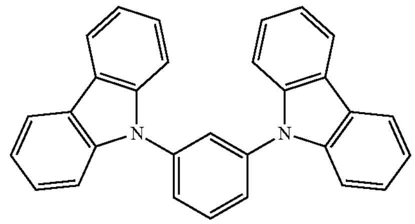 [SMILES: c1cc(-n2c3ccccc3c3ccccc32)cc(-n2c3ccccc3c3ccccc32)c1]
M2
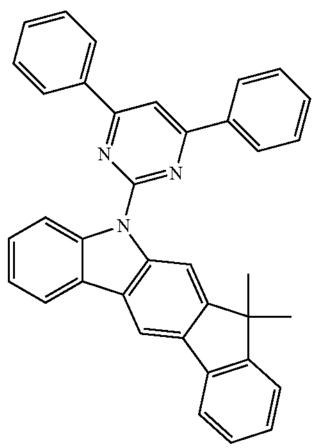 [SMILES: CC1(C)c2ccccc2-c2cc3c4ccccc4n(-c4nc(-c5ccccc5)cc(-c5ccccc5)n4)c3cc21]
M3 = HBM2
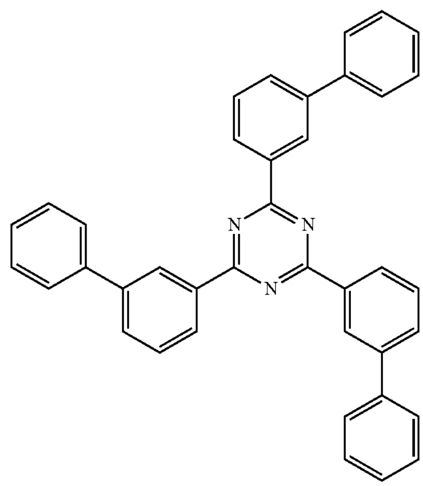 [SMILES: c1ccc(-c2cccc(-c3nc(-c4cccc(-c5ccccc5)c4)nc(-c4cccc(-c5ccccc5)c4)n3)c2)cc1]
M4 = HBM1
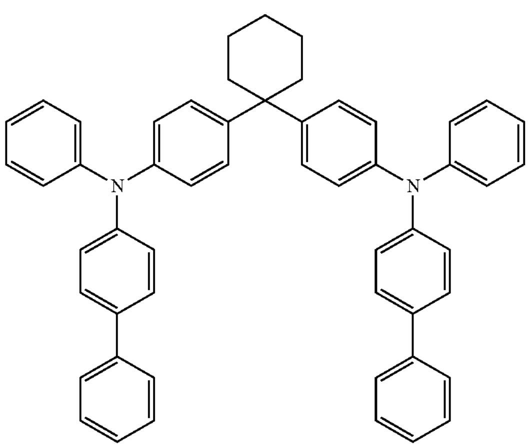 [SMILES: c1ccc(-c2ccc(N(c3ccccc3)c3ccc(C4(c5ccc(N(c6ccccc6)c6ccc(-c7ccccc7)cc6)cc5)CCCCC4)cc3)cc2)cc1]
M5
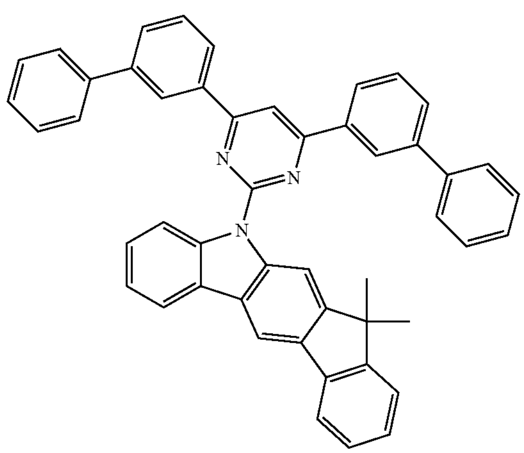 [SMILES: CC1(C)c2ccccc2-c2cc3c4ccccc4n(-c4nc(-c5cccc(-c6ccccc6)c5)cc(-c5cccc(-c6ccccc6)c5)n4)c3cc21]
M6

TABLE 7-continued
| Structural formulae of the materials used |
|---|
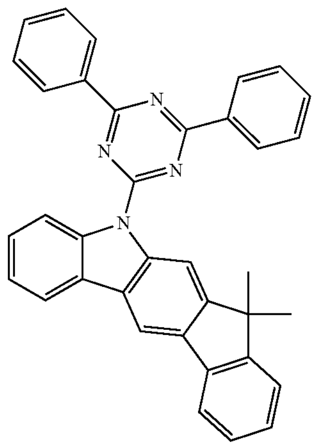 [SMILES: CC1(C)c2ccccc2-c2cc3c4ccccc4n(-c4nc(-c5ccccc5)nc(-c5ccccc5)n4)c3cc21]
M7
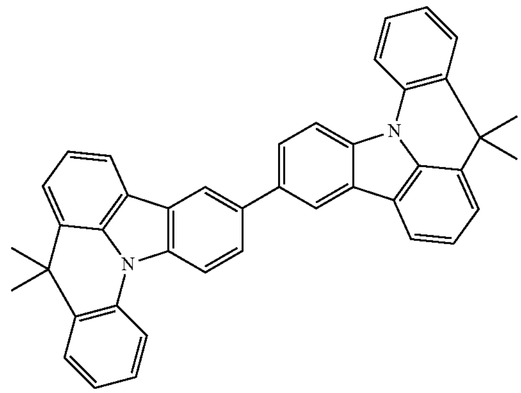
M8
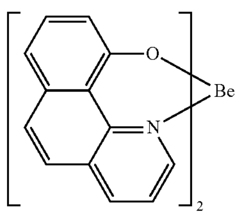
148896-39-3
M9
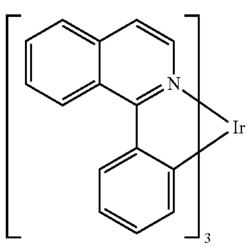
435293-93-9
Ir-R1
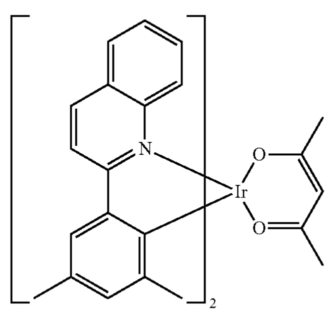
1056874-46-4
Ir-R2
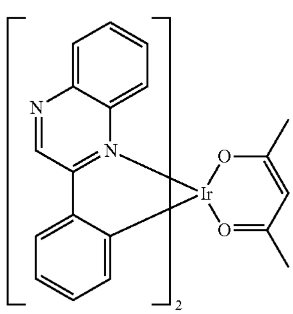
1361033-48-8
Ir-R3
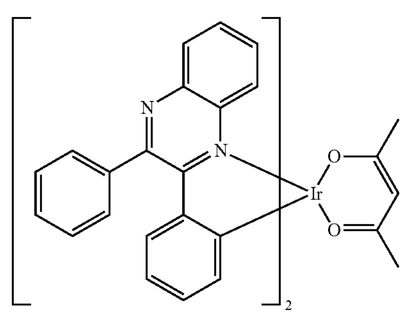
848127-98-0
Ir-R4

TABLE 7-continued
| Structural formulae of the materials used |
| --- |
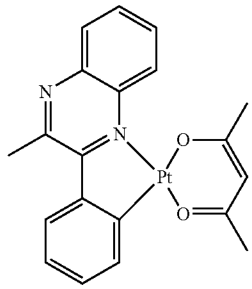
890307-63-8
Pt-R1
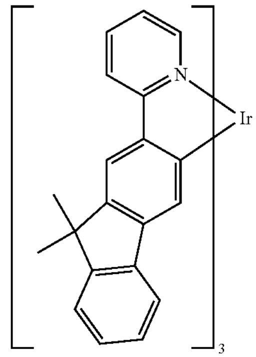
458532-65-5
Ir-Y1
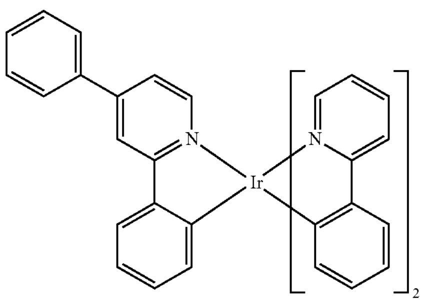
1215281-24-5
Ir-Y2
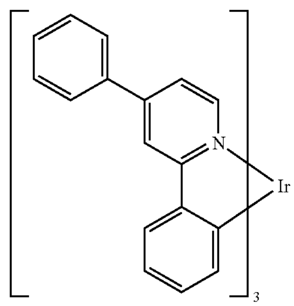
459133-57-4
Ir-Y3
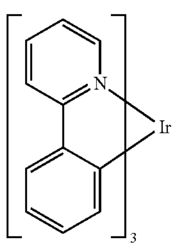
693794-98-8
Ir-G1
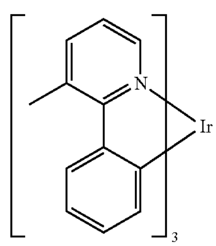
359014-71-4
Ir-G2

TABLE 7-continued
Structural formulae of the materials used
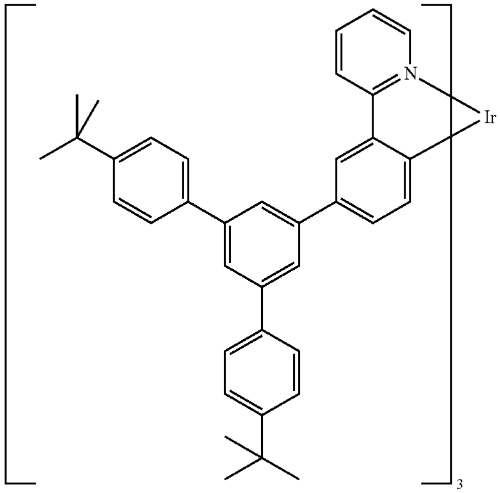
856219-87-9
Ir-G3
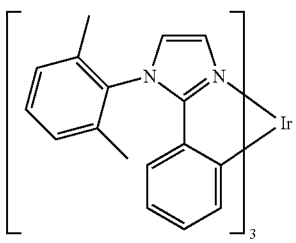
1013022-35-9
Ir-B1
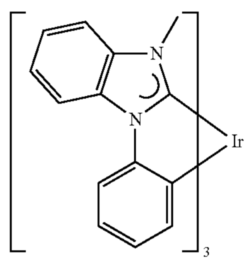
869486-05-5
Ir-B2
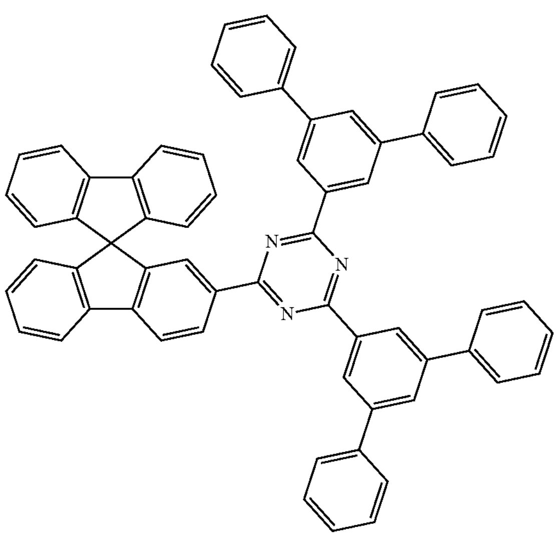 [SMILES: c1ccc(-c2cc(-c3ccccc3)cc(-c3nc(-c4cc(-c5ccccc5)cc(-c5ccccc5)c4)nc(-c4ccc5c(c4)C4(c6ccccc6-c6ccccc64)c4ccccc4-5)n3)c2)cc1]
ETM1
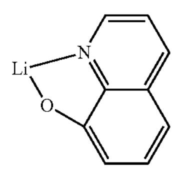
ETM2

Example L160

1-Phenyl-1H-1,2,3,4-tetrahydro-1,4-methanobenz[f]-indazole

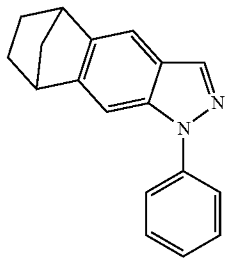 [SMILES: c1ccc(-n2ncc3cc4c(cc32)C2CCC4C2)cc1]

Procedure analogous to H. K. Lee et al., Synth. Commun., 2013, 43, 915. A mixture of 25.1 g (100 mmol) of S53, 11.9 g (110 mmol) of phenylhydrazine [100-63-0], 19.2 g (200 mmol) of sodium tert-butoxide, 636 mg (10 mmol) of copper bronze and 500 ml of PEG-400 is stirred on a water separator at 120° C. for 10 h. After cooling, 1000 ml of ethyl acetate are added, the solid material is filtered off with suction via a Celite bed, the filtrate is washed five times with 300 ml of water each time, and once with 500 ml of saturated sodium chloride solution, and the organic phase is dried over magnesium sulfate. After removal of the solvent, the residue is recrystallised three times from DMF/EtOH, and the residue is subjected to fractional bulb-tube distillation (T about 150° C., p about $10^{-4}$ mbar). Yield: 12.5 g (48 mmol), 48%; purity: about 99.5% according to $^1$H-NMR.

The following compounds can be prepared analogously:

| Ex. | Starting materials | Product | Yield |
|---|---|---|---|
| L161 | 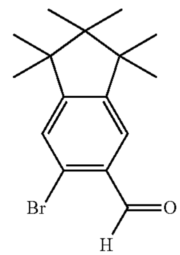 S54 | 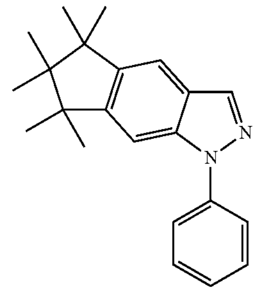 [SMILES: CC1(C)c2cc3cnn(-c4ccccc4)c3cc2C(C)(C)C1(C)C] | 51% |
| L162 | 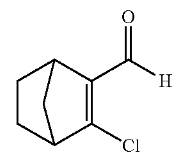 1194655-78-1 | 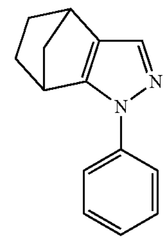 [SMILES: c1ccc(-n2ncc3c2C2CCC3C2)cc1] | 26% |

Preparation of Fac-Tris-Homoleptic Iridium Complexes

The preparation is carried out analogously to 1) Homoleptic tris-facial iridium complexes of the phenylpyridine, phenylimidazole or phenylbenzimidazole type.

| Ex. | Ligand L | Ir complex Diastereomer | Variant Reaction medium Reaction temp. Reaction time Suspension medium Extractant | Yield |
|---|---|---|---|---|
| $Ir(L160)_3$ | L160 | 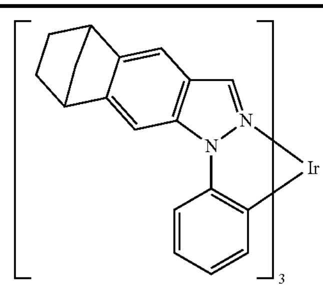 Λ,Δ-C3 | A<br>260° C.<br>60 h<br>Ethyl acetate<br>o-Xylene | 23% |
| $Ir(L161)_3$ | L161 | $Ir(L161)_3$ | as $Ir(L160)_3$ | 33% |
| $Ir(L162)_3$ | L162 | 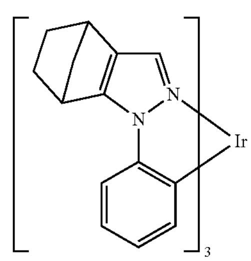 Λ,Δ-C3 | A<br>—<br>260° C.<br>40 h<br>Ethanol<br>o-Xylene | 22% |

-continued

| Ex. | Ligand L | Ir complex Diastereomer | Variant Reaction medium Reaction temp. Reaction time Suspension medium Extractant | Yield |
|---|---|---|---|---|

OLED Examples

The OLEDs are produced by vacuum processing, as described above.

Structure of the OLEDs:

| Ex. | HTL2 Thickness | EBL Thickness | EML Thickness | HBL Thickness | ETL Thickness |
|---|---|---|---|---|---|
| D-fac-$Ir(161)_3$ | HTM 190 nm | EBM 10 nm | M10:M4:fac-$Ir(L161)_3$ (65%:30%:5%) 25 nm | HBM1 10 nm | ETM1:ETM2 (50%:50%) 15 nm |
| D-fac-$Ir(162)_3$ | HTM 190 nm | EBM 10 nm | M10:M4:fac-$Ir(L162)_3$ (60%:35%:5%) 25 nm | HBM1 10 nm | ETM1:ETM2 (50%:50%) 15 nm |

Device Results:

| Ex. | EQE (%) 1000 cd/m$^2$ | Voltage (V) 1000 cd/m$^2$ | CIE x/y 1000 cd/m$^2$ |
|---|---|---|---|
| D-fac-$Ir(161)_3$ | 14.2 | 4.8 | 0.19/0.48 |
| D-fac-$Ir(162)_3$ | 6.5 | 5.0 | 0.14/0.12 |

The invention claimed is:

1. A compound of formula (1):

$$M(L)_n(L')_m \quad (1)$$

which comprises a moiety $M(L)_n$ of formula (2):

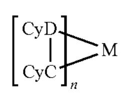

(2)

wherein

M is iridium or platinum;

CyC is an aryl or heteroaryl group having 5 to 18 aromatic ring atoms or a fluorene group, wherein CyC is coordinated to M via a carbon atom, is optionally substituted by one or more radicals R, and is bonded to CyD via a covalent bond wherein CyC and CyD are optionally linked to one another via a group selected from the group consisting of $C(R^1)_2$, $C(R^1)_2—C(R^1)_2—$, $NR^1$, O, and S;

CyD is a heteroaryl group having 5 to 18 aromatic ring atoms, wherein CyD is coordinated to M via a neutral nitrogen atom or via a carbene carbon atom, is optionally substituted by one or more radicals R, and is bonded to CyC via a covalent bond wherein CyD and CyC are optionally linked to one another via a group selected from the group consisting of $C(R^1)_2$, $C(R^1)_2—C(R^1)_2—$, $NR^1$, O, and S;

R is on each occurrence, identically or differently, H, D, F, Cl, Br, I, $N(R^1)_2$, CN, $NO_2$, OH, COOH, $C(═O)N(R^1)_2$, $Si(R^1)_3$, $B(OR^1)_2$, $C(═O)R^1$, $P(═O)(R^1)_2$, $S(═O)R^1$, $S(═O)_2R^1$, $OSO_2R^1$, a straight-chain alkyl, alkoxy, or thioalkoxy group having 1 to 20 C atoms or an alkenyl or alkynyl group having 2 to 20 C atoms or a branched or cyclic alkyl, alkoxy or thioalkoxy group having 3 to 20 C atoms, each of which is optionally substituted by one or more radicals R', wherein one or more non-adjacent $CH_2$ groups is optionally replaced by $R^1C═CR^1$, C≡C, $Si(R^1)_2$, C═O, $NR^1$, O, S, or $CONR^1$ and wherein one or more H atoms is optionally replaced by D, F, Cl, Br, I, or CN, an aromatic or heteroaromatic ring system having 5 to 60 aromatic ring atoms optionally substituted by one or more radicals $R^1$, an aryloxy or heteroaryloxy group having 5 to 40 aromatic ring atoms optionally substituted by one or more radicals $R^1$, an aralkyl or heteroaralkyl group having 5 to 40 aromatic ring atoms optionally substituted by one or more radicals $R^1$, or a diarylamino group, diheteroarylamino group, or arylheteroarylamino group having 10 to 40 aromatic ring atoms optionally substituted by one or more radicals $R^1$; and wherein two adjacent radicals R optionally form a mono- or polycyclic, aliphatic, aromatic or heteroaromatic ring system with one another;

$R^1$ is on each occurrence, identically or differently, H, D, F, Cl, Br, I, $N(R^2)_2$, CN, $NO_2$, $Si(R^2)_3$, $B(OR^2)_2$, $C(═O)R^2$, $P(═O)(R^2)_2$, $S(═O)R^2$, $S(═O)_2R^2$, $OSO_2R^2$, a straight-chain alkyl, alkoxy or thioalkoxy group having 1 to 20 C atoms or an alkenyl or alkynyl group having 2 to 20 C atoms or a branched or cyclic alkyl, alkoxy or thioalkoxy group having 3 to 20 C atoms, each of which is optionally substituted by one or more radicals $R^2$, wherein one or more non-adjacent $CH_2$ groups is optionally replaced by $R^2C═CR^2$, —C≡C, $Si(R^2)_2$, C═O, $NR^2$, O, S, or $CONR^2$ and where one or more H atoms is optionally replaced by D, F, Cl, Br, I, CN, or $NO_2$, an aromatic or heteroaromatic ring system having 5 to 60 aromatic ring atoms optionally substituted by one or more radicals $R^2$, an aryloxy or heteroaryloxy group having 5 to 40 aromatic ring atoms optionally substituted by one or more radicals $R^2$, an aralkyl or heteroaralkyl group having 5 to 40 aromatic ring atoms optionally substituted by one or more radicals $R^2$, or a diarylamino group, diheteroarylamino group or arylheteroarylamino group having 10 to 40 aromatic ring atoms optionally substituted by one or more radicals $R^2$;

$R^2$ is on each occurrence, identically or differently, H, D, F or an aliphatic, aromatic, and/or heteroaromatic hydrocarbon radical having 1 to 20 C atoms, wherein one or more H atoms are optionally replaced by F; and wherein two or more substituents $R^2$ optionally form a mono- or polycyclic, aliphatic ring system with one another;

L' is, identically or differently on each occurrence, a co-ligand;

n is 1, 2, or 3;

m is 0, 1, 2, 3, or 4;

and wherein a plurality of ligands L are optionally linked to one another or L is optionally linked to L' via a single bond or a divalent or trivalent bridge and thus form a tridentate, tetradentate, pentadentate, or hexadentate ligand system;

a substituent R optionally additionally coordinates to the metal; and wherein CyD and/or CyC contain(s) two adjacent carbon atoms which are each substituted by radicals R, wherein the respective radicals R, together with the C atoms, form a ring of formula (3) or (4):

(3)

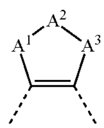

(4)

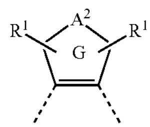

wherein $R^1$ and $R^2$ are as defined above and the dashed bonds indicate the linking of the two carbon atoms in the ligand;

$A^1$ is $C(R^3)_2$, or $NR^3$;

$A^2$ is $C(R^1)_2$, O, S, $NR^3$, or C(=O);

$A^3$ is $C(R^3)_2$, $NR^3$, or C(=O);

G is an alkylene group having 1, 2 or 3 C atoms and is optionally substituted by one or more radicals $R^2$, $—CR^2=CR^2—$, or an ortho-linked arylene or heteroarylene group having 5 to 14 aromatic ring atoms optionally substituted by one or more radicals $R^2$; and $R^3$ is, identically or differently on each occurrence, a straight-chain alkyl or alkoxy group having 1 to 20 C atoms, a branched or cyclic alkyl or alkoxy group having 3 to 20 C atoms, each of which is optionally substituted by one or more radicals $R^2$, wherein one or more non-adjacent $CH_2$ groups is optionally replaced by $R^2C=CR^2$, —C≡C, $Si(R^2)_2$, C=O, $NR^2$, O, S, or $CONR^2$ and wherein one or more H atoms is optionally replaced by D or F, an aromatic or hetero aromatic ring system having 5 to 24 aromatic ring atoms optionally substituted by one or more radicals $R^2$, an aryloxy or heteroaryloxy group having 5 to 24 aromatic ring atoms optionally substituted by one or more radicals $R^2$, or an aralkyl or heteroaralkyl group having 5 to 24 aromatic ring atoms optionally substituted by one or more radicals $R^2$; wherein two radicals $R^3$ bonded to the same carbon atom optionally form an aliphatic or aromatic ring system with one another to form a spiro system; and wherein $R^3$ optionally forms an aliphatic ring system with an adjacent radical R or $R^1$;

with the proviso that two heteroatoms are not bonded directly to one another in $A^1$-$A^2$-$A^3$ and with the proviso that the radicals R on CyC do not join together to form a ring with the radicals R on CyD.

2. The compound of claim 1, wherein when M is iridium (III), n is 1, 2 or 3, and when M is platinum(II), n is 1 or 2.

3. The compound of claim 1, wherein CyC is selected from the group consisting of formulae (CyC-1) to (CyC-19), wherein CyC is in each case bonded to CyD at the position denoted by # and is coordinated to the metal at the position denoted by *:

(CyC-1)

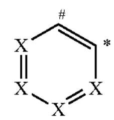

(CyC-2)

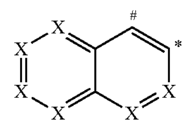

(CyC-3)

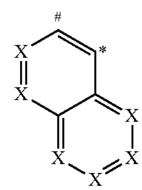

(CyC-4)

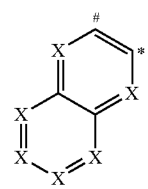

(CyC-5)

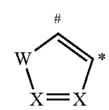

(CyC-6)

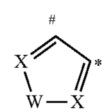

(CyC-7)

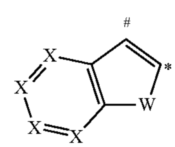

(CyC-8)

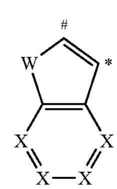

(CyC-9)

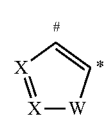

-continued (CyC-10)

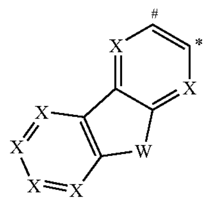

(CyC-11)

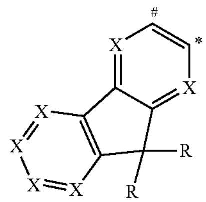

(CyC-12)

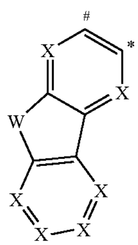

(CyC-13)

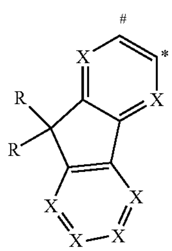

(CyC-14)

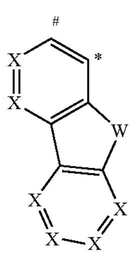

(CyC-15)

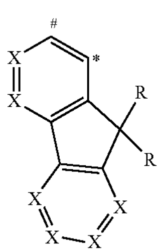

-continued (CyC-16)

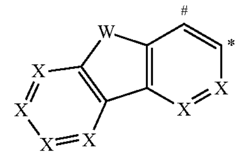

(CyC-17)

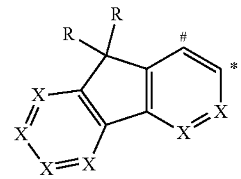

(CyC-18)

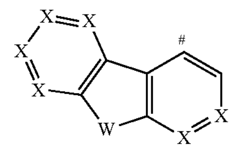

(CyC-19)

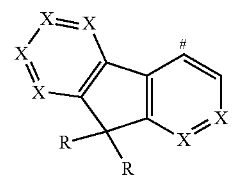

wherein

X is on each occurrence, identically or differently, CR or N; and

W is on each occurrence, identically or differently, NR, O, S, or $CR_2$.

4. The compound of claim 1, wherein CyC is selected from the group consisting of formulae (CyC-1a) to (CyC-19a), wherein CyC is in each case bonded to CyD at the position denoted by # and is coordinated to the metal at the position denoted by *:

(CyC-1a)

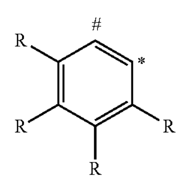

(CyC-1b)

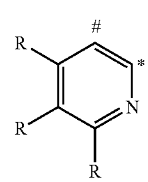

(CyC-1c)

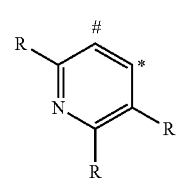

-continued
(CyC-1d)
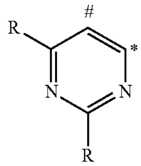
(CyC-2a)
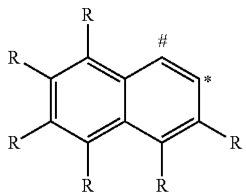
(CyC-2b)
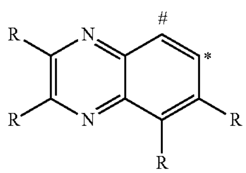
(CyC-3a)
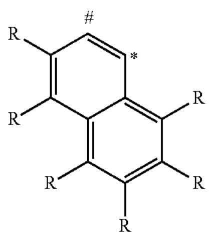
(CyC-3b)
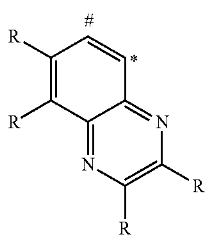
(Cyc-4a)
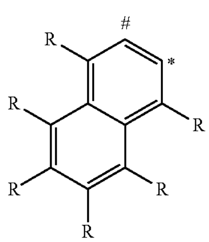
(CyC-4b)
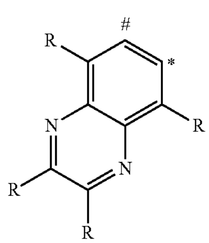
-continued
(CyC-5a)
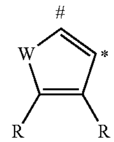
(CyC-6a)
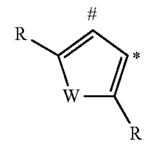
(CyC-7a)
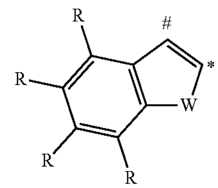
(CyC-8a)
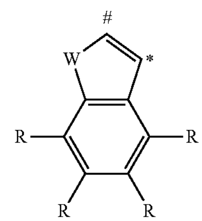
(CyC-9a)
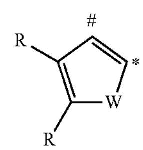
(CyC-10a)
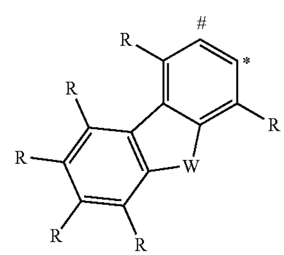
(CyC-11a)
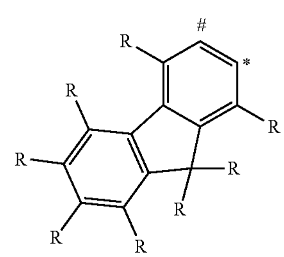

-continued (CyC-12a)

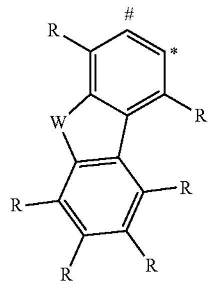

(CyC-13a)

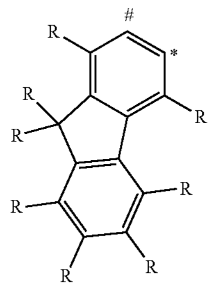

(CyC-14a)

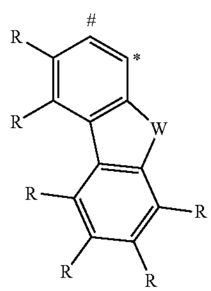

(CyC-15a)

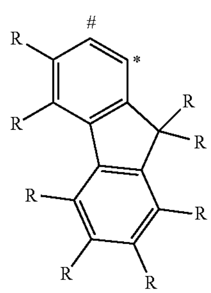

(CyC-16a)

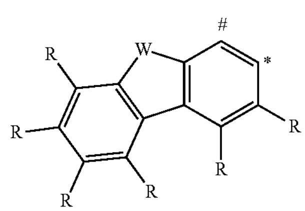

(CyC-17a)

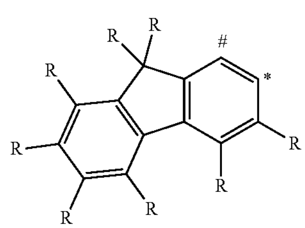

-continued (CyC-18a)

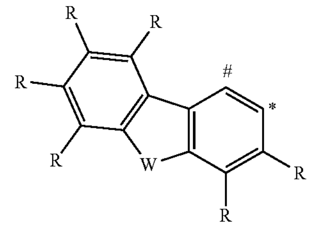

(CyC-19a)

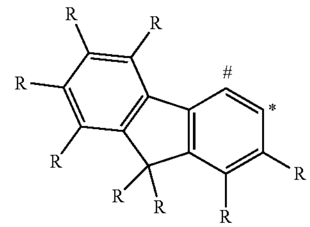

wherein

W is on each occurrence, identically or differently, NR, O, S, or $CR_2$.

5. The compound of claim 1, wherein CyD is selected from the group consisting of formulae (CyD-1) to (CyD-10), wherein CyD is in each case bonded to CyC at the position denoted by # and is coordinated to the metal at the position denoted by *:

(CyD-1)

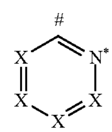

(CyD-2)

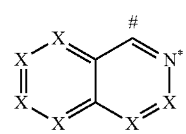

(CyD-3)

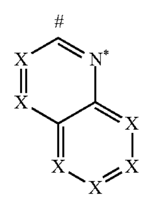

(CyD-4)

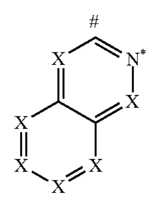

(CyD-5)

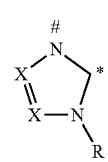

-continued (CyD-6)

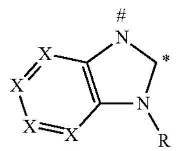

(CyD-7)

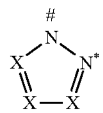

(CyD-8)

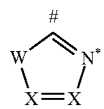

(CyD-9)

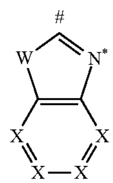

(CyD-10)

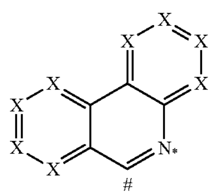

wherein

X is on each occurrence, identically or differently, CR or N; and

W is on each occurrence, identically or differently, NR, O, S, or $CR_2$.

6. The compound of claim 1, wherein CyD is selected from the group consisting of formulae (CyD-1a) to (CyD-10a), wherein CyD is in each case bonded to CyC at the position denoted by # and is coordinated to the metal at the position denoted by *:

(CyD-1a)

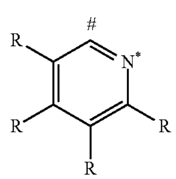

(CyD-2a)

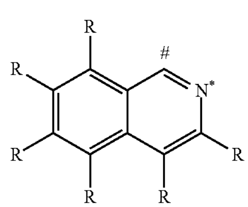

-continued (CyD-3a)

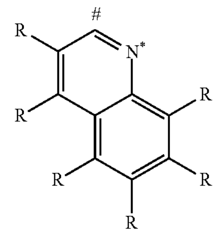

(CyD-3b)

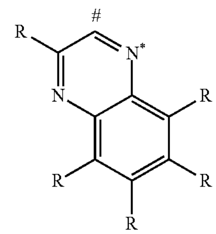

(CyD-4a)

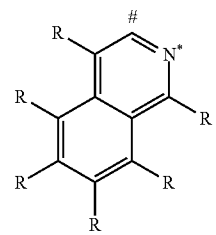

(CyD-5a)

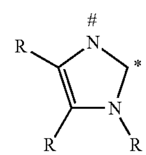

(CyD-6a)

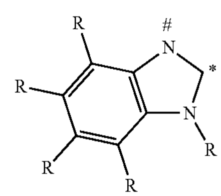

(CyD-7a)

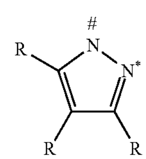

(CyD-8a)

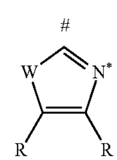

(CyD-9a)

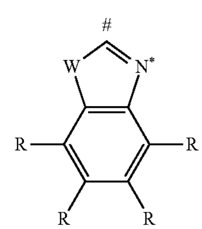

-continued (CyD-10a)

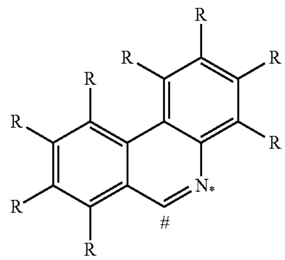

wherein

W is on each occurrence, identically or differently, NR, O, S, or $CR_2$.

7. The compound of claim 1, wherein CyC comprises a group of formula (3) or (4) and is selected from the group consisting of formulae (CyC-1-1) to (CyC-19-1) and/or CyD comprises a group of formula (3) or (4) and is selected from the group consisting of formulae (CyD 1-1) to (CyD-10-1):

(CyC-1-1)

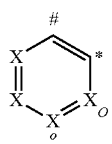

(CyC-1-2)

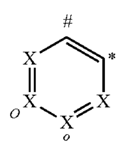

(CyC-2-1)

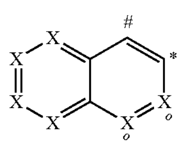

(CyC-2-2)

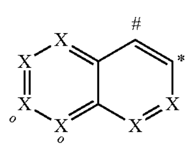

(CyC-2-3)

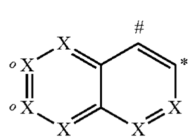

(CyC-3-1)

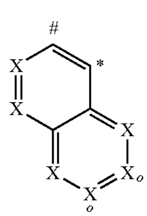

-continued (CyC-3-2)

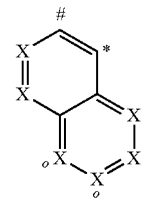

(CyC-4-1)

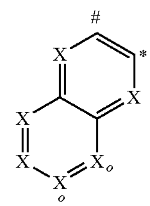

(CyC-4-2)

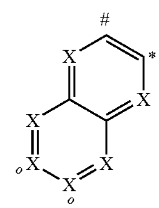

(CyC-4-3)

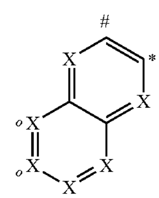

(CyC-5-1)

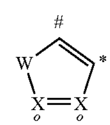

(CyC-7-1)

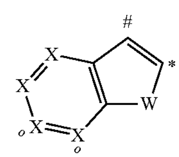

(CyC-7-2)

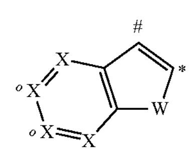

(CyC-7-3)

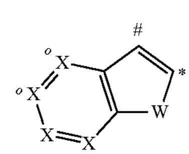

-continued
(CyC-8-1)
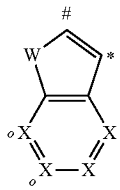
(CyC-8-2)
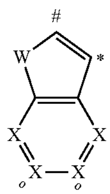
(CyC-8-3)
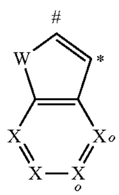
(CyC-9-1)
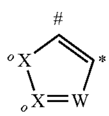
(CyC-14-1)
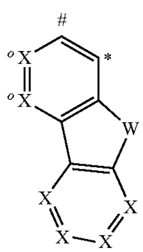
(CyC-15-1)
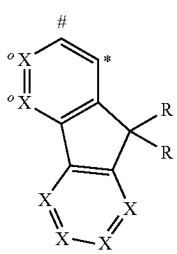
(CyC-16-1)
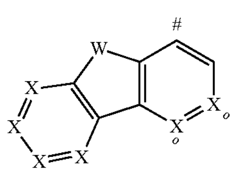
(CyC-17-1)
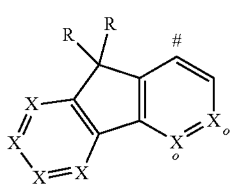
-continued
(CyC-18-1)
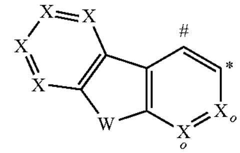
(CyC-19-1)
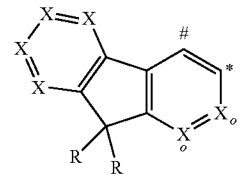
(CyD-1-1)
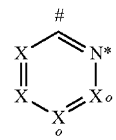
(CyD-1-2)
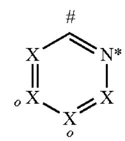
(CyD-2-1)
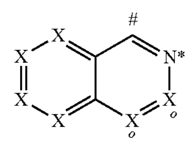
(CyD-2-2)
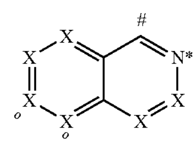
(CyD-2-3)
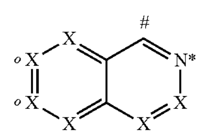
(CyD-3-1)
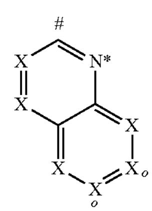
(CyD-3-2)
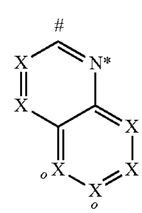

-continued
(CyD-4-1)
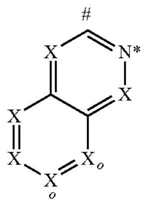
(CyD-4-2)
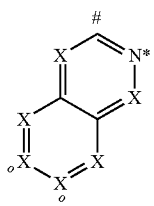
(CyD-4-3)
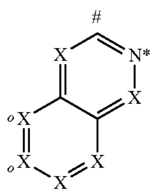
(CyD-5-1)
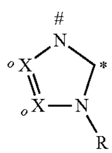
(CyD-6-1)
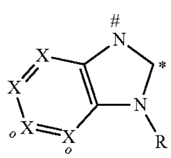
(CyD-6-2)
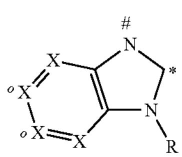
(CyD-6-3)
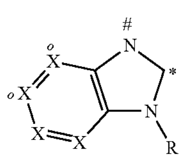
(CyD-7-1)
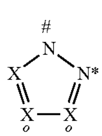
(CyC-7-2)
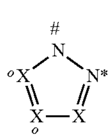
-continued
(CyD-8-1)
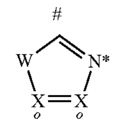
(CyD-9-1)
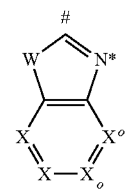
(CyD-9-2)
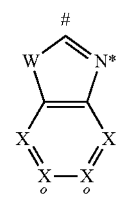
(CyD-9-3)
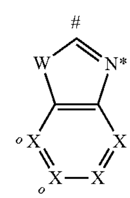
(CyD-10-1)
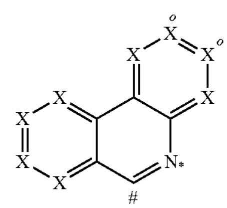
(CyD-10-2)
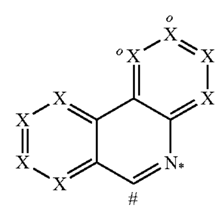
(CyD-10-3)
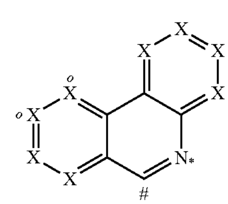
(CyD-10-4)
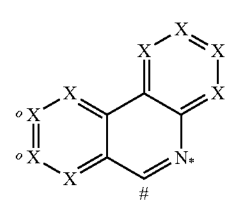

wherein

X is on each occurrence, identically or differently, CR or N; and

W is on each occurrence, identically or differently, NR, O, S, or $CR^2$;

in each case denotes the positions which stand for CR, wherein the respective radicals R, together with the C atoms to which they are bonded, form a ring of formula (3) or (4), where the group of formulae (CyC-1-1) to (CyC-19-1) is in each case bonded to CyD at the position denoted by # and is coordinated to the metal at the position denoted by *, and where the groups of formula (CyD-1-1) to (CyD-10-1) is in each case bonded to CyC at the position denoted by # and is coordinated to the metal at the position denoted by *.

8. The compound of claim 1, wherein the compound is selected from the group consisting of formulae (17) to (22):

(17)

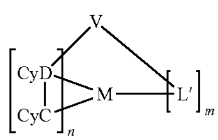

(18)

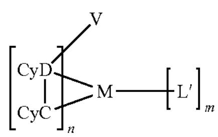

(19)

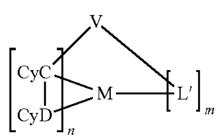

(20)

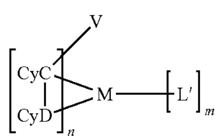

(21)

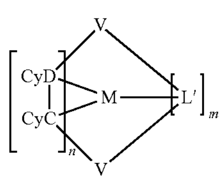

(22)

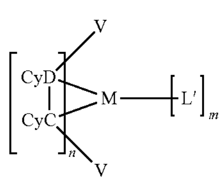

wherein

V is a single bond or a bridging unit containing 1 to 80 atoms from the third, fourth, fifth, and/or sixth main group or a 3- to 6-membered homocycle or heterocycle which covalently bonds L to one another or L to L'.

9. An oligomer, polymer, or dendrimer comprising one or more compounds of claim 1, wherein one or more bonds are present from the compound to the polymer, oligomer, or dendrimer.

10. A formulation comprising a compound of claim 1 and at least one further compound.

11. A formulation comprising an oligomer, polymer, or dendrimer of claim 9 and at least one further compound.

12. An electronic device comprising at least one compound of claim 1.

13. The electronic device of claim 12, where the electronic device is selected from the group consisting of organic electroluminescent devices, organic integrated circuits, organic field-effect transistors, organic thin-film transistors, organic light-emitting transistors, organic solar cells, organic optical detectors, organic photoreceptors, organic field-quench devices, light-emitting electrochemical cells, and organic laser diodes.

14. An electronic device comprising at least one oligomer, polymer, or dendrimer of claim 9.

15. The electronic device of claim 14, wherein the electronic device is selected from the group consisting of organic electroluminescent devices, organic integrated circuits, organic field-effect transistors, organic thin-film transistors, organic light-emitting transistors, organic solar cells, organic optical detectors, organic photoreceptors, organic field-quench devices, light-emitting electrochemical cells, and organic laser diodes.

16. An organic electroluminescent device comprising a compound of claim 1 employed as an emitting compound in one or more emitting layers optionally in combination with a matrix material.

17. The compound of claim 1, wherein

R is on each occurrence, identically or differently, H, D, F, Cl, Br, I, $N(R^1)_2$, CN, $NO_2$, OH, COOH, $C(=O)N(R^1)_2$, $Si(R^1)_3$, $B(OR^1)_2$, $C(=O)R^1$, $P(=O)(R^1)_2$, $S(=O)R^1$, $S(=O)_2R^1$, $OSO_2R^1$ a straight-chain alkyl, alkoxy, or thioalkoxy group having 1 to 20 C atoms or an alkenyl or alkynyl group having 2 to 20 C atoms or a branched or cyclic alkyl, alkoxy or thioalkoxy group having 3 to 20 C atoms, each of which is optionally substituted by one or more radicals $R^1$, wherein one or more non-adjacent $CH_2$ groups is optionally replaced by $R^1C{=}CR^1$, C≡C, $Si(R^1)_2$, C=O, $NR^1$, O, S, or $CONR^1$ and wherein one or more H atoms is optionally replaced by D, F, Cl, Br, I, or CN, an aromatic or heteroaromatic ring system having 5 to 60 aromatic ring atoms optionally substituted by one or more radicals $R^1$, an aryloxy or heteroaryloxy group having 5 to 40 aromatic ring atoms optionally substituted by one or more radicals $R^1$, an aralkyl or heteroaralkyl group having 5 to 40 aromatic ring atoms optionally substituted by one or more radicals $R^1$, or a diarylamino group, diheteroarylamino group, or arylheteroarylamino group having 10 to 40 aromatic ring atoms optionally substituted by one or more radicals $R^1$.

18. The compound of claim 1, wherein the structure of formula (3) is selected from the group consisting of formulae (3-A), (3-B), (3-C), (3-D), and (3-E):

(3-A)

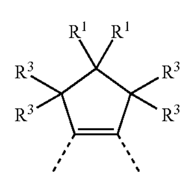

-continued (3-B)

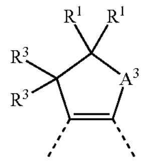

(3-C)

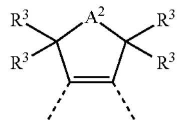

(3-D)

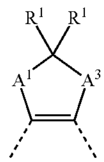

(3-E)

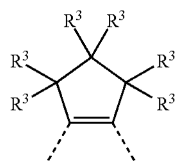

wherein $A^1$ is $C(R^3)_2$,— or $NR^3$;

$A^2$ is O or $NR^3$;

$A^3$ is $NR^3$; and $R^1$ and $R^3$ are defined as in claim 1, and the structure of formula (4) is selected from the group consisting of formulae (4-A), (4-B) and (4-C):

(4-A)

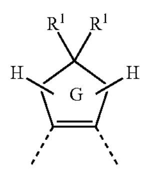

(4-B)

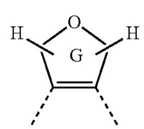

(4-C)

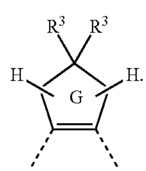

19. An organic electroluminescent device comprising an oligomer, polymer, or dendrimer of claim 9 employed as an emitting compound in one or more emitting layers optionally in combination with a matrix material.

20. A compound of formula (1):

$$M(L)_n(L')_m \quad (1)$$

which comprises a moiety $M(L)_n$ of formula (2):

(2)

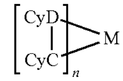

wherein

M is iridium or platinum;

CyC is an aryl or heteroaryl group having 5 to 18 aromatic ring atoms or a fluorene group, wherein CyC is coordinated to M via a carbon atom, is optionally substituted by one or more radicals R, and is bonded to CyD via a covalent bond wherein CyC and CyD are optionally linked to one another via a group selected from the group consisting of $C(R^1)_2$, $C(R^1)_2$—$C(R^1)_2$—, $NR^1$, O, and S;

CyD is a heteroaryl group having 5 to 18 aromatic ring atoms, wherein CyD is coordinated to M via a neutral nitrogen atom or via a carbene carbon atom, is optionally substituted by one or more radicals R, and is bonded to CyC via a covalent bond wherein CyD and CyC are optionally linked to one another via a group selected from the group consisting of $C(R^1)_2$, $C(R^1)_2$—$C(R^1)_2$—, $NR^1$, O, and S;

R is on each occurrence, identically or differently, H, D, F, Cl, Br, I, $N(R^1)_2$, CN, $NO_2$, OH, COOH, $C(=O)N(R^1)_2$, $Si(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl, alkoxy, or thioalkoxy group having 1 to 20 C atoms or an alkenyl or alkynyl group having 2 to 20 C atoms or a branched or cyclic alkyl, alkoxy or thioalkoxy group having 3 to 20 C atoms, each of which is optionally substituted by one or more radicals $R^1$, wherein one or more non-adjacent $CH_2$ groups is optionally replaced by $R^1C{=}CR^1$, C≡C, $Si(R^1)_2$, C═O, $NR^1$, O, S, or $CONR^1$ and wherein one or more H atoms is optionally replaced by D, F, Cl, Br, I, or CN, an aromatic or heteroaromatic ring system having 5 to 60 aromatic ring atoms optionally substituted by one or more radicals $R^1$, an aryloxy or heteroaryloxy group having 5 to 40 aromatic ring atoms optionally substituted by one or more radicals $R^1$, an aralkyl or heteroaralkyl group having 5 to 40 aromatic ring atoms optionally substituted by one or more radicals $R^1$, or a diarylamino group, diheteroarylamino group, or arylheteroarylamino group having 10 to 40 aromatic ring atoms optionally substituted by one or more radicals $R^1$; and wherein two adjacent radicals R optionally form a mono- or polycyclic, aliphatic, aromatic or heteroaromatic ring system with one another;

$R^1$ is on each occurrence, identically or differently, H, D, F, Cl, Br, I, $N(R^2)_2$, CN, $NO_2$, $Si(R^2)_3$, $B(OR^2)_2$, $C(=O)R^2$, $P(=O)(R^2)_2$, $S(=O)R^2$, $S(=O)_2R^2$, $OSO_2R^2$, a straight-chain alkyl, alkoxy or thioalkoxy group having 1 to 20 C atoms or an alkenyl or alkynyl group having 2 to 20 C atoms or a branched or cyclic alkyl, alkoxy or thioalkoxy group having 3 to 20 C atoms, each of which is optionally substituted by one or more radicals $R^2$, wherein one or more non-adjacent $CH_2$ groups is optionally replaced by $R^2C{=}CR^2$, —C≡C, $Si(R^2)_2$, C═O, $NR^2$, O, S, or $CONR^2$ and where one or more H atoms is optionally replaced by D, F, Cl, Br, I, CN, or $NO_2$, an aromatic or heteroaromatic ring system having 5 to 60 aromatic ring atoms optionally substituted by one or more radicals $R^2$, an aryloxy or heteroaryloxy group having 5 to 40 aromatic ring atoms optionally substituted by one or more radicals $R^2$, an aralkyl or heteroaralkyl group having 5 to 40 aromatic ring atoms optionally substituted by one or more radicals $R^2$, or a diarylamino group, diheteroarylamino group or arylheteroarylamino group having 10 to 40 aromatic ring atoms optionally substituted by one or more radicals $R^2$; and wherein two or more adjacent radicals $R^1$ with one another or $R^1$ with R optionally form a mono- or polycyclic, aliphatic, aromatic, or heteroaromatic ring system;

$R^2$ is on each occurrence, identically or differently, H, D, F or an aliphatic, aromatic, and/or heteroaromatic hydrocarbon radical having 1 to 20 C atoms, wherein one or more H atoms are optionally replaced by F; and wherein two or more substituents $R^2$ optionally form a mono- or polycyclic, aliphatic ring system with one another;

L' is, identically or differently on each occurrence, a co-ligand;

n is 1, 2, or 3;

m is 0, 1, 2, 3, or 4;

and wherein a plurality of ligands L are optionally linked to one another or L is optionally linked to L' via a single bond or a divalent or trivalent bridge and thus form a tridentate, tetradentate, pentadentate, or hexadentate ligand system;

a substituent R optionally additionally coordinates to the metal; and wherein CyD contain(s) two adjacent carbon atoms which are each substituted by radicals R, wherein the respective radicals R, together with the C atoms, form a ring of formula (3) or (4):

(3)

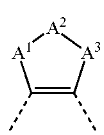

(4)

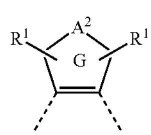

wherein $R^1$ and $R^2$ are as defined above and the dashed bonds indicate the linking of the two carbon atoms in the ligand;

$A^1$ is $C(R^3)_2$, S, or $NR^3$;

$A^2$ is $C(R^1)_2$, O, S, $NR^3$, or C(=O);

$A^3$ is $C(R^3)_2$, O, S, $NR^3$, or C(=O);

G is an alkylene group having 1, 2 or 3 C atoms and is optionally substituted by one or more radicals $R^2$, $—CR^2=CR^2—$, or an ortho-linked arylene or heteroarylene group having 5 to 14 aromatic ring atoms optionally substituted by one or more radicals $R^2$; and $R^3$ is, identically or differently on each occurrence, a straight-chain alkyl or alkoxy group having 1 to 20 C atoms, a branched or cyclic alkyl or alkoxy group having 3 to 20 C atoms, each of which is optionally substituted by one or more radicals $R^2$ wherein one or more non-adjacent $CH_2$ groups is optionally replaced by $R^2C=CR^2$, —C≡C, $Si(R^2)_2$, C=O, $NR^2$, O, S, or $CONR^2$ and wherein one or more H atoms is optionally replaced by D or F, an aromatic or hetero aromatic ring system having 5 to 24 aromatic ring atoms optionally substituted by one or more radicals $R^2$, an aryloxy or heteroaryloxy group having 5 to 24 aromatic ring atoms optionally substituted by one or more radicals $R^2$, or an aralkyl or heteroaralkyl group having 5 to 24 aromatic ring atoms optionally substituted by one or more radicals $R^2$; wherein two radicals $R^3$ bonded to the same carbon atom optionally form an aliphatic or aromatic ring system with one another to form a spiro system; and wherein $R^3$ optionally forms an aliphatic ring system with an adjacent radical R or $R^1$;

with the proviso that two heteroatoms are not bonded directly to one another in $A^1$-$A^2$-$A^3$ and with the proviso that the radicals R on CyC do not join together to form a ring with the radicals R on CyD.

21. An organic electroluminescent device comprising a compound of claim 20.

22. A compound of formula (1):

$$M(L)_n(L')_m \quad (1)$$

which comprises a moiety $M(L)_n$ of formula (2):

(2)

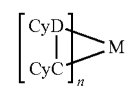

wherein

M is iridium or platinum;

CyC is an aryl or heteroaryl group having 5 to 18 aromatic ring atoms or a fluorene group, wherein CyC is coordinated to M via a carbon atom, is optionally substituted by one or more radicals R, and is bonded to CyD via a covalent bond wherein CyC and CyD are optionally linked to one another via a group selected from the group consisting of $C(R^1)_2$, $C(R^1)_2—C(R^1)_2—$, $NR^1$, O, and S;

CyD is a heteroaryl group having 5 to 18 aromatic ring atoms, wherein CyD is coordinated to M via a neutral nitrogen atom or via a carbene carbon atom, is optionally substituted by one or more radicals R, and is bonded to CyC via a covalent bond wherein CyD and CyC are optionally linked to one another via a group selected from the group consisting of $C(R^1)_2$, $C(R^1)_2—C(R^1)_2—$, $NR^1$, O, and S;

R is on each occurrence, identically or differently, H, D, F, Cl, Br, I, $N(R^1)_2$, CN, $NO_2$, OH, COOH, $C(=O)N(R^1)_2$, $Si(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl, alkoxy, or thioalkoxy group having 1 to 20 C atoms or an alkenyl or alkynyl group having 2 to 20 C atoms or a branched or cyclic alkyl, alkoxy or thioalkoxy group having 3 to 20 C atoms, each of which is optionally substituted by one or more radicals $R^1$, wherein one or more non-adjacent $CH_2$ groups is optionally replaced by $R^1C=CR^1$, C≡C, $Si(R^1)_2$, C=O, $NR^1$, O, S, or $CONR^1$ and wherein one or more H atoms is optionally replaced by D, F, Cl, Br, I, or CN, an aromatic or heteroaromatic ring system having 5 to 60 aromatic ring atoms optionally substituted by one or more radicals $R^1$, an aryloxy or heteroaryloxy group having 5 to 40 aromatic ring atoms optionally substituted by one or more radicals $R^1$, an aralkyl or heteroaralkyl group having 5 to 40 aromatic ring atoms optionally substituted by one or more radicals $R^1$, or a diarylamino group, diheteroarylamino group, or arylheteroarylamino group having 10 to 40 aromatic ring atoms optionally substituted by one or more radicals $R^1$; and wherein two adjacent radicals R optionally form a mono- or polycyclic, aliphatic, aromatic or heteroaromatic ring system with one another;

$R^1$ is on each occurrence, identically or differently, H, D, F, Cl, Br, I, $N(R^2)_2$, CN, $NO_2$, $Si(R^2)_3$, $B(OR^2)_2$, $C({=}O)R^2$, $P({=}O)(R^2)_2$, $S({=}O)R^2$, $S({=}O)_2R^2$, $OSO_2R^2$, a straight-chain alkyl, alkoxy or thioalkoxy group having 1 to 20 C atoms or an alkenyl or alkynyl group having 2 to 20 C atoms or a branched or cyclic alkyl, alkoxy or thioalkoxy group having 3 to 20 C atoms, each of which is optionally substituted by one or more radicals $R^2$, wherein one or more non-adjacent $CH_2$ groups is optionally replaced by $R^2C{=}CR^2$, —C≡C, $Si(R^2)_2$, C═O, $NR^2$, O, S, or $CONR^2$ and where one or more H atoms is optionally replaced by D, F, Cl, Br, I, CN, or $NO_2$, an aromatic or heteroaromatic ring system having 5 to 60 aromatic ring atoms optionally substituted by one or more radicals $R^2$, an aryloxy or heteroaryloxy group having 5 to 40 aromatic ring atoms optionally substituted by one or more radicals $R^2$, an aralkyl or heteroaralkyl group having 5 to 40 aromatic ring atoms optionally substituted by one or more radicals $R^2$, or a diarylamino group, diheteroarylamino group or arylheteroarylamino group having 10 to 40 aromatic ring atoms optionally substituted by one or more radicals $R^2$; and wherein two or more adjacent radicals $R^1$ with one another or $R^1$ with R optionally form a mono- or polycyclic, aliphatic, aromatic, or heteroaromatic ring system;

$R^2$ is on each occurrence, identically or differently, H, D, F or an aliphatic, aromatic, and/or heteroaromatic hydrocarbon radical having 1 to 20 C atoms, wherein one or more H atoms are optionally replaced by F; and wherein two or more substituents $R^2$ optionally form a mono- or polycyclic, aliphatic ring system with one another;

$L^1$ is, identically or differently on each occurrence, a co-ligand;

n is 2, or 3;

m is 0, 1, 2, 3, or 4;

and wherein a plurality of ligands L are optionally linked to one another or L is optionally linked to L' via a single bond or a divalent or trivalent bridge and thus form a tridentate, tetradentate, pentadentate, or hexadentate ligand system;

a substituent R optionally additionally coordinates to the metal; and wherein CyD and/or CyC contain(s) two adjacent carbon atoms which are each substituted by radicals R, wherein the respective radicals R, together with the C atoms, form a ring of formula (3) or (4):

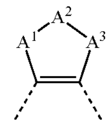

(3)

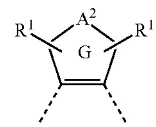

(4)

wherein $R^1$ and $R^2$ are as defined above and the dashed bonds indicate the linking of the two carbon atoms in the ligand;

$A^1$ is $C(R^3)_2$, or $NR^3$;

$A^2$ is $C(R^1)_2$, O, S, $NR^3$, or $C({=}O)$;

$A^3$ is $C(R^3)_2$, $NR^3$, or $C({=}O)$;

G is an alkylene group having 1, 2 or 3 C atoms and is optionally substituted by one or more radicals $R^2$, $—CR^2{=}CR^2—$, or an ortho-linked arylene or heteroarylene group having 5 to 14 aromatic ring atoms optionally substituted by one or more radicals $R^2$; and $R^3$ is, identically or differently on each occurrence, a straight-chain alkyl or alkoxy group having 1 to 20 C atoms, a branched or cyclic alkyl or alkoxy group having 3 to 20 C atoms, each of which is optionally substituted by one or more radicals $R^2$, wherein one or more non-adjacent $CH_2$ groups is optionally replaced by $R^2C{=}CR^2$, —C≡C, $Si(R^2)_2$, C═O, $NR^2$, O, S, or $CONR^2$ and wherein one or more H atoms is optionally replaced by D or F, an aromatic or hetero aromatic ring system having 5 to 24 aromatic ring atoms optionally substituted by one or more radicals $R^2$, an aryloxy or heteroaryloxy group having 5 to 24 aromatic ring atoms optionally substituted by one or more radicals $R^2$, or an aralkyl or heteroaralkyl group having 5 to 24 aromatic ring atoms optionally substituted by one or more radicals $R^2$; wherein two radicals $R^3$ bonded to the same carbon atom optionally form an aliphatic or aromatic ring system with one another to form a spiro system; and wherein $R^3$ optionally forms an aliphatic ring system with an adjacent radical R or $R^1$;

with the proviso that two heteroatoms are not bonded directly to one another in $A^1$-$A^2$-$A^3$ and with the proviso that the radicals R on CyC do not join together to form a ring with the radicals R on CyD.

23. An organic electroluminescent device comprising a compound of claim 22.

* * * * *